US010444625B2

(12) United States Patent
Samejima et al.

(10) Patent No.: US 10,444,625 B2
(45) Date of Patent: *Oct. 15, 2019

(54) COLORING COMPOSITION, CURED FILM, COLOR FILTER, METHOD OF MANUFACTURING COLOR FILTER, SOLID IMAGE PICKUP ELEMENT, AND IMAGE DISPLAY APPARATUS

(71) Applicant: FUJIFILM Corporation, Tokyo (JP)

(72) Inventors: Suguru Samejima, Haibara-gun (JP); Masayuki Harada, Haibara-gun (JP); Hiroaki Idei, Haibara-gun (JP); Kazuya Oota, Haibara-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 290 days.

This patent is subject to a terminal disclaimer.

(21) Appl. No.: 15/427,226

(22) Filed: Feb. 8, 2017

(65) Prior Publication Data

US 2017/0146904 A1 May 25, 2017

Related U.S. Application Data

(63) Continuation of application No. PCT/JP2015/073431, filed on Aug. 20, 2015.

(30) Foreign Application Priority Data

Sep. 3, 2014 (JP) ................................ 2014-179392
Jul. 28, 2015 (JP) ................................ 2015-148600

(51) Int. Cl.

| | |
|---|---|
| ***G02B 5/20*** | (2006.01) |
| ***G03F 7/004*** | (2006.01) |
| ***G03F 7/00*** | (2006.01) |
| ***G03F 7/11*** | (2006.01) |
| ***C09B 69/10*** | (2006.01) |
| ***C09D 133/10*** | (2006.01) |
| ***G02B 5/22*** | (2006.01) |
| ***G03F 7/16*** | (2006.01) |
| ***G03F 7/20*** | (2006.01) |
| ***G03F 7/26*** | (2006.01) |
| ***H04N 9/04*** | (2006.01) |
| ***H04N 9/07*** | (2006.01) |
| ***C08F 2/50*** | (2006.01) |
| ***G03F 7/027*** | (2006.01) |
| ***G03F 7/105*** | (2006.01) |
| *C08K 5/56* | (2006.01) |
| *G02F 1/1335* | (2006.01) |

(Continued)

(52) U.S. Cl.

CPC .............. *G03F 7/0007* (2013.01); *C08F 2/50* (2013.01); *C09B 69/101* (2013.01); *C09B 69/103* (2013.01); *C09B 69/106* (2013.01); *C09B 69/108* (2013.01); *C09B 69/109* (2013.01); *C09D 133/10* (2013.01); *G02B 5/223* (2013.01); *G03F 7/027* (2013.01); *G03F 7/105* (2013.01); *G03F 7/11* (2013.01); *G03F 7/16* (2013.01); *G03F 7/168* (2013.01); *G03F 7/2002* (2013.01); *G03F 7/26* (2013.01); *H04N 9/045* (2013.01); *H04N 9/07* (2013.01); *C08F 220/06* (2013.01); *C08F 220/20* (2013.01); *C08F 222/1006* (2013.01); *C08F 222/20* (2013.01); *C08F 2220/1858* (2013.01); *C08F 2220/281* (2013.01); *C08F 2220/283* (2013.01); *C08F 2220/346* (2013.01); *C08F 2220/382* (2013.01); *C08F 2222/104* (2013.01); *C08F 2222/1026* (2013.01); *C08F 2222/1053* (2013.01); *C08K 5/56* (2013.01); *G02F 1/133514* (2013.01); *H01L 27/14621* (2013.01); *H04N 2209/042* (2013.01)

(58) Field of Classification Search

CPC ............... G02B 5/223; G02F 1/133514; G02F 1/133516; G03F 7/0007; G03F 7/027; G03F 7/028; G03F 7/105; H01L 27/14621

USPC ...................................... 430/7, 270.1, 281.1

See application file for complete search history.

(56) References Cited

U.S. PATENT DOCUMENTS

2014/0175348 A1 6/2014 Takahashi et al.
2017/0010530 A1* 1/2017 Idei ...................... G03F 7/0007

FOREIGN PATENT DOCUMENTS

JP 2007-277514 A 10/2007
JP 2013-028764 A 2/2013

(Continued)

OTHER PUBLICATIONS

International Search Report for PCT/JP2015/073431, dated Nov. 24, 2015.

Communication dated May 1, 2018, issued by the Korean Intellectual Property Office in corresponding Korean Application No. 10-2017-7004168.

International Preliminary Report on Patentability and Written Opinion, dated Mar. 7, 2017, in corresponding International Application No. PCT/JP2015/073431, 10 pages in English and Japanese.

(Continued)

*Primary Examiner* — John A McPherson
(74) *Attorney, Agent, or Firm* — Sughrue Mion, PLLC

(57) ABSTRACT

The coloring composition includes a curable compound and a colorant represented by $(D\text{-}L^1\text{-}Y—X—)_n—R^1—(R^2)_m$; $R^1$ represents a (m+n)-valent linking group, X represents —C(═O)O—, Y represents an alkylene group, $L^1$ represents a single bond or a divalent linking group, D represents a colorant structure. $R^2$ represents a monovalent substituent, m represents an integer of 1 to 13, n represents an integer of 2 to 14, m+n represents an integer of 3 to 15, $L^1$ (in a case where $L^1$ represents a single bond, D) and X are separated by Y by a distance of three or more carbon atoms, and at least one of D, $L^1$, $R^1$, $R^2$, X, or Y has an acid group.

23 Claims, No Drawings

(51) Int. Cl.

| | |
|---|---|
| *C08F 220/06* | (2006.01) |
| *C08F 220/20* | (2006.01) |
| *C08F 222/10* | (2006.01) |
| *C08F 222/20* | (2006.01) |
| *H01L 27/146* | (2006.01) |
| *C08F 220/18* | (2006.01) |
| *C08F 220/28* | (2006.01) |
| *C08F 220/34* | (2006.01) |
| *C08F 220/38* | (2006.01) |

(56) References Cited

FOREIGN PATENT DOCUMENTS

| | | | |
|---|---|---|---|
| JP | 2013-29760 | A | 2/2013 |
| JP | 2013-209435 | A | 10/2013 |
| JP | 6162165 | B2 | 7/2017 |
| KR | 10-2008-0084576 | A | 9/2008 |

OTHER PUBLICATIONS

Communication dated Feb. 13, 2017 from the Japanese Patent Office in counterpart Japanese application No. 2016-546414.

Communication dated Feb. 13, 2018 from the Japanese Patent Office in counterpart Japanese application No. 2016-546414.

Communication dated Oct. 3, 2017 from the Japanese Patent Office in counterpart Japanese application No. 2016-546414.

Communication dated Oct. 15, 2018 from the Taiwanese Patent Office in counterpart application No. 104127797.

* cited by examiner

COLORING COMPOSITION, CURED FILM, COLOR FILTER, METHOD OF MANUFACTURING COLOR FILTER, SOLID IMAGE PICKUP ELEMENT, AND IMAGE DISPLAY APPARATUS

CROSS-REFERENCE TO RELATED APPLICATIONS

This application is a Continuation of PCT International Application No. PCT/JP2015/73431, filed on Aug. 20, 2015, which claims priority under 35 U.S.C. § 119(a) to Japanese Patent Application No. 2014-179392, filed on Sep. 3, 2014 and Japanese Patent Application No. 2015-148600, filed on Jul. 28, 2015. Each of the above application(s) is hereby expressly incorporated by reference, in its entirety, into the present application.

BACKGROUND OF THE INVENTION

1. Field of the Invention

The present invention relates to a coloring composition. In particular, the present invention relates to a coloring composition which is preferable for manufacturing a color filter used in a solid image pickup element, an image display apparatus, or the like. In addition, the present invention relates to a cured film, a color filter, a solid image pickup element, and an image display apparatus in which the coloring composition is used.

2. Description of the Related Art

Recently, a digital camera, a mobile phone equipped with a camera, or the like has been widely used, and a demand for a solid image pickup element such as a charge coupled device (CCD) image sensor has increased significantly. As a key device of these displays and optical elements, a color filter has been used, and a demand to further increase the sensitivity and a demand to further reduce the size have increased. Typically, such a color filter includes colored patterns of three primary colors including red (R), green (G), and blue (B) and has a function of separating transmitted light into three primary colors.

A colorant used in such a color filter is required to have the following common properties. That is, for example, it is necessary that the colorant have light absorbing properties, which are preferable from the viewpoint of color reproducibility, and have excellent light fastness.

For example, as a quinophthalone colorant having excellent solvent solubility and fastness, JP2013-209435A discloses a quinophthalone colorant having 2 to 6 colorant structures derived from a quinophthalone colorant in one molecule.

On the other hand, JP2007-277514A discloses a pigment dispersant which has 2 to 9 sites having an ability to be adsorbed on pigments in one molecule. Examples of the site having an ability to be adsorbed on pigments include an organic colorant structure, a heterocyclic structure, an acid group, a group having a basic nitrogen atom, an urea group, an urethane group, a group having a coordinating oxygen atom, a hydrocarbon group having 4 or more carbon atoms, an alkoxysilyl group, an epoxy group, an isocyanate group, and a hydroxyl group.

SUMMARY OF THE INVENTION

In a coloring composition used in a color filter or the like, further improvement in heat resistance and color transfer properties during thermal curing for forming a pattern is required.

The present inventors performed an investigation on a coloring composition including the colorant disclosed in JP2013-209435A and found that decomposition occurs during thermal curing and heat resistance and color transfer properties are poor.

On the other hand, the present inventors performed an investigation on the pigment dispersant disclosed in JP2007-277514A and found that, although the pigment dispersant has heat resistance, decomposition is likely to occur between an ester group and an ethylene group adjacent to the ester group in an extremely high-temperature environment.

The present invention has been made in consideration of the above-described circumstances, and an object thereof is to provide a coloring composition having excellent heat resistance and color transfer properties. In addition, another object of the present invention is to provide a cured film, a color filter, a method of manufacturing a color filter, a solid image pickup element, and an image display apparatus in which the above-described coloring composition is used.

As a result of detailed investigation, the present inventors found that, in a colorant polymer having 2 to 14 colorant structures in a branched shape, by introducing a group, which is adjacent to a specific linking group and is separated by a distance of three or more carbon atoms, into the colorant polymer, heat resistance and color transfer properties of a coloring composition including the colorant polymer can be improved, thereby completing the present invention.

Specifically, the above-described problems can be solved using the following means <1>, preferably <2> to <22>.

<1> A coloring composition comprising a curable compound and a colorant represented by the following Formula (1), $$(D\text{-}L^1\text{-}Y\text{—}X\text{—})_n\text{—}R^1\text{—}(R^2)_m, \qquad \text{Formula (1):}$$

in Formula (1), $R^1$ represents a (m+n)-valent linking group, X represents —C(=O)O—, —C(=O)—, —C(=O)NR$^{10}$—, —O—, —S(=O)—, or —$SO_2$—, $R^{10}$ represents a hydrogen atom or an alkyl group, Y represents an alkylene group, $L^1$ represents a single bond or a divalent linking group, D represents a colorant structure, $R^2$ represents a monovalent substituent, m represents an integer of 1 to 13, n represents an integer of 2 to 14, m+n represents an integer of 3 to 15, in a case where m represents 2 or more, plural $R^2$'s may be different from each other, in a case where n represents 2 or more, plural D's may be different from each other, in a case where $L^1$ represents a divalent linking group, $L^1$ and X are separated by Y by a distance of three or more carbon atoms, in a case where $L^1$ represents a single bond, D and X are separated by Y by a distance of three or more carbon atoms, and at least one of D, $L^1$, $R^1$, $R^2$, X, or Y has an acid group.

<2> The coloring composition according to <1>, in which D in Formula (1) is derived from a colorant selected from the group consisting of a dipyrromethene colorant, a triarylmethane colorant, a xanthene colorant, a cyanine colorant, a squarylium colorant, an anthraquinone colorant, a quinophthalone colorant, a phthalocyanine colorant, a subphthalocyanine colorant, and an azo colorant.

<3> The coloring composition according to <1> or <2>, in which D in Formula (1) has a cation site and a counter anion or has a cation site and an anion site in one molecule, the counter anion is at least one selected from the group consisting of a sulfonic acid anion, a sulfonyl imide anion, a bis(alkylsulfonyl)imide anion, a tris(alkylsulfonyl)methide anion, a carboxylic acid anion, a tetraaryl borate anion, $BF_4^-$, $PF_6^-$, and $SbF_6^-$, and the anion site is a sulfonyl imide anion.

<4> The coloring composition according to any one of <1> to <3>, in which Y in Formula (1) represents an unsubstituted linear alkylene group.

<5> The coloring composition according to any one of <1> to <4>, in which $R^2$ in Formula (1) includes a repeating unit derived from a vinyl compound having an acid group.

<6> The coloring composition according to any one of <1> to <5>, in which $R^2$'s in Formula (1) include repeating units, and an average number of the repeating units is 2 to 20.

<7> The coloring composition according to any one of <1> to <6>, in which X in Formula (1) represents *—C(═O)O—#,

* is bonded to Y, and is bonded to $R^1$.

<8> The coloring composition according to any one of <1> to <7>, in which the colorant represented by Formula (1) includes a group having an ethylenically unsaturated bond.

<9> The coloring composition according to any one of <1> to <8>, in which $R^2$ in Formula (1) includes a group having an ethylenically unsaturated bond.

<10> The coloring composition according to any one of <1> to <9>, in which $R^1$ in Formula (1) represents a linking group represented by the following Formula (2), a linking group represented by the following Formula (3), a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms, Formula (2)

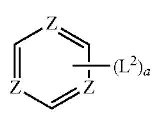

in Formula (2), Z's each independently represent $CR^{20}$ or N, $L^2$'s each independently represent a single bond or a p-valent linking group, $R^{20}$ represents a hydrogen atom or a substituent, a represents an integer of 1 to 6, p represents an integer of 2 or more, and in a case where $L^2$ represents a p-valent linking group, $L^2$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms, and Formula (3)

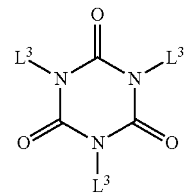

in Formula (3), $L^3$'s each independently represent a single bond or a q-valent linking group, q represents an integer of 2 or more, and in a case where $L^3$ represents a q-valent linking group, $L^3$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

<11> The coloring composition according to any one of <1> to <10>, in which $L^1$ in Formula (1) represents a single bond,

—S—, a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

<12> The coloring composition according to any one of <1> to <11>, in which in Formula (1), m represents 1 to 5 and n represents 2 to 8.

<13> The coloring composition according to any one of <1> to <12>, in which a weight average molecular weight of the colorant represented by Formula (1) is 2000 to 15000.

<14> The coloring composition according to any one of <1> to <13>, further comprising a pigment other than the colorant represented by Formula (1).

<15> The coloring composition according to any one of <1> to <14>, further comprising a photopolymerization initiator.

<16> The coloring composition according to any one of <1> to <15> which is used for forming a colored layer of a color filter.

<17> A cured film which is obtained by curing the coloring composition according to any one of <1> to <15>.

<18> A color filter which is obtained using the coloring composition according to any one of <1> to <15>.

<19> A method of manufacturing a color filter comprising:

applying the coloring composition according to any one of <1> to <15> to a support to form a coloring composition layer;

exposing the coloring composition layer in a pattern shape; and forming a colored pattern by removing a non-exposed portion by development.

<20> A method of manufacturing a color filter comprising:

forming a colored layer by applying the coloring composition according to any one of <1> to <15> to a support to form a coloring composition layer and curing the coloring composition layer;

forming a photoresist layer on the colored layer;

obtaining a resist pattern by patterning the photoresist layer by exposure and development; and dry-etching the colored layer by using the resist pattern as an etching mask.

<21> A solid image pickup element comprising the color filter according to <18> or a color filter which is manufactured using the method of manufacturing a color filter according to <19> or <20>.

<22> An image display apparatus comprising the color filter according to <18> or a color filter which is manufactured using the method of manufacturing a color filter according to <19> or <20>.

According to the present invention, a coloring composition and a colorant having excellent heat resistance and color transfer properties can be provided. In addition, a cured film, a color filter, a method of manufacturing a color filter, a solid image pickup element, and an image display apparatus in which the above-described coloring composition is used can be provided.

DESCRIPTION OF THE PREFERRED EMBODIMENTS

Hereinafter, the details of the present invention will be described.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, "actinic ray" or "radiation" denotes, for example, a bright light spectrum of a mercury lamp, a far ultraviolet ray represented by excimer laser, an extreme ultraviolet lithography ray (EUV ray), an X-ray, or an electron ray. In addition, in the present invention, "light" denotes an actinic ray or radiation. In this specification, unless specified otherwise, "exposure" refers to not only exposure using a bright light spectrum of a mercury lamp, far ultraviolet rays represented by excimer laser, X-rays, or EUV rays but also drawing using corpuscular beams such as electron rays or ion beams.

In this specification, numerical ranges represented by "to" include numerical values before and after "to" as lower limits and upper limits.

In this specification, a total solid content denotes the total mass of components of a total composition of a coloring composition excluding a solvent.

A solid content denotes a solid content at 25° C.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, "monomer" has the same definition as "monomer". In this specification, a monomer is distinguished from an oligomer and a polymer and denotes a compound having a weight average molecular weight of 2000 or lower. In this specification, a polymerizable compound denotes a compound having a polymerizable functional group and may be either a monomer or a polymer. A polymerizable functional group denotes a group relating to a polymerization reaction.

In this specification, in a chemical formula, Me represents a methyl group, Et represents an ethyl group, Pr represents a propyl group, Bu represents a butyl group, and Ph represents a phenyl group.

In this specification, the term "step" denotes not only an individual step but also a step which is not clearly distinguishable from another step as long as an effect expected from the step can be achieved.

In this specification, a weight average molecular weight and a number average molecular weight are defined as values in terms of polystyrene obtained by gel permeation chromatography (GPC). In this specification, an weight average molecular weight (Mw) and a number average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

<Coloring Composition>

A coloring composition according to the present invention includes a curable compound and a colorant represented by Formula (1) described below.

With the above-described configuration, a coloring composition having excellent heat resistance and color transfer properties can be provided.

The reason why the above-described effect is obtained is not clear but is presumed to be as follows. In the colorant represented by Formula (1) described below, as a linking group Y bonded to a group represented by X, an alkylene group which is separated by a distance of three or more carbon atoms is introduced into a portion where thermal decomposition cannot be prevented by a methylene group or an ethylene group. As a result, thermal decomposition at a high temperature can be reduced, and heat resistance and color transfer properties are excellent. Hereinafter, the details of the present invention will be described.

<<Colorant Represented by Formula (1)>>

The coloring composition according to the present invention includes at least one colorant represented by the following Formula (1) (hereinafter, also referred to simply as "colorant (A)").

The colorant (A) is a colorant polymer having 2 to 14 colorant structures in a branched shape. The colorant (A) functions as, for example, a colorant in the coloring composition according to the present invention.

$$(D\text{-}L^1\text{-}Y—X—)_n—R^1—(R^2)_m, \qquad \text{Formula (1)}$$

In Formula (1), $R^1$ represents a (m+n)-valent linking group.

X represents —C(=O)O—, —C(=O)—, —C(=O)NR$^{10}$—, —O—, —S(=O)—, or —SO$_2$—, and R$^{10}$ represents a hydrogen atom or an alkyl group.

Y represents an alkylene group.

$L^1$ represents a single bond or a divalent linking group.

D represents a colorant structure.

$R^2$ represents a monovalent substituent.

m represents an integer of 1 to 13.

n represents an integer of 2 to 14.

m+n represents an integer of 3 to 15.

In a case where m represents 2 or more, plural $R^2$'s may be different from each other, and in a case where n represents 2 or more, plural D's may be different from each other.

In a case where $L^1$ represents a divalent linking group, $L^1$ and X are separated by Y by a distance of three or more carbon atoms, and in a case where $L^1$ represents a single bond, D and X are separated by Y by a distance of three or more carbon atoms.

At least one of D, $L^1$, $R^1$, $R^2$, X, or Y has an acid group.

In Formula (1), m represents 1 to 13. m represents preferably 1 to 5, more preferably an integer of 1 to 4, and still more preferably 1 to 3.

In Formula (1), n represents 2 to 14. n represents preferably 2 to 8, more preferably 2 to 7. and still more preferably 3 to 6.

In Formula (1), m+n represents 3 to 15.

In one colorant (A), m and n each independently represent an integer. The coloring composition according to the present invention may include plural colorants (A)' having different m's and n's. Therefore, in the coloring composition according to the present invention, each of average values of m and n may not be an integer.

In the present invention, it is preferable that, in one colorant (A), m represents an integer of 1 to 13, n represents an integer of 2 to 14, and m+n represents an integer of 3 to 15.

For example, in a case where the colorant (A) is a mixture including 50 mass % of a colorant a1 in which m represents 3 and n represents 1 in Formula (1) and 50 mass % of a colorant a2 in which m represents 2 and n represents 2 in Formula (1), an average value of m's is 2.5 and an average value of n's is 1.5. However, the colorant a2 included in the mixture satisfies the conditions of m; an integer of 1 to 13, n: an integer of 2 to 14, and m+n: an integer of 3 to 15, and thus the mixture corresponds to the colorant (A) according to the present invention.

In addition, in the case of a mixture of plural colorants (A), it is preferable that an average value of m's is 1 to 13, and an average value of n's is to 2 to 14.

<<<$R^1$>>>

In Formula (1), $R^1$ represents a (m+n)-valent linking group. m+n satisfies 3 to 15.

The (m+n)-valent linking group represented by $R^1$ is a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may have a substituent.

Specific examples of the (m+n)-valent linking group represented by $R^1$ include a group (in which a ring structure may be formed) including one of the following structural unit or a combination of two or more of the structural units.

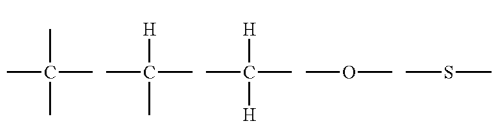

-continued

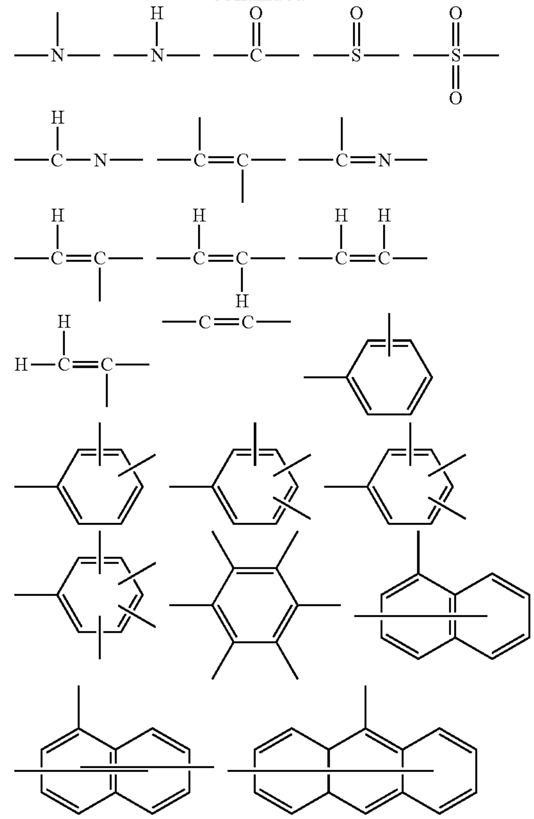

It is preferable that the (m+n)-valent linking group represented by $R^1$ is a group composed of 1 to 60 carbon atoms, 0 to 10 nitrogen atoms, 0 to 40 oxygen atoms, 1 to 120 hydrogen atoms, and 0 to 10 sulfur atoms. It is more preferable that the (m+n)-valent linking group is a group composed of 1 to 50 carbon atoms, 0 to 10 nitrogen atoms, 0 to 30 oxygen atoms, 1 to 100 hydrogen atoms, and 0 to 7 sulfur atoms. It is still more preferable that the (m+n)-valent linking group is a group composed of 1 to 40 carbon atoms, 0 to 8 nitrogen atoms, 0 to 20 oxygen atoms, 1 to 80 hydrogen atoms, and 0 to 5 sulfur atoms.

The (m+n)-valent linking group represented by $R^1$ may have a substituent. Examples of the substituent include: an alkyl group having 1 to 20 carbon atoms such as a methyl group or an ethyl group; an aryl group having 6 to 16 carbon atoms such as a phenyl group or a naphthyl group; a hydroxyl group; an amino group; a carboxyl group; a sulfonamide group; a N-sulfonylamide group; an acyloxy group having 1 to 6 carbon atoms such as an acetoxy group; an alkoxy group having 1 to 6 carbon atoms such as a methoxy group or an ethoxy group; a halogen atom such as chlorine or bromine; an alkoxycarbonyl group having 2 to 7 carbon atoms such as a methoxycarbonyl group, an ethoxycarbonyl group, or a cyclohexyloxycarbonyl group; a cyano group; and a carbonate group such as t-butyl carbonate.

It is preferable that the (m+n)-valent linking group represented by $R^1$ is a linking group represented by the following Formula (2), a linking group represented by the following Formula (3), a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

Here, the main chain refers to a skeleton of the linking group and does not include a substituent. In addition, the heteroatom refers to an atom having a valence of two or more other than a carbon atom, and examples thereof include a nitrogen atom, an oxygen atom, a sulfur atom, and a phosphorus atom.

Formula (2)

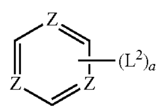

In Formula (2), Z's each independently represent $CR^{20}$ or N, $L^2$'s each independently represent a single bond or a p-valent linking group, $R^{20}$ represents a hydrogen atom or a substituent, a represents an integer of 1 to 6, p represents an integer of 2 or more, and in a case where $L^2$ represents a p-valent linking group, $L^2$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

In Formula (2), $R^{20}$ represents a hydrogen atom or a substituent, and examples of the substituent are as described above as the substituent which may be included in $R^1$.

In order for the valence of the linking group represented by Formula (2) to satisfy m+n, $L^2$'s each independently represent a single bond or a p-valent linking group, a represents an integer of 1 to 6, and p represents an integer of 2 or more.

Formula (3)

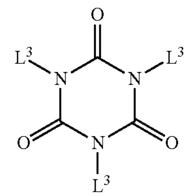

in Formula (3), $L^3$'s each independently represent a single bond or a q-valent linking group, q represents an integer of 2 or more, and in a case where $L^3$ represents a q-valent linking group, $L^3$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

It more preferable that the (m+n)-valent linking group represented by $R^1$ is a linking group including an alkylene group or a combination of an alkylene group and an ester group in which a main chain includes at least one portion where three or more carbon atoms are continuously located, or a linking group including an alkylene group or a combination of an alkylene group and an ester group in which a main chain includes at least one portion where five or more carbon atoms are continuously located.

In order for the valence of the linking group represented by Formula (3) to satisfy m+n, $L^3$'s each independently represent a single bond or a q-valent linking group, and q represents an integer of 2 or more.

Specific examples of the (m+n)-valent linking group represented by $R^1$ are as follows. In the following description, "#" represents a direct bond to X or $R^2$, and p1 to p3, q1 to q4, and r1 to r6 each independently represent an integer of 0 or more. p1+p2+p3, q1+q2+q3+q4, and r1+r2+r3+r4+r5+r6 each independently represent an integer of 1 or more and preferably 40 or less.

However, the present invention is not limited to these exemplary compounds.

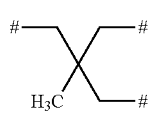

(1)

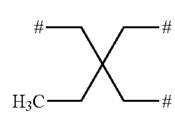

(2)

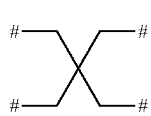

(3)

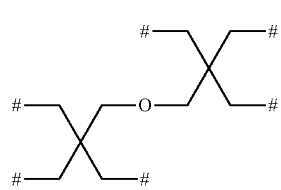

(4)

-continued
(5)
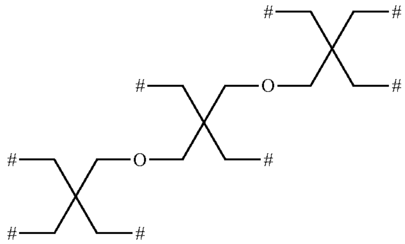
(6)
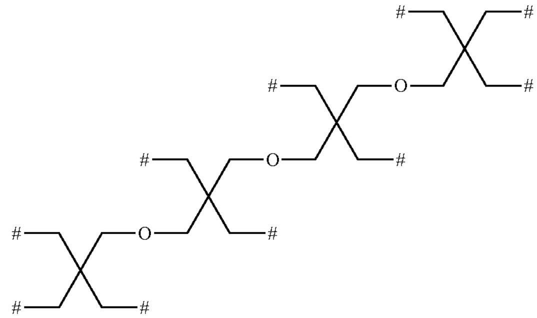
(7)
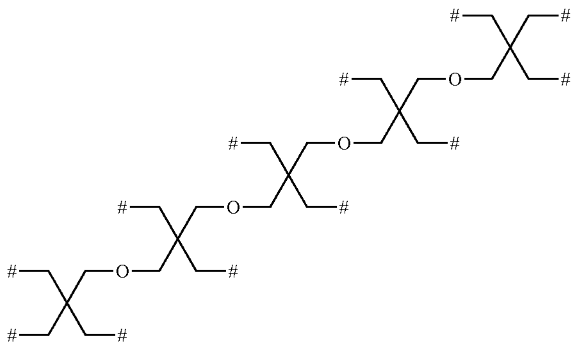
(8)
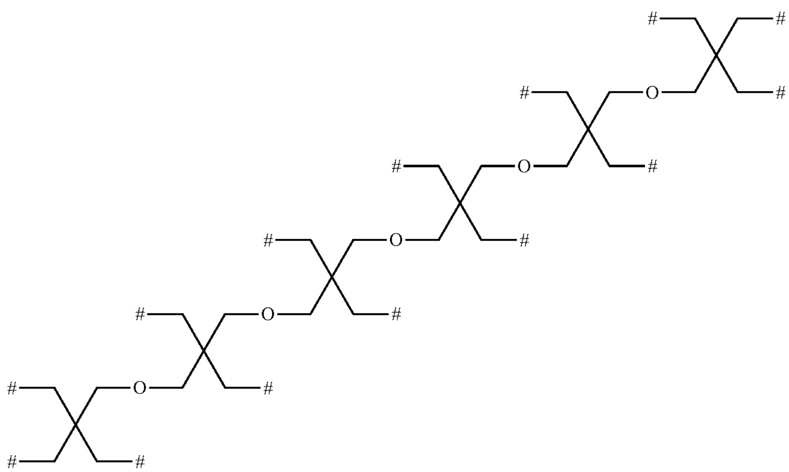
(9)
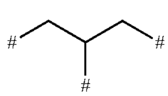
(10)
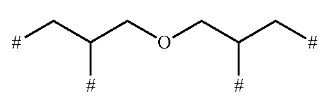
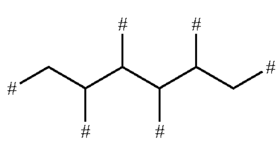
(11)
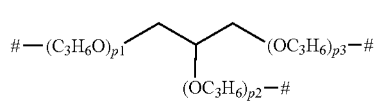
(13)
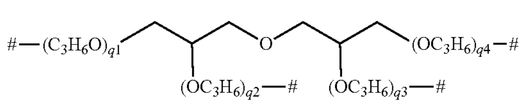
(14)
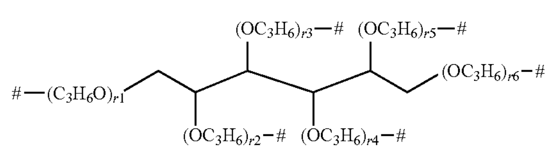

-continued

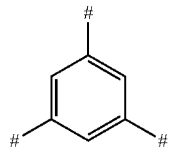

(15)

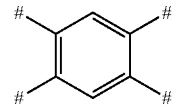

(16)

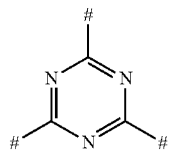

(17)

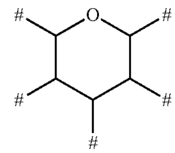

(18)

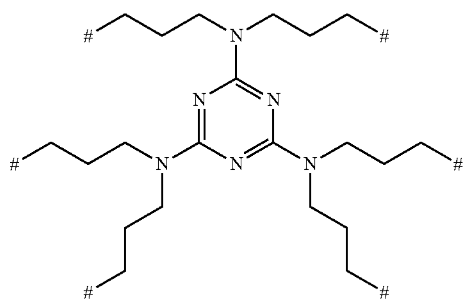

(19)

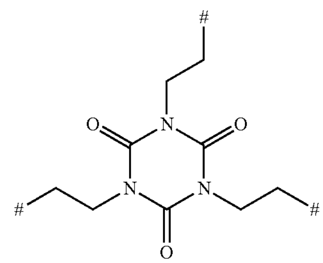

(20)

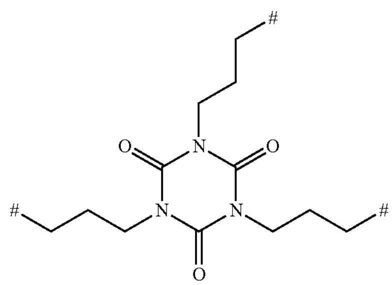

(21)

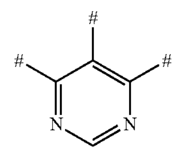

(22)

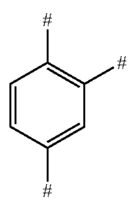

(23)

Among the above-described examples of the (m+n)-valent linking group represented by $R^1$, (1) to (14) are preferable, (1) to (6) and (9) to (11) are more preferable, and (1) to (3), (9), and (11) are still more preferable.

<<<X>>>

In Formula (1), X represents —C(═O)O—, —C(═O)—, —C(═O)NR$^{10}$—, —O—, —S(═O)—, or —$SO_2$—, and $R^{10}$ represents a hydrogen atom or an alkyl group. In a case where X represents —C(═O)O— or —C(═O)NR$^{10}$—, a bond orientation may be any orientation. That is, carbonyl carbon may be bonded to Y or $R^1$.

It is preferable that X represents —C(═O)— or —O—, it is more preferable that X represents —C(═O)O—, and it is still more preferable that X represents —C(═O)O— and carbonyl carbon is bonded to Y. That is, it is even still more preferable that X represents *—C(═O)O—#, * is bonded to Y, and # is bonded to $R^1$.

<<<Y>>>

In Formula (1), Y represents an alkylene group, and the alkylene group may be linear, branched, or cyclic and is preferably linear. In addition, the alkylene group may be unsubstituted or may have a substituent and preferably is unsubstituted. Examples of the substituent are as described above as the substituent which may be included in $R^1$. It is preferable Y represents a unsubstituted linear alkylene group.

in a case where $L^1$ represents a divalent linking group, $L^1$ and X are separated by Y, which is an alkylene group, by a distance of three or more carbon atoms, and in a case where $L^1$ represents a single bond, D and X are separated by Y, which is an alkylene group, by a distance of three or more carbon atoms. Here, the number of carbon atoms refers to the number of carbon atoms having the shortest length present in a main chain linking $L^1$ and X (in a case where L1 represents a single bond, D and X) to each other and does not include the number of carbon atoms substituted. That is, in the following Formulae (B) and (C), the total number of carbon atoms in an alkylene group linking $L^1$ and X to each other is 3 which is the same as in the following Formula (A), the number of carbon atoms separating $L^1$ and X is 2, and the above-described conditions are not satisfied.

$L^1$ and X (in a case where $L^1$ represents a single bond, D and X) are separated by Y by a distance of preferably three or more carbon atoms and more preferably 5 or more atoms. According to this embodiment, heat resistance can be further improved. The upper limit value is not particularly limited and is typically 10 or less.

Formula (A)

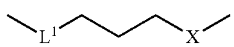

Formula (B)

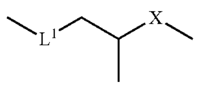

Formula (C)

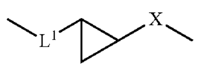

<<<$L^1$>>>

In Formula (1), $L^1$ represents a single bond or a divalent linking group.

The divalent linking group is a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may have a substituent.

Specific examples of the divalent linking group include a group including one of the following structural unit or a combination of two or more of the structural units.

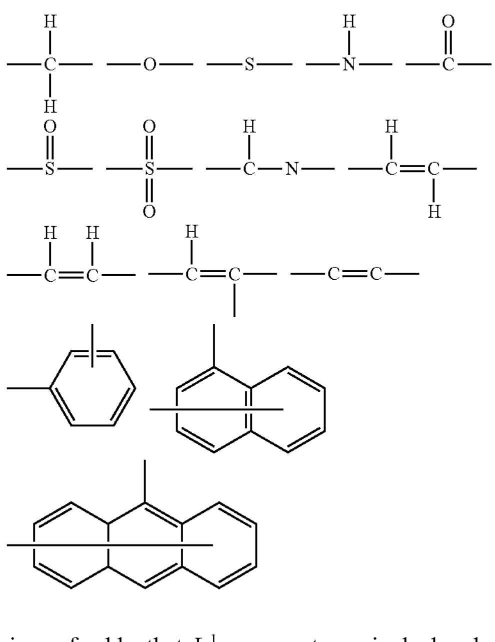

It is preferable that $L^1$ represents a single bond or a divalent linking group composed of 0 to 50 carbon atoms, 0 to 8 nitrogen atoms, 0 to 25 oxygen atoms, 0 to 100 hydrogen atoms, and 0 to 10 sulfur atoms. It is more preferable that $L^1$ represents a single bond or a divalent linking group composed of 0 to 30 carbon atoms, 0 to 6 nitrogen atoms, 0 to 15 oxygen atoms, 0 to 50 hydrogen atoms, and 0 to 7 sulfur atoms. It is still more preferable that $L^1$ represents a single bond or a divalent linking group composed of 0 to 10 carbon atoms, 0 to 5 nitrogen atoms, 0 to 10 oxygen atoms, 0 to 30 hydrogen atoms, and 0 to 5 sulfur atoms. It is even still more preferable that $L^1$ represents a single bond or a divalent linking group in which a main chain includes at least one sulfur atom, that is at least one —S—.

It is preferable that $L^1$ represents a linking group which has a main chain including a single bond, —S—, and plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms, The divalent linking group represented by $L^1$ may have a substituent. Examples of the substituent include: an alkyl group having 1 to 20 carbon atoms such as a methyl group or an ethyl group; an aryl group having 6 to 16 carbon atoms such as a phenyl group or a naphthyl group; a hydroxyl group; an amino group; a carboxyl group; a sulfonamide group, a N-sulfonylamide group; an acyloxy group having 1 to 6 carbon atoms such as an acetoxy group; an alkoxy group having 1 to 6 carbon atoms such as a methoxy group or an ethoxy group: a halogen atom such as chlorine or bromine; an alkoxycarbonyl group having 2 to 7 carbon atoms such as a methoxycarbonyl group, an ethoxycarbonyl group, or a cyclohexyloxycarbonyl group; a cyano group; and a carbonate group such as t-butyl carbonate.

<<<$R^2$>>>

In Formula (1), $R^2$ represents a monovalent substituent, and in a case where m represents 2 or more, plural $R^2$'s may be different from each other. Regarding $R^2$, there are two embodiments including one embodiment in which $R^2$ does not have a repeating unit and the other embodiment in which $R^2$ has a repeating unit.

<<<<$R^2$ which does not have Repeating Unit>>>

Examples of the monovalent substituent represented by $R^2$ which does not have a repeating unit include a halogen atom, an alkyl group, an alkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl or heterocyclic azo group, an imido group, a phosphino group, a phosphinyl group, a phosphinyloxy group, a phosphinylamino group, and a silyl group. The details will be described below.

Specific examples the monovalent substituent represented by $R^2$ which does not have a repeating unit include a halogen atom (for example, a fluorine atom, a chlorine atom, a bromine atom, or an iodine atom), a linear or branched alkyl group (a linear or branched substituted or unsubstituted alkyl group, preferably an alkyl group having 1 to 30 carbon atoms; for example, methyl, ethyl, n-propyl, isopropyl, t-butyl, n-octyl, 2-chloroethyl, 2-cyanoethyl, or 2-ethylhexyl), and a cyclic alkyl group (preferably. a substituted or unsubstituted cyclic cycloalkyl group having 3 to 30 carbon atoms (for example, cyclohexyl or cyclopentyl) or a cyclic alkyl group having a polycyclic structure, for example, a bicyclic alkyl group (a so-called bicycloalkyl group, preferably a substituted or unsubstituted bicyclic alkyl group having 5 to 30 carbon atoms; for example, bicyclo[1,2,2]heptane-2-yl or bicyclo[2,2,2]octan-3-yl) or a tricyclic alkyl group (a so-called tricycloalkyl group); as the cyclic alkyl group, a monocyclic alkyl group or a bicyclic alkyl group is preferable, and a monocyclic alkyl group is more preferable).

Specific examples further include a linear or branched alkenyl group (a linear or branched substituted or unsubstituted alkenyl group, preferably, an alkenyl group having 2 to 30 carbon atoms; for example, vinyl, allyl, prenyl, geranyl, or oleyl), a cyclic alkenyl group (preferably, a substituted or unsubstituted cyclic alkenyl group having 3 to 30 carbon atoms (for example, 2-cyclopenten-1-yl or 2-cyclohexen-1-yl) or a cyclic alkenyl group having a polycyclic structure, for example, a bicyclic alkenyl group (preferably a substituted or unsubstituted bicyclic alkenyl group having 5 to 30 carbon atoms; for example, bicyclo[2,2,1]hept-2-en-1-yl or bicyclo[2,2,2]oct-2-en-4-yl) or a tricyclic alkenyl group; as the cyclic alkenyl group, a monocyclic alkenyl group is preferable), and an alkynyl group (preferably a substituted or unsubstituted alkynyl group having 2 to 30 carbon atoms; for example, ethynyl, propargyl, or trimethylsilylethynyl group).

Specific examples further include an aryl group (preferably a substituted or unsubstituted aryl group having 6 to 30 carbon atoms; for example, phenyl, p-tolyl, naphthyl, m-chlorophenyl, or o-hexadecanoylaminophenyl), a heterocyclic group (preferably a substituted or unsubstituted, saturated or unsaturated, aromatic or non-aromatic, and monocyclic or condensed 5-membered to 7-membered heterocyclic group, more preferably a heterocyclic group having a ring-constituting atom selected from a carbon atom, a nitrogen atom, and a sulfur atom and having at least one heteroatom selected from a nitrogen atom, an oxygen atom, and a sulfur atom, and still more preferably a 5-membered or 6-membered aromatic heterocyclic group having 3 to 30 carbon atoms; for example, 2-furyl, 2-thienyl, 2-pyridyl, 4-pyridyl, 2-pyrimidinyl, or 2-benzothiazolyl), a cyano group, a hydroxyl group, a nitro group, and a carboxyl group.

Specific examples further include an alkoxy group (preferably a substituted or unsubstituted alkoxy group alkoxy group having 1 to 30 carbon atoms; for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms; for example, phenoxy, 2-methylphenoxy, 2,4-di-t-amylphenoxy, 4-t-butylphenoxy, 3-nitrophenoxy, or 2-tetradecanoylaminophenoxy), a silyloxy group (preferably a silyloxy group having 3 to 20 carbon atoms; for example, trimethylsilyloxy or t-butyldimethylsilylsilyloxy), and a heterocyclic oxy group (preferably a substituted or unsubstituted heterocyclic oxy group having 2 to 30 carbon atoms in which a heterocycle is preferably configured as described above regarding the heterocyclic group; for example, 1-phenyltetrazole-5-oxy or 2-tetrahydropyranyloxy).

Specific examples further include an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms; for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms; for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms; for example, methoxycarbonyloxy, ethoxycarbonyloxy, t-butoxycarbonyloxy, or n-octylcarbonyloxy), and an aryloxycarbonyloxy group (preferably a substituted or unsubstituted aryloxycarbonyloxy group having 7 to 30 carbon atoms; for example, phenoxycarbonyloxy, p-methoxyphenoxycarbonyloxy, or p-n-hexadecyloxyphenoxycarbonyloxy).

Specific examples further include an amino group (preferably a substituted or unsubstituted alkylamino group having 1 to 30 carbon atoms, a substituted or unsubstituted arylamino group having 6 to 30 carbon atoms, or a heterocyclic amino group having 0 to 30 carbon atoms; for example, amino, methylamino, dimethylamino, anilino, N-methyl-anilino, diphenylamino, or N-1,3,5-triazine-2-yl amino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms; for example, formylamino, acetylamino, pivaloylamino, lauroylamino, benzoylamino, or 3,4,5-tri-n-octyloxyphenylcarbonylamino), an aminocarbonylamino group (preferably a substituted or unsubstituted aminocarbonylamino group having 1 to 30 carbon atoms; for example, carbamoylamino, N,N-dimethylaminocarbonylamino, N,N-diethylaminocarbonylamino, or morpholinocarbonylamino), and an alkoxycarbonylamino group (preferably a substituted or unsubstituted alkoxycarbonylamino group having 2 to 30 carbon atoms; for example, methoxycarbonylamino, ethoxycarbonylamino, t-butoxycarbonylamino, n-octadecyloxycarbonylamino, or N-methyl-methoxycarbonylamino).

Specific examples further include an aryloxycarbonylamino group (preferably a substituted or unsubstituted aryloxycarbonylamino group having 7 to 30 carbon atoms; for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms; for example, sulfamoylamino, N,N-dimethylaminosulfonylamino, or N-n-octylaminosulfonylamino), an alkyl- or aryl-sulfonylamino group (preferably a substituted or unsubstituted alkylsulfonylamino group having 1 to 30 carbon atoms or a substituted or unsubstituted arylsulfonylamino group having 6 to 30 carbon atoms; for example, methylsulfonylamino, butylsulfonylamino, phenylsulfonylamino, 2,3,5-trichlorophenylsulfonylamino, or p-methylphenylsulfonylamino), and a mercapto group.

Specific examples further include an alkylthio group (preferably a substituted or unsubstituted alkylthio group having 1 to 30 carbon atoms; for example, methylthio, ethylthio, or n-hexadecylthio), an arylthio group (preferably a substituted or unsubstituted arylthio group having 6 to 30 carbon atoms; for example, phenylthio, p-chlorophenylthio, or m-methoxyphenylthio), a heterocyclic thio group (preferably a substituted or unsubstituted heterocyclic thio group having 2 to 30 carbon atoms in which a heterocycle is preferably configured as described above regarding the heterocyclic group; for example, 2-benzothiazolylthio or 1-phenyltetrazole-5-ylthio), a sulfamoyl group (preferably a substituted or unsubstituted sulfamoyl group having 0 to 30 carbon atoms; for example, N-ethylsulfamoyl, N-(3-dodecyloxypropyl)sulfamoyl, N,N-dimethylsulfamoyl, N-acetylsulfamoyl, N-benzoylsulfamoyl, or N-(N'-phenylcarbamoyl)sulfamoyl), and a sulfo group.

Specific examples include an alkyl- or aryl-sulfinyl group (preferably a substituted or unsubstituted alkylsulfinyl group having 1 to 30 carbon atoms or a substituted or unsubstituted arylsulfinyl group having 6 to 30 carbon atoms; for example, methylsulfinyl, ethylsulfinyl, phenylsulfinyl, or p-methylphenylsulfinyl), an alkyl- or aryl-sulfonyl group (preferably a substituted or unsubstituted alkylsulfonyl group having 1 to 30 carbon atoms or a substituted or unsubstituted arylsulfonyl group having 6 to 30 carbon atoms; for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, or a substituted or unsubstituted arylcarbonyl group having 7 to 30 carbon atoms; for example, acetyl, pivaloyl, 2-chloroacetyl, stearoyl, benzoyl, or p-n-octyloxyphenylcarbonyl), and an aryloxycarbonyl group (preferably a substituted or unsubstituted aryloxycarbonyl group having 7 to 30 carbon atoms; for example, phenoxycarbonyl, o-chlorophenoxycarbonyl, m-nitrophenoxycarbonyl, or p-t-butylphenoxycarbonyl).

Specific examples further include an alkoxycarbonyl group (preferably a substituted or unsubstituted alkoxycarbonyl group having 2 to 30 carbon atoms; for example, methoxycarbonyl, ethoxycarbonyl, t-butoxycarbonyl, or n-octadecyloxycarbonyl), a carbamoyl group (preferably a substituted or unsubstituted carbamoyl group having 1 to 30 carbon atoms; for example, carbamoyl, N-methylcarbamoyl, N,N-dimethylcarbamoyl, N,N-di-n-octylcarbamoyl, or N-(methylsulfonyl)carbamoyl), an aryl- or heterocyclic azo group (preferably a substituted or unsubstituted aryl azo group having 6 to 30 carbon atoms or a substituted or unsubstituted heterocyclic azo group having 3 to 30 carbon atoms (in which a heterocycle is preferably configured as described above regarding the heterocyclic group); for example, phenylazo, p-chlorophenylazo, or 5-ethylthio-1,3,4-thiadiazol-2-ylazo), an imido group (preferably a substituted or unsubstituted imido group having 2 to 30 carbon atoms; for example, N-succinimido or N-phthalimido), a phosphino group (preferably a substituted or unsubstituted phosphino group having 2 to 30 carbon atoms; for example, dimethylphosphino, diphenylphosphino, or methylphenoxyphosphino), and a phosphinyl group (preferably a substituted or unsubstituted phosphinyl group having 2 to 30 carbon atoms; for example, phosphinyl, dioctyloxyphosphinyl, or diethoxyphosphinyl).

Specific examples further include a phosphinyloxy group (preferably a substituted or unsubstituted phosphinyloxy group having 2 to 30 carbon atoms; for example, diphenoxyphosphinyloxy or dioctyloxyphosphinyloxy), a phosphinylamino group (preferably a substituted or unsubstituted phosphinylamino group having 2 to 30 carbon atoms; for example, dimethoxyphosphinylamino or dimethylaminophosphinylamino), and a silyl group (preferably a substituted or unsubstituted silyl group having 3 to 30 carbon atoms; for example, trimethylsilyl, t-butyldimethylsilyl, or phenyldimethylsilyl).

Regarding a functional group having a hydrogen atom among the above-described functional groups, the hydrogen atom in the functional group may be substituted with the above-described group.

It is preferable that $R^2$ which does not have a repeating unit is the following Formula (NR).

$$*\text{—X—Y-}L^1\text{-}R^T \qquad \text{Formula (NR)}$$

In Formula (NR), X, Y, and $L^1$ have the same definitions and the preferable embodiments as X, Y, and $L^1$ in Formula (1). $R^T$ represents an alkyl or aryl group having an acid group and/or a polymerizable group. "*" represents a direct bond to $R^1$.

As the acid group, a carboxyl group, a sulfo group, or a phosphate group is preferable, and a carboxyl group is more preferable. The number of acid groups in $R^T$ is preferably 1 to 5.

Examples of the polymerizable group include a well-known polymerizable group which is crosslinkable by a radical, an acid or heat, for example, a group including an ethylenically unsaturated bond, a cyclic ether group (an epoxy group or an oxetane group), or a methylol group. A group including an ethylenically unsaturated bond is preferable, and a (meth)acryloyl group is more preferable. The number of polymerizable groups in $R^T$ is preferably 1 to 4.

It is preferable that $R^T$ represents an acid group.

<<<<$R^2$ which has Repeating Unit>>>

It is preferable that the monovalent substituent represented by $R^2$ which has a repeating unit has a repeating unit derived from a vinyl compound and at least one selected from the group consisting of an ester polymer, an ether polymer, an urethane polymer, an amide polymer, an epoxy polymer, a silicone polymer, and a modified product or copolymer thereof [for example, a polyether/polyurethane copolymer or a copolymer of polyether/a polymer of a vinyl compound (which may be a random copolymer, a block copolymer, or a graft copolymer)], it is more preferable that the monovalent substituent represented by $R^2$ which has a repeating unit has a repeating unit derived from a vinyl compound and at least one selected from the group consisting of an ether polymer, an ether polymer, an urethane polymer, and a modified product or copolymer thereof, and it is still more preferable that the monovalent substituent represented by $R^2$ which has a repeating unit derived from a vinyl compound.

In a case where m represents 1, $R^2$ represents a monovalent substituent having preferably 2 to 20 repeating units, more preferably 2 to 15 repeating units, and still more preferably 2 to 10 repeating units. In addition, in a case where m represents 2 or more, the average number of repeating units in m $R^2$'s is preferably 2 to 20, more preferably 2 to 15, and still more preferably 2 to 10. According to this embodiment, the flatness of a coating film is improved.

The number of repeating units derived from a vinyl compound in a case where m represents 1, and the average number of repeating units derived from a vinyl compound in m $R^2$'s in a case where m represents 2 or more can be obtained by nuclear magnetic resonance (NMR). Specifically, for example, the measurement can be performed by obtaining m based on a peak area ratio between the (m+n)-valent linking group represented by $R^1$ and the colorant structure D, and then dividing a peak area ratio of the repeating unit derived from a vinyl compound by m.

The vinyl compound is not particularly limited and preferable examples thereof include (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth)acrylonitriles, and vinyl compounds having an acid group.

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)

acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy) ethyl (meth)acrylate, 3-phenoxy-2-hydroxypropyl (meth) acrylate, 2-chloroethyl (meth)acrylate, glycidyl (meth) acrylate, 3,4-epoxycyclohexyl methyl (meth)acrylate, vinyl (meth)acrylate, 2-phenylvinyl (meth)acrylate, 1-propenyl (meth)acrylate, allyl (meth)acrylate, 2-allyloxyethyl (meth) acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxy polyethylene glycol (meth) acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth) acrylate, dicyclopentanyl (meth)acrylate, tribromophenyl (meth)acrylate, tribromophenyloxyethyl (meth)acrylate, and γ-butyrolactone (meth)acrylate.

Examples of the crotonic acid esters include butyl crotonate and hexyl crotonate.

Examples of the vinyl esters include vinyl acetate, vinyl chloroacetate, vinyl propionate, vinyl butyrate, vinyl methoxy acetate, and vinyl benzoate.

Examples of the maleic acid diesters include dimethyl maleate, diethyl maleate, and dibutyl maleate.

Examples of the fumaric acid diesters include dimethyl fumarate, diethyl fumarate, and dibutyl fumarate.

Examples of the itaconic acid diesters include dimethyl itaconate, diethyl itaconate, and dibutyl itaconate.

Examples of the (meth)acrylamides include (meth)acrylamide, N-methyl (meth)acrylamide, N-ethyl (meth)acrylamide, N-propyl (meth)acrylamide, N-isopropyl (meth)acrylamide, N-n-butyl acryl(meth)amide, N-t-butyl (meth) acrylamide, N-cyclohexyl (meth)acrylamide, N-(2-methoxyethyl) (meth)acrylamide, N,N-dimethyl (meth) acrylamide, N,N-diethyl (meth)acrylamide, N-phenyl (meth)acrylamide, N-nitrophenyl acrylamide, N-ethyl-N-phenylacrylamide, N-benzyl (meth)acrylamide, (meth)acryloylmorpholine, diacetone acrylamide, N-methylolacrylamide, N-hydroxyethyl acrylamide, vinyl (meth)acrylamide, N,N-diallyl (meth)acrylamide, and N-allyl (meth)acrylamide.

Examples of the styrenes include styrene, methyl styrene, dimethyl styrene, trimethyl styrene, ethyl styrene, isopropyl styrene, butyl styrene, hydroxy styrene, methoxy styrene, butoxy styrene, acetoxy styrene, chlorostyrene, dichlorostyrene, bromostyrene, chloromethylstyrene, hydroxystyrene protected by a group (for example, a tert-butoxycarbonyl group) which is deprotectable by an acidic material, methyl vinyl benzoate, and α-methyl styrene.

Examples of the vinyl ethers include methyl vinyl ether, ethyl vinyl ether, 2-chloroethyl vinyl ether, hydroxy ethyl vinyl ether, propyl vinyl ether, butyl vinyl ether, hexyl vinyl ether, octyl vinyl ether, methoxy ethyl vinyl ether, and phenyl vinyl ether.

Examples of the vinyl ketones include methyl vinyl ketone, ethyl vinyl ketone, propyl vinyl ketone, and phenyl vinyl ketone.

Examples of the olefins include ethylene, propylene, isobutylene, butadiene, and isoprene.

Examples of the maleimides include maleimide, butyl maleimide, cyclohexyl maleimide, and phenyl maleimide.

(Meth)acrylonitriles, a heterocyclic group which is substituted with a vinyl group (for example, vinyl pyridine, N-vinylpyrrolidone, or vinylcarbazole), N-vinyl formamide, N-vinylacetamide, N-vinylimidazole, vinylcaprolactone, or the like can also be used.

In addition to the above-described compounds, a vinyl compound having a functional group such as an urethane group, an urea group, a sulfonamide group, a phenol group, or an imide group can also be used. The vinyl compound having an urethane group or an urea group can be appropriately synthesized using an addition reaction of an isocyanate group and a hydroxyl group or an amino group. Specifically, the vinyl compound having an urethane group or an urea group can be appropriately synthesized, for example, using an addition reaction of an isocyanate group-containing monomer and a compound having one hydroxyl group or a compound having one primary or secondary amino group, or using an addition reaction of a hydroxyl group-containing monomer or a primary or secondary amino group-containing monomer and monoisocyanate.

Examples of the vinyl compound having an acid group include a vinyl compound having a carboxyl group, a vinyl compound having a sulfo group, and a vinyl compound having a phosphate group.

Examples of the vinyl compound having a carboxyl group include (meth)acrylic acid, vinylbenzoic acid, maleic acid, maleic acid monoalkyl ester, fumaric acid, itaconic acid, crotonic acid, cinnamic acid, and an acrylic acid dimer. In addition, for example, an addition product a monomer having a hydroxyl group such as 2-hydroxyethyl (meth) acrylate and a cyclic anhydride such as maleic anhydride, phthalic anhydride, or cyclohexanedicarboxylic anhydride, or co-carboxy-polycaprolactone mono(meth)acrylate can also be used. In addition, as a precursor of a carboxyl group, a monomer including an anhydride such as maleic anhydride, itaconic anhydride, or citraconic anhydride may be used. Among these (meth)acrylic acid is preferable from the viewpoints of copolymerizability, cost, solubility, and the like.

Examples of the vinyl compound having a sulfo group include 2-acrylamide-2-methylpropanesulfonic acid.

Examples of the vinyl compound having a phosphate group include mono(2-acryloyloxyethyl) phosphate and mono(1-methyl-2-acryloyloxyethyl) phosphate.

Further, as the vinyl compound having an acid group, for example, a vinyl compound having a phenolic hydroxyl group or a vinyl compound having a sulfonamide group can also be used.

In the present invention, it is preferable that $R^2$ includes a repeating unit derived from a vinyl compound having an acid group, it is more preferable that $R^2$ includes 30 mol % or higher of a repeating unit derived from a vinyl compound having an acid group with respect to all the repeating units included in $R^2$, and it is still more preferable that $R^2$ includes 30 to 90 mol % of a repeating unit derived from a vinyl compound having an acid group with respect to all the repeating units included in $R^2$. By $R^2$ including a repeating unit derived from a vinyl compound having an acid group, a development residue can be further reduced.

As the acid group, a carboxyl group, a sulfo group, or a phosphate group is preferable, and a carboxyl group is more preferable.

In the present invention, it is preferable that $R^2$ includes a repeating unit derived from a vinyl compound having a polymerizable group, it is more preferable that $R^2$ includes 10 mol % or higher of a repeating unit derived from a vinyl compound having a polymerizable group with respect to all the repeating units included in $R^2$, and it is still more preferable that $R^2$ includes 10 to 80 mol % of a repeating unit derived from a vinyl compound having a polymerizable group with respect to all the repeating units included in $R^2$. By $R^2$ including a repeating unit derived from a vinyl compound having a polymerizable group, color transfer properties can be further improved.

As the polymerizable group, a well-known polymerizable group which is crosslinkable by a radical, an acid or heat can be used, and examples thereof include a group including an ethylenically unsaturated bond, a cyclic ether group such as an epoxy group or an oxetane group, and a methylol group. A group having an ethylenically unsaturated bond is preferable, a (meth)acryloyl group is more preferable, and a (meth)acryloyl group derived from glycidyl (meth)acrylate and 3,4-epoxy-cyclohexylmethyl (meth)acrylate is still more preferable.

<<<Colorant Structure>>>

In Formula (1), D represents a colorant structure. In a case where n represents 2 or more, plural D's may be different from each other. As the colorant structure, a colorant structure having a cation site and a counter anion or a colorant structure having a cation site and an anion site in one molecule is preferable. The counter anion is an anion which is present outside of the colorant structure and can form a salt with a cation site of the colorant structure. For example, the colorant structure having a cation site and a counter anion refers to a case where a cation and an anion are present as different compounds without being bonded to each other through a covalent bond. In addition, the colorant structure having a cation site and an anion site in one molecule refers to a case where a cation and an anion are bonded to each other through a covalent bond. In a case where the colorant structure has a cation site and an anion site in one molecule, it is preferable that the anion site is a sulfonyl imide anion.

The colorant structure D in the colorant (A) is not particularly limited, and well-known colorant structures can be adopted.

Specific examples of a colorant compound which can form the colorant structure are described in, for example, "New Edition, Dye Handbook" (edited by Journal of Synthetic Organic Chemistry, Japan; Maruzen, 1970), "Color Index" (The Society of Dyers and colourists), and "colorant handbook" (edited by Ogawara et al.; Kodansha, 1986).

For example, the colorant structure used in the present invention can be selected from the group consisting of a quinone colorant, (for example, a benzoquinone colorant, a naphthoquinone colorant, an anthraquinone colorant, or an anthrapyridone colorant), a carbonium colorant (for example, a diarylmethane colorant, a triarylmethane colorant, a xanthene colorant, or an acridine colorant), a quinonimine colorant (for example, an oxazine colorant, or a thiazine colorant), an azine colorant, a polymethine colorant, (for example, an oxonol colorant, a merocyanine colorant, an arylidene colorant, a styryl colorant, a cyanine colorant, a squarylium colorant, or a croconium colorant), a quinophthalone colorant, a phthalocyanine colorant, a subphthalocyanine colorant, a perinone colorant, an indigo colorant, a thioindigo colorant, a quinoline colorant, a nitro colorant, a nitroso colorant, a dipyrromethene colorant, an azo colorant, and a metal complex colorant thereof.

Among these colorant structures, from the viewpoint of color separability and light fastness, a colorant structure selected from the group consisting of a dipyrromethene colorant, a triarylmethane colorant, a xanthene colorant, an anthraquinone colorant, a cyanine colorant, a squarylium colorant, a quinophthalone colorant, a phthalocyanine colorant, a subphthalocyanine colorant, and an azo colorant is preferable, a colorant structure selected from the group consisting of a dipyrromethene colorant, a triarylmethane colorant, a xanthene colorant, a cyanine colorant, a squarylium colorant, an anthraquinone colorant, a quinophthalone colorant, a phthalocyanine colorant, a subphthalocyanine colorant, and an azo colorant is more preferable, and a triarylmethane colorant or a xanthene colorant is still more preferable.

Hereinafter, the colorant structure which is preferably used in the present invention will be described in detail.

<<<<Triarylmethane Colorant>>>>

In one embodiment of the colorant structure used in the present invention, a partial structure derived from a triarylmethane colorant (triarylmethane compound) is provided. Regarding the triarylmethane colorant, a partial structure derived from a compound represented by the following Formula (TP) is provided as a colorant structure. The triarylmethane compound is a collective term for compounds which have a colorant site having a triarylmethane skeleton in the molecules.

Formula (TP)

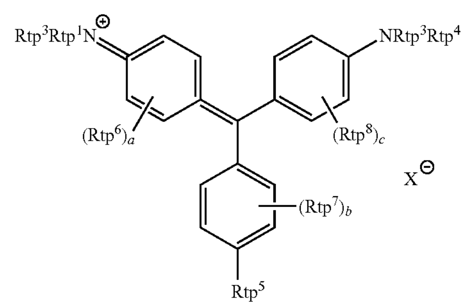

In Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ ($Rtp^9$ and $Rtp^{10}$ represent a hydrogen atom, an alkyl group, or an aryl group). $Rtp^6$, $Rtp^7$, and $Rtp^8$ represent a substituent. a, b, and c represent an integer of 0 to 4. In a case where a, b, and c represent 2 or more, $Rtp^6$'s, $Rtp^7$'s, and $Rtp^8$'s may be linked to each other to form a ring, respectively. $X^-$ represents an anion structure. In a case where $X^-$ is not present, at least one of $Rtp^1$, $Rtp^2$, $Rtp^3$, $Rtp^4$, $Rtp^5$, $Rtp^6$, or $Rtp^7$ includes an anion.

$Rtp^1$ to $Rtp^6$ represent preferably a hydrogen atom, a linear or branched alkyl group having 1 to 5 carbon atoms, or a phenyl group. $Rtp^5$ represents preferably a hydrogen atom or $NRtp^9Rtp^{10}$ and more preferably $NRtp^9Rtp^{10}$. $Rtp^9$ and $Rtp^{10}$ represent preferably a hydrogen atom, a linear or branched alkyl group having 1 to 5 carbon atoms, or a phenyl group. As the substituent represented by $Rtp^6$, $Rtp^7$, or $Rtp^8$, the same substituents described below in a substituent group A can be used. In particular, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 5 carbon atoms or an alkenyl group having 1 to 5 carbon atoms, a phenyl group, or a carboxyl group is more preferable. In particular, $Rtp^6$ and $Rtp^8$ represent preferably an alkyl group having 1 to 5 carbon atoms, and $Rtp^7$ represents preferably an alkenyl group (preferably, a phenyl group to which adjacent two alkenyl groups are linked), a phenyl group, or a carboxyl group.

a, b, and c each independently represent an integer of 0 to 4. In particular, a and b each independently represent 0 or 1, and c represents preferably an integer of 0 to 2.

It is preferable that one of the sites represented by $Rtp^1$ to $Rtp^{10}$ in the compound represented by Formula (TP) is bonded to $L^1$ in Formula (1).

In a case where at least one of $Rtp^1$, $Rtp^2$, $Rtp^3$, $Rtp^4$, $Rtp^5$, $Rtp^6$, or $Rtp^7$ includes an anion, the anion has, for example, a structure in which at least one of $Rtp^1$, $Rtp^2$, $Rtp^3$, $Rtp^4$, $Rtp^5$, $Rtp^6$, or $Rtp^7$ is substituted with Formula (P).

Formula (P)

In Formula (P), L represents a single bond or a divalent linking group, and $X^1$ represents at least one selected from the group consisting of $—SO_3^-$, $—COO^-$, $—PO_4^-$, a group having a structure represented by the following Formula (A1), and a group having a structure represented by the following Formula (A2).

Formula (A1)

$$R^1—\overset{\ominus}{N}—R^2$$

In Formula (A1), $R^1$ and $R^2$ each independently represent $—SO^2—$ or —CO—.

Formula (A2)

$$R^3—\underset{R^5}{\overset{\ominus}{C}}—R^4$$

In Formula (A2), $R^3$ represents $—SO^2—$ or —CO—. $R^4$ and $R^5$ each independently represent $—SO_2—$, —CO—, or —CN.

In Formula (P), L represents a single bond or a divalent linking group. As the divalent linking group, $—NR^{10}—$, —O—, $—SO_2—$, a fluorine-substituted alkylene group, a fluorine-substituted phenylene group, or a group having a combination thereof is preferable. In particular, a group having a combination of $—NR^{10}—$, $—SO^2—$, and a fluorine-substituted alkylene group, a group of having a combination of —O— and a fluorine-substituted phenylene group, or a group of having a combination of $—NR^{10}—$, $—SO^2—$, and a fluorine-substituted alkylene group is preferable.

In $—NR^{10}—$, $R^{10}$ represents a hydrogen atom or an alkyl group having 1 to 5 carbon atoms and preferably a hydrogen atom.

The number of carbon atoms in the fluorine-substituted alkylene group is preferably 1 to 10, more preferably 1 to 6, and still more preferably 1 to 3. Among these alkylene groups, a perfluoroalkylene group is more preferable. Specific examples of the fluorine-substituted alkylene group include a difluoromethylene group, a tetrafluoroethylene group, and a hexafluoropropylene group.

The number of carbon atoms in the fluorine-substituted phenylene group is preferably 6 to 20, more preferably 6 to 14, and still more preferably 6 to 10. Specific examples of the fluorine-substituted phenylene group include a tetrafluorophenylene group, a hexafluoro-1-naphthylene group, and a hexafluoro-2-naphthylene group.

It is preferable that $X^1$ in Formula (P) represents an anion which is at least one selected from the group consisting of $—SO_3^-$, $—COO^-$, a group having a structure represented by Formula (A1), and a group having a structure represented by Formula (A2).

In the group having a structure represented by the following Formula (A1), it is preferable that a fluorine-substituted alkyl group is provided at a terminal of either $R^1$ or $R^2$ in Formula (A1), and it is more preferable that either $R^1$ or $R^2$ is directly bonded to a fluorine-substituted alkyl group. The number of carbon atoms in the fluorine-substituted alkyl group is preferably 1 to 10, more preferably 1 to 6, still more preferably 1 to 3, even still more preferably 1 or 2, and yet even still more preferably 1. Among these alkyl groups, a perfluoroalkyl group is more preferable. As a specific example of the fluorine-substituted alkyl group, a trifluoromethyl group is preferable.

In the group having a structure represented by the following Formula (A2), it is preferable that a fluorine-substituted alkyl group is provided at a terminal of at least one of $R^3$, $R^4$ or $R^5$ in Formula (A2), and it is more preferable that at least two of $R^3$, $R^4$ or $R^5$ are directly bonded to a fluorine-substituted alkyl group. It is still preferable that a fluorine-substituted alkyl group is provided at terminals of at least two of $R^3$, $R^4$, or $R^5$ in Formula (A1), and it is even more preferable that at least two of $R^3$, $R^4$, or $R^5$ are directly bonded to a fluorine-substituted alkyl group. The fluorine-substituted alkyl group has the same definition and the same preferable range as that described above regarding the group having a structure represented by Formula (A1).

$X^1$ represents preferably a group having a structure represented by Formula (A2) and more preferably a sulfonyl imide anion.

Hereinafter, specific examples of the compound represented by Formula (TP) are shown, but the present invention is not limited thereto. In the following specific examples, $X^-$ represents an anion. In addition, any hydrogen atom in the colorant structure is bonded to $L^1$ in Formula (1). Alternatively, $L^1$ in Formula (1) is bonded after any halogen atom in the colorant structure is removed.

(tp-1)
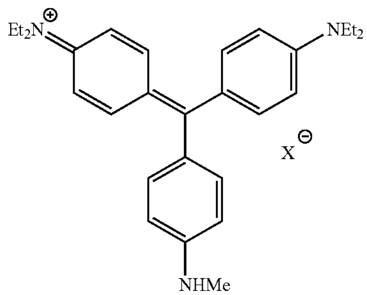
(tp-2)
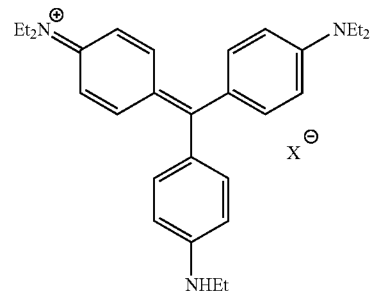
(tp-3)
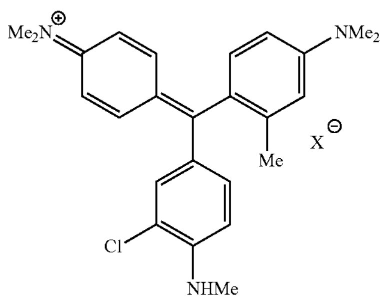
(tp-4)
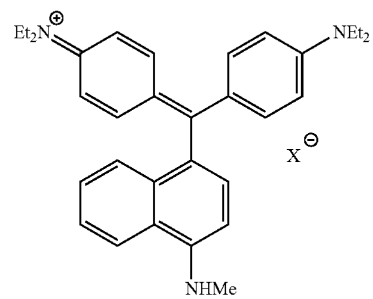
(tp-5)
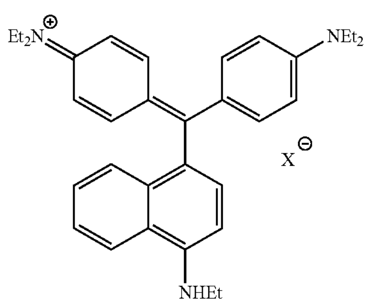
(tp-6)
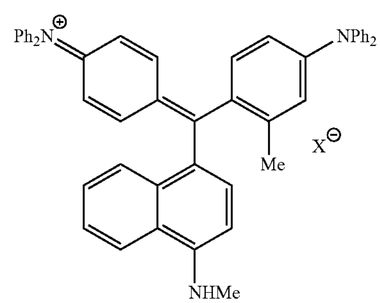
(tp-7)
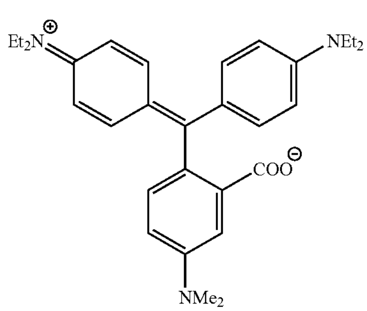
(tp-8)
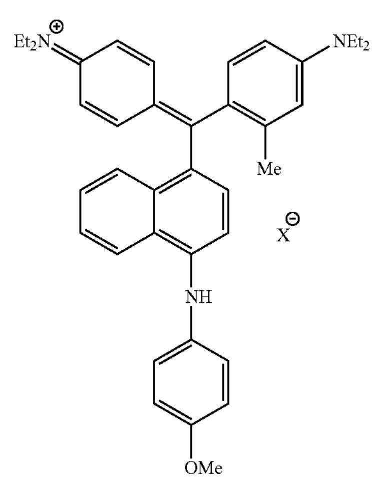

-continued
(tp-9)
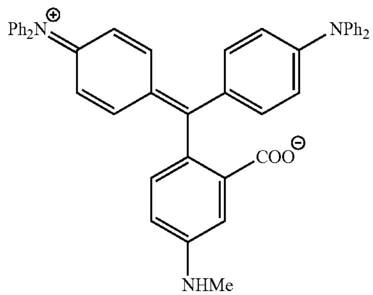
(tp-10)
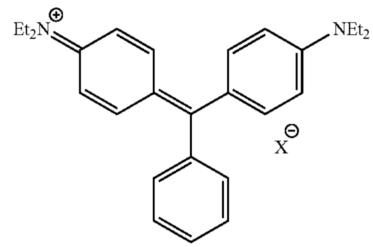
(tp-11)
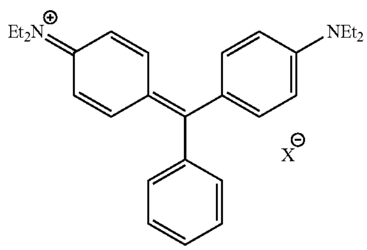
(tp-12)
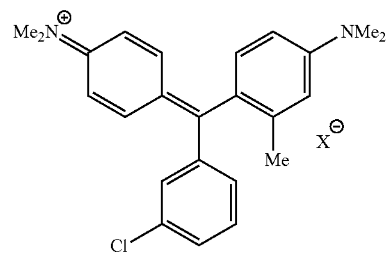
(tp-13)
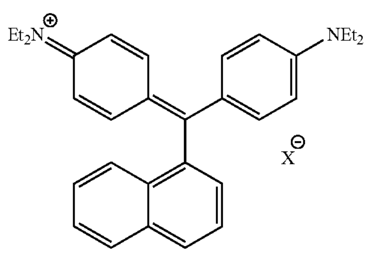
(tp-14)
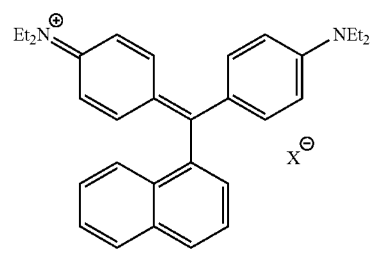
(tp-15)
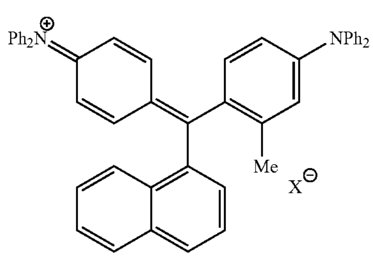
(tp-16)
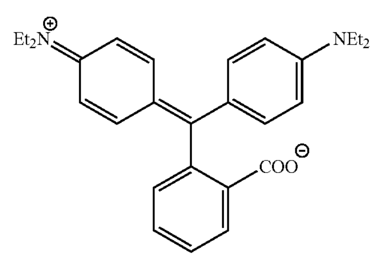
(tp-17)
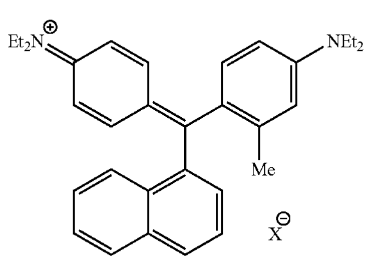
(tp-18)
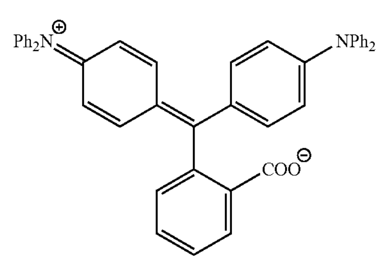

-continued
(A-tp-1)
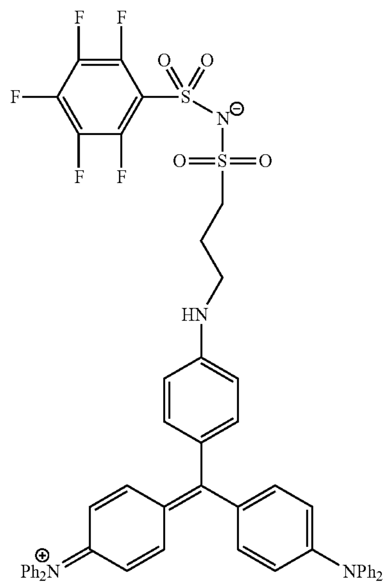
(A-tp-2)
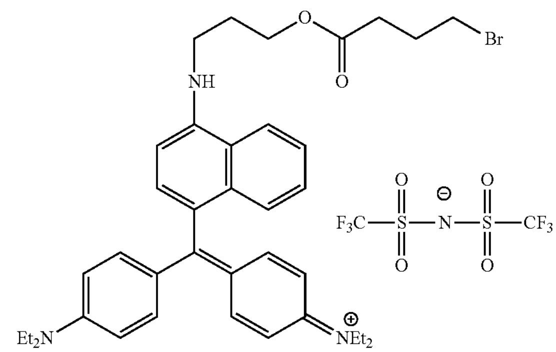
(A-tp-3)
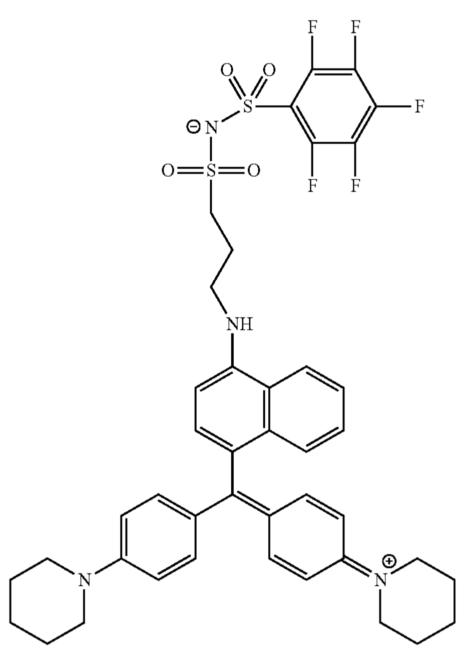
(A-tp-4)
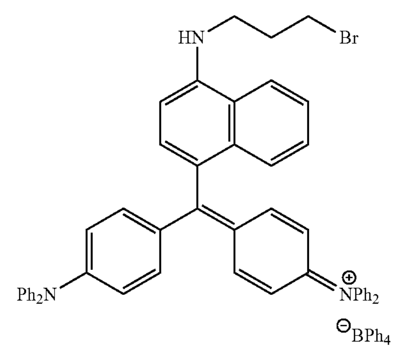

-continued
(A-tp-5)
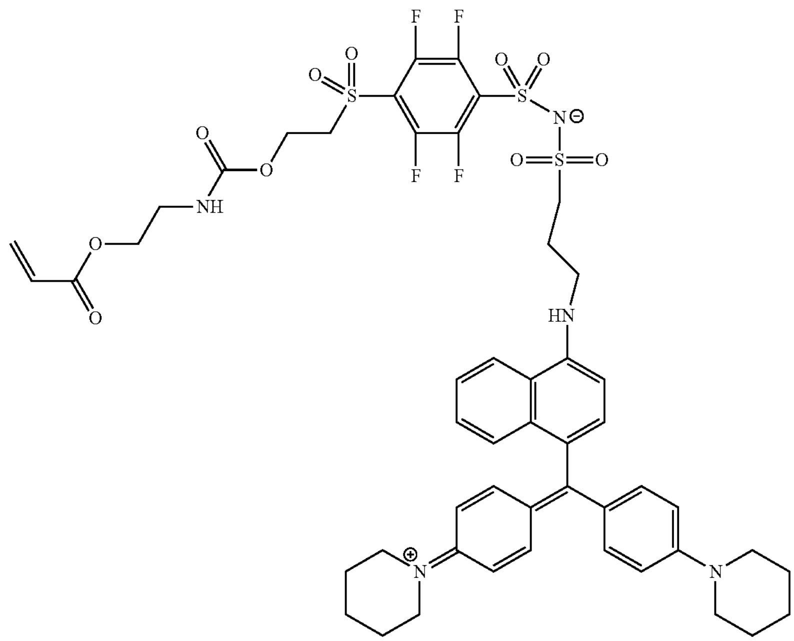
(A-tp-6)
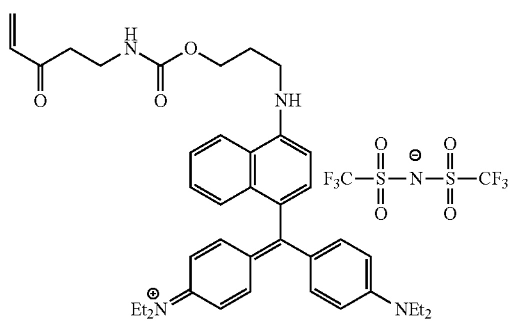
(A-tp-7)
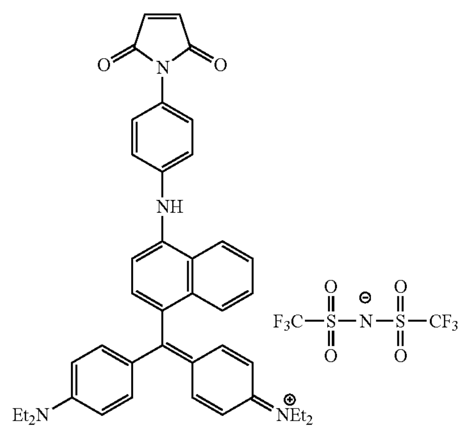
(A-tp-8)
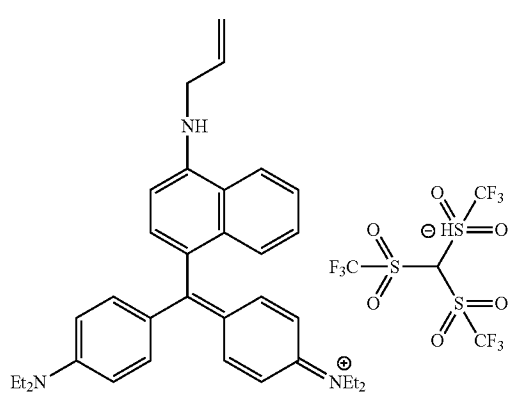
(A-tp-9)
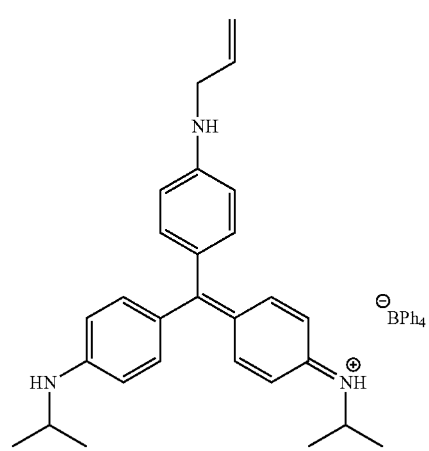

-continued
(A-tp-10)
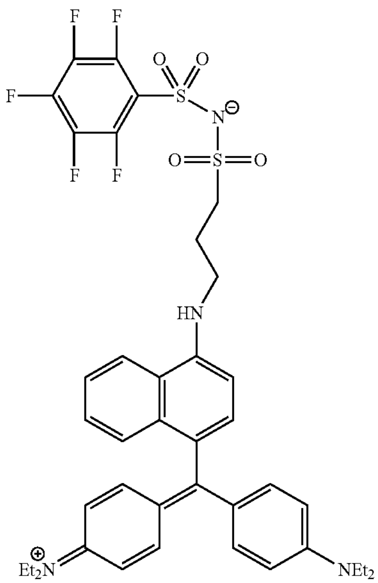
(A-tp-11)
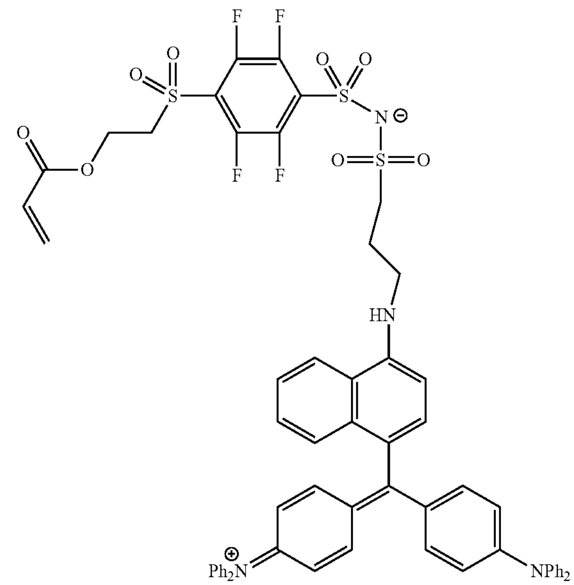
(A-tp-12)
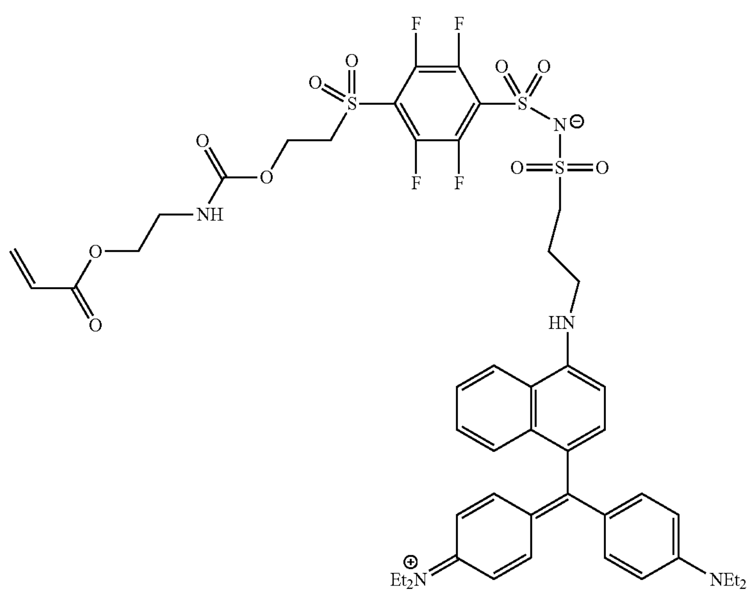

<<<<Xanthene Colorant>>>>

In a preferable embodiment of the colorant structure according to the present invention, a partial structure derived from a xanthene colorant (xanthene compound) is provided. Regarding the xanthene colorant, a partial structure derived from a xanthene compound represented by the following Formula (J) is provided as a colorant structure.

Formula (J)

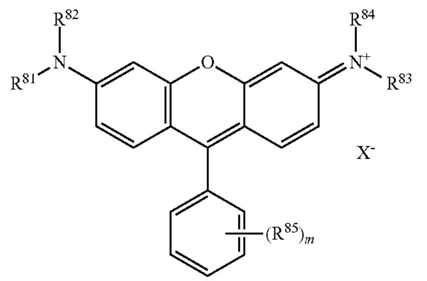

In Formula (J), $R^{81}$, $R^{82}$, $R^{83}$, and $R^{84}$ each independently represent a hydrogen atom or a monovalent substituent, and $R^{85}$'s each independently represent a monovalent substituent, and m represents an integer of 0 to 5. $X^-$ represents a counter anion. In a case where $X^-$ is not present, at least one of $R^{81}$, $R^{82}$, $R^{83}$, $R^{84}$, or $R^{85}$ includes an anion.

As a substituent which can be used in $R^{81}$ to $R^{85}$ of Formula (J), the same substituents described below in the substituent group A can be used.

It is preferable that one of the sites represented by $R^{81}$ to $R^{85}$ in the compound represented by Formula (J) is bonded to $L^1$ in Formula (1).

In Formula (J), $R^{81}$ and $R^{82}$, $R^{83}$ and $R^{84}$, and $R^{85}$'s (in a case where m represents 2 or more) may be each independently bonded to each other to form a 5-membered, 6-membered, or 7-membered saturated ring or a 5-membered, 6-membered, or 7-membered unsaturated ring. In a case where the formed 5-membered, 6-membered, or 7-membered ring is a group which can be further substituted, the ring may be substituted with the substituent described above regarding $R^{81}$ to $R^{85}$. In a case where the formed 5-membered, 6-membered, or 7-membered ring is substituted with two or more substituents, these substituents may be the same as or different from each other.

In a case where $R^{81}$ and $R^{82}$, $R^{83}$ and $R^{84}$, and $R^{85}$'s (in a case where m represents 2 or more) in Formula (J) may be each independently bonded to each other to form a 5-membered, 6-membered, or 7-membered saturated ring or a 5-membered. 6-membered, or 7-membered unsaturated ring which does not have a substituent, examples of the 5-membered, 6-membered, or 7-membered saturated ring or the 5-membered, 6-membered, or 7-membered unsaturated ring which does not have a substituent include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring. Among these, a benzene ring or a pyridine ring is preferable.

In particular, $R^{82}$ and $R^{83}$ represent a hydrogen atom or a substituted or unsubstituted alkyl group, and $R^{81}$ and $R^{84}$ represent a substituted or unsubstituted alkyl group or a phenyl group. In addition, $R^{85}$ represents preferably a halogen atom, a linear or branched alkyl group having 1 to 5 carbon atoms, a sulfo group, a sulfonamide group, a carboxyl group, or an amido group, and more preferably a sulfo group, a sulfonamide group, a carboxyl group, or an amido group. It is preferable that $R^{85}$ is bonded to a portion adjacent to carbon linked to a xanthene ring. It is more preferable that a substituent included in the phenyl group represented by $R^{81}$ or $R^{84}$ is a hydrogen atom, a halogen atom, a linear or branched alkyl group having 1 to 5 carbon atoms, a sulfo group, a sulfonamide group, or a carboxyl group.

The compound having a xanthene skeleton represented by Formula (J) can be synthesized using a method described in the following document. Specifically, a method described in, for example, Tetrahedron Letters, 2003, Vol. 44, No. 23, p. 4355-4360 and Tetrahedron, 2005, Vol. 61, No. 12, p. 3097-3106 can be used.

In a case where $X^-$ represents an anion, the details thereof can be found in the description of a case where a counter anion described below is present as a separate molecule. In addition, in a case where $X^-$ is not present and at least one of $R^{81}$, $R^{82}$, $R^{83}$, or $R^{84}$ includes an anion, the details thereof can be found in the description of a case where a counter anion is present in the same constitutional unit.

Hereinafter, specific embodiments (first embodiment and second embodiment) of the compound represented by Formula (J) will be described.

(First Embodiment of Compound Represented by Formula (J))

In the compound represented by Formula (J), one of $R^{81}$ and $R^{83}$ may represent a group represented by the following Formula (4), and the other one of $R^{81}$ and $R^{83}$ may represent a hydrogen atom, a group represented by the following Formula (4), or an aryl group or alkyl group other than the group represented by the following Formula (4). In addition, $R^{82}$ and $R^{84}$ may each independently represent a hydrogen atom, an alkyl group, or an aryl group.

Formula (4)

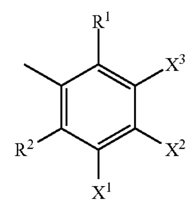

In Formula (4), $R^1$ and $R^2$ each independently represent an alkyl group having 3 or more carbon atoms, an aryl group, or a heterocyclic group, and $X^1$ to $X^3$ each independently represent a hydrogen atom or a monovalent substituent. The colorant compound represented by Formula (J) has a counter anion inside the molecules and/or outside the molecules.

In the compound represented by Formula (J), one of $R^{81}$ and $R^{83}$ may represent a group represented by the following Formula (4), and the other one of $R^{81}$ and $R^{83}$ may represent a hydrogen atom, a group represented by the following Formula (4), or an aryl group or alkyl group other than the group represented by the following Formula (4). In addition, both $R^{81}$ and $R^{83}$ may represent a group represented by Formula (4). In a case where both $R^{81}$ and $R^{83}$ may represent a group represented by Formula (4), two groups represented by Formula (4) may be the same as or different from each other.

In Formula (4), $R^1$ and $R^2$ each independently represent an alkyl group having 3 or more carbon atoms, an aryl group, or a heterocyclic group and may represent a secondary or tertiary alkyl group having 3 to 12 carbon atoms or an isopropyl group.

Specifically, the alkyl group having 3 or more carbon atoms may be linear, branched, or cyclic and may have 3 to 24 carbon atoms, 3 to 18 carbon atoms, or 3 to 12 carbon atoms. Specific examples of the alkyl group having 3 or more carbon atoms include a propyl group, an isopropyl group, a butyl group (for example, a t-butyl group), a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, and a 1-adamantyl group. The alkyl group having 3 or more carbon atoms may be a propyl group, an isopropyl group, a butyl group, a t-butyl group, a pentyl group, a hexyl group, a heptyl group, an octyl group, a 2-ethylhexyl group, a dodecyl group, a cyclopropyl group, a cyclopentyl group or a cyclohexyl group, may be a propyl group, an isopropyl group, a butyl group (t-butyl group), a pentyl group, a hexyl group, a heptyl group, an octyl group, or a 2-ethylhexyl group, and may be an isopropyl group, a t-butyl group, or a 2-ethylhexyl group.

The aryl group may be an substituted or unsubstituted aryl group. The substituted or unsubstituted aryl group may be an aryl group having 6 to 30 carbon atoms, and examples thereof include a phenyl group and a naphthyl group. Examples of the substituent are the same as those of the substituent group A described below.

A heterocycle of the heterocyclic group may be 5-membered or 6-membered and may be further condensed or not. In addition, the heterocyclic group may be an aromatic or nonaromatic heterocycle. Examples of the heterocyclic group include a pyridine ring, a pyrazine ring, a pyridazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazoline ring. Among these, the heterocyclic group may be an aromatic heterocyclic group, for example, a pyridine ring, a pyrazine ring, a pyridazine ring, a pyrazole ring, an imidazole ring, a benzimidazole ring, a triazole ring, a benzoxazole ring, a thiazole ring, a benzothiazole ring, an isothiazole ring, a benzisothiazole ring, a thiadiazole ring, a pyrazole ring, an imidazole ring, a benzoxazole ring, or a thiadiazole ring, and may be a pyrazole ring, a thiadiazole ring (1,3,4-thiadiazole ring or 1,2,4-thiadiazole ring). These heterocyclic groups may have a substituent, and examples of the substituent are the same as those of an aryl group described below.

$R^1$ and $R^2$ may be an alkyl group having 3 or more carbon atoms or an alkyl group having 3 to 12 carbon atoms.

In Formula (4), $X^1$ to $X^3$ each independently represent a hydrogen atom or a monovalent substituent. Examples of the substituent are the same as those of the substituent group A described below. $X^1$ to $X^3$ may represent a halogen atom, an alkyl group, a hydroxyl group, an alkoxy group, an acyl group, an acyloxy group, an alkylthio group, a sulfonamide group, or a sulfamoyl group.

Examples of the aryl group other than the group represented by Formula (4) include a phenyl group. The phenyl group may have a substituent or may be unsubstituted. Examples of the substituent are the same as those of the substituent group A described below. The substituent may be an alkyl group or an aryl group.

$R^{82}$ and $R^{84}$ each independently represent a hydrogen atom, an alkyl group, or an aryl group. The alkyl group or the aryl group may have a substituent or may be unsubstituted.

The substituted or unsubstituted alkyl group may be an alkyl group having 1 to 30 carbon atoms. Examples of the substituent are the same as those of the substituent group A described below. Examples of the alkyl group include a methyl group, an ethyl group, a propyl group, an isopropyl group, a butyl group (t-butyl group), a n-octyl group, and a 2-ethylhexyl group.

The substituted or unsubstituted aryl group may be an aryl group having 6 to 30 carbon atoms, and examples thereof include a phenyl group and a naphthyl group. Examples of the substituent are the same as those of the substituent group A described below.

$R^{82}$ and $R^{84}$ may be a hydrogen atom or an alkyl group and may be a hydrogen atom.

(Second Embodiment of Compound Represented by Formula (J))

In the compound represented by Formula (J), $R^{81}$ and $R^{83}$ each independently represent an aliphatic hydrocarbon group, and $R^{82}$ and $R^{84}$ each independently represent an aromatic hydrocarbon group.

$R^{81}$ and $R^{83}$ each independently represent an aliphatic hydrocarbon group and may be an alkyl group having 1 to 10 carbon atoms, may be an alkyl group having 1 to 5 carbon atoms, may be a methyl group, an ethyl group, a propyl group, or a butyl group, and may be a methyl group, an ethyl group, a n-propyl group, an isopropyl group, or a n-butyl group. $R^{81}$ and $R^{83}$ may be the same as or different from each other. The alkyl group represented by $R^{81}$ and $R^{83}$ may have a substituent and may not have a substituent.

$R^{82}$ and $R^{84}$ each independently represent an aromatic hydrocarbon group and may represent a phenyl group. The aromatic hydrocarbon group represented by $R^{82}$ and $R^{84}$ may have a substituent. The substituent may be selected from the substituent group A described below and may be an alkyl group having 1 to 5 carbon atoms, may be a methyl group, an ethyl group, a propyl group, or a butyl group, and may be a methyl group, an ethyl group, a n-propyl group, or a n-butyl group.

At least one of $R^{81}$ and $R^{83}$ or $R^{82}$ and $R^{84}$ may be represented by the following Formula (A1-1-2).

Formula (A1-1-2)

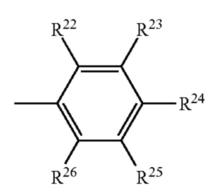

In Formula (A1-1-2), $R^{23}$ to $R^{25}$ each independently represent a hydrogen atom, a halogen atom, a hydroxyl group, an alkoxy group, an alkyl group having 1 to 12 carbon atoms, a carbonyl group, a carbonylamide group, a sulfonyl group, a sulfonylamide group, a nitro group, an amino group, an aminocarbonyl group, an aminosulfonyl group, a sulfonylimide group, or a carbonylimide group. $R^{22}$ and $R^{26}$ each independently represent an alkyl group having 1 to 5 carbon atoms.

In Formula (A1-1-2), $R^{23}$ to $R^{25}$ may represent a hydrogen atom or a halogen atom.

In Formula (A1-1-2), $R^{22}$ and $R^{26}$ may each independently represent an alkyl group having 1 to 5 carbon atoms. The alkyl group having 1 to 5 carbon atoms may be a methyl group, an ethyl group, a propyl group, or a butyl group, and may be a methyl group, an ethyl group, a n-propyl group, an isopropyl group, or an n-butyl group.

$R^{85}$'s may each independently a hydrogen atom, a halogen atom, an alkyl group, an aryl group, a carbonyl group, a nitro group, an amino group, an alkylamino group, an arylamino group, or a sulfonyl group. Examples of the halogen atom include a fluorine atom, a chlorine atom, and a bromine atom. The halogen atom may be a fluorine atom or a chlorine atom. The aliphatic hydrocarbon group may be an aliphatic hydrocarbon group having 1 to 10 carbon atoms. In addition, examples of the aliphatic hydrocarbon group include an alkyl group and an alkenyl group. The aliphatic hydrocarbon group may be an alkyl group. The aromatic hydrocarbon group may be an aryl group and may be a phenyl group.

Hereinafter, specific examples of the xanthene compound are shown, but the present invention is not limited thereto. In the following specific examples, X represents an anion. In addition, any hydrogen atom in the colorant structure is bonded to $L^1$ in Formula (1). Alternatively, $L^1$ in Formula (1) is bonded after any halogen atom in the colorant structure is removed.

In addition, in the colorant structure, the cation is not localized and thus is present on, for example, a nitrogen atom or a carbon atom of a xanthene ring as shown below.

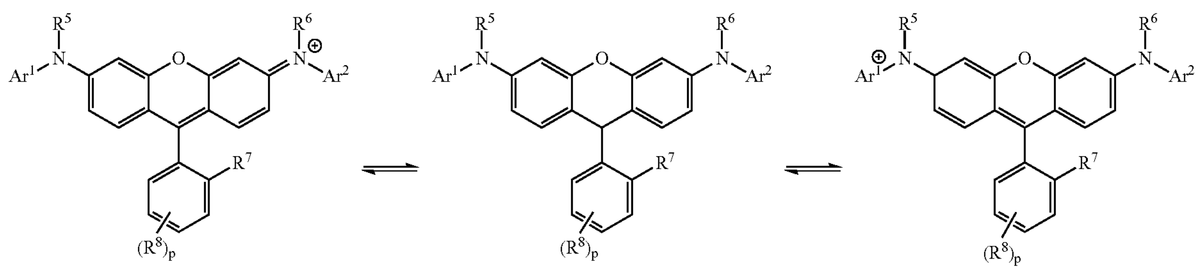

(A-xt-1)

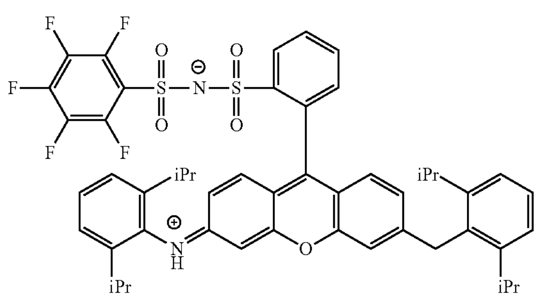

(A-xt-2)

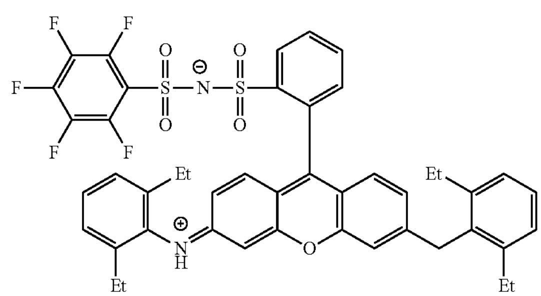

(A-xt-3)

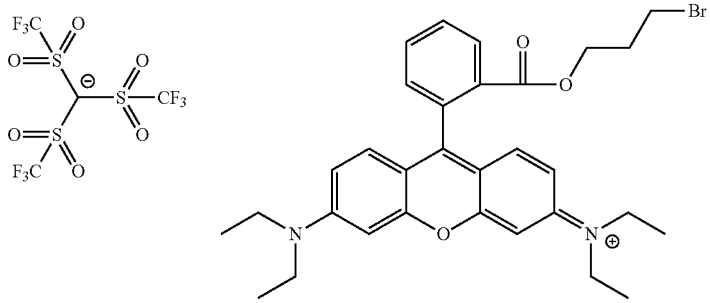

-continued
(A-xt-4)
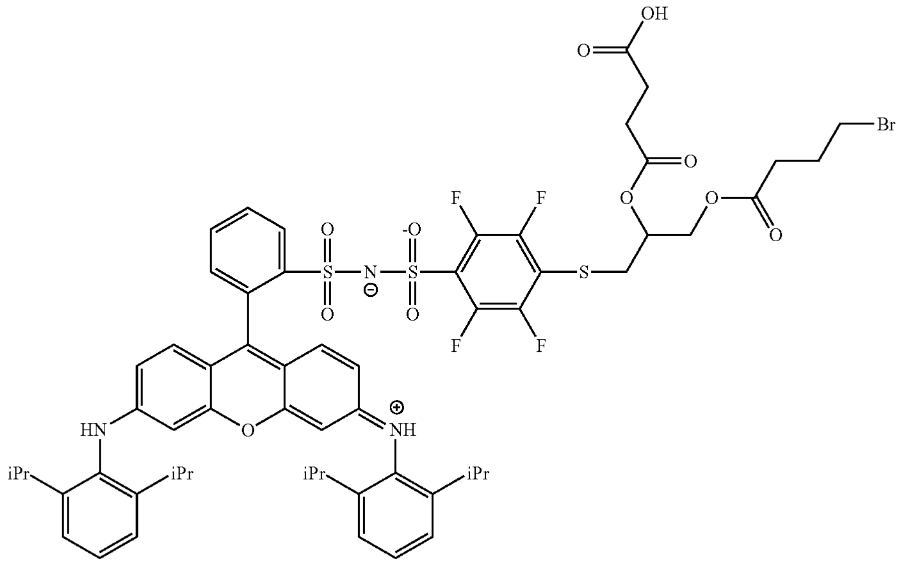
(A-xt-5)
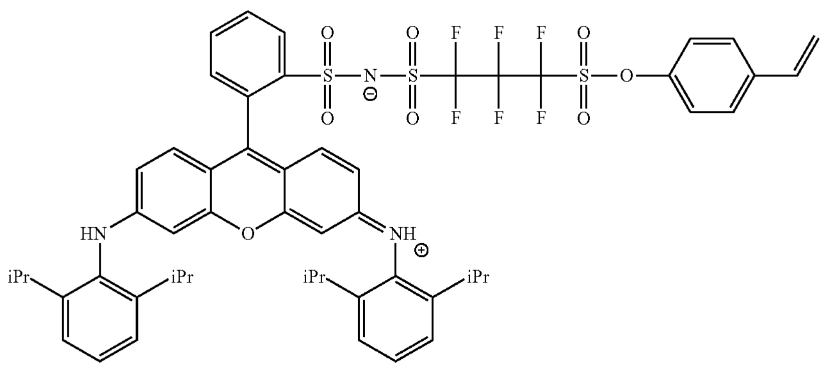
(A-xt-6)
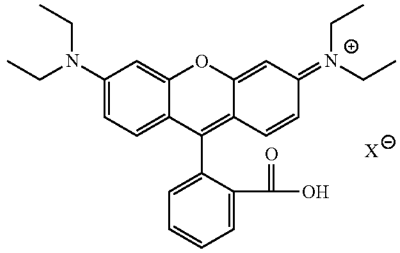
(A-xt-7)
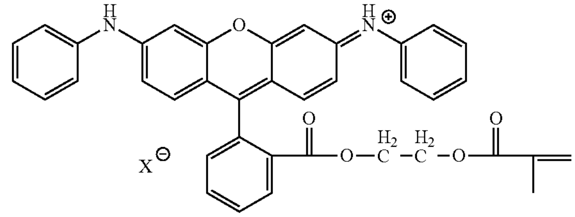

-continued
(A-xt-8)
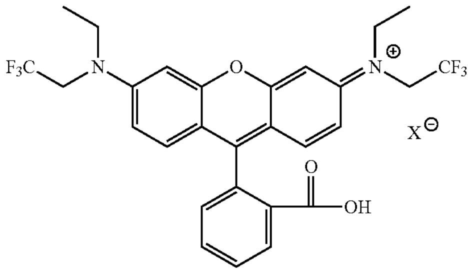
(A-xt-9)
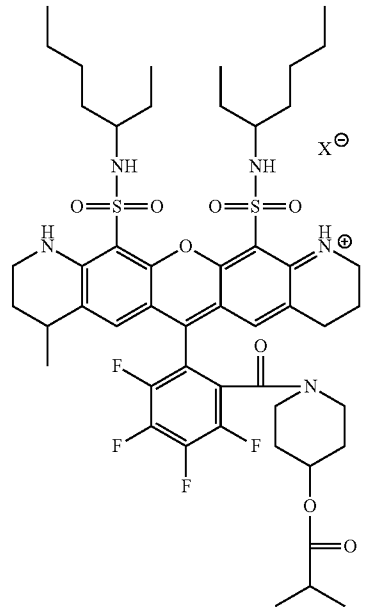
(A-xt-10)
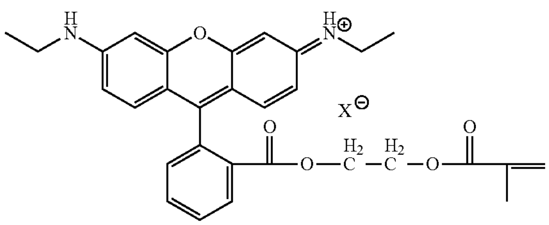
(A-xt-11)
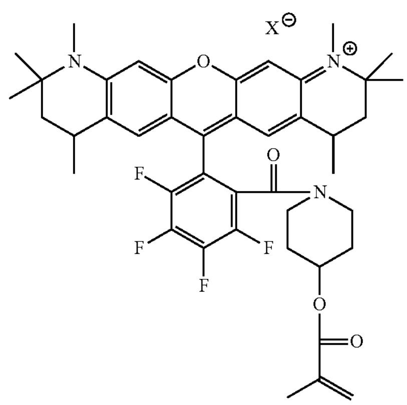
(A-xt-13)
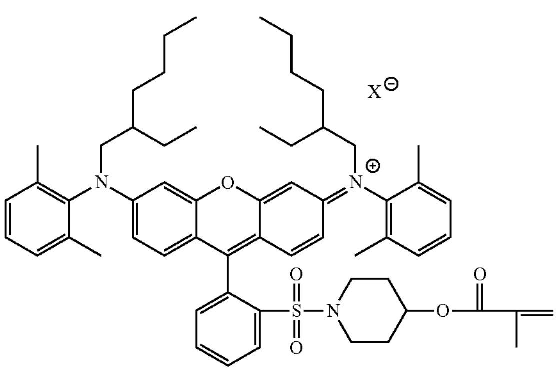
(A-xt-14)
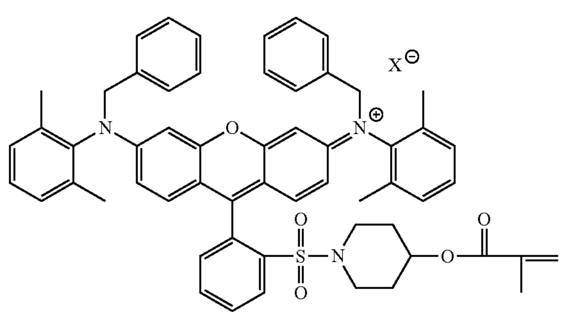

-continued
(A-xt-15)
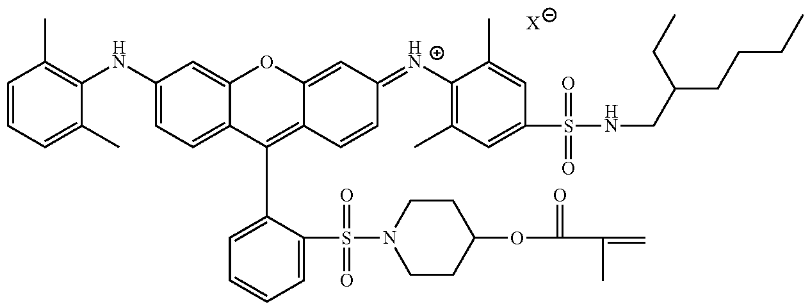
(A-xt-16)
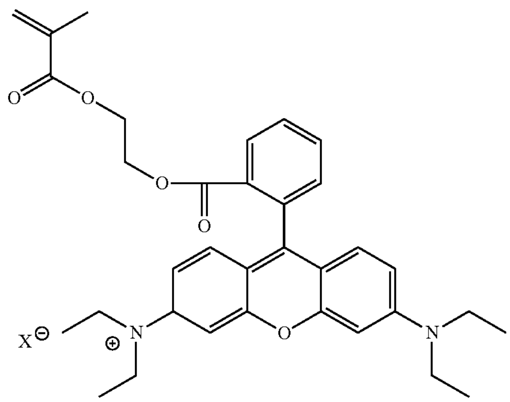
(A-xt-17)
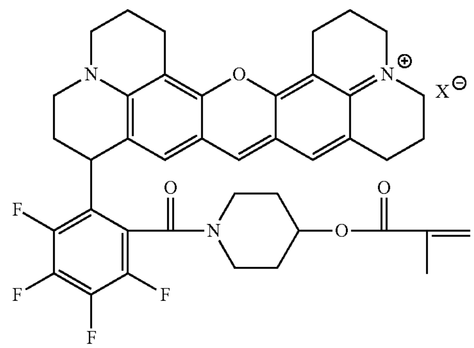
(A-xt-18)
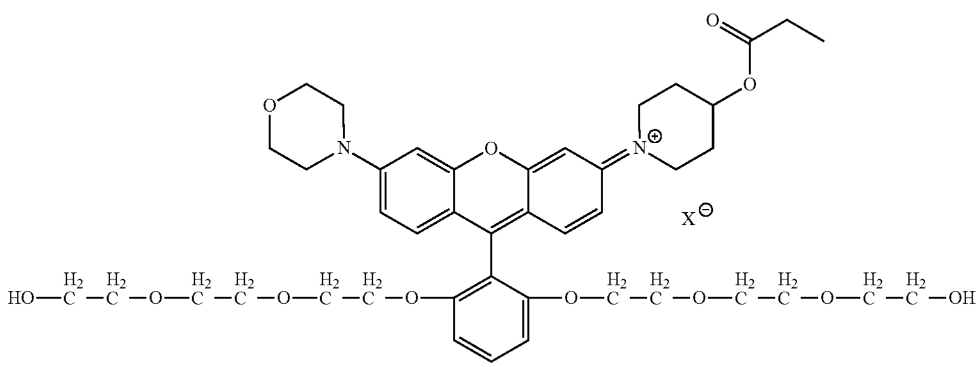
(A-xt-19)
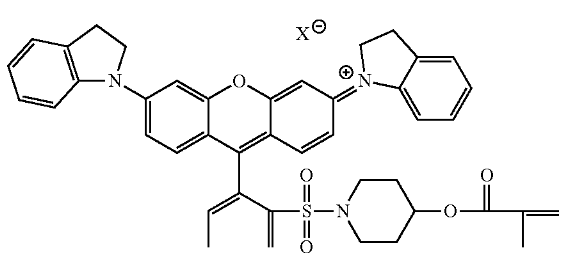
(A-xt-20)
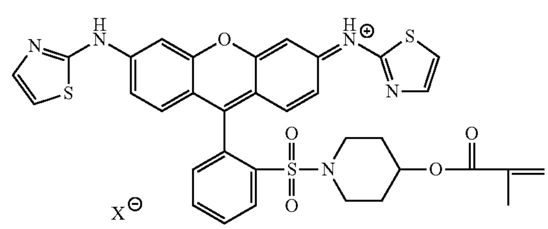
(A-xt-21)
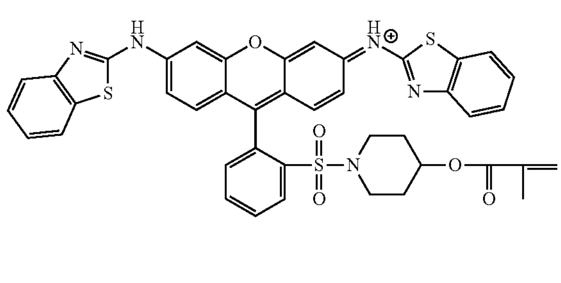
(A-xt-22)
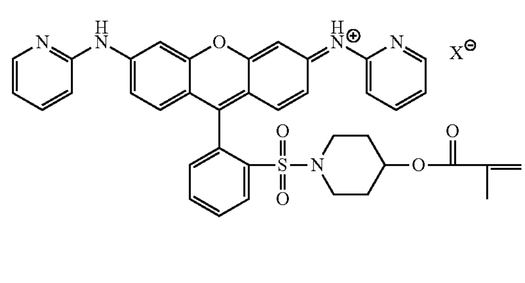

-continued
(A-xt-101)
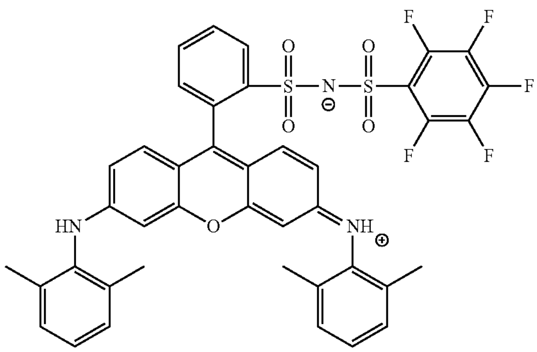
(A-xt-102)
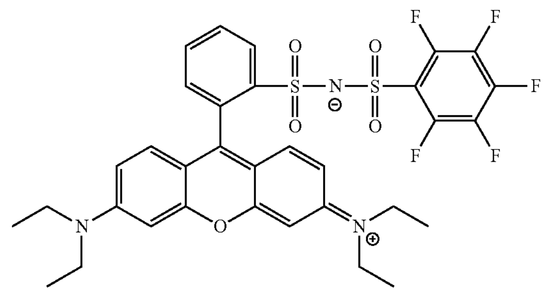
(A-tp-103)
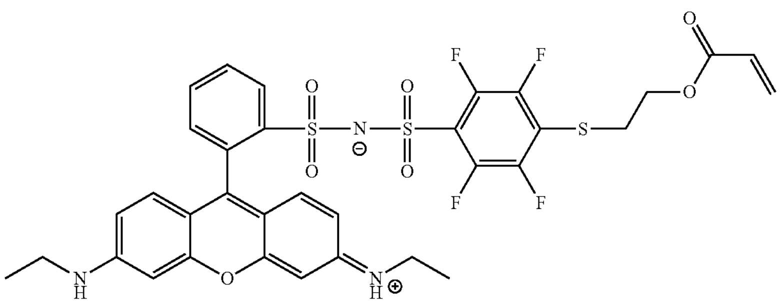
(A-xt-104)
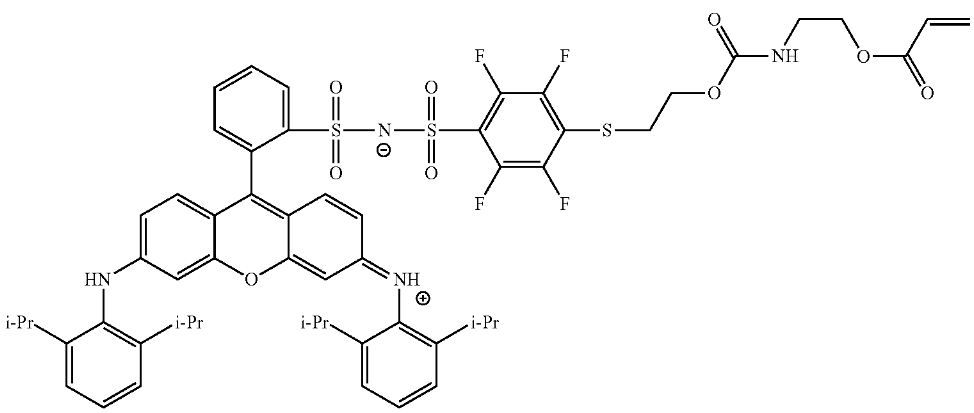
(A-xt-105)
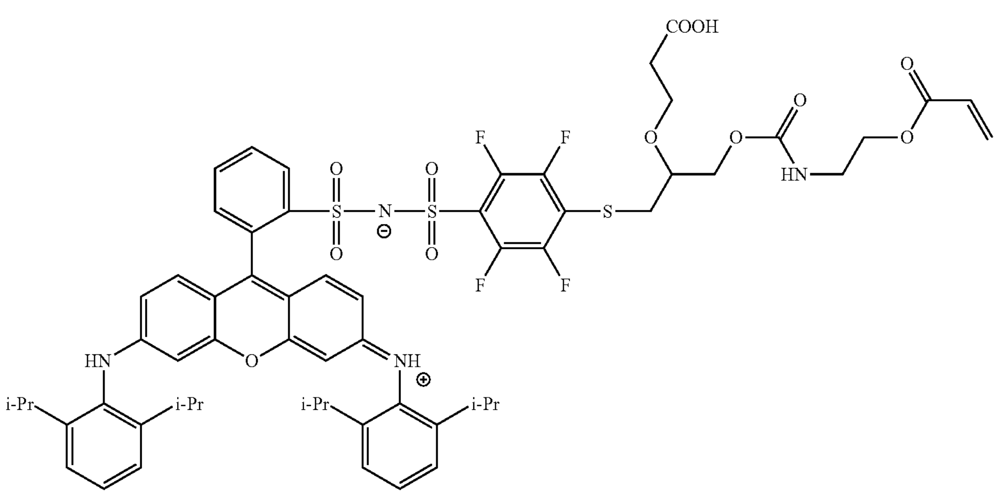

-continued
(A-xt-106)
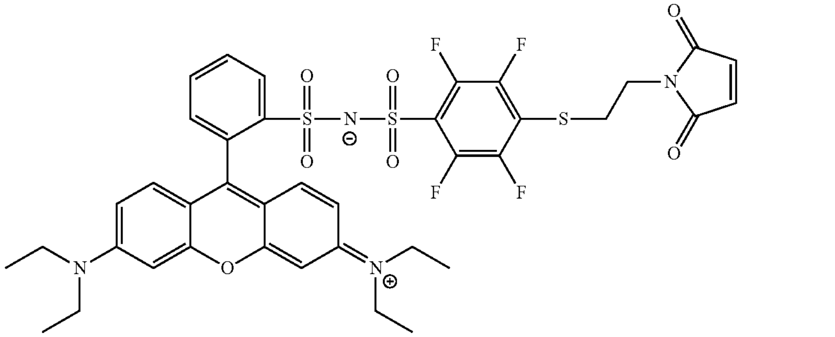
(A-xt-107)
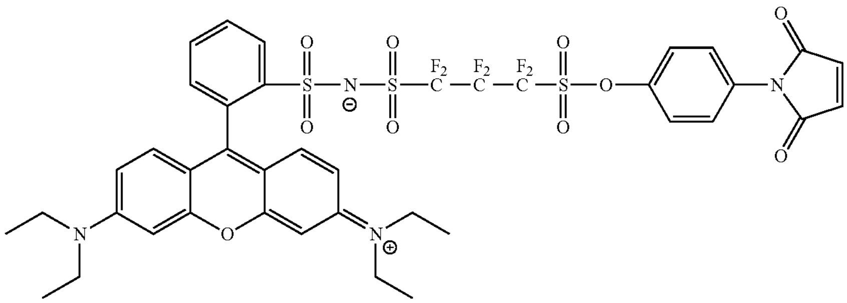
(A-xt-109)
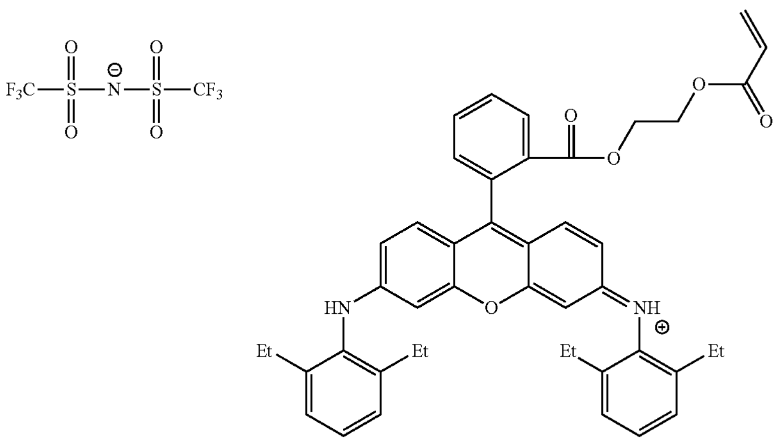
(A-xt-110)
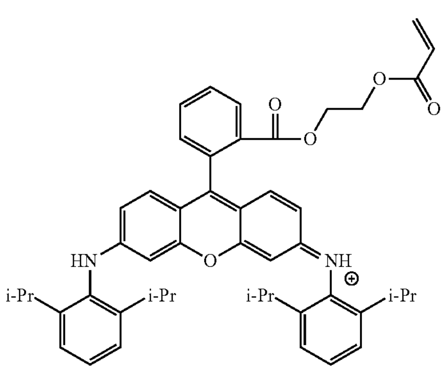
(A-xt-111)
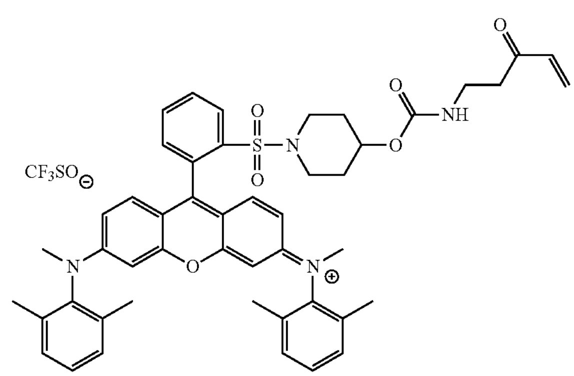

-continued
(A-xt-112)
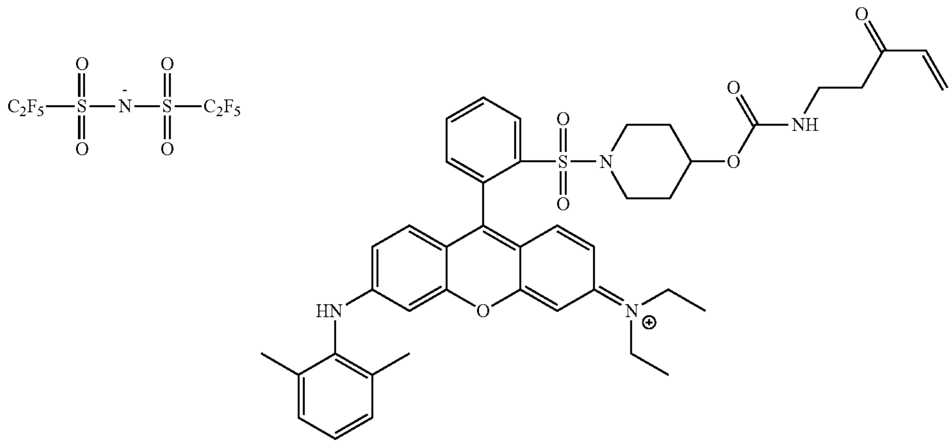
(A-xt-113)
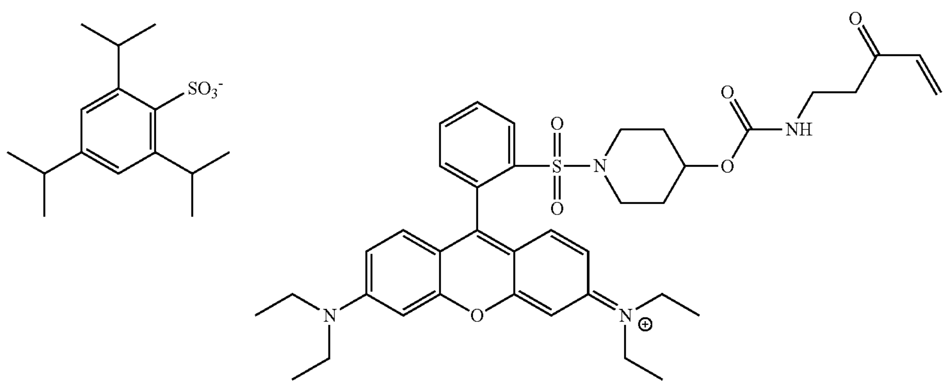
(A-xt-114)
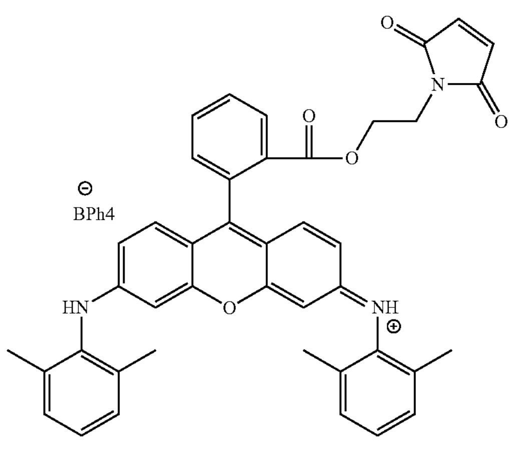
(A-xt-115)
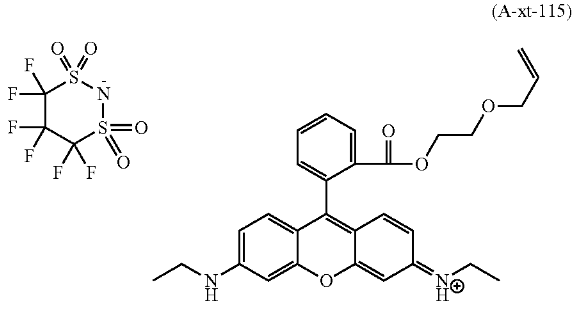
(A-xt-116)
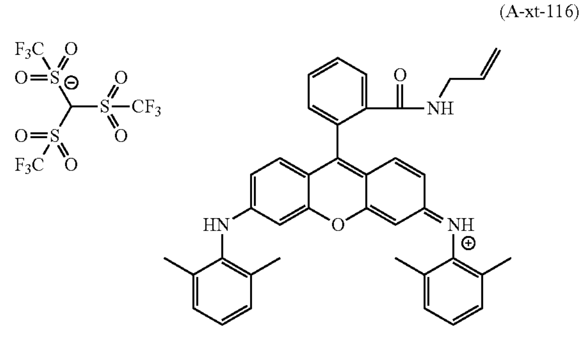

-continued (A-xt-23)

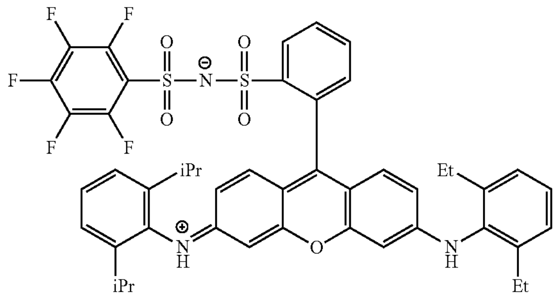

(A-xt-24)

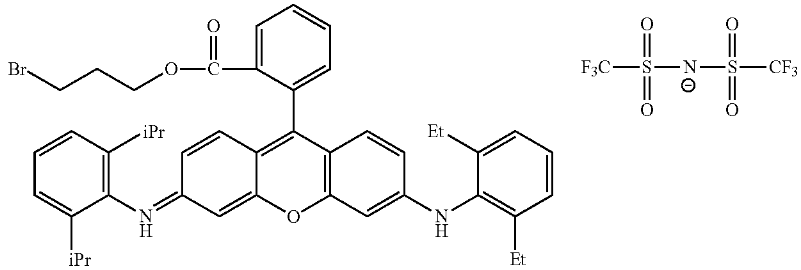

(A-xt-25)

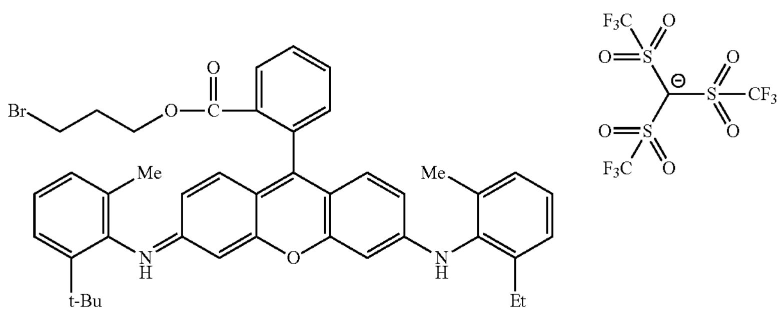

(A-xt-26)

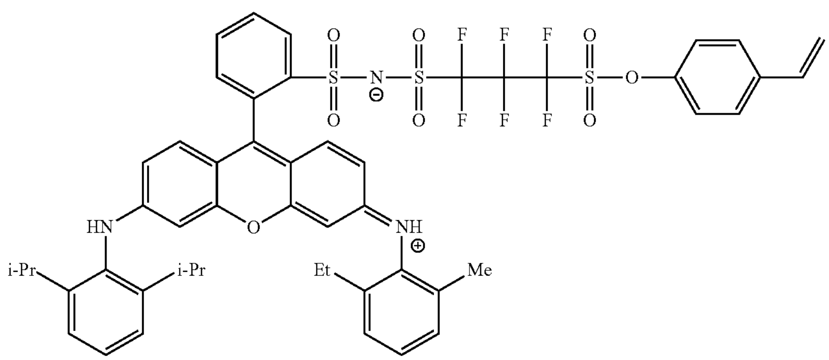

<<<<Anthraquinone Colorant>>>>

In one embodiment of the colorant structure used in the present invention, a partial structure derived from an anthraquinone colorant is provided. As the partial structure derived from an anthraquinone colorant (anthraquinone compound), a partial structure derived from a compound represented by any of the following formulae (AQ-1) to (AQ-3) is preferable. The anthraquinone compound is a collective term for compounds which have a colorant site having an anthraquinone skeleton in the molecules.

Formula (AQ-1)

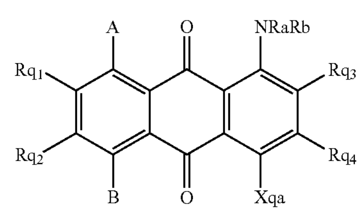

-continued

Formula (AQ-2)

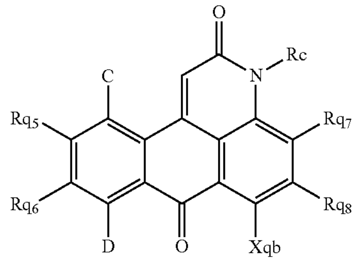

Formula (AQ-3)

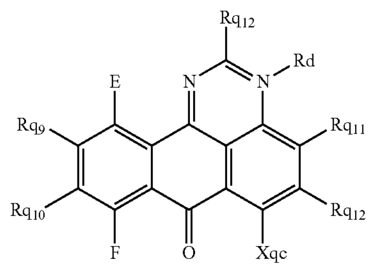

In Formula (AQ-1), A and B each independently represent an amino group, a hydroxyl group, an alkoxy group, or a hydrogen atom. Xqa represents $ORqa^1$ or $NRqa^2Rqa^3$. $Rqa^1$ to $Rqa^3$ each independently represent a hydrogen atom, an alkyl group, or an aryl group. $Rq^1$ to $Rq^4$ represent a substituent. As a substituent which can be used in $Rq^1$ to $Rq^4$, the same substituents described below in the substituent group A can be used. Ra and Rb each independently represent a hydrogen atom, an alkyl group, or an aryl group.

In Formula (AQ-2), C and D have the same definitions as A and B in Formula (AQ-1). Xqb represents $ORqb^1$ or $NRqb^2Rqb^3$. $Rqb^1$ to $Rqb^3$ each independently represent a hydrogen atom, an alkyl group, or an aryl group. $Rq^5$ to $Rq^8$ represent a substituent. $Rq^5$ to $Rq^8$ have the same definitions as $Rq^1$ to $Rq^4$ in Formula (AQ-1). Rc has the same definition as Ra or Rb in Formula (AQ-1).

In Formula (AQ-3), E and F have the same definitions as A and B in Formula (AQ-1). Xqc represents $ORqc^1$ or $NRqc^2Rqc^3$. $Rqc^1$ to $Rqc^3$ each independently represent a hydrogen atom, an alkyl group, or an aryl group. $Rq^9$ to $Rq^{12}$ have the same definitions as $Rq^1$ to $Rq^4$ in Formula (AQ-1). Rd has the same definition as Ra or Rb in Formula (AQ-1).

Preferable ranges of Formulae (AQ-1), (AQ-2), and (AQ-3) can be found in, for example, paragraphs "0045" to "0047" of JP2013-29760A, the content of which is incorporated herein by reference.

Specific examples of the anthraquinone colorant are as follows. In addition, specific examples of the anthraquinone colorant can be found in paragraphs "0049" to "0050" of JP2013-29760A, the content of which is incorporated herein by reference. In specific examples of the anthraquinone colorant, any hydrogen atom in the anthraquinone colorant structure is bonded to $L^1$ in Formula (1). Alternatively, $L^1$ in Formula (1) is bonded after any halogen atom in the colorant structure is removed.

(A-aq-1)

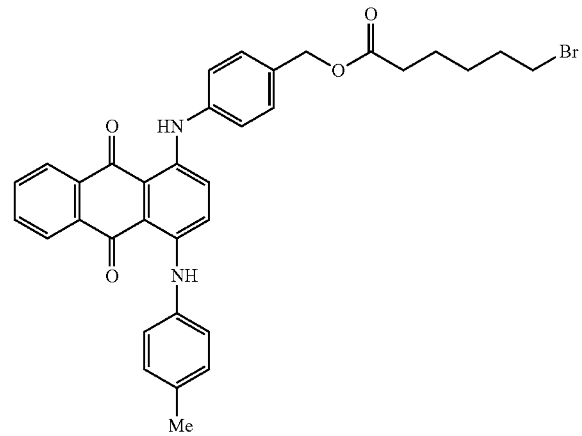

(A-aq-2)

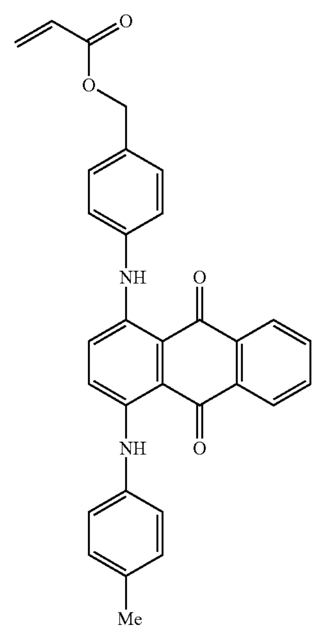

<<<<Cyanine Colorant>>>>

In one embodiment of the colorant structure used in the present invention, a partial structure derived from a cyanine colorant (cyanine compound) is provided. As the partial structure derived from a cyanine colorant, a partial structure derived from a compound (cyanine compound) represented by the following formula (PM) is preferable. In the present invention, the cyanine compound is a collective term for compounds which have a colorant site having a cyanine skeleton in the molecules.

Formula (PM)

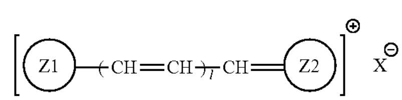

In Formula (PM), a ring Z1 and a ring Z2 each independently a heterocycle which may have a substituent. 1 represents an integer of 0 to 3. $X^-$ represents an anion.

A preferable range of Formula (PM) can be found in, for example, paragraphs "0077" to "0084" of JP2013-29760A, the content of which is incorporated herein by reference. In specific examples of the cyanine colorant described in paragraphs "0077" to "0084" of JP2013-29760A, any hydrogen atom in the cyanine colorant structure is bonded to $L^1$ in Formula (1).

<<<<Squarylium Colorant>>>>

In one embodiment of the colorant structure used in the present invention, a partial structure derived from a squarylium colorant (squarylium compound) is provided. As the partial structure derived from a squarylium colorant, a partial structure derived from a compound (squarylium compound) represented by the following formula (K) is preferable. In the present invention, the squarylium compound is a collective term for compounds which have a colorant site having a squarylium skeleton in the molecules.

Formula (K)

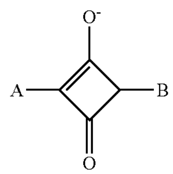

In Formula (K), A and B each independently represent an aryl group or a heterocyclic group. As the aryl group, an aryl group having preferably 6 to 48 carbon atoms and more preferably 6 to 24 carbon atoms can be used, and examples thereof include phenyl and naphthyl. As the heterocyclic group, a 5-membered or 6-membered heterocyclic group is preferable, and examples thereof include imidazole, pyrazole, thienyl, pyridyl, pyrimidyl, pyridazyl, triazole-1-yl, furyl, and thiadiazoyl.

A preferable range of Formula (K) can be found in, for example, paragraphs "0088" to "0106" of JP2013-29760A, the content of which is incorporated herein by reference.

Specific examples of the squarylium colorant are as follows. In addition, specific examples of the squarylium colorant can be found in. for example, paragraph "0105" of JP2013-29760A. In specific examples of the squarylium colorant, any hydrogen atom in the squarylium colorant structure is bonded to $L^1$ in Formula (1). Alternatively, $L^1$ in Formula (1) is bonded after any halogen atom in the colorant structure is removed.

(A-sq-1)

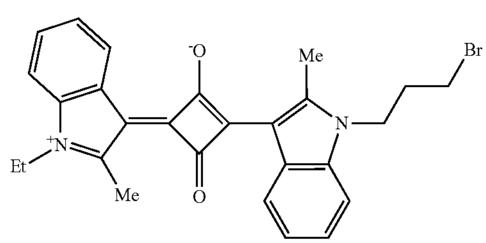

(A-sq-2)

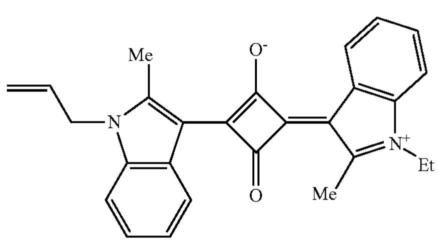

<<<<Quinophthalone Colorant>>>>

In one embodiment of the colorant structure used in the present invention, a partial structure derived from a quinophthalone colorant (quinophthalone compound) is provided. As the partial structure derived from a quinophthalone colorant, a partial structure derived from a compound (quinophthalone compound) represented by the following formula (QP) is preferable. In the present invention, the quinophthalone compound is a collective term for compounds which have a colorant site having a quinophthalone skeleton in the molecules.

Formula (QP)

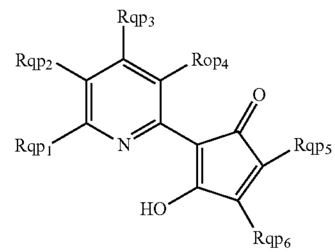

In Formula (QP), $Rqp^1$ to $Rqp^6$ each independently represent a hydrogen atom or a substituent. In a case where at least two of $Rqp^1$ to $Rqp^6$ are adjacent to each other, the adjacent two sites may be bonded to each other to form a ring, and the formed ring may further have a substituent.

A preferable range of Formula (QP) can be found in, for example, paragraphs "0110" to "0114" of JP2013-29760A, the content of which is incorporated herein by reference.

Specific examples of the quinophthalone colorant are as follows. In addition, specific examples of the quinophthalone colorant can be found in paragraph "0113" of JP2013-29760A. In specific examples of the quinophthalone colorant, any hydrogen atom in the quinophthalone colorant structure is bonded to $L^1$ in Formula (1). Alternatively, $L^1$ in Formula (1) is bonded after any halogen atom in the colorant structure is removed.

(A-Qu-1)

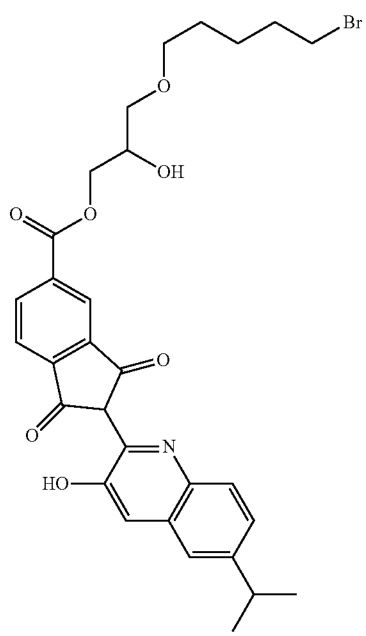

-continued (A-Qu-2)

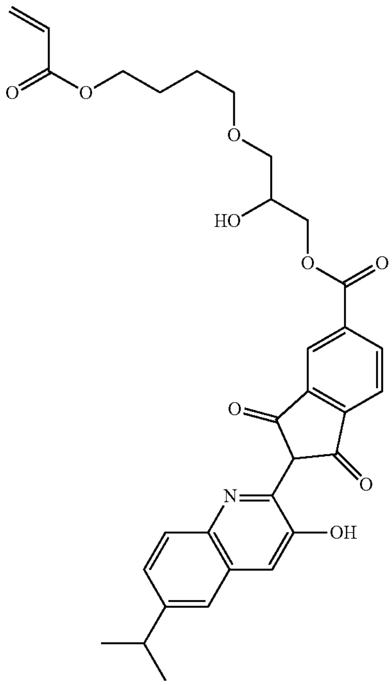

(A-Qu-3)

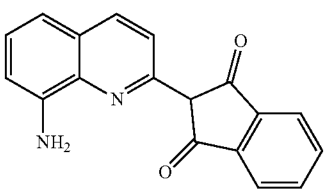

<<<<Phthalocyanine Colorant>>>>

In one embodiment of the colorant structure used in the present invention, a partial structure derived from a phthalocyanine colorant (phthalocyanine compound) is provided. As the partial structure derived from a phthalocyanine colorant, a partial structure derived from a compound (phthalocyanine compound) represented by the following formula (F) is preferable. In the present invention, the phthalocyanine compound is a collective term for compounds which have a colorant site having a phthalocyanine skeleton in the molecules.

Formula (F)

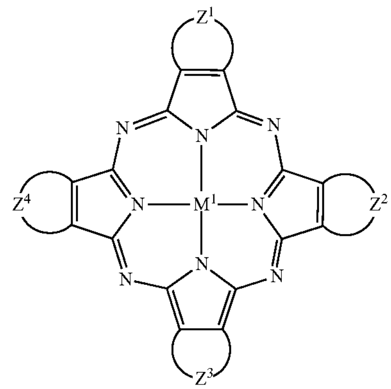

In Formula (F), $M^1$ represents a metal, and $Z^1$, $Z^2$, $Z^3$, and $Z^4$ each independently represent an atomic group which is required to form a 6-membered ring including atoms selected from a hydrogen atom, a carbon atom, and a nitrogen atom.

A preferable range of Formula (F) can be found in, for example, paragraphs "0118" to "0124" of JP2013-29760A, the content of which is incorporated herein by reference.

Specific examples of the phthalocyanine colorant are as follows. In addition, specific examples of the squarylium colorant can be found in, for example, paragraph "0123" of JP2013-29760A. In specific examples of the phthalocyanine colorant, any hydrogen atom in the phthalocyanine colorant structure is bonded to $L^1$ in Formula (1).

(A-Pc-1)

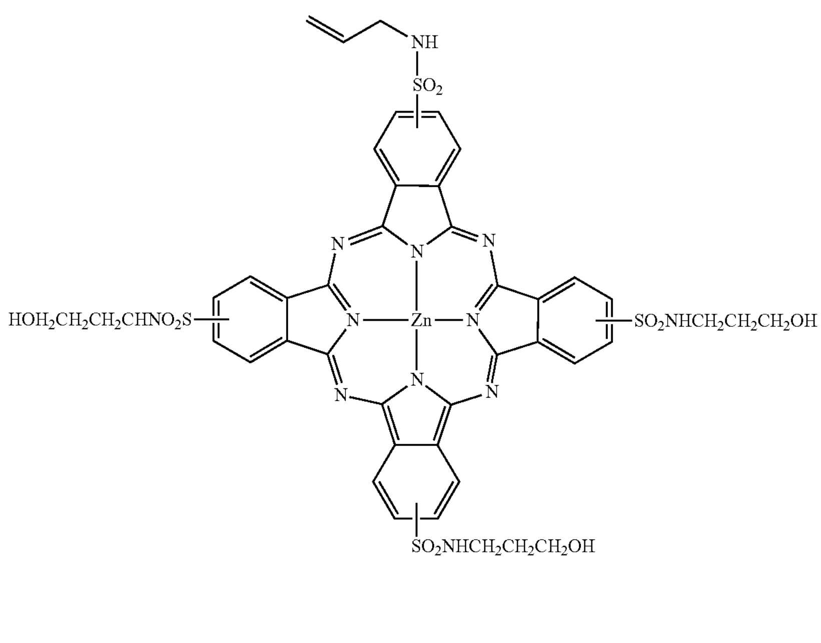

<<<<Subphthalocyanine Colorant>>>>

In one embodiment of the cation included in the colorant structure according to the present invention, a partial structure derived from a subphthalocyanine colorant (subphthalocyanine compound) is provided. As the partial structure derived from a subphthalocyanine colorant, a partial structure derived from a compound (subphthalocyanine compound) represented by the following formula (SP) is preferable. In the present invention, the subphthalocyanine compound is a collective term for compounds which have a colorant site having a subphthalocyanine skeleton in the molecules.

Formula (SP)

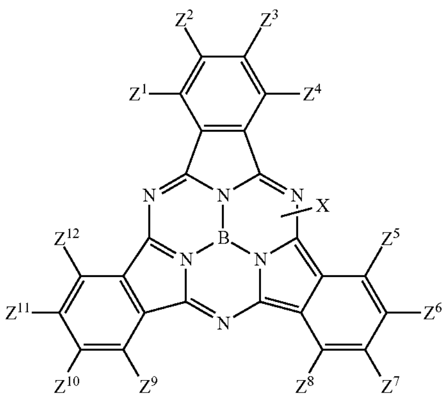

In Formula (SP), $Z^1$ to $Z^{12}$ each independently represent a hydrogen atom, an alkyl group, an aryl group, a hydroxy group, a mercapto group, an amino group, an alkoxy group, an aryloxy group, or a thioether group. X represents an anion.

A preferable range of Formula (SP) can be found in, for example, paragraphs "0128" to "0133" of JP2013-29760A, the content of which is incorporated herein by reference.

Specific examples of the subphthalocyanine colorant are as follows. In addition, specific examples of the subphthalocyanine colorant can be found in, for example, paragraph "0132" of JP2013-29760A. In specific examples of the subphthalocyanine colorant, any hydrogen atom in the subphthalocyanine colorant structure is bonded to $L^1$ in Formula (1). Alternatively, $L^1$ in Formula (1) is bonded after any halogen atom in the colorant structure is removed.

(A-subPc-1)

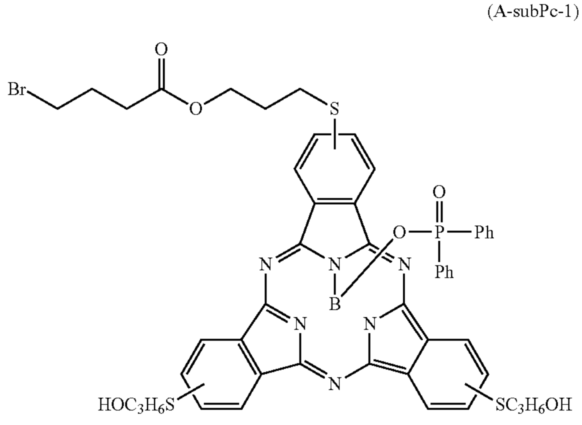

-continued (A-subPc-2)

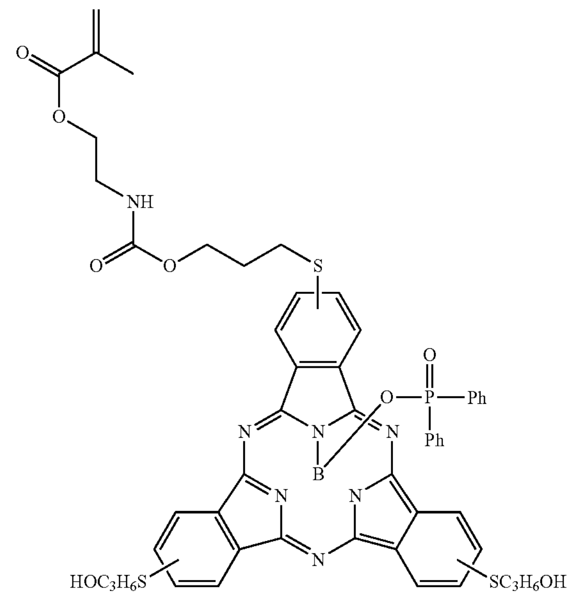

<<<<Azo Colorant>>>>

One of the colorant structures according to the present invention has a partial structure derived from an azo colorant (azo compound). In the present invention, the azo compound is a collective term for compounds which have a colorant site having a N═N group in the molecules. As the azo colorant, a well-known azo colorant (for example, substituted azobenzene) can be appropriately selected and used. The azo colorant can be found, for example, paragraphs "0084" to "0134" of JP2013-41097 and paragraphs "0029" to "0136" of JP2011-162760, the contents of which are incorporated herein by reference. Specific examples of the azo colorant are as follows. In specific examples of the azo colorant, any hydrogen atom in the azo colorant structure is bonded to $L^1$ in Formula (1). Alternatively, $L^1$ in Formula (1) is bonded after any halogen atom in the colorant structure is removed.

(A-az-1)

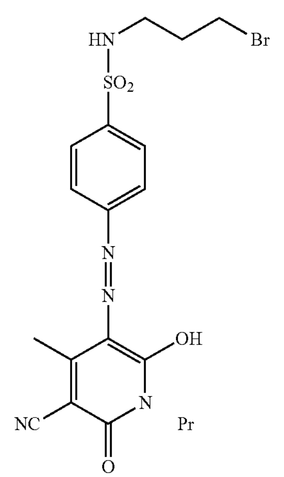

-continued (A-az-2)

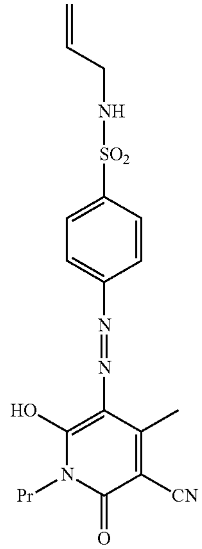

<<<Dipyrromethene Colorant>>>

In one embodiment of the colorant structure according to the present invention, a partial structure derived from an dipyrromethene colorant is provided. As the dipyrromethene colorant, a dipyrromethene compound or a dipyrromethene metal complex compound obtained from a dipyrromethene compound and a metal or a metal compound is preferable. For example, the dipyrromethene colorant has the following structure. The details of the dipyrromethene colorant can be found in paragraphs "0033" to "0136" of JP2011-95732A, the content of which is incorporated herein by reference. In the following formula, Me represents a methyl group, Bu represents a butyl group, and Ac represents an acetyl group.

(A-pm-1)

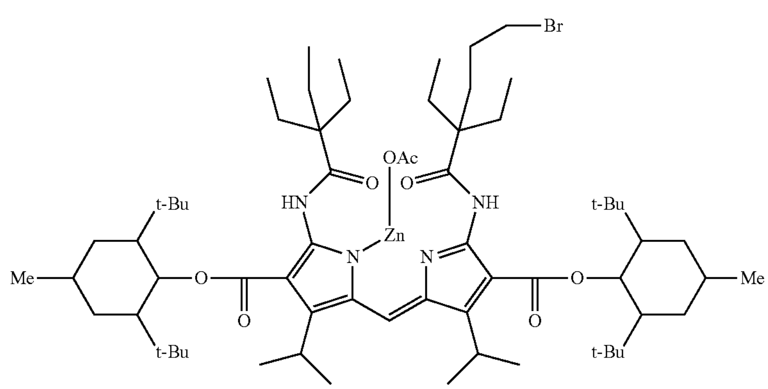

In the colorant (A) used in the present invention, a hydrogen atom in the colorant structure D may be substituted with a substituent selected from the substituent group A.

(Substituent Group A)

Examples of the substituent with which the colorant structure D may be substituted include a halogen atom (for example, fluorine, chlorine, or bromine), an alkyl group (a linear, branched, or cyclic alkyl group having preferably 1 to 48 carbon atoms and more preferably 1 to 24 carbon atoms; for example, methyl, ethyl, propyl, isopropyl, a butyl group (preferably, a t-butyl group), pentyl, hexyl, heptyl, octyl, 2-ethylhexyl, dodecyl, hexadecyl, cyclopropyl, cyclopentyl, cyclohexyl, 1-norbornyl, or 1-adamantyl), an alkenyl group (an alkenyl group having preferably 2 to 48 carbon atoms and more preferably 2 to 18 carbon atoms; for example, vinyl, allyl, or 3-buten-1-yl), an alkynyl group (an alkynyl group having preferably 2 to 20 carbon atoms, more preferably 2 to 12 carbon atoms, and still more preferably 2 to 8 carbon atoms; for example, propargyl or 3-pentynyl), an aryl group (an aryl group having preferably 6 to 48 carbon atoms and more preferably 6 to 24 carbon atoms; for example, phenyl or naphthyl), a heterocyclic group (a heterocyclic group having preferably 1 to 32 carbon atoms and more preferably 1 to 18 carbon atoms; for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), a silyl group (a silyl group having preferably 3 to 38 carbon atoms and more preferably 3 to 18 carbon atoms; for example, trimethylsilyl, triethylsilyl, tributylsilyl, t-butyldimethylsilyl, or t-hexyldimethylsilyl), a hydroxyl group, a cyano group, a nitro group, an alkoxy group (an alkoxy group having preferably 1 to 48 carbon atoms and more preferably 1 to 24 carbon atoms: for example, methoxy, ethoxy, 1-butoxy, 2-butoxy, isopropoxy, t-butoxy, dodecyloxy, or a cyclic alkyloxy group such as cyclopentyloxy or cyclohexyloxy), an aryloxy group (an aryloxy group having preferably 6 to 48 carbon atoms and more preferably 6 to 24 carbon atoms; phenoxy or 1-naphthoxy), a heterocyclic oxy group (a heterocyclic oxy group having preferably 1 to 32 carbon atoms and more preferably 1 to 18 carbon atoms; for example, 1-phenyltetrazole-5-oxy or 2-tetrahydropyranyloxy), a silyloxy group (a silyloxy group having preferably 1 to 32 carbon atoms and more preferably 1 to 18 carbon atoms; for example, trimethylsilyloxy, t-butyldimethylsilyloxy, or diphenylmethylsilyloxy), an acyloxy group (an acyloxy group having preferably 2 to 48 carbon atoms and more preferably 2 to 24 carbon atoms; for example, acetoxy, pivaloyloxy, benzoyloxy, or dodecanoyloxy), an alkoxycarbonyloxy group (an alkoxycarbonyloxy group having preferably 2 to 48 carbon atoms and more preferably 2 to 24 carbon atoms; for example, ethoxycarbonyloxy, t-butoxycarbonyloxy, or a cyclic alkyloxycarbonyloxy group such as cyclohexyloxycarbonyloxy), and an aryloxycarbonyloxy group (an aryloxycarbonyloxy group having preferably 7 to 32 carbon atoms and more preferably 7 to 24 carbon atoms; for example, phenoxycarbonyloxy).

Examples of the substituent further include a carbamoyloxy group (a carbamoyloxy group having preferably 1 to 48 carbon atoms and more preferably 1 to 24 carbon atoms; for example, N,N-dimethylcarbamoyloxy, N-butylcarbamoyloxy, N-phenylcarbamoyloxy, or N-ethyl-N-phenylcarbamoyloxy), a sulfamoyloxy group (a sulfamoyloxy group having preferably 1 to 32 carbon atoms and more preferably 1 to 24 carbon atoms; for example, N,N-diethylsulfamoyloxy or N-propylsulfamoyloxy), an alkylsulfonyloxy group (an alkylsulfonyloxy group having preferably 1 to 38 carbon atoms and more preferably 1 to 24 carbon atoms; for example, methylsulfonyloxy, hexadecylsulfonyloxy, or cyclohexylsulfonyloxy), an arylsulfonyloxy group (an arylsulfonyloxy group having preferably 6 to 32 carbon atoms and more preferably 6 to 24 carbon atoms; for example, phenylsulfonyloxy), an acyl group (an acyl group having preferably 1 to 48 carbon atoms and more preferably 1 to 24 carbon atoms; for example, formyl, acetyl, pivaloyl, benzoyl, tetradecanoyl, or cyclohexanoyl), an alkoxycarbonyl group (an alkoxycarbonyl group having preferably 2 to 48 carbon atoms and more preferably 2 to 24 carbon atoms; for example, methoxycarbonyl, ethoxycarbonyl, octadecyloxycarbonyl, cyclohexyloxycarbonyl, or 2,6-di-tert-butyl-4-methylcyclohexyloxycarbonyl), an aryloxycarbonyl group (an aryloxycarbonyl group having preferably 7 to 32 carbon atoms and more preferably 7 to 24 carbon atoms; for example, phenoxycarbonyl), a carbamoyl group (a carbamoyl group having preferably 1 to 48 carbon atoms and more preferably 1 to 24 carbon atoms; for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, or N,N-dicyclohexylcarbamoyl), an amino group (an amino group having preferably 32 carbon atoms or less and more preferably 24 carbon atoms or less; for example, amino, methylamino, N,N-dibutylamino, tetradecylamino, 2-ethylhexylamino, or cyclohexylamino), an anilino group (an anilino group having preferably 6 to 32 carbon atoms and more preferably 6 to 24 carbon atoms; for example, anilino or N-methylanilino), a heterocyclic amino group (a heterocyclic amino group having preferably 1 to 32 carbon atoms and more preferably 1 to 18 carbon atoms; for example, 4-pyridylamino), a carbonamido group (a carbon amido group having preferably 2 to 48 carbon atoms and more preferably 2 to 24 carbon atoms; for example, acetoamido, benzamido, tetradecaneamido, pivaloylamido, or cyclohexaneamido), a ureido group (preferably a ureido group having 1 to 32 carbon atoms, and more preferably 1 to 24 carbon atoms; for example, ureido, N,N-dimethylureido, or N-phenylureido), an imido group (an imido group having preferably 36 or less carbon atoms and more preferably 24 or less carbon atoms; for example, N-succinimido or N-phthalimido), and an alkoxycarbonylamino group (an alkoxycarbonylamino group having 2 to 48 carbon atoms and more preferably 2 to 24 carbon atoms: for example, methoxycarbonylamino, ethoxycarbonylamino, t-butoxycarbonylamino, octadecyloxycarbonylamino, or cyclohexyloxycarbonylamino).

Examples of the substituent further include an aryloxycarbonylamino group (an aryloxycarbonylamino group having preferably 7 to 32 carbon atoms and more preferably 7 to 24 carbon atoms; for example, phenoxycarbonylamino), a sulfonamide group (a sulfonamide group having preferably 1 to 48 carbon atoms and more preferably 1 to 24 carbon atoms; for example, methansulfonamide, butansulfonamide, benzensulfonamide, hexadecanamide, or cyclohexansulfonamide), a sulfamoylamino group (a sulfamoylamino group having preferably 1 to 48 carbon atoms and more preferably 1 to 24 carbon atoms; for example, N,N-dipropylsulfamoylamino, or N-ethyl-N-dodecylsulfamoylamino), an azo group (an azo group having preferably 1 to 32 carbon atoms and more preferably 1 to 24 carbon atoms; for example, phenylazo or 3-pyrazolyazo), an alkylthio group (preferably an alkylthio group having 1 to 48 carbon atoms and more preferably 1 to 24 carbon atoms; for example, methylthio, ethylthio, octylthio, or cyclohexylthio), an arylthio group (an arylthio group having preferably 6 to 48 carbon atoms and more preferably 6 to 24 carbon atoms; for example, phenylthio), a heterocyclic thio group (a heterocyclic thio group having preferably 1 to 32 carbon atoms and more preferably 1 to 18 carbon atoms; for example, 2-benzothiazolylthio, 2-pyridylthio, or 1-phenyltetrazolylthio), an alkylsulfinyl group (an alkylsulfinyl group having preferably 1 to 32 carbon group and more preferably 1 to 24 carbon atoms; for example, dodecanesulfinyl), an arylsulfinyl group (an arylsulfinyl group having preferably 6 to 32 carbon atoms and more preferably 6 to 24 carbon atoms; for example, phenylsulfinyl), an alkylsulfonyl group (an alkylsulfonyl group having 1 to 48 carbon atoms and more preferably 1 to 24 carbon atoms; for example, methylsulfonyl, ethylsulfonyl, propylsulfonyl, butylsulfonyl, isopropylsulfonyl, 2-ethylhexylsulfonyl, hexadecylsulfonyl, octylsulfonyl, or cyclohexylsulfonyl), an arylsulfonyl group (an arylsulfonyl group having preferably 6 to 48 carbon atoms, and more preferably 6 to 24 carbon atoms; for example, phenylsulfonyl or 1-naphthylsulfonyl), a sulfamoyl group (a sulfamoyl group having preferably 32 or less carbon atoms and more preferably 24 or less carbon atoms; for example, sulfamoyl, N,N-dipropylsulfamoyl, N-ethyl-N-dodecylsulfamoyl, N-ethyl-N-phenylsulfamoyl, or N-cyclohexylsulfamoyl), a sulfo group, a phosphonyl group (a phosphonyl group having preferably 1 to 32 carbon atoms and more preferably 1 to 24 carbon atoms; for example, phenoxyphosphonyl, octyloxyphosphonyl, or phenylphosphonyl), a phosphinoylamino group (a phosphinoylamino group having preferably 1 to 32 carbon atoms and more preferably 1 to 24 carbon atoms; for example, diethoxyphosphinoylamino or dioctyloxyphophinoylamino), and an alkyloxycarbonyloxy group (an alkyloxycarbonyloxy having preferably 5 to 30 carbon atoms and more preferably 5 to 10 carbon atoms).

These substituents may be further substituted. In addition, in a case where two or more substituents are present, the substituents may be the same as or different from each other. In addition, if possible, the substituents may be bonded to each other to form a ring.

The details can be found in paragraphs "0027" to "0038" of JP2013-29760A, the content of which is incorporated herein by reference.

<<<<Counter Anion>>>>

In a case where the colorant structure D in Formula (1) has a cation site and a counter anion, the counter anion is not particularly limited but is preferably a non-nucleophilic anion from the viewpoint of heat resistance. As the non-nucleophilic counter anion, a well-known non-nucleophilic counter anion described in paragraph "0075" and the like of JP2007-310315A. Here, non-nucleophilic represents a property in which the colorant does not undergo nucleophilic attack during heating.

It is preferable that the counter anion is at least one selected from the group consisting of a sulfonic acid anion, a carboxylic acid anion, a sulfonyl imide anion, a bis (alkylsulfonyl)imide anion, a tris(alkylsulfonyl)methide anion, a carboxylic acid anion, a tetraaryl borate anion, $—CON^-CO—$, $—CON^-SO_2—$, $BF_4^-$, $PF_6^-$, $SbF_6^-$, and $B^-(CN)_3OCH_3$. It is more preferable that the counter anion is at least one selected from the group consisting of a sulfonic acid anion, a sulfonyl imide anion, a bis(alkylsulfonyl)imide anion, a tris(alkylsulfonyl)methide anion, a carboxylic acid anion, a tetraaryl borate anion, $BF_4^-$, $PF_6^-$, and $SbF_6^-$.

It is still more preferable that the counter anion is a non-nucleophilic anion having a structure represented by any one of Formulae (AN-1) to (AN-5).

(AN-1)

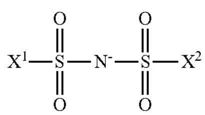

In Formula (AN-1), $X^1$ and $X^2$ each independently represent a fluorine atom or an alkyl group having a fluorine atom and 1 to 10 carbon atoms. $X^1$ and $X^2$ may be bonded to each other to form a ring.

$X^1$ and $X^2$ each independently represent a fluorine atom or an alkyl group having a fluorine atom and 1 to 10 carbon atoms, preferably a fluorine atom or an alkyl group having a fluorine atom and 1 to 10 carbon atoms, more preferably a perfluoroalkyl group having 1 to 10 carbon atoms, still more preferably a perfluoroalkyl group having 1 to 4 carbon atoms, and even still more preferably a trifluoromethyl group.

(AN-2)

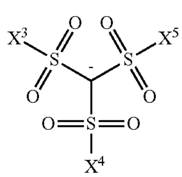

In Formula (AN-2), $X^3$, $X^4$, and $X^5$ each independently represent a fluorine atom or an alkyl group having a fluorine atom and 1 to 10 carbon atoms.

$X^3$, $X^4$, and $X^5$ each independently have the same definitions and the preferable ranges as $X^1$ and $X^2$.

$$X^6—SO_3^- \quad \text{(AN-3)}$$

In Formula (AN-3), $X^6$ represents an alkyl group having a fluorine atom and 1 to 10 carbon atoms.

$X^6$ represents preferably a perfluoroalkyl group having 1 to 10 carbon atoms and more preferably a perfluoroalkyl group having 1 to 4 carbon atoms.

$$O_3^-S—X^7—SO_3^- \quad \text{(AN-4)}$$

In Formula (AN-4), $X^7$ represents an alkylene group having a fluorine atom and 1 to 10 carbon atoms.

$X^7$ represents preferably a perfluoroalkylene group having 1 to 10 carbon atoms and more preferably a perfluoroalkylene group having 1 to 4 carbon atoms.

(AN-5)

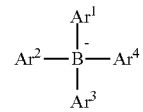

In Formula (AN-5), $Ar^1$, $Ar^2$, $Ar^3$, $Ar^4$ each independently represent an aryl group.

$Ar^1$, $Ar^2$, $Ar^3$, and $Ar^4$ each independently represent preferably an aryl group having 6 to 20 carbon atoms, an aryl group having 6 to 14 carbon atoms, and an aryl group having 6 to 10 carbon atoms.

The aryl group represented by $Ar^1$, $Ar^2$, $Ar^3$, or $Ar^4$ may have a substituent. In a case where the aryl group has a substituent, examples of the substituent include a halogen atom, an alkyl group, an aryl group, an alkoxy group, a carbonyl group, a carbonyloxy group, a carbamoyl group, a sulfo group, a sulfonamide group, and a nitro group. Among these a halogen atom or an alkyl group is preferable, a fluorine atom or an alkyl group is more preferable, and a fluorine atom or a perfluoroalkyl group having 1 to 4 carbon atoms is still more preferable.

$Ar^1$, $Ar^2$, $Ar^3$, or $Ar^4$ each independently represent more preferably a phenyl group having a halogen atom and/or an alkyl group having a halogen atom, and still more preferably a phenyl group having a fluorine atom and/or an alkyl group having a fluorine atom.

It is also preferable that the non-nucleophilic counter anion is represented by $—B(CN)_{n1}(OR^a)_{4-n1}$ ($R^a$ represents an alkyl group having 1 to 10 carbon atoms or an aryl group having 6 to 10 carbon atoms, and n1 represents an integer of 1 to 4). $R^a$ representing the alkyl group having 1 to 10 carbon atoms represents preferably an alkyl group having 1 to 6 carbon atoms and more preferably an alkyl group having 1 to 4 carbon atoms. $R^a$ as the aryl group having 6 to 10 carbon atoms represents preferably a phenyl group or a naphthyl group.

n1 represents preferably 1 to 3 and more preferably 1 to 2.

It is also preferable that the non-nucleophilic counter anion is represented by $—PF_6R^P{}_{(6-n2)}{}^-$ ($R^P$ represents a fluorinated alkyl group having 1 to 10 carbon atoms, and n2 represents an integer of 1 to 6). $R^P$ represents preferably an alkyl group having a fluorine atom and 1 to 6 carbon atoms, more preferably an alkyl group having a fluorine atom and 1 to 4 carbon atoms, and still more preferably a perfluoroalkyl group having a fluorine atom and 1 to 3 carbon atoms.

n2 represents preferably an integer of 1 to 4 and more preferably 1 or 2.

The mass of the non-nucleophilic counter anion used in the present invention per molecule is preferably 100 to 1000 and more preferably 200 to 500.

The colorant (A) according to the present invention may include one kind of non-nucleophilic counter anion or may include two or more kinds of non-nucleophilic counter anions.

Hereinafter, specific examples of the non-nucleophilic counter anion used in the present invention are shown, but the present invention is not limited thereto.

(IM-1)

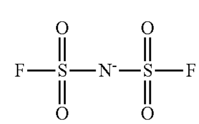

-continued
(IM-2)
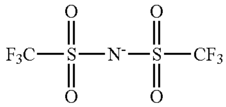
(IM-3)
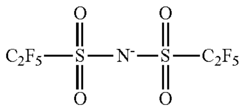
(IM-4)
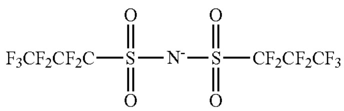
(IM-5)
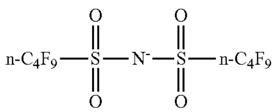
(IM-6)
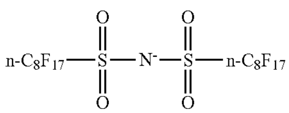
(IM-7)
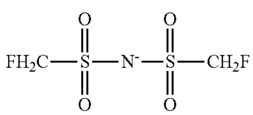
(IM-8)
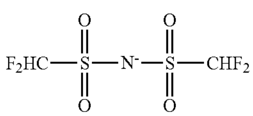
(IM-9)
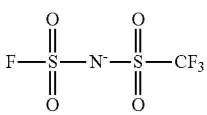
(IM-10)
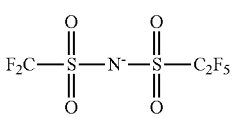
(IM-11)
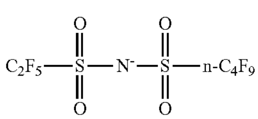
(IM-12)
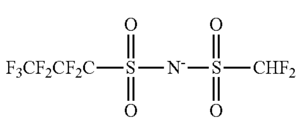
(IM-13)
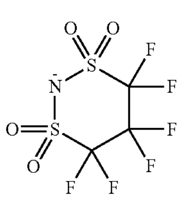
-continued
(IM-14)
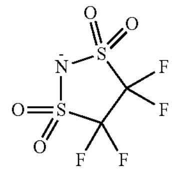
(IM-15)
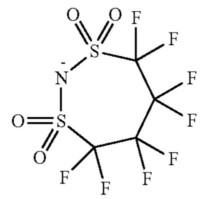
(MD-1)
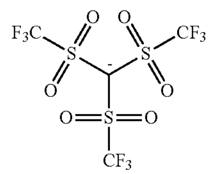
(MD-2)
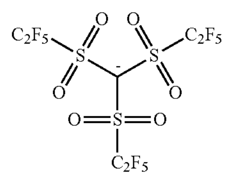
(MD-3)
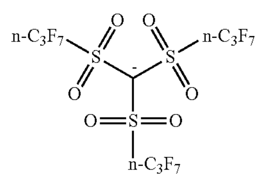
(MD-4)
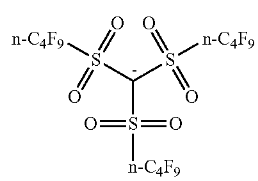
(MD-5)
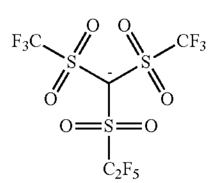
(MD-6)
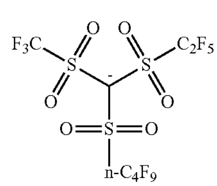

-continued
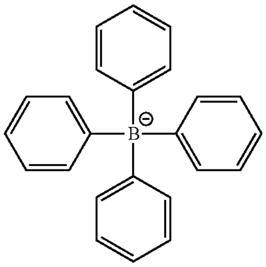
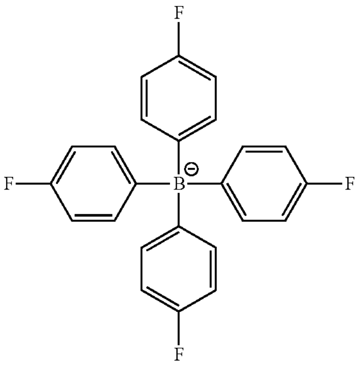
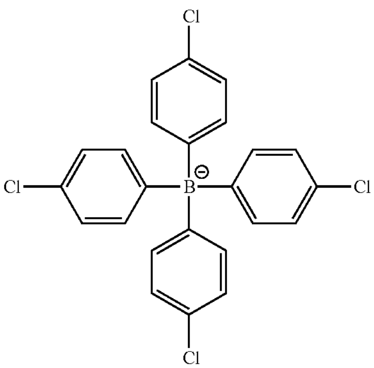
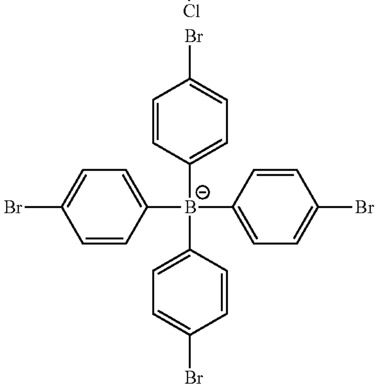
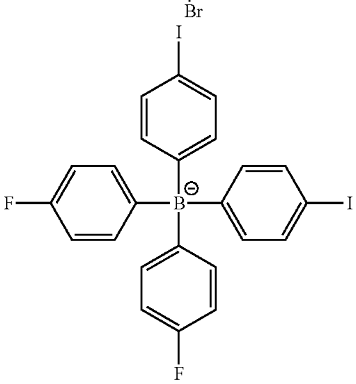
-continued
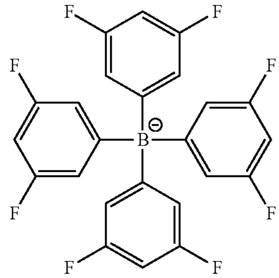
(a-1)
$CF_3SO_3^-$
(a-2)
$C_4F_{13}SO_3^-$
(a-3)
$C_8F_{17}SO_3^-$
(a-4)
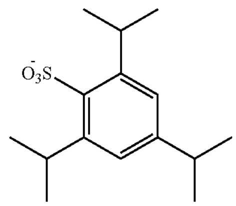
(a-5)
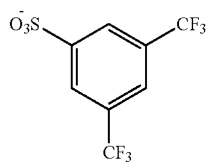
(a-6)
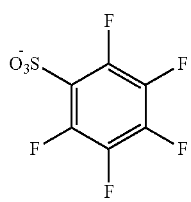
(a-7)
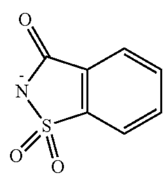
(a-8)
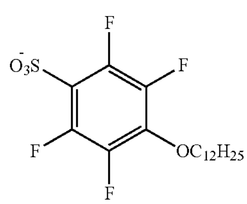
(a-9)
$^-O_3S—CF_2—SO_3^-$
(a-10)
$^-O_3S—CF_2CF_2—SO_3^-$
(a-11)
$^-O_3S—CF_2CF_2CF_2—SO_3^-$ -continued (a-12)

$^{-}O_3S—CF_2CF_2CF_2CF_2—SO_3^{-}$ (a-13)

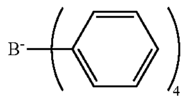

(a-14)

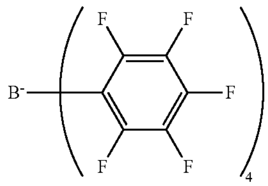

(a-15)

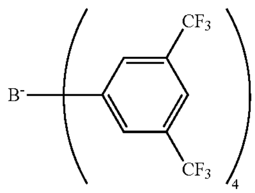

(a-16)

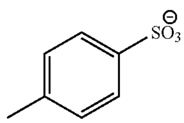

(a-17)

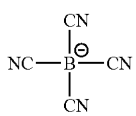

(a-18)

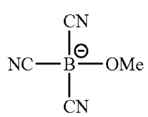

(a-19)

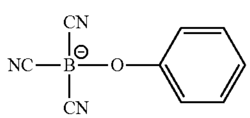

(a-20)

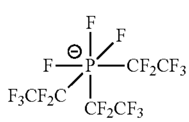

It is preferable that the colorant (A) has a polymerizable group.

As the polymerizable group, a well-known polymerizable group which is crosslinkable by a radical, an acid or heat can be used, and examples thereof include a group including an ethylenically unsaturated bond, a cyclic ether group (an epoxy group or an oxetane group), and a methylol group. In particular, a group having an ethylenically unsaturated bond is preferable, a (meth)acryloyl group is more preferable, and a (meth)acryloyl group derived from glycidyl (meth)acrylate and 3,4-epoxycyclohexylmethyl (meth)acrylate is still more preferable.

It is preferable that the colorant (A) has the following configurations:

$R^1$ represents a linking group selected from the above-described examples (1) to (6) and (9) to (11);

X represents —C(═O)O— or —O—;

Y represents a unsubstituted alkylene group;

$L^1$ represents a divalent linking group having at least one —S—;

$R^2$ represents a substituent having repeating units which are derived from a vinyl compound having a carboxyl group and a (meth)acryloyl group, and an average number of the repeating units is 2 to 20; and D represents a colorant structure selected from the group consisting of a triarylmethane colorant, a xanthene colorant, an anthraquinone colorant, a cyanine colorant, a squarylium colorant, a quinophthalone colorant, a phthalocyanine colorant, a subphthalocyanine colorant, an azo colorant, and a dipyrromethene colorant.

<<Various Properties of Colorant (A)>>

The weight average molecular weight of the colorant (A) is preferably 2000 to 15000, more preferably 3000 to 12500, and still more preferably 5000 to 11000. In a case where the weight average molecular weight is in the above-described range, color transfer properties are further improved. Further, developability is improved, and a development residue can be further reduced.

In the colorant (A), at least one of D, $L^1$, $R^1$, $R^2$, X, or Y in Formula (1) has an acid group. An acid value of the colorant (A) is preferably 10 mgKOH/g, more preferably 20 to 200 mgKOH/g, and still more preferably 20 to 150 mgKOH/g. In a case where the acid value is 20 mgKOH/g or higher, developability is improved, and a development residue can be further reduced.

The colorant (A) in the present invention is preferably a dye. A dye refers to a colorant having a substantial solubility in water or an organic solvent and preferably is an organic solvent-soluble dye which is soluble in the following organic solvents.

Examples of the organic solvent include esters (for example, 3-methyl ethoxypropionate, 3-ethyl ethoxypropionate, ethyl lactate, butyl acetate, or methyl 3-methoxypropionate), ethers (for example, methyl cellosolve acetate, ethyl cellosolve acetate, propylene glycol monomethyl ether, or propylene glycol monomethyl ether acetate), ketones (for example, methyl ethyl ketone, cyclohexanone, 2-heptanone, or 3-heptanone), and aromatic hydrocarbons (for example, toluene or xylene). The solubility in these solvents is preferably 1 to 50 mass %, more preferably 5 to 40 mass %, and still more preferably 10 to 30 mass %. In the above-described range, in a case where the coloring composition according to the present invention is applied to a color filter or the like, a preferable coating surface can be obtained, and a decrease in density caused by elution after application of other colors can be further reduced.

It is preferable that the colorant (A) according to the present invention has a turbidity of 2 ppm or lower in a 5 mass % cyclohexanone solution. The turbidity of the colorant (A) is a value measured using a method shown in Examples described below.

In the colorant (A) according to the present invention, the content of free metals which are neither bonded nor coordinated to the colorant (A) is preferably 2 ppm or lower, the free metals being selected from the group consisting of Al, Ca, Cu, Cr, Mg, Fe, Mn, Ni, Co, Cd, Li, Pb, Na, K, Zn, and P. In addition, the total content of the free metals are preferably 2 ppm or lower. According to this embodiment, a color filter having reduced defects is likely to be manufactured. The content of the free metals in the colorant (A) can be measured appropriately using the existing analysis methods. However, if possible, it is preferable that the measurement is performed by inductively coupled plasma atomic emission spectroscopy.

In the colorant (A) according to the present invention, the content of free Br which is neither bonded nor coordinated to the colorant (A) is preferably 900 ppm or lower and more preferably 600 ppm or lower. In addition, the content of free C1 which is neither bonded nor coordinated to the colorant (A) is preferably 900 ppm or lower, more preferably 600 ppm or lower, and still more preferably 300 ppm or lower. In addition, the total content of free Br and the free C1 is preferably 1500 ppm or lower and more preferably 900 ppm or lower. According to this embodiment, a color filter having reduced defects is likely to be manufactured. The content of free Br and the content of free C1 in the colorant (A) can be measured appropriately using the existing analysis methods. If possible, it is preferable that the measurement is performed using combustion ion chromatography according to BS EN 14582 (halogen content measurement).

In the coloring composition according to the present invention, as the colorant (A) one colorant may be used alone, or two or more colorants may be used in combination.

The content of the colorant (A) in the coloring composition according to the present invention is set in consideration of a content ratio of the pigment and the like described below.

A mass ratio (colorant (A)/pigment) of the colorant to the pigment is preferably 0.1 to 5, more preferably 0.2 to 2, and still more preferably 0.3 to 1.

The content of the colorant (A) in the coloring composition according to the present invention is preferably 1.0 to 50 mass %, more preferably 5.0 to 30 mass %, and still more preferably 10 to 25 mass % with respect to the total solid content of the coloring composition.

In a case where the colorant structure D in the colorant (A) according to the present invention is a xanthene colorant, an azo colorant, or a squarylium colorant (preferably a xanthene colorant), a red coloring composition can be obtained by using a red colorant (preferably a red pigment) and a yellow colorant (preferably a yellow pigment) in combination. In this case, a ratio (mass ratio) of the mass of the colorant (A) according to the present invention to the total mass of the red colorant and the yellow colorant is preferably 10:90 to 90:10.

<<Method of Synthesizing Colorant (A)>>

The colorant represented by Formula (1) is not particularly limited and can be synthesized, for example, using the following methods:

(1) a method of performing a polymer reaction using a polymer having a terminal, into which a functional group selected from a carboxyl group, hydroxyl group, an amino group, and the like, and an acid halide having a colorant structure, an alkyl halide having a colorant structure, or an isocyanate having a colorant structure;

(2) a method of performing a Michael addition reaction using a polymer having a terminal into which a carbon-carbon double bond is introduced, and a mercapto having a colorant structure;

(3) a method of causing a polymer having a terminal into which a carbon-carbon double bond is introduced, and a mercapto having a colorant structure to react with each other in the presence of a radical generator;

(4) a method of causing a polymer having a terminal into which plural mercaptos are introduced and a compound having a carbon-carbon double bond and a colorant structure to react with each other in the presence of a radical generator; and (5) a method of performing radical polymerization using a vinyl compound in the presence of a mercapto compound having a colorant structure.

Among these from the viewpoint of easiness of synthesis, the synthesis methods (2) to (5) are preferable, and the synthesis methods (3) to (5) are more preferable. In particular, in a case where the colorant (A) according to the present invention has a structure represented by Formula (2), the synthesis method (5) is most preferable from the viewpoint of easiness of synthesis.

As the synthesis method (5), more specifically, a method of performing a radical polymerization in the presence of a compound represented by the following Formula (5) is preferable.

$$(\text{D-L}^1\text{-Y—X—})_n\text{—R}^3\text{—(SH)}_m \qquad \text{Formula (5)}$$

In Formula (5), $R^3$ represents a (m+n)-valent linking group, S represents a sulfur atom, SH represents a mercapto group, X represents —C(═O)O—, —C(═O)—, —C(═O)$NR^{10}$—, —O—, —S(═O)—, or —$SO_2$—, and $R^{10}$ represents a hydrogen atom or an alkyl group.

Y represents an alkylene group, $L^1$ represents a single bond or a divalent linking group, D represents a colorant structure, m represents an integer of 1 to 13, n represents an integer of 2 to 14, m+n represents an integer of 3 to 15, and in a case where n represents 2 or more, plural D's may be different from each other.

In Formula (5), D, $L^1$, Y, X, m, and n each independently have the same definitions and the same preferable embodiments as D, $L^1$, Y, X, m, and n in Formula (1).

The compound represented by Formula (5) can be synthesized, for example, using the following methods. From the viewpoint of easiness of synthesis, the following method (7) is more preferable.

(6) a method of converting a halid compound having a colorant structure into a mercapto compound (for example, a method of performing hydrolysis causing the halid compound to react with thiourea, a method of causing the halide compound to directly react with NaSH, a method of performing hydrolysis causing the halid compound to react with $CH_3COSNa$); and (7) a method of performing an addition reaction or a substitution reaction using a compound having 3 to 15 mercapto groups in one molecule and a compound having a colorant structure and a functional group which is reactive with a mercapto group Preferable examples of "the functional group which is reactive with a mercapto group" described in the method (7) include an acid halide, an alkyl halide, an aryl halide, an isocyanate, and a carbon-carbon double bond.

It is preferable that "the functional group which is reactive with a mercapto group" is an aryl halide or an alkyl halide and a substitution reaction is performed, and it is preferable that "the functional group which is reactive with a mercapto group" is a carbon-carbon double bond and an addition reaction is a radical addition reaction. As the carbon-carbon double bond, from the viewpoint of reactivity with a mercapto group, a monosubstituted or disubstituted vinyl group is more preferable.

Specific examples of the compound having 3 to 15 mercapto groups in one molecule include the following compounds. In the following compound examples, p1 to p3, q1 to q4, and r1 to r6 each independently represent an integer of 0 or more. p1+p2+p3, q1+q2+q3+q4, and r1+r2+r3+r4+r5+r6 each independently represent an integer of 1 or more and preferably 40 or less. However, the present invention is not limited to these exemplary compounds.

(S-1)
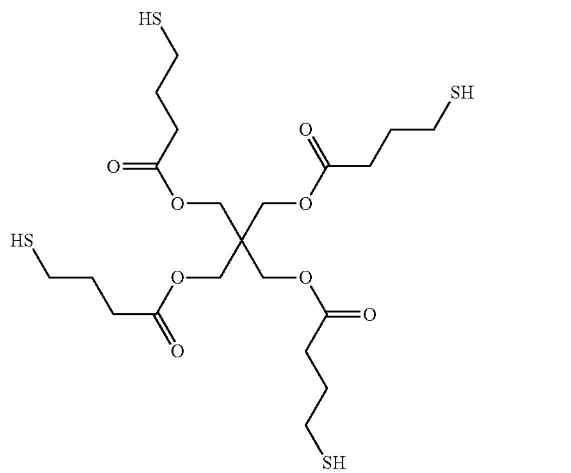
(S-2)
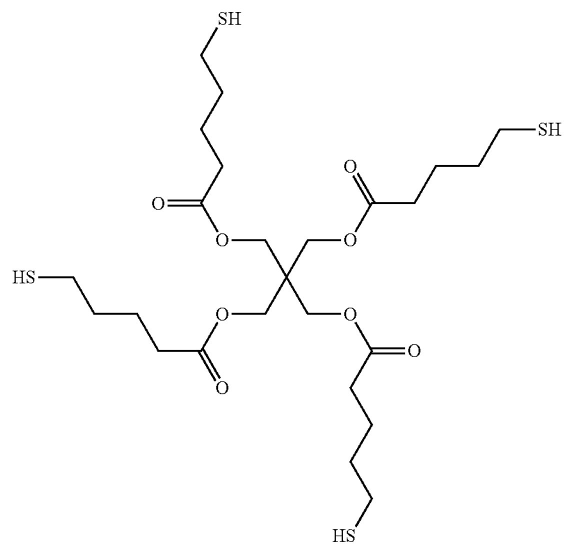
(S-3)
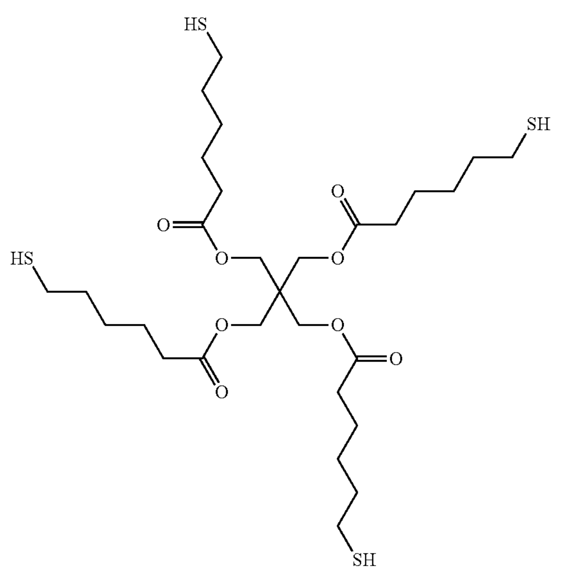
(S-4)
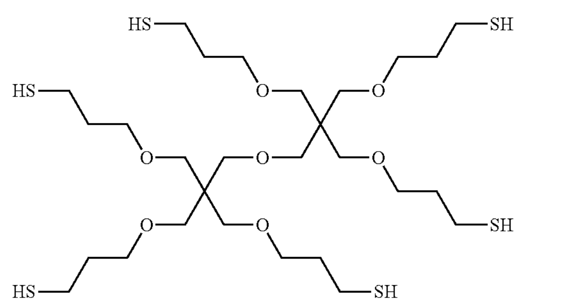
(S-5)
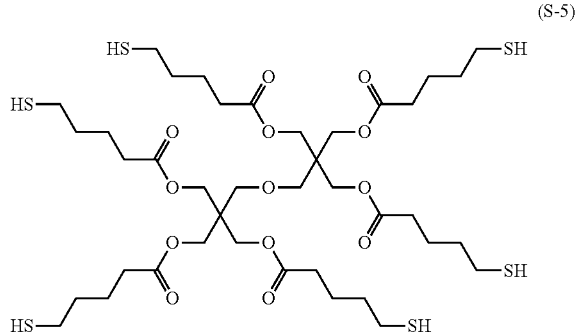
(S-6)
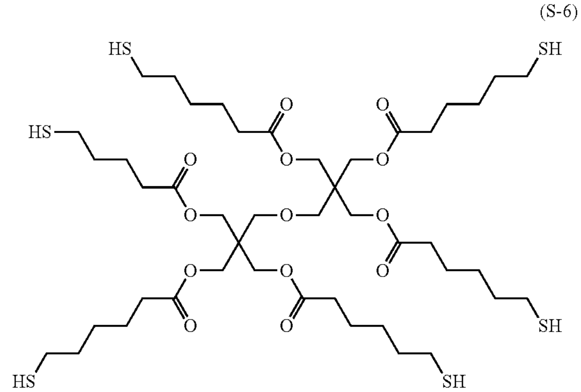

-continued
(S-7)
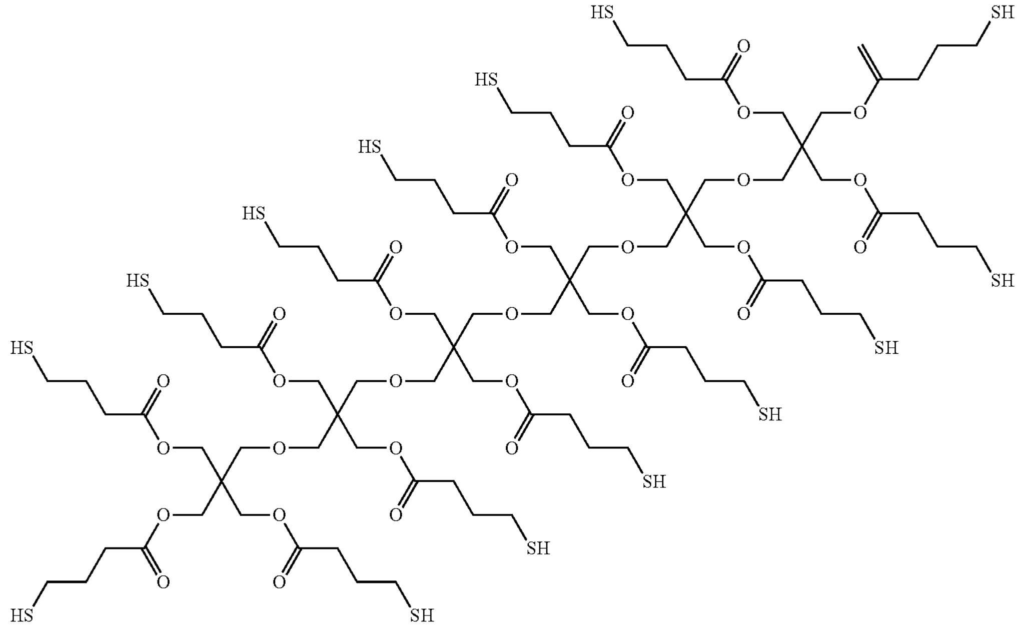
(S-15)
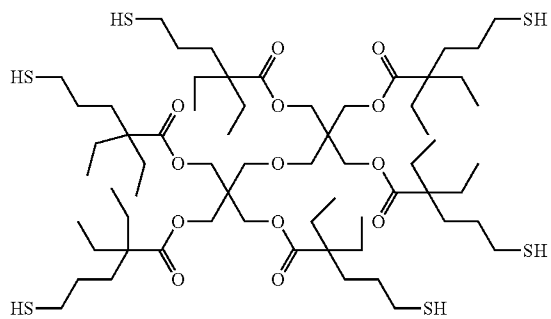
(S-16)
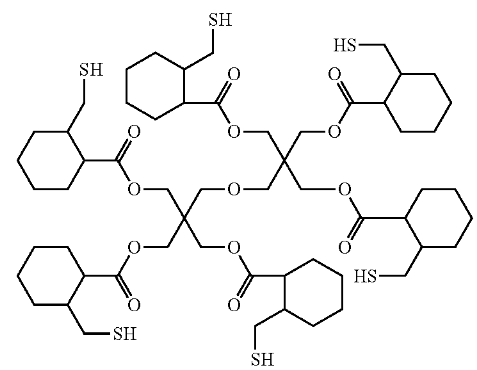
(S-8)
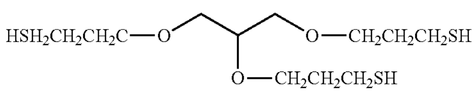
(S-9)
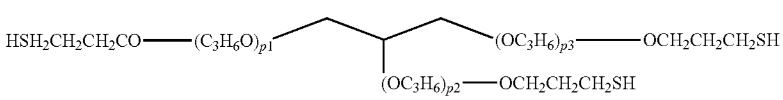
(S-10)
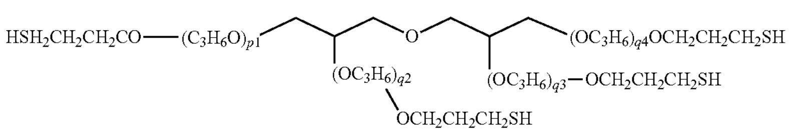
(S-11)
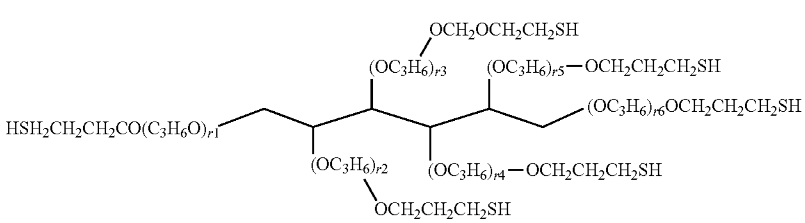

-continued (S-12)

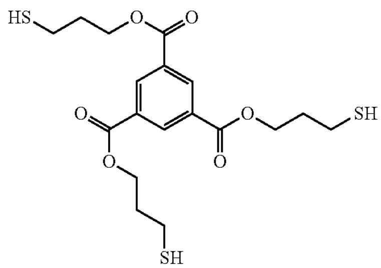

(S-13)

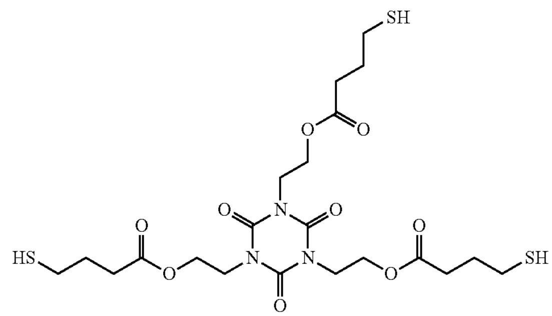

(S-14)

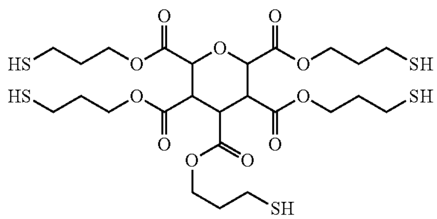

(S-17)

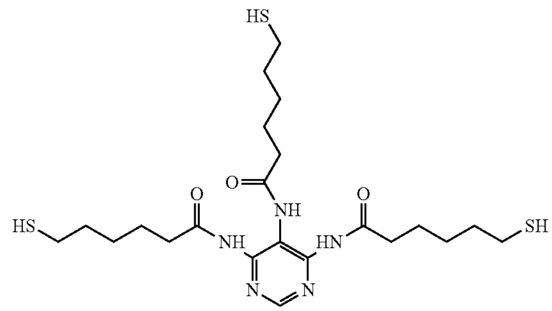

(S-18)

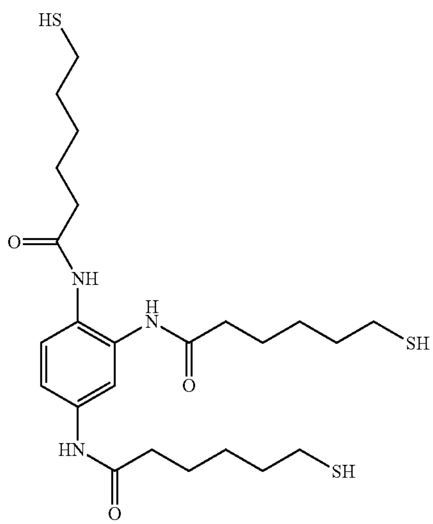

(S-19)

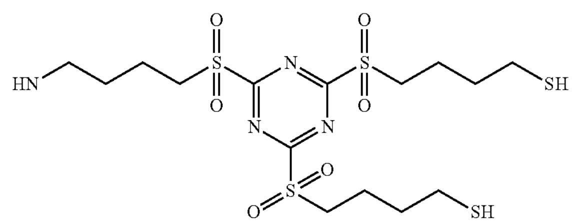

A product of a substitution reaction of “the compound having 3 to 15 mercapto groups in one molecule” and “the compound having a colorant structure and a functional group which is reactive with a mercapto group” is obtained using, for example, a method including: dissolving “the compound having 3 to 15 mercapto groups in one molecule” and “the compound having a colorant structure and a functional group which is reactive with a mercapto group” in an appropriate solvent; adding a base to the solution; and performing a substitution reaction at about 25° C. to 100° C. A product of a radical addition reaction of “the compound having 3 to 15 mercapto groups in one molecule” and “the compound having a colorant structure and a functional group which is reactive with a mercapto group” is obtained using, for example, a method (thiol-ene reaction method) including: dissolving “the compound having 3 to 15 mercapto groups in one molecule” and “the compound having a colorant structure and a functional group which is reactive with a mercapto group” in an appropriate solvent; adding a radical generator to the solution; and performing an addition reaction at about 50° C. to 100° C.

Examples of the appropriate solvent used in the thiol-ene reaction method and substitution reaction method can be arbitrarily selected according to the solubility of “the compound having 3 to 15 mercapto groups in one molecule”, “the compound having a colorant structure and a functional group which is reactive with a mercapto group”, and “the reaction product”.

Examples of the solvent include methanol, ethanol, propanol, isopropanol, 1-methoxy-2-propanol, 1-methoxy-2-propyl acetate, acetone, methyl ethyl ketone, methyl isobutyl ketone, methoxy propyl acetate, ethyl lactate, ethyl acetate, acetonitrile, tetrahydrofuran, dimethyl formamide, dimethylacetamide, chloroform, toluene, N-methylpyrrolidone (NMP), N-ethylpyrrolidone (NEP), 1,3-dimethyl-2-imidazolidinone (DMI), and pyridine. Among these solvents, a mixture of two or more kinds may be used.

In addition, examples of the radical generator which can be used include: an azo compound such as 2,2'-azobis (isobutyronitrile) (AIBN), 2,2'-azobis-(2,4'-dimethylvaleronitrile), or dimethyl 2,2'-azodiisobutyrate; a peroxide such as benzoyl peroxide; and a persulfate such as potassium persulfate or ammonium persulfate. Examples of the base which can be used include 1,8-diazabicyclo[5.4.0]-7-undecene, triethylamine, diisopropylamine, diisopropylethylamine, and sodium hydride.

The vinyl compound used in the synthesis method (5) is not particularly limited. For example, in a case where $R^2$ in Formula (1) represents a substituent having a repeating unit derived from a vinyl compound, the same substituent as the vinyl compound is used.

As the vinyl compound, one kind may be polymerized, or two or more kinds may be copolymerized in combination.

In addition, in a case where a photocurable composition requiring an alkali development process is used, it is more preferable that a vinyl compound having one or more acid groups and a vinyl compound not having one or more acid is copolymerized.

It is preferable that the colorant (A) according to the present invention is obtained by polymerizing the above-described vinyl compounds and the compound represented by Formula (5) using a well-known method. The compound represented by Formula (5) functions as a chain transfer agent and will be referred to simply as "chain transfer agent" hereinafter.

For example, the colorant (A) according to the present invention is obtained using a method (solution polymerization method) including: dissolving the vinyl compounds and the chain transfer agent in an appropriate solvent; adding a radical polymerization initiator to the solution; and performing polymerization in the solution at about 50° C. to 220° C.

Examples of the appropriate solvent used in the solution polymerization method can be arbitrarily selected according to the solubility of monomers to be used and an obtained copolymer. Examples of the solvent include methanol, ethanol, propanol, isopropanol, 1-methoxy-2-propanol, 1-methoxy-2-propyl acetate, acetone, methyl ethyl ketone, methyl isobutyl ketone, methoxy propyl acetate, ethyl lactate, ethyl acetate, acetonitrile, tetrahydrofuran, dimethyl formamide, chloroform, toluene, cyclohexanone, N-methyl pyrrolidone, N-ethyl pyrrolidone, dimethylacetamide, and 1,3-dimethyl-2-imidazolidinone (DMI). Among these solvents, a mixture of two or more kinds may be used.

In addition, examples of the radical polymerization initiator which can be used include: an azo compound such as 2,2'-azobis(isobutyronitrile) (AIBN), 2,2'-azobis-(2,4'-dimethylvaleronitrile), or dimethyl 2,2'-azodiisobutyrate; a peroxide such as benzoyl peroxide; and a persulfate such as potassium persulfate or ammonium persulfate.

<<Curable Compound>>

<<Polymerizable Compound>>

The coloring composition according to the present invention includes a curable compound. As the curable compound, a well-known polymerizable compound which is crosslinkable by a radical, an acid, or heat can be used. For example, a polymerizable compound having an ethylenically unsaturated bond, a cyclic ether (epoxy, oxetane), or methylol can be used. From the viewpoint of sensitivity, the polymerizable compound is suitably selected from compounds having at least one terminal ethylenically unsaturated bond and preferably two or more terminal ethylenically unsaturated bonds. Among these, a tetrafunctional or higher polyfunctional polymerizable compound is preferable, and a pentafunctional or higher polyfunctional polymerizable compound is more preferable.

This group of compounds is widely used and can be used in the present invention without any particular limitation. These compounds may have any chemical form such as a monomer, a prepolymer (that is, a dimer, a trimer, or an oligomer), or a mixture or polymer thereof. Among these polymerizable compounds in the present invention, one kind may be used alone, or two or more kinds may be used in combination.

Examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, a reactant of an unsaturated carboxylic acid ester or amide having an electrophilic substituent such as an isocyanate group or an epoxy group with a monofunctional or polyfunctional alcohol, amine, or mercapto, or a reactant of an unsaturated carboxylic acid ester or amide having a leaving substituent such as a halogen group or a tosyloxy group with a monofunctional or polyfunctional alcohol, amine, or mercapto is preferable In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In addition, as the polymerizable compound, a compound which has a boiling point at 100° C. or higher under normal pressure and has at least one ethylenically unsaturated group capable of addition polymerization is also preferable. Examples of the polymerizable compound can be found in paragraph "0227" of JP2013-29760A, the content of which is incorporated herein by reference.

In addition, as the compound which has a boiling point at 100° C. or higher under normal pressure and has at least one ethylenically unsaturated group capable of addition polymerization, a compound described in paragraphs "0254" to "0257" of JP2008-292970A can be used, the content of which is incorporated herein by reference.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth) acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), ethyleneoxy-modified dipentaerythritol hexaacrylate (A-DPH-12E as a commercially available product; manufactured by Shin-Nakamura Chemical Co., Ltd.), and a structure (for example, SR454, SR499, SR368, or SR494; manufactured by Sartomer) in which these (meth) acryloyl group is bonded through an ethylene glycol or a propylene glycol residue is preferable. Oligomers of the above-described examples can be used. Hereinafter, a preferable embodiment of the polymerizable compound will be described.

The polymerizable compound may have an acid group such as a carboxyl group, a sulfonate group, or a phosphate group. In a case where the polymerizable compound has a unreacted carboxyl group, this polymerizable compound can be used as it is. Optionally, an acid group may be introduced into the polymerizable compound by causing a nonaromatic carboxylic anhydride to react with, for example, a hydroxyl group of the polymerizable compound. Specific examples of the nonaromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

As the polymerizable compound having an acid group, an ester of an aliphatic polyhydroxy compound and an unsaturated carboxylic acid is preferable. A polymerizable compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-510 and M-520 as polybasic acid-modified acrylic oligomer (manufactured by Toagosei Co., Ltd.).

Among these polymerizable compounds having an acid group, one kind may be used alone, but a mixture of two or more kinds may be used because it is difficult to use a single compound due to reasons regarding the manufacturing of the polymerizable compounds.

The acid value of the polymerizable compound having an acid group is preferably 0.1 mgKOH/g to 40 mgKOH/g and more preferably 5 mgKOH/g to 30 mgKOH/g. In a case where the acid value of the polyfunctional monomer is 0.1 mgKOH/g or higher, development solubility is excellent. In a case where the acid value of the polyfunctional monomer is 40 mgKOHg or lower, there are advantageous effects in manufacturing and handleability. Further, photopolymerization performance is excellent, and curing properties such as surface smoothness of pixels are excellent. Therefore, in a case where a combination of two or more kinds of polymerizable compounds having different acid groups or a combination of a polymerizable compound having no acid group and a polymerizable compound having an acid group is used, it is preferable that all the acid groups in the polymerizable compounds is adjusted to be in the above-described range.

In addition, in a preferable embodiment, a polymerizable compound having a caprolactone structure can also be used as the polymerizable compound. The polymerizable compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a polymerizable compound having a caprolactone structure represented by the following Formula (Z-1) is preferable.

(Z-1)

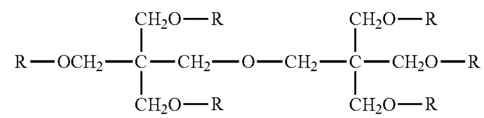

In Formula (Z-1), all of six R's represent a group represented by the following Formula (Z-2), or one to five R's among the six R's represent a group represented by the following Formula (Z-2) and the remaining R's represent a group represented by the following Formula (Z-3).

(Z-2)

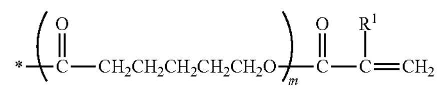

In Formula (Z-2), $R^1$ represents a hydrogen atom or a methyl group, m represents 1 or 2, and "*" represents a direct bond.

(Z-3)

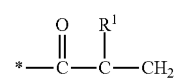

In Formula (Z-3), $R^1$ represents a hydrogen atom or a methyl group, and "*" represents a direct bond.

The polymerizable compound having a caprolactone structure is commercially available as for example, KAYARAD DPCA series (manufactured by Nippon Kayaku Co., Ltd.), and examples thereof include DPCA-20 (a compound in which m=1 in Formulae (Z-1) to (Z-3). the number of groups represented by Formula (Z-2)=2, and all of $R^1$'s represent a hydrogen atom), DPCA-30 (a compound in which m=1 in Formulae (Z-1) to (Z-3), the number of groups represented by Formula (Z-2)=3, and all of $R^1$'s represent a hydrogen atom), DPCA-60 (a compound in which m=6 in Formulae (Z-1) to (Z-3), the number of groups represented by Formula (Z-2)=6, and all of $R^1$'s represent a hydrogen atom), and DPCA-120 (a compound in which m=2 in Formulae (Z-1) to (Z-3), the number of groups represented by Formula (Z-2)=6, and all of $R^1$'s represent a hydrogen atom).

In the present invention, among these polymerizable compounds having a caprolactone structure, one kind may be used alone, or a mixture of two or more kinds may be used.

In addition, as the polymerizable compound, a compound represented by Formula (Z-4) or (Z-5) can be used.

(Z-4)

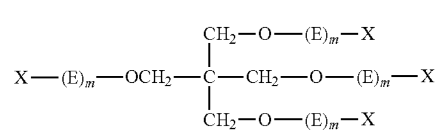

-continued (Z-5)

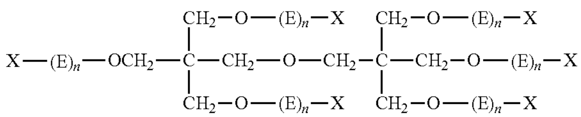

In Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent an acryloyl group, a methacryloyl group, a hydrogen atom, or a carboxyl group.

In Formula (Z-4), the total number of acryloyl groups and methacryloyl groups is 3 or 4, m's each independently represent an integer of 0 to 10, and the sum of m's is an integer of 0 to 40. In a case where the sum of m's is 0, one of X's represents a carboxyl group.

In Formula (Z-5), the total number of acryloyl groups and methacryloyl groups is 5 or 6, n's each independently represent an integer of 0 to 10, and the sum of n's is an integer of 0 to 60. In a case where the sum of n's is 0, one of X's represents a carboxyl group.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in —$((CH_2)_yCH_2O)$— or —$((CH_2)_yCH(CH_3)O)$— of Formula (Z-4) or (Z-5), a terminal thereof on an oxygen atom side is bonded to X.

Among these compounds represented by Formula (Z-4) and (Z-5), one kinds may be used alone, or two or more kinds may be used in combination. In particular, it is preferable that all of six X's in Formula (Z-5) represent an acryloyl group.

In addition, the total content of the compound represented by Formula (Z-4) or (Z-5) in the polymerizable compound is preferably 20 mass % or higher and more preferably 50 mass % or higher.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

Among the compounds represented by Formula (Z-4) and (Z-5), a pentaerythritol derivative and/or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

(a)

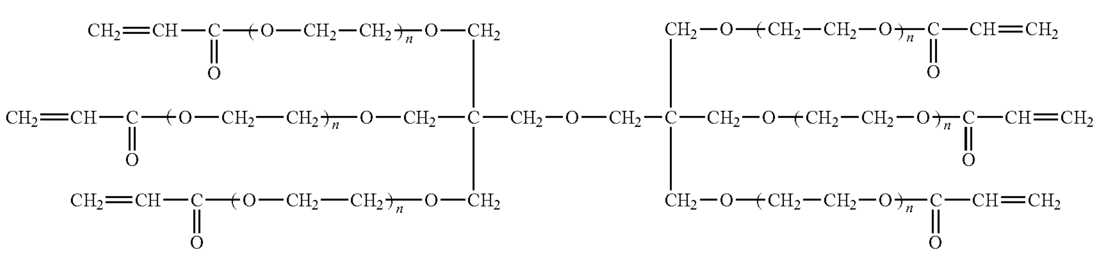

(The sum of n's is 6)

(b)

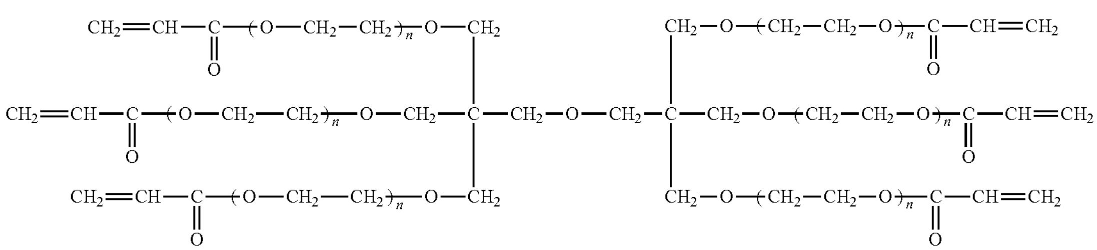

(The sum of n's is 12)

-continued (c)

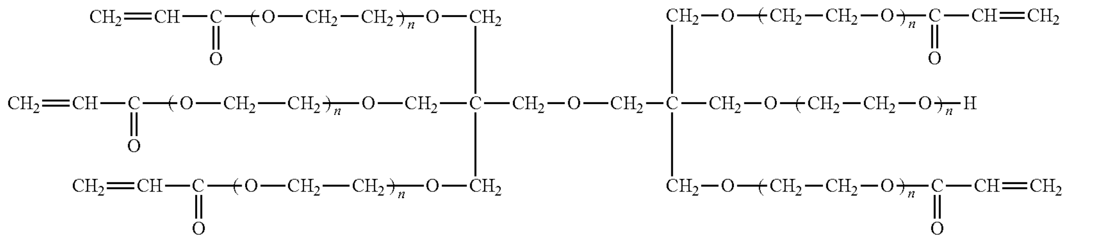

(The sum of n's is 12)

(d)

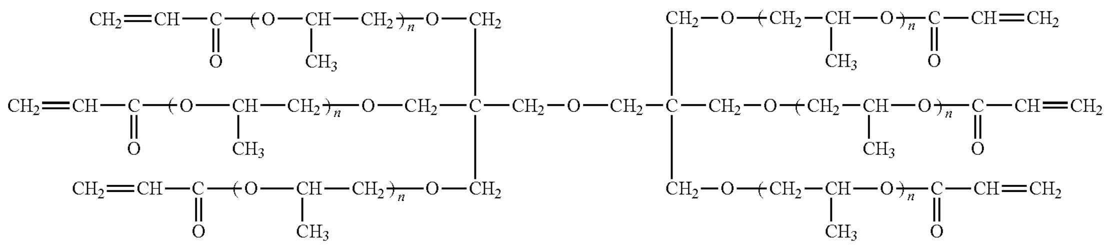

(The sum of n's is 6)

(e)

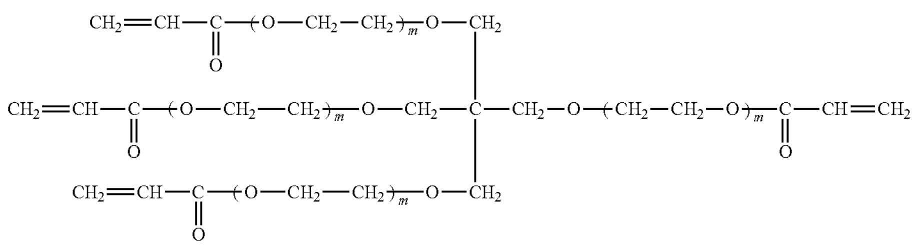

(The sum of m's is 4)

(f)

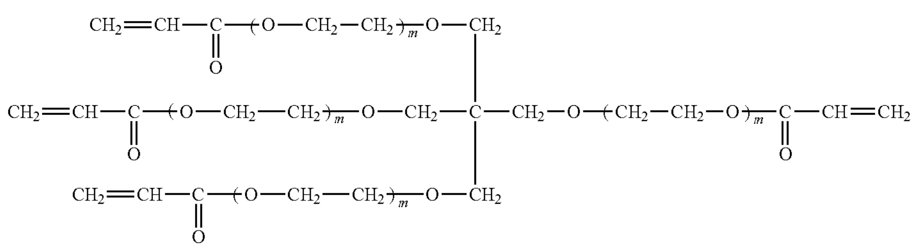

(The sum of m's is 12)

Examples of a commercially available product of the polymerizable compound represented by Formula (Z-4) or (Z-5) include SR-494 (manufactured by Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

In addition, in the present invention, as the polymerizable compound, a compound having an epoxy group can also be used. As the compound having an epoxy group, a compound having two or more epoxy groups in one molecule is preferable. By using the compound having two or more epoxy groups in one molecule, the effects of the present invention can be more effectively achieved. The number of epoxy groups in one molecule is preferably 2 to 10, more preferably 2 to 5, and still more preferably 3.

It is preferable that the compound having an epoxy group in the present invention has a structure in which two benzene rings are linked to each other through a hydrocarbon group. As the hydrocarbon group, an alkylene group having 1 to 6 carbon atoms is preferable. In addition, it is preferable that the epoxy groups are linked to each other through a linking group. Examples of the linking group include an alkylene group, an arylene group, —O—, a structure represented by —NR'— ($R^1$ represents a hydrogen atom, an alkyl group which may have a substituent, or an aryl group which may have a substituent and preferably represents a hydrogen atom), and a group having at least one selected from —$SO_2$—, —CO—, —O—, and —S—.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq. By setting the upper limit value of the epoxy equivalent of the compound having an epoxy group to be 500 g/eq or lower, the above-described effects can be obtained. In addition, by setting the lower limit value of the epoxy equivalent of the compound having an epoxy group to be 100 g/eq or higher, which is preferable in stability in practice.

The compound having an epoxy group may be a low molecular weight compound (for example, molecule weight: 2000 or lower or 1000 or lower) or a high molecular weight compound (macromolecule; for example, molecular weight: 1000 or higher, and in the case of a polymer, weight average molecular weight: 1000 or higher). The weight average molecular weight of the compound having an epoxy group is preferably 200 to 100000 and more preferably 500 to 50000.

As the compound having an epoxy group which has a structure in which two benzene rings are linked to each other through a hydrocarbon group, a compound represented by the following Formula (E1) is preferably used.

(E1)

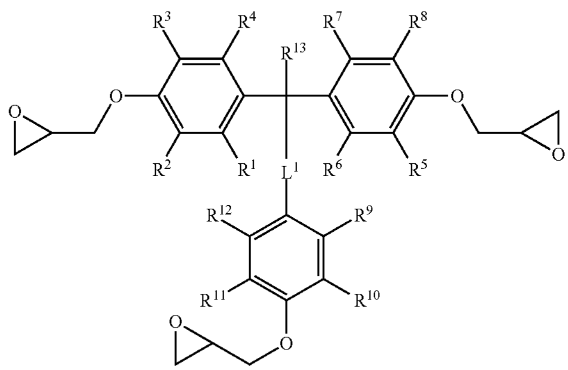

In Formula (E1), $R^1$ to $R^{13}$ each independently represent a hydrogen atom, an alkyl group, an alkoxy group, or a halogen atom. $L^1$ represents a single bond or a divalent linking group.

In Formula (E1), $R^1$ to $R^{13}$ each independently represent a hydrogen atom, an alkyl group, an alkoxy group, or a halogen atom.

As the alkyl group represented by $R^1$ to $R^{13}$, an alkyl group having 1 to 30 carbon atoms is preferable, and an alkyl group having 1 to 12 carbon atoms is more preferable.

The alkyl group may be linear, branched, or cyclic and is preferably linear or branched and more preferably linear.

The alkyl group may have a substituent or may be unsubstituted. It is preferable that the alkyl group is unsubstituted.

Examples of the substituent which may be included in the alkyl group include an alkyl group (a linear, branched, or cyclic alkyl group having preferably 1 to 48 carbon atoms and more preferably 1 to 24 carbon atoms; for example, methyl, ethyl, propyl, isopropyl, n-butyl, tert-butyl, pentyl, hexyl, heptyl, octyl, 2-ethylhexyl, dodecyl, hexadecyl, cyclopropyl, cyclopentyl, cyclohexyl, 1-norbornyl, or 1-adamantyl), an alkenyl group (an alkenyl group having preferably 2 to 48 carbon atoms and more preferably 2 to 18 carbon atoms; for example, vinyl, allyl, or 3-buten-1-yl), an alkynyl group (an alkynyl group having preferably 2 to 20 carbon atoms, more preferably 2 to 12 carbon atoms, and still more preferably 2 to 8 carbon atoms; for example, propargyl or 3-pentynyl), an aryl group (an aryl group having preferably 6 to 48 carbon atoms and more preferably 6 to 24 carbon atoms; for example, phenyl or naphthyl), a heterocyclic group (a heterocyclic group having preferably 1 to 32 carbon atoms and more preferably 1 to 18 carbon atoms; for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), a silyl group (a silyl group having preferably 3 to 38 carbon atoms and more preferably 3 to 18 carbon atoms; for example, trimethylsilyl, triethylsilyl, tributylsilyl, tert-butyldimethylsilyl, or tert-hexyldimethylsilyl), a hydroxyl group, a cyano group, a nitro group, an alkoxy group (an alkoxy group having preferably 1 to 48 carbon atoms, more preferably 1 to 24 carbon atoms, and still more preferably 1 to 3 carbon atoms; for example, methoxy, ethoxy, 1-butoxy, 2-butoxy, isopropoxy, tert-butoxy, dodecyloxy, or a cyclic alkyloxy group such as cyclopentyloxy or cyclohexyloxy), an aryloxy group (an aryloxy group having preferably 6 to 48 carbon atoms and more preferably 6 to 24 carbon atoms; phenoxy or 1-naphthoxy), a heterocyclic oxy group (a heterocyclic oxy group having preferably 1 to 32 carbon atoms and more preferably 1 to 18 carbon atoms; for example, 1-phenyltetrazole-5-oxy or 2-tetrahydropyranyloxy), a silyloxy group (a silyloxy group having preferably 1 to 32 carbon atoms and more preferably 1 to 18 carbon atoms; for example, trimethylsilyloxy, tert-butyldimethylsilyloxy, or diphenylmethylsilyloxy), an acyloxy group (an acyloxy group having preferably 2 to 48 carbon atoms and more preferably 2 to 24 carbon atoms; for example, acetoxy, pivaloyloxy, a 2-ethylhexanoyloxy group, a 2-methylpropanoyloxy group, an octanoyloxy group, a butanoyloxy group, a 2-methylbutanoyloxy group, benzoyloxy, or dodecanoyloxy), an alkoxycarbonyloxy group (an alkoxycarbonyloxy group having preferably 2 to 48 carbon atoms and more preferably 2 to 24 carbon atoms; for example, ethoxycarbonyloxy, tert-butoxycarbonyloxy, or a cyclic alkyloxycarbonyloxy group such as cyclohexyloxycarbonyloxy), an aryloxycarbonyloxy group (an aryloxycarbonyloxy group having preferably 7 to 32 carbon atoms and more preferably 7 to 24 carbon atoms; for example, phenoxycarbonyloxy), a carbamoyloxy group (a carbamoyloxy group having preferably 1 to 48 carbon atoms and more preferably 1 to 24 carbon atoms; for example, N,N-dimethylcarbamoyloxy, N-butylcarbamoyloxy, N-phenylcarbamoyloxy, or N-ethyl-N-phenylcarbamoyloxy), a sulfamoyloxy group (a sulfamoyloxy group having preferably 1 to 32 carbon atoms and more preferably 1 to 24 carbon atoms; for example, N,N-diethylsulfamoyloxy or N-propylsulfamoyloxy), an alkylsulfonyloxy group (an alkylsulfonyloxy group having preferably 1 to 38 carbon atoms and more preferably 1 to 24 carbon atoms; for example, methylsulfonyloxy, hexadecylsulfonyloxy, or cyclohexylsulfonyloxy), an arylsulfonyloxy group (an arylsulfonyloxy group having preferably 6 to 32 carbon atoms and more preferably 6 to 24 carbon atoms; for example, phenylsulfonyloxy), an acyl group (an acyl group having preferably 1 to 48 carbon atoms and more preferably 1 to 24 carbon atoms; for example, formyl, acetyl, pivaloyl, benzoyl, tetradecanoyl, or cyclohexanoyl), an alkoxycarbonyl group (an alkoxycarbonyl group having preferably 2 to 48 carbon atoms and more preferably 2 to 24 carbon atoms; for example, methoxycarbonyl, ethoxycarbonyl, octadecyloxycarbonyl, cyclohexyloxycarbonyl, or 2,6-di-tert-butyl-4-methylcyclohexyloxycarbonyl), an aryloxycarbonyl group (an aryloxycarbonyl group having preferably 7 to 32 carbon atoms and more preferably 7 to 24 carbon atoms; for example, phenoxycarbonyl), a carbamoyl group (a carbamoyl group having preferably 1 to 48 carbon atoms and more preferably 1 to 24 carbon atoms; for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, or N,N-dicyclohexylcarbamoyl), an amino group (an amino group having preferably 32 carbon atoms or less and more preferably 24 carbon atoms or less; for example, amino, methylamino, N,N-dibutylamino, tetradecylamino, 2-ethylhexylamino, or cyclohexylamino), an anilino group (an anilino group having preferably 6 to 32 carbon atoms and more preferably 6 to 24 carbon atoms; for example, anilino or N-methylanilino), a heterocyclic amino group (a heterocyclic amino group having preferably 1 to 32 carbon atoms and more preferably 1 to 18 carbon atoms; for example, 4-pyridylamino), a carbonamido group (a carbon amido group having preferably 2 to 48 carbon atoms and more preferably having 2 to 24 carbon atoms: for example, acetoamido, benzamido, tetradecaneamido, pivaloylamido, or cyclohexaneamido), a ureido group (preferably a ureido group having 1 to 32 carbon atoms, and more preferably having 1 to 24 carbon atoms; for example, ureido, N,N-dimethylureido, or N-phenylureido), an imido group (an imido group having preferably 36 or less carbon atoms and more preferably 24 or less carbon atoms; for example, N-succinimido or N-phthalimido), an alkoxycarbonylamino group (an alkoxycarbonylamino group having 2 to 48 carbon atoms and more preferably 2 to 24 carbon atoms; for example, methoxycarbonylamino, ethoxycarbonylamino, tert-butoxycarbonylamino, octadecyloxycarbonylamino, or cyclohexyloxycarbonylamino), an aryloxycarbonylamino group (an aryloxycarbonylamino group having preferably 7 to 32 carbon atoms and more preferably 7 to 24 carbon atoms; for example, phenoxycarbonylamino), a sulfonamide group (a sulfonamide group having preferably 1 to 48 carbon atoms and more preferably 1 to 24 carbon atoms; for example, methansulfonamide, butansulfonamide, benzensulfonamide, hexadecanamide, or cyclohexansulfonamide), a sulfamoylamino group (a sulfamoylamino group having preferably 1 to 48 carbon atoms and more preferably 1 to 24 carbon atoms; for example, N,N-dipropylsulfamoylamino, or N-ethyl-N-dodecylsulfamoylamino), an azo group (an azo group having preferably 1 to 32 carbon atoms and more preferably 1 to 24 carbon atoms; for example, phenylazo or 3-pyrazolyazo), an alkylthio group (preferably an alkylthio group having 1 to 48 carbon atoms and more preferably 1 to 24 carbon atoms; for example, methylthio, ethylthio, octylthio, or cyclohexylthio), an arylthio group (an arylthio group having preferably 6 to 48 carbon atoms and more preferably 6 to 24 carbon atoms; for example, phenylthio), a heterocyclic thio group (a heterocyclic thio group having preferably 1 to 32 carbon atoms and more preferably 1 to 18 carbon atoms; for example, 2-benzothiazolylthio, 2-pyridylthio, or 1-phenyltetrazolylthio), an alkylsulfinyl group (an alkylsulfinyl group having preferably 1 to 32 carbon group and more preferably 1 to 24 carbon atoms; for example, dodecanesulfinyl), an arylsulfinyl group (an arylsulfinyl group having preferably 6 to 32 carbon atoms and more preferably 6 to 24 carbon atoms; for example, phenylsulfinyl), an alkylsulfonyl group (an alkylsulfonyl group having 1 to 48 carbon atoms and more preferably 1 to 24 carbon atoms; for example, methylsulfonyl, ethylsulfonyl, propylsulfonyl, butylsulfonyl, isopropylsulfonyl, 2-ethylhexylsulfonyl, hexadecylsulfonyl, octylsulfonyl, or cyclohexylsulfonyl), an arylsulfonyl group (an arylsulfonyl group having preferably 6 to 48 carbon atoms, and more preferably 6 to 24 carbon atoms; for example, phenylsulfonyl or 1-naphthylsulfonyl), a sulfamoyl group (a sulfamoyl group having preferably 32 or less carbon atoms and more preferably 24 or less carbon atoms; for example, sulfamoyl, N,N-dipropylsulfamoyl, N-ethyl-N-dodecylsulfamoyl, N-ethyl-N-phenylsulfamoyl, or N-cyclohexylsulfamoyl), a sulfo group, a phosphonyl group (a phosphonyl group having preferably 1 to 32 carbon atoms and more preferably 1 to 24 carbon atoms; for example, phenoxyphosphonyl, octyloxyphosphonyl, or phenylphosphonyl), and a phosphinoylamino group (a phosphinoylamino group having preferably 1 to 32 carbon atoms and more preferably 1 to 24 carbon atoms, for example, diethoxyphosphinoylamino or dioctyloxyphophinoylamino). These groups may further have a substituent. In addition, in a case where two or more substituents are present, the substituents may be the same as or different from each other. In addition, if possible, the substituents may be bonded to each other to form a ring.

As the alkoxy group represented by $R^1$ to $R^{13}$, an alkoxy group having 1 to 30 carbon atoms is preferable, and an alkyl group having 1 to 12 carbon atoms is more preferable.

The alkoxy group may have a substituent or may be unsubstituted. It is preferable that the alkyl group is unsubstituted. Specific examples of the substituent are as described above as the substituent which may be included in the alkyl group.

Examples of the halogen atom represented by $R^1$ to $R^{13}$ include a fluorine atom, a chlorine atom, a bromine atom, and an iodine atom.

$R^1$ to $R^{13}$ each independently represent preferably a hydrogen atom, a methyl group, an ethyl group, or a methoxy group. In addition, $R^{13}$ represents preferably a methyl group. In addition, $R^1$ to $R^{12}$ represent preferably a hydrogen atom.

In Formula (E1), $L^1$ represents a single bond or a divalent linking group. $L^1$ represents preferably a divalent linking group.

Examples of the divalent linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from $—SO_2—$, —CO—, —O—, and —S—. The above groups may have a substituent. Examples of the substituent are as described above as the substituent which may be included in the alkyl group represented by $R^1$ to $R^{13}$.

The number of carbon atoms in the alkylene group is preferably 1 to 30 and more preferably 1 to 12.

The number of carbon atoms in the arylene group is preferably 6 to 30 and more preferably 6 to 12.

It is more preferable that the compound represented by Formula (E1) is a compound represented by the following Formula (E1a).

(E1a)

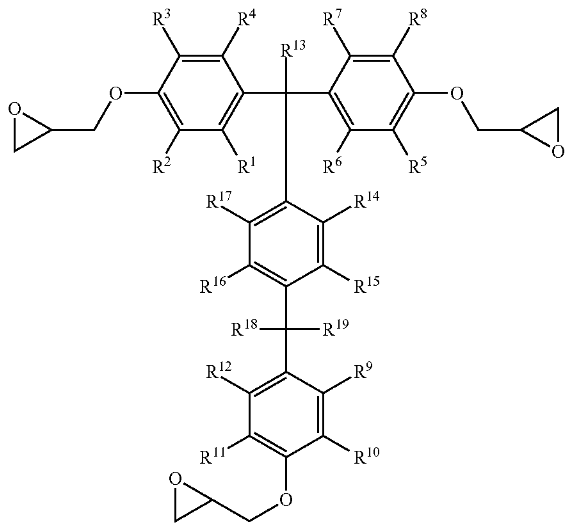

In Formula (E1a), $R^1$ to $R^{19}$ each independently represent a hydrogen atom, an alkyl group, an alkoxy group, or a halogen atom.

$R^1$ to $R^{19}$ in Formula (E1a) have the same definitions as $R^1$ to $R^{13}$ in Formula (E1).

In particular, $R^1$ to $R^{19}$ each independently represent preferably a hydrogen atom, a methyl group, an ethyl group, or a methoxy group. In addition, it is more preferable that one or more selected from $R^{13}$, $R^{18}$, and $R^{19}$ represent a methyl group. It is still more preferable that $R^{13}$, $R^{18}$, and $R^{19}$ represent a methyl group and $R^1$ to $R^{12}$ and $R^{14}$ to $R^{17}$ represent a hydrogen atom.

Examples of the compound represented by Formula (E1a) include a compound obtained as a major component by a reaction of a phenol resin and an epihalohydrin (at least one selected from epichlorohydrin and epibromohydrin), the phenol resin obtained by a reaction of 1-[4-(1-hydroxy-1-methyl-ethyl)phenol]ethanone and a phenol (a phenol which is unsubstituted or has an alkyl group having 1 to 12 carbon atoms, an alkoxy group having 1 to 12 carbon atoms, or a halogen atom as a substituent). Examples of a commercially available product of the compound include VG-3101L (manufactured by Printec Co.) and NC-6000 and NC-6300 (manufactured by Nippon Kayaku Co., Ltd.).

As the compound having an epoxy group, for example, a compound represented by the following Formula (EP1) can be used.

(EP1)

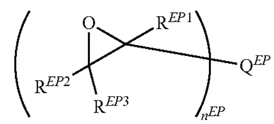

In Formula (EP1), $R^{EP1}$ to $R^{EP3}$ each independently represent a hydrogen atom, a halogen atom, or an alkyl group. The alkyl group may have a cyclic structure or may have a substituent. In addition, $R^{EP1}$ and $R^{EP2}$, or $R^{EP2}$ and $R^{EP3}$ may be bonded to each other to form a ring structure. Examples of the substituent which may be included in the alkyl group include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group, and an alkylamido group.

$Q^{EP}$ represents a single bond or a $n^{EP}$-valent organic group. $R^{EP1}$ to $R^{EP3}$ may be bonded to $Q^{EP}$ to form a ring structure.

$n^{EP}$ represents an integer of 2 or more, preferably 2 to 10, and more preferably 2 to 6. In a case where $Q^{EP}$ represents a single bond, $n^{EP}$ represents 2.

In a case where $Q^{EP}$ represents a $n^{EP}$-valent organic group, preferable examples of the $n^{EP}$-valent organic group include a branched or cyclic $n^{EP}$-valent saturated hydrocarbon group (having preferably 2 to 20 carbon atoms), a $n^{EP}$-valent aromatic ring group (having preferably 6 to 30 carbon atoms), and a $n^{EP}$-valent organic group having a structure in which a divalent linking group such as an ether group, an ester group, an amido group, a sulfonamide group, or an alkylene group (preferably an alkylene group having 1 to 4 carbon atoms, and more preferably a methylene group), a trivalent linking group such as —N(−)$_2$, or a combination thereof is linked to a branched or cyclic saturated hydrocarbon or aromatic hydrocarbon.

Hereinafter, specific examples are shown, but the present invention is not limited thereto.

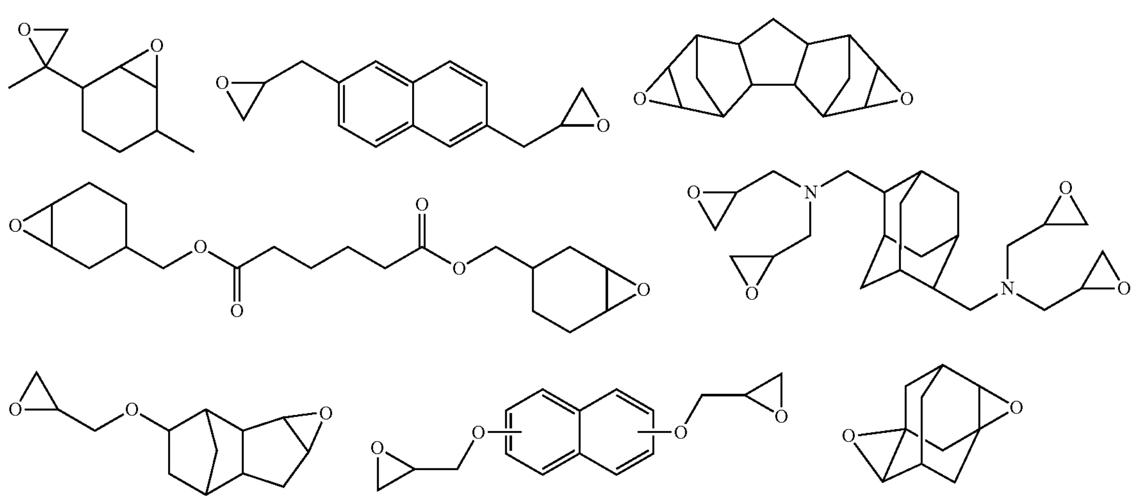

-continued
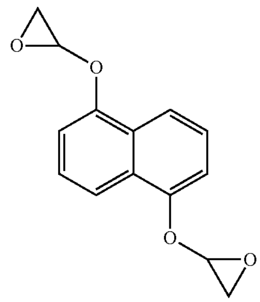
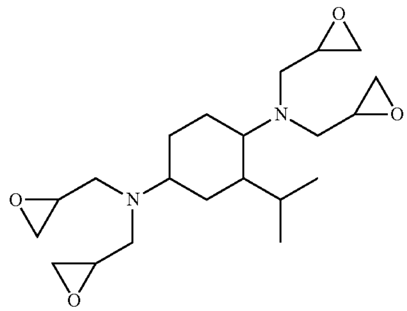
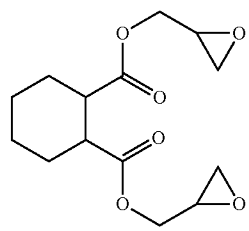
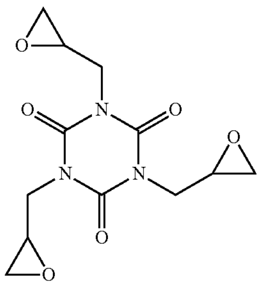
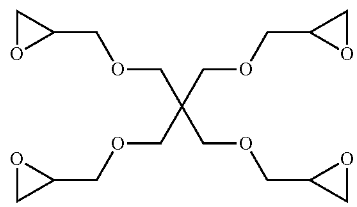
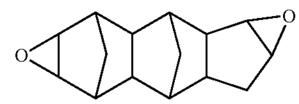
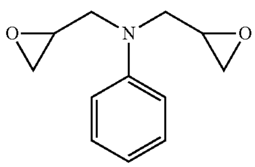
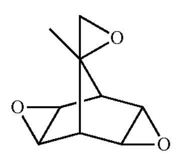
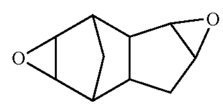
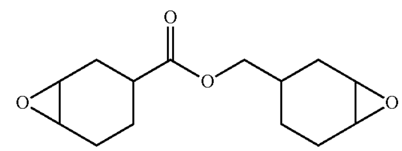
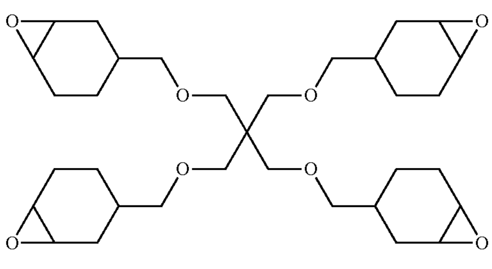
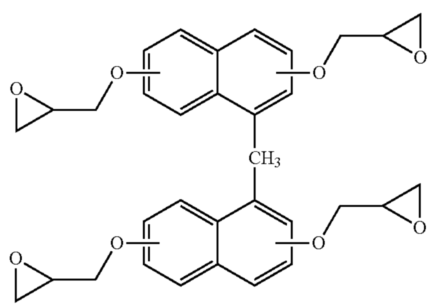
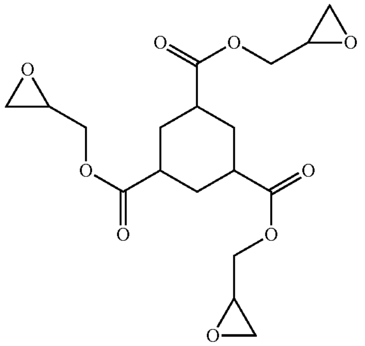

-continued
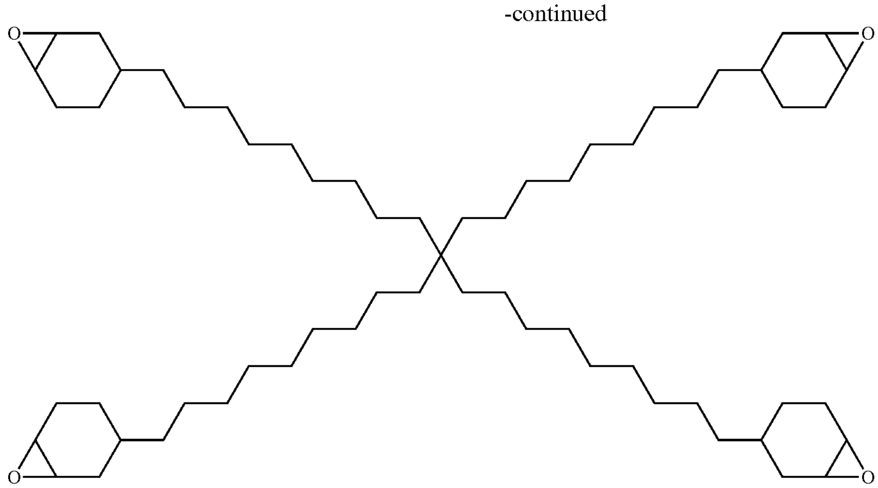
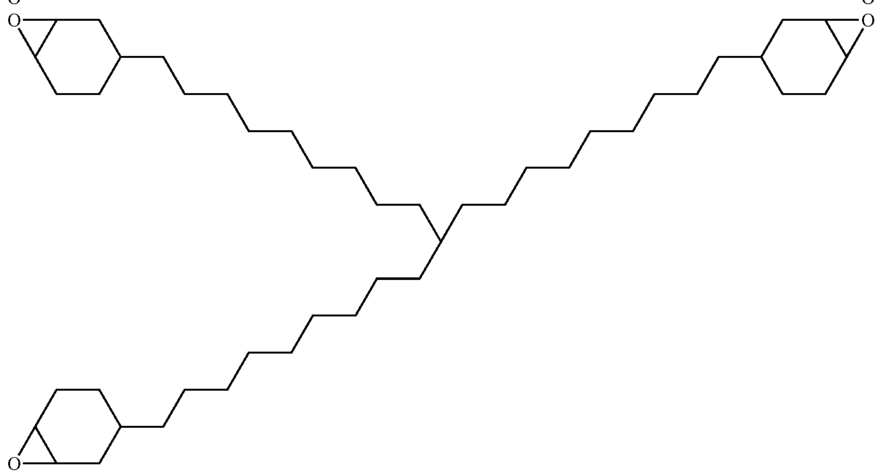
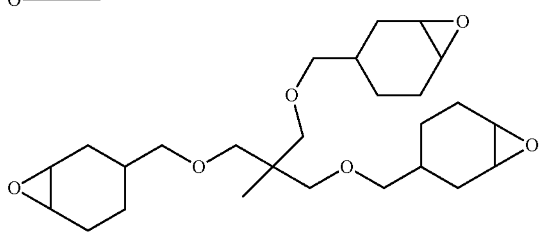
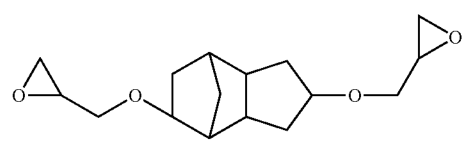
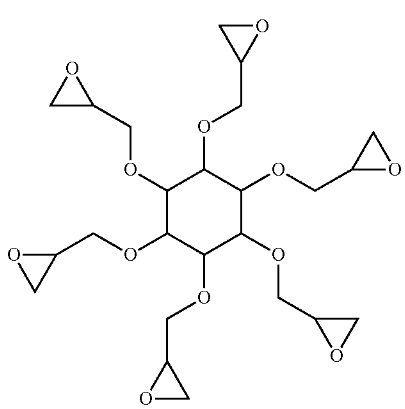
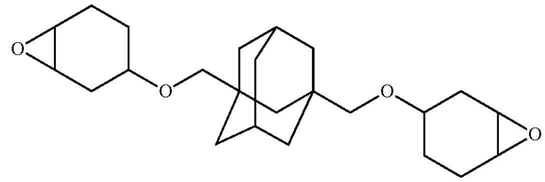

-continued

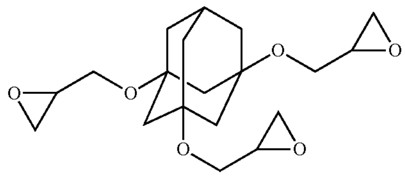

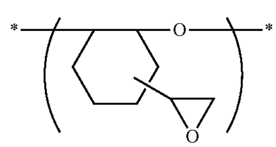

As the compound having an epoxy group, an oligomer or polymer having an epoxy group at a side chain can be preferably used. Examples of the compound include a bisphenol A epoxy resin, a bisphenol F epoxy resin, a phenol novolac epoxy resin, a cresol novolac epoxy resin, and an aliphatic epoxy resin.

These compounds may be commercially available or may be obtained by introducing an epoxy group into a side chain of a polymer.

Regarding the commercially available product, examples of the bisphenol A epoxy resin include JER827, JER828, JER834, JER1001, JER1002, JER1003, JER1055, JER1007, JER1009, and JER1010 (all of which are manufactured by Japan Epoxy Resins Co., Ltd.) and EPICLON860, EPICLON1050, EPICLON1051, and EPICLON1055 (all of which are manufactured by DIC Corporation). Examples of the bisphenol F epoxy resin include JER806, JER807, JER4004, JER4005, JER4007, and JER4010 (all of which are manufactured by Japan Epoxy Resins Co., Ltd.), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include JER152, JER154, JER157S70, and JER157S65 (all of which are manufactured by Japan Epoxy Resins Co., Ltd.) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), and JER1031S (manufactured by Japan Epoxy Resins Co., Ltd.).

In addition, preferable examples of a commercially available product of the compound having an epoxy group include JER1031S (manufactured by Mitsubishi Chemical Corporation), JER1032H60 (manufactured by Mitsubishi Chemical Corporation), EPICLON HP-4700 (manufactured by DIC Corporation), EPICLON N-695 (manufactured by DIC Corporation), EPICLON840 (manufactured by DIC Corporation), EPICLON N660 (manufactured by DIC Corporation), and EPICLON HP7200 (manufactured by DIC Corporation).

In a case where the compound having an epoxy group is synthesized by introducing an epoxy group into a side chain of a polymer, the introducing reaction can be performed, for example, by performing the reaction in an organic solvent at a reaction temperature of 50° C. to 150° C. for 1 hour to several tens of hours by using a tertiary amine such as triethylamine or benzylmethylamine, a quaternary ammonium salt such as dodecyltrimethylammonium chloride, tetramethylammonium chloride, or tetraethylammonium chloride, pyridine, or triphenyl phosphine as a catalyst. It is preferable that the amount of an alicyclic epoxy unsaturated compound introduced is controlled such that the acid value of the polymer is in a range of 5 to 200 KOH·mg/g.

As the epoxy unsaturated compound, an unsaturated compound having a glycidyl group such as glycidyl (meth) acrylate or allyl glycidyl ether as an epoxy group can be used, and an unsaturated compound having an alicyclic epoxy group is preferable. Specific examples are the following compounds.

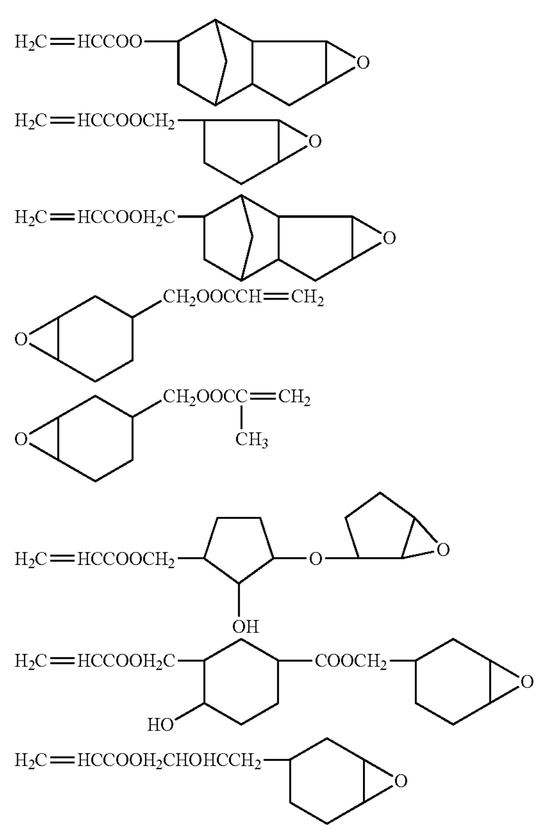

-continued

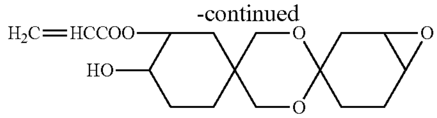

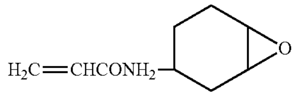

In the present invention, as the compound having an epoxy group, one kind may be used alone, two or more kinds may be used in combination.

In a case where the coloring composition according to the present invention includes the compound having an epoxy group, the total content of the compound having an epoxy group in the coloring composition is 0.1 to 20 mass %, more preferably 0.1 to 10 mass %, and still more preferably 0.5 to 5 mass % with respect to the total solid content (mass) of the coloring composition.

In addition, in the present invention, as the polymerizable compound, a urethane acrylate described in JP1973-41708B (JP-S48-41708B), JP1976-37193A (JP-S51-37193A), JP1990-32293B (JP-H02-32293B), or JP1990-16765B (JP-H02-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. Further, as the polymerizable compound, a coloring composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H01-105238A).

In addition, in the present invention, as the polymerizable compound, a compound having an oxetane group can also be used. Examples of the compound having an oxetane group include a compound described in paragraphs “0134” to “0145” of JP2008-224970A, the content of which is incorporated herein by reference. Specific examples include ARONE OXETANE OXT-121, OXT-221, OX-SQ, and PNOX (all of which are manufactured by Toagosei Co., Ltd.).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

It is preferable that the coloring composition according to the present invention further includes a colorant other than the colorant (A). As the colorant other than the colorant (A), for example, a dye or a pigment can be used, and a pigment is preferable.

A pigment described in the present invention denotes an insoluble colorant compound which is not likely to dissolve in a solvent. Typically, a pigment denotes a colorant compound which is present in a state of being dispersed as particles in a composition. As the solvent described herein, for example, an arbitrary solvent can be used, and examples thereof are described in the item “Solvent” below. It is preferable that the pigment used in the present invention has a solubility of 0.1 g/100 g Solvent or lower at 25° C., for example, both in propylene glycol monomethyl ether acetate and in water.

<<Dye>>

As a well-known dye other than the colorant (A), for example, a dye described in JP1989-90403A (JP-S64-90403A), JP1989-91102A (JP-S64-91102A), JP1989-94301A (JP-H01-94301A), JP1994-11614A (JP-H06-1614A), JP2592207B, U.S. Pat. Nos. 4,808,501, 5,667,920, 505,950, JP1993-333207A (JP-H05-333207A), JP1994-35183A (JP-H06-35183A), JP1994-51115A (JP-H06-51115A), or JP1994-194828A (JP-H06-194828A) can be used. In terms of a chemical structure, a dye such as a pyrazole azo dye, a pyrromethene dye, an anilino azo dye, a triarylmethane dye, an anthraquinone dye, a benzylidene dye, an oxonol dye, a pyrazolotriazole azo dye, a pyridone azo dye, a cyanine dye, a phenothiazine dye, or a pyrrolopyrazole azo methine dye can be used.

In addition, a colorant polymer may be used as the dye. Examples of the colorant polymer include a compound described in JP2011-213925A or JP2013-041097A.

<<Pigment>>

As the pigment other than the colorant (A), various well-known inorganic pigments or organic pigments of the related art can be used, and organic pigments are preferable. It is preferable that the pigment has high transmittance.

As the inorganic pigment, for example, a metal compound such as a metal oxide or a metal complex salt can be used, and specific examples thereof include: an oxide of a metal such as iron, cobalt, aluminum, cadmium, lead, copper, titanium, magnesium, chromium, zinc, or antimony; a composite oxide of the metal; and a black pigment such as carbon black or titanium black.

Examples of the organic pigment include:

C.I. Pigment Yellow 11, 24, 31, 53, 83, 93, 99, 108, 109, 110, 138, 139, 147, 150, 151, 154, 155, 167, 180, 185, and 199;

C.I. Pigment Orange 36, 38, 43, and 71;

C.I. Pigment Red 81, 105, 122, 149, 150, 155, 171, 175, 176, 177, 179, 209, 220, 224, 242, 254, 255, 264, and 270;

C.I. Pigment Violet 19, 23, 32, and 39;

C.I. Pigment Blue 1, 2, 15, 15:1, 15:3, 15:6, 16, 22, 60, and 66;

C.I. Pigment Green 7, 36, 37, 58, and 59;

C.I. Pigment Brown 25 and 28;

C.I. Pigment Black 1.

Examples of the pigment which can be preferable used in the present invention are as follows. However, the present invention is not limited to the examples.

C.I. Pigment Yellow 11, 24, 108, 109, 110, 138, 139, 150, 151, 154, 167, 180, and 185;

C.I. Pigment Orange 36 and 71;

C.I. Pigment Red 122, 150, 171, 175, 177, 209, 224, 242, 254, 255, and 264;

C.I. Pigment Violet 19, 23, and 32;

C.I. Pigment Blue 15:1, 15:3, 15:6, 16, 22, 60, and 66;

C.I. Pigment Green 7, 36, 37, 58, and 59; and

C.I. Pigment Black 1 and 7.

Among these organic pigments, one kind may be used alone, or a combination of various kinds may be used in order to adjust spectroscopic properties or to increase color purity. Specific examples of the combination are as follows. For example, as a red pigment, an anthraquinone pigment, a perylene pigment, or a diketo pyrrolo pyrrole pigment can be used alone, or a mixture of at least one of the above red pigments and a disazo yellow pigment, an isoindoline yellow pigment, a quinophthalone yellow pigment, or a perylene red pigment can be used. Examples of the anthraquinone pigment include C.I. Pigment Red 177. Examples of the perylene pigment include C.I. Pigment Red 155 and C.I. Pigment Red 224. Examples of the diketo pyrrolo pyrrole pigment include C.I. Pigment Red 254. From the viewpoint of color separability, the red pigment may be mixed with C.I. Pigment Yellow 139. In addition, a mass ratio of the red pigment to the yellow pigment is preferably 100:5 to 100:50 and more preferably 100:10 to 100:30. In a case where a combination of red pigments is used, a mass ratio between the red pigments can be adjusted according to the required spectroscopic properties.

In addition, as a green pigment, a halogenated phthalocyanine pigment can be used alone, or a mixture of the halogenated phthalocyanine pigment and a disazo yellow pigment, a quinophthalone yellow pigment, an azomethine yellow pigment, or an isoindoline yellow pigment can be used. Preferable examples of the green pigment include a mixture of C.I. Pigment Green 7, 36, or 37 and C.I. Pigment Yellow 83, C.I. Pigment Yellow 138, C.I. Pigment Yellow 139, C.I. Pigment Yellow 150, C.I. Pigment Yellow 180, or C.I. Pigment Yellow 185. In addition, a mass ratio of the green pigment to the yellow pigment is preferably 100:5 to 100:150 and more preferably 100:30 to 100:120.

As a blue pigment, a phthalocyanine pigment can be used alone, or a mixture of the phthalocyanine pigment and a dioxazine violet pigment can be used. Preferable examples of the blue pigment include a mixture of C.I. Pigment Blue 15:6 and C.I. Pigment Violet 23. A mass ratio of the blue pigment to the violet pigment is preferably 100:0 to 100:100.

In addition, a pigment for a black matrix, carbon, titanium black, iron oxide, or titanium oxide may be used alone, or a mixture thereof can be used. Among these, a combination of carbon and titanium black is preferable. In addition, a mass ratio of carbon to titanium black is preferably 100:0 to 100:60.

In a case where the pigment is used for a color filter, the primary particle size of the pigment is preferably 100 nm or less from the viewpoints of and color unevenness and contrast and is preferably 5 nm or more from the viewpoint of dispersion stability. The primary particle size of the pigment is more preferably 5 to 75 nm, still more preferably 5 to 55 nm, and even still more preferably 5 nm to 35 nm.

The primary particle size of the pigment can be measured with a well-known method using an electron microscope or the like.

It is preferable that the pigment is selected from an anthraquinone pigment, a diketo pyrrolo pyrrole pigment, a phthalocyanine pigment, a quinophthalone pigment, an isoindoline pigment, an azomethine pigment, and a dioxazine pigment. In particular, C.I. Pigment Red 177 (anthraquinone pigment), C.I. Pigment Red 254 (diketo pyrrolo pyrrole pigment), C.I. Pigment Green 7, 36, and 58, C.I. Pigment Blue 15:6 (phthalocyanine pigment), C.I. Pigment Yellow 138 (quinophthalone pigment). C.I. Pigment Yellow 139 and 185 (isoindoline pigment), C.I. Pigment Yellow 150 (azomethine pigment), or C.I. Pigment Violet 23 (dioxazine pigment) is more preferable.

In a case where the coloring composition according to the present invention includes a pigment, the content of the pigment is preferably 10 to 70 mass %, more preferably 25 to 65 mass %, and still more preferably 35 to 55 mass % with respect to the amount of all the components of the coloring composition other than a solvent.

The coloring composition according to the present invention may include one pigment or two or more pigments. In a case where the coloring composition according to the present invention includes two or more pigments, it is preferable that the total content of the two or more pigments is in the above-described range.

<<Pigment Dispersant>>

In a case where the coloring composition according to the present invention includes a pigment, it is preferable that the coloring composition includes a pigment dispersant.

Examples of the pigment dispersant include: a polymer dispersant [for example, polyamideamine or a salt thereof, a polycarboxylic acid or a salt thereof, a high-molecular-weight unsaturated acid ester, a modified polyurethane, a modified polyester, a modified poly(meth)acrylate, a (meth) acrylic copolymer, or a naphthalene sulfonic acid formalin condensate]; a surfactant such as a polyoxyethylene alkyl phosphoric acid ester, polyoxyethylene alkyl amine, or alkanol amine; and a pigment derivative.

In terms of a structure, the polymer dispersant can be further classified into a linear polymer, a terminal-modified polymer, a graft polymer, and a block polymer.

Examples of the terminal-modified polymer having an anchor site to a pigment surface include a polymer having a phosphate group at a terminal thereof described in JP1991-112992A (JP-H03-112992A) or JP2003-533455A, a polymer having a sulfonate group at a terminal thereof described in JP2002-273191A, and a polymer having a partial skeleton or a heterocycle of an organic colorant described in JP1997-77994A (JP-H09-77994A). In addition, polymers described in JP2007-277514A in which two or more anchor sites (for example, an acid group, a basic group, a partial skeleton or a hetero ring of an organic colorant) to a pigment surface are introduced into a terminal thereof are also preferable due to its dispersion stability.

As the graft polymer having an anchor site to a pigment surface, for example, a polyester dispersant may be used, and specific examples thereof include a reaction product of poly(low-alkylene imine) and polyester described in JP1979-37082A (JP-S54-37082A), JP1996-507960A (JP-H08-507960A), or JP2009-258668A, a reaction product of polyallylamine and polyester described in JP1997-169821A (JP-H09-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A. In particular, an amphoteric dispersion resin having a basic group and an acid group described in JP2009-203462A is preferable from the viewpoints of the dispersibility and dispersion stability of a pigment dispersion and the developability of a coloring composition in which a pigment dispersion is used.

As the macromonomer used for manufacturing the graft polymer having an anchor site to a pigment surface by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H02-272009A). Among these, from the viewpoint of the dispersibility and dispersion stability of a pigment dispersion and the developability of a coloring composition in which a pigment dispersion is used, a polyester macromonomer having excellent flexibility and solvent compatibility is more preferable, and the polyester macromonomer described in JP1990-272009A (JP-H02-272009A) is still more preferable.

As the block polymer having an anchor site to a pigment surface, a block polymer described in JP2003-49110A or JP2009-52010A is preferable.

The pigment dispersant is available as a commercially available product, and specific examples thereof include: "DA-7301" manufactured by Kusumoto Chemicals Ltd.; "Disperbyk-101 (polyamideamine phosphate), 107 (carboxylate), 110 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4010 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional site at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; "HINOACT T-8000E" manufactured by Kawaken Fine Chemicals Co., Ltd.; "organosiloxane polymer KP-341" manufactured by Shin-Etsu Chemical Co., Ltd.; "W001: cationic surfactant" manufactured by Yusho Co., Ltd.; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as "W004, W005, and W017" all of which are manufactured by Yusho Co. Ltd.; polymer dispersants such as "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "ISONET (trade name) S-20" manufactured by Sanyo Chemical Industries Ltd.

Among these pigment dispersants, one kind may be used alone, or two or more kinds may be used in combination. In the present invention, in particular, it is preferable that the pigment derivative and a polymer dispersant are used in combination. In addition, regarding the pigment dispersant, the terminal-modified polymer, the graft polymer, or the block polymer having an anchor site to a pigment surface may be used in combination with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H07-319161A) is also preferable. Specifically, for example, a copolymer including an alkali-soluble resin, benzyl methacrylate, methacrylic acid, and 2-hydroxyethyl methacrylate may be used.

As the pigment dispersant, the following compounds can also be used. In the following structure, n represents 20.

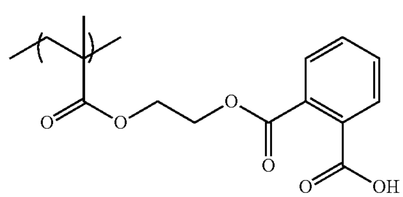

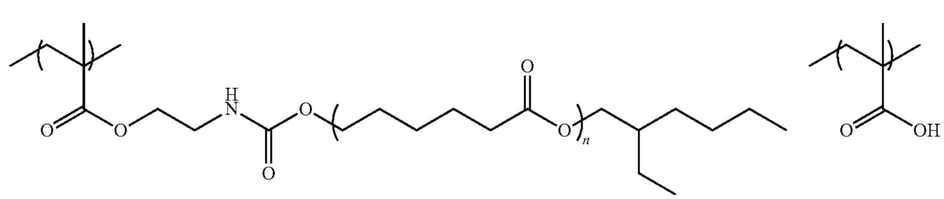

-continued

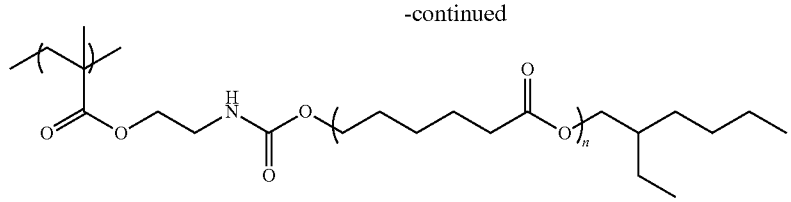

In a case where the coloring composition according to the present invention includes a pigment dispersant, the total content of the pigment dispersant is preferably 1 to 80 parts by mass, more preferably 5 to 70 parts by mass, and still more preferably 10 to 60 parts by mass with respect to 100 parts by mass of the pigment.

Specifically, in a case where a polymer dispersant is used, the amount of the polymer dispersant used is preferably 5 to 100 parts by mass and more preferably 10 to 80 parts by mass with respect to 100 parts by mass of the pigment.

In addition, in a case where the polymer dispersant is used in combination of a pigment derivative, the amount of the pigment derivative used is preferably 1 to 30 parts by mass, more preferably 3 to 20 parts by mass, and still more preferably 5 to 15 parts by mass with respect to 100 parts by mass of the pigment.

In the coloring composition according to the present invention, from the viewpoints of curing sensitivity and color density, the sum of the content of the colorant and the content of the dispersant is preferably 50 mass % to 90 mass %, more preferably 55 mass % to 85 mass %, and still more preferably 60 mass % to 80 mass % with respect to the total solid content of the coloring composition according to the present invention.

<<Alkali-Soluble Resin>>

The coloring composition according to the present invention may further include an alkali-soluble resin.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain). As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkali aqueous solution is preferable, and (meth)acrylic acid is more preferable. Among these acid groups, one kind may be used alone, or two or more kinds may be used in combination.

Examples of a monomer which can introduce an acid group after polymerization include a monomer having a hydroxyl group such as 2-hydroxyethyl (meth)acrylate, a monomer having an epoxy group such as glycidyl (meth) acrylate, and a monomer having an isocyanate group such as 2-Isocyanatoethyl (meth)acrylate. Among these monomers for introducing an acid group, one kind may be used alone, or two or more kinds may be used in combination. In order to introduce an acid group into the alkali-soluble resin, for example, polymerization may be performed using a monomer having an acid group and/or the monomer which can introduce an acid group into the alkali-soluble resin after polymerization as monomer components.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the linear organic polymer used as the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxylic acid at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth) acrylate, isobutyl (meth)acrylate, pentyl (meth)acrylate, hexyl (meth)acrylate, octyl (meth)acrylate, phenyl (meth) acrylate, benzyl (meth)acrylate, tolyl (meth)acrylate, naphthyl (meth)acrylate, and cyclohexyl (meth)acrylate. Examples of the vinyl compound include styrene, a-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922A) include N-phenylmaleimide and N-cyclohexylmaleimide. Among these monomers which are copolymerizable with the (meth)acrylic acid, one kind may be used alone, or two or more kinds may be used in combination.

As the alkali-soluble resin, a polymer (a) obtained by copolymerization in which a compound represented by the following Formula (ED) and/or a compound represented by the following Formula (ED2) (hereinafter, these compounds will also be referred to as "ether dimer") are used as essential monomer components is also preferable.

Formula (ED)

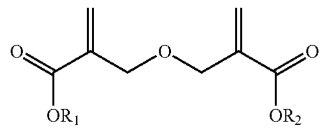

In Formula (ED), $R^1$ and $R^2$ each independently represent a hydrogen atom or a hydrocarbon group having 1 to 25 carbon atoms which may have a substituent.

Formula (ED2)

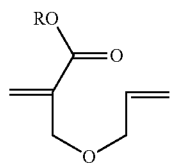

In Formula (ED2), R represents a hydrogen atom or an organic group having 1 to 30 carbon atoms. Specific examples of Formula (ED2) can be found in the description of JP2010-168539A As a result, the coloring composition according to the present invention can form a cured film having excellent heat resistance and transparency. The hydrocarbon group having 1 to 25 carbon atoms represented by $R^1$ and $R^2$ in Formula (ED) which may have a substituent is not particularly limited, and examples thereof include a linear or branched alkyl group such as methyl ethyl n-propyl isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)]bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyctlopentadienyl)-2,2'-[oxybis(methylene)]bis-2-propenoate, di(tricyclodecanyl)-2,2'-[oxybis(methylene)]bis-2-propenoate, di(isobornyl)-2,2'[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate.

Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, or dibenzyl-2,2'-[oxybis(methylene)]bis-2-propenoate is preferable.

Among these ether dimers, one kind may be used alone, or two or more kinds may be used in combination. A structure derived from the compound represented by Formula (ED) may be copolymerized with other monomers.

The alkali-soluble resin may include a structural unit which is derived from an ethylenically unsaturated compound represented by the following Formula (X).

Formula (X)

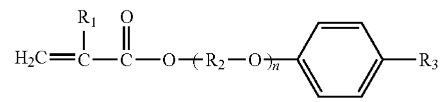

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms which may have a benzene ring, and n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

In addition, in order to improve a crosslinking effect of the coloring composition according to the present invention, an alkali-soluble resin having a polymerizable group may be used. As the alkali-soluble resin having a polymerizable group, an alkali-soluble resin having an allyl group, a (meth)acryl group, or an allyloxy alkyl group at a side chain thereof is suitably used. Examples of the alkali-soluble resin having a polymerizable group include Dianal NR series (manufactured by Mitsubishi Rayon Co., Ltd.), Photomer 6173 (a COOH-containing polyurethane acrylic oligomer; manufactured by Diamond Shamrock Co., Ltd.), Biscoat R-264 and KS Resist 106 (both of which are manufactured by Osaka Organic Chemical Industry Ltd.), Cyclomer P series and Plakcel CF200 series (both of which manufactured by Daicel Corporation), and Ebecryl 3800 (manufactured by Daicel-UCB Co., Ltd.). Preferable examples of the alkali-soluble resin having a polymerizable group include: a urethane-modified polymerizable double bond-containing acrylic resin obtained by a reaction of a compound having a (meth)acryloyl group, in which one unreacted isocyanate group remains by a previous reaction of isocyanate groups and OH groups, with an acrylic resin having a carboxyl group; an unsaturated group-containing acrylic resin obtained by a reaction of an acrylic resin having a carboxyl group with a compound having both an epoxy group and a polymerizable double bond in a molecule thereof; an acid pendant type epoxy acrylate resin; a polymerizable double bond-containing acrylic resin obtained by a reaction of an acrylic resin having an OH group with a dibasic acid anhydride having a polymerizable double bond; a resin obtained by a reaction of an acrylic resin having an OH group with isocyanate and a compound having a polymerizable group; and a resin described in JP2002-229207A or JP2003-335814A obtained by performing a basic treatment on a resin having a halogen atom or a leaving group such as a sulfonate group at the α-position or at the β-position and having an ester group at a side chain. In addition, ACRYCURE RD-F8 (manufactured by Nippon Shokubai Co., Ltd.) is also preferable.

As the alkali-soluble resin, a copolymer including benzyl (meth)acrylate and (meth)acrylic acid or a multi-component copolymer including benzyl (meth)acrylate, (meth)acrylic acid, and another monomer is preferable. Other examples of the alkali-soluble resin include a copolymer including benzyl (meth)acrylate, (meth)acrylic acid, and 2-hydroxyethyl (meth)acrylate which is obtained by copolymerization of 2-hydroxyethyl methacrylate, and copolymers described in JP1995-140654A (JP-H07-140654A), for example, a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; and a copolymer including 2-hydroxyethyl methacrylate, a polystyrene macromonomer, benzyl methacrylate, and methacrylic acid. In particular, a copolymer including benzyl methacrylate and methacrylic acid is preferable.

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 " and a binder resin used in Examples of JP2012-137531A, a binder resin described in paragraphs "0132" to "0143" and a binder resin used in Examples of JP2013-024934A, a binder resin described in paragraphs "0092" to "0098" and Examples of JP2011-242752A, or a binder resin described in paragraphs "0030" to "0072" of JP2012-032770A is preferable. The contents of which are incorporated herein by reference. More specifically, the following resins are preferable.

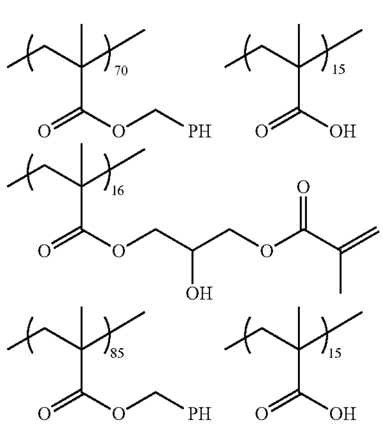

-continued

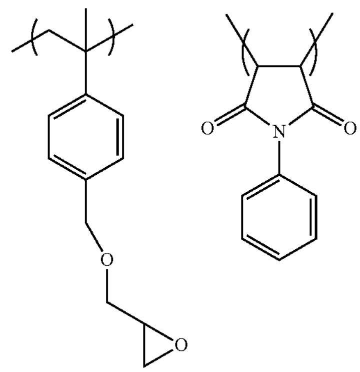

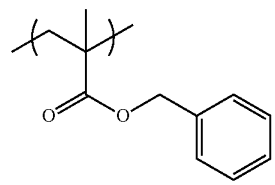

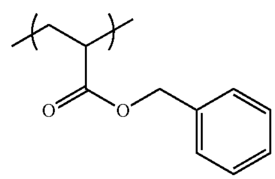

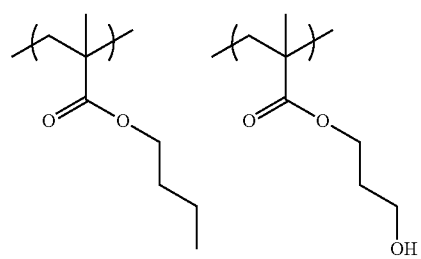

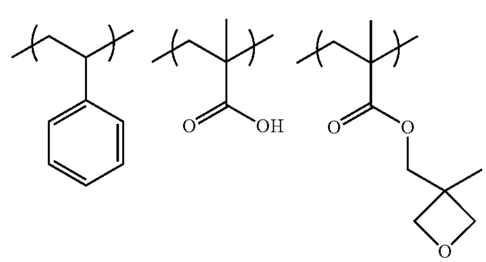

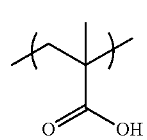

-continued
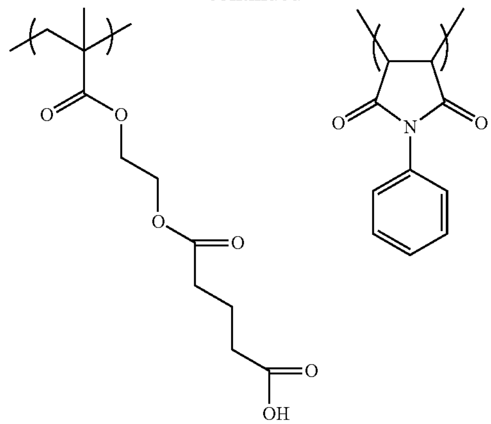
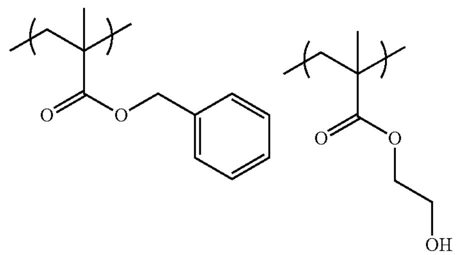
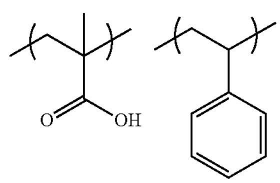
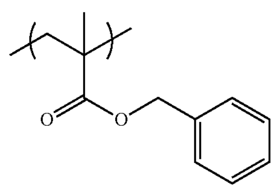
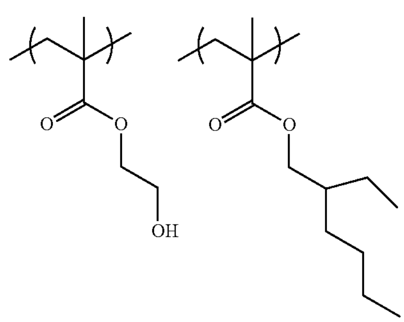
-continued
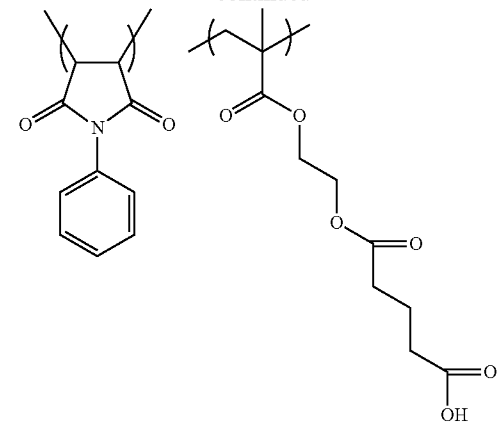
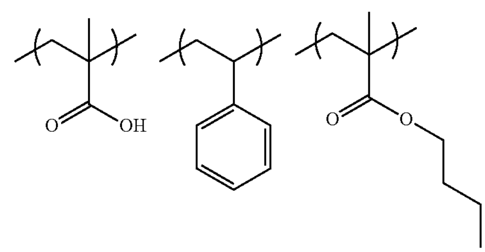
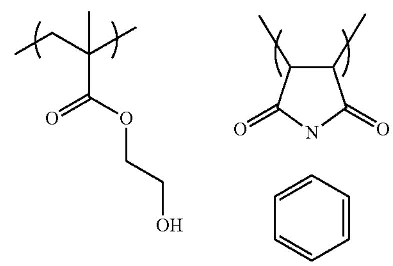
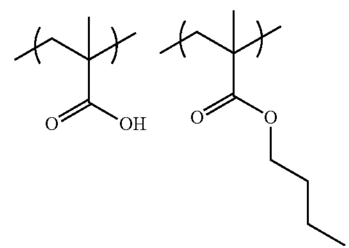
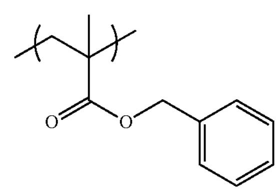
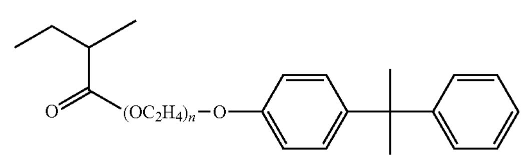

-continued

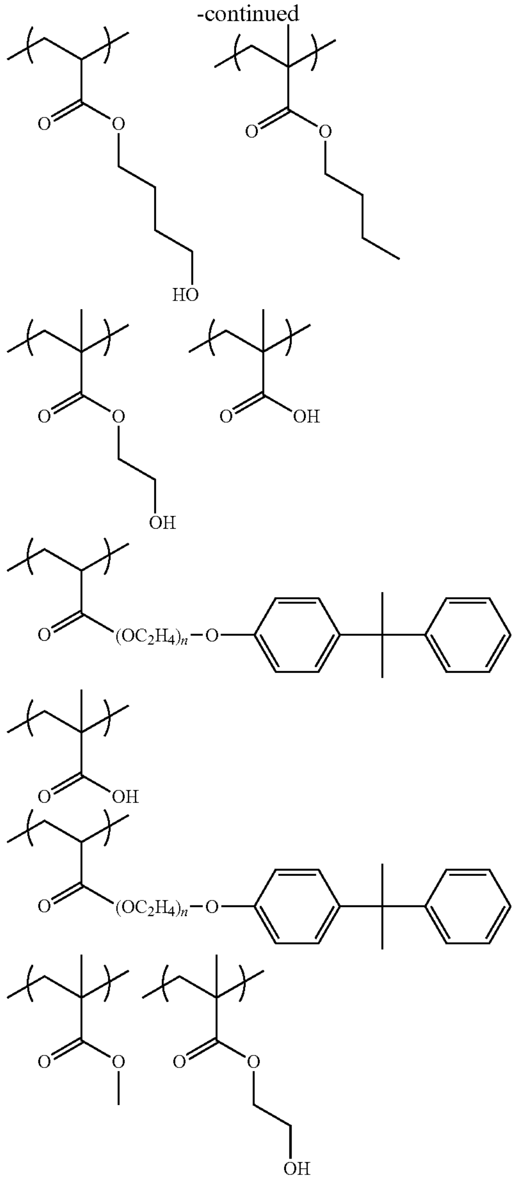

The acid value of the alkali-soluble resin is preferably 30 mgKOH/g to 200 mgKOH/g, more preferably 50 mgKOH/g to 150 mgKOH/g, and still more preferably 70 mgKOH/g to 120 mgKOH/g.

In addition, the weight average molecular weight (Mw) of the alkali-soluble resin is preferably 2000 to 50000, more preferably 5000 to 30000, and still more preferably 7000 to 20000.

In a case where the coloring composition according to the present invention includes an alkali-soluble resin, the content of the alkali-soluble resin is preferably 1 to 15 mass %, more preferably 2 to 12 mass %, and still more preferably 3 to 10 mass % with respect to the total solid content of the coloring composition.

The coloring composition according to the present invention may include one alkali-soluble resin or two or more alkali-soluble resins. In a case where the coloring composition according to the present invention includes two or more alkali-soluble resins, it is preferable that the total content of the two or more alkali-soluble resins is in the above-described range.

<<Photopolymerization Initiator>>

It is preferable that the coloring composition according to the present invention further includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light rays in a range from the ultraviolet region to the visible region is preferable. In addition, the photopolymerization initiator may be an activator which causes an action with a photo-excited sensitizer to generate active radicals, or may be an initiator which initiates cation polymerization depending on the kinds of monomers.

In addition, it is preferable that the photopolymerization initiator at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone.

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triallylimidazole dimer, an onium compound, a benzothiazole compound, a benzophenone compound, an acetophenone compound and a derivative thereof a cyclopentadiene-benzene-iron complex and a salt thereof, and a halomethyl oxadiazole compound, a 3-aryl-substituted coumarin compound is preferable.

Among these, a trihalomethyltriazine compound, an α-amino ketone compound, an acylphosphine compound, a phosphine oxide compound, an oxime compound, a triallylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triallylimidazole dimer, and a benzophenone compound is still more preferable.

In particular, in a case where the coloring composition according to the present invention is used to prepare a color filter of a solid image pickup element, it is necessary to form a fine pattern in a sharp shape, and thus it is important to obtain excellent curing properties and perform development without a residue remaining in a non-exposed portion. From these viewpoints, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable an oxime compound is used as the photopolymerization initiator for forming a fine pattern in a solid image pickup element or the like. In addition, by using the oxime compound, color transfer properties can be further improved.

Specific examples of the photopolymerization initiator used in the present invention can be found in, for example, paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine oxide initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used. As the aminoacetophenone initiator, IRGACURE-907, IRGACURE-369, or IRGACURE-379 (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used. As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable. Specific examples of the oxime initiator include a compound described in JP2001-233842A, a compound described in JP2000-80068A, and a compound described in JP2006-342166A.

Examples of the oxime compound such as an oxime derivative which can be preferably used as the photopolymerization initiator in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A.

As a commercially available product of the oxime compound, IRGACURE-OXE 01 (manufactured by BASF SE) and IRGACURE-OXE 02 (manufactured by BASF SE) can also be preferably used. In addition, TRONLY TR-PBG-304, TRONLY TR-PBG-309, and TRONLY TR-PBG-305, (all of which are manufactured by Changzhou Tronly New Electronic Materials Co., Ltd.); and ADEKA ARKLS NCI-831 and ADEKA ARKLS NCI-930 (all of which are manufactured by ADEKA Corporation) can also be used.

In addition, in addition to the above-described oxime compounds, for example, a compound described in JP2009-519904A in which oxime is linked to a N-position of carbazole, a compound described in U.S. Pat. No. 7,626,957 in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910 having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(0X-1)

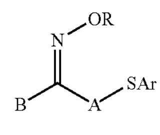

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, or an alkynylene group is preferable. These groups may have one or more substituents. Examples of the substituent are as described above.

Hereinafter, specific examples (C-4) to (C-13) of the compound represented by Formula (OX-1) are shown, but the present invention is not limited thereto.

(C-4)

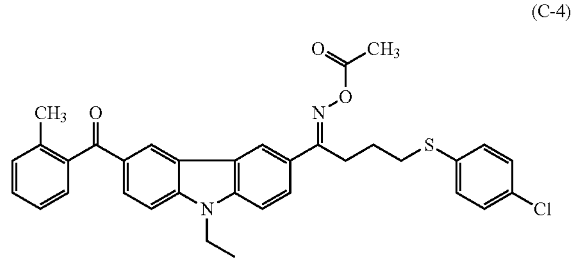

-continued (C-5)

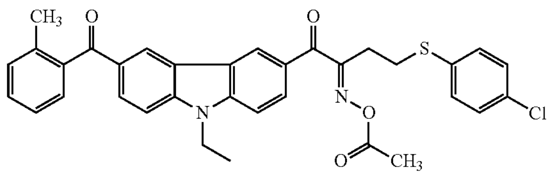

(C-6)

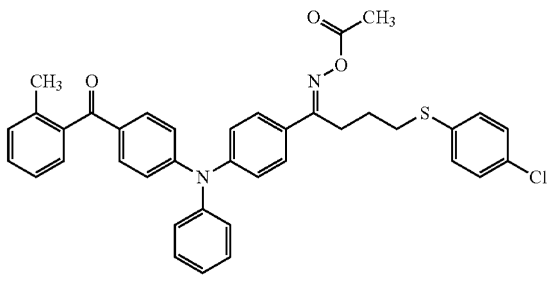

(C-7)

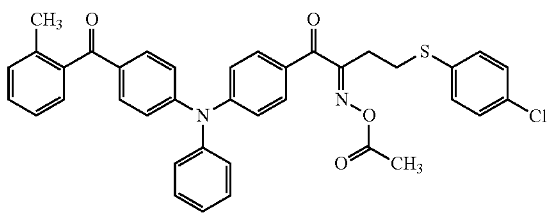

(C-8)

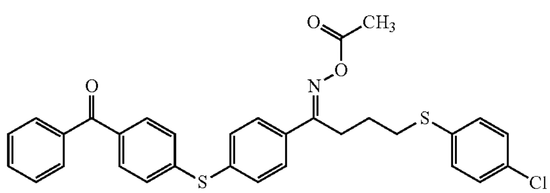

(C-9)

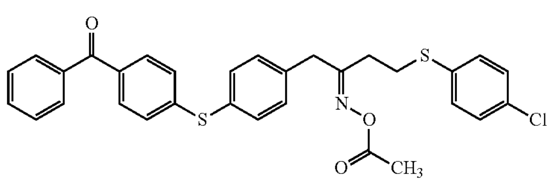

(C-10)

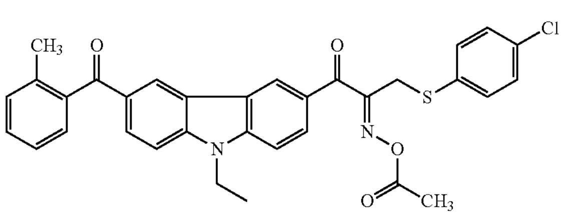

(C-11)

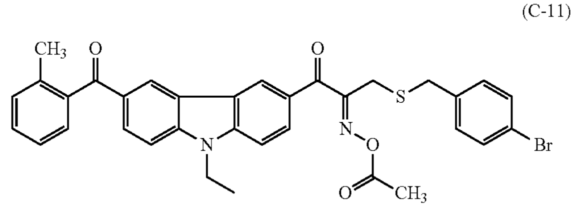

-continued (C-12)

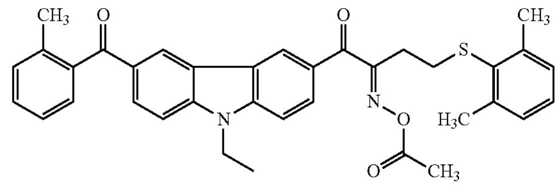

(C-13)

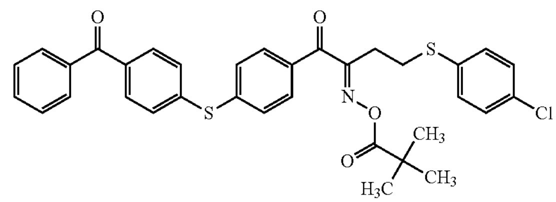

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

The oxime compound has an absorption maximum in a wavelength range of 350 nm to 500 nm, preferably has an absorption wavelength in a wavelength range of 360 nm to 480 nm, and more preferably has a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. Specifically, for example, the molar absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

In the present invention, optionally, two or more photopolymerization initiators are used in combination.

In a case where the coloring composition according to the present invention includes a photopolymerization initiator, the content of the photopolymerization initiator is preferably 0.1 to 50 mass %, more preferably 0.5 to 30 mass %, and still more preferably 1 to 20 mass % with respect to the total solid content of the coloring composition. In the above-described range, excellent sensitivity and pattern formability can be obtained.

The coloring composition according to the present invention may include one photopolymerization initiator or two or more photopolymerization initiators. In a case where the coloring composition according to the present invention includes two or more photopolymerization initiators, it is preferable that the total content of the two or more photopolymerization initiators is in the above-described range.

<<Other Components>>

In addition to the above-described components, within a range where the effects of the present invention do not deteriorate, the coloring composition according to the present invention may further include other components such as a polyfunctional mercapto compound, an organic solvent, a crosslinking agent, a polymerization inhibitor, a surfactant, an organic carboxylic acid, or an organic carboxylic anhydride.

<<Polyfunctional Mercapto Compound>>

In order to promote a reaction of the polymerizable compound, the coloring composition according to the present invention may include a polyfunctional mercapto compound having two or more mercapto groups in a molecule. The polyfunctional mercapto compound is preferably a secondary alkane mercapto and more preferably a compound having a structure represented by the following Formula (T1).

Formula (T1)

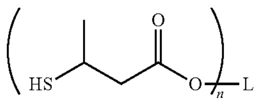

In Formula (T1), n represents an integer of 2 to 4, and L represents a divalent to tetravalent linking group.

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional mercapto compound include compounds represented by the following Structural Formulae (T2) to (T4). Among these, a compound represented by Structural Formula (T2) is preferable. Among these polyfunctional mercapto compounds, one kind may be used alone, or two or more kinds may be used in combination.

(T2)

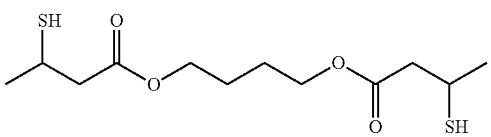

(T3)

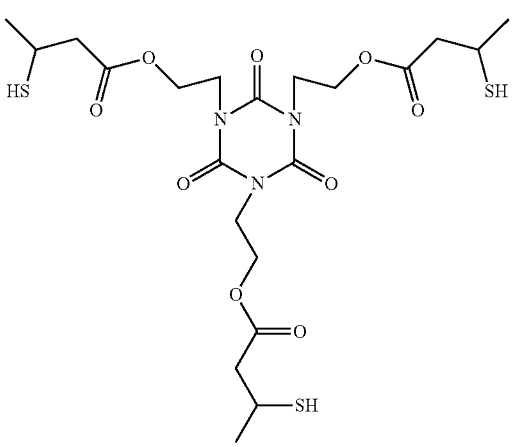

-continued (T4)

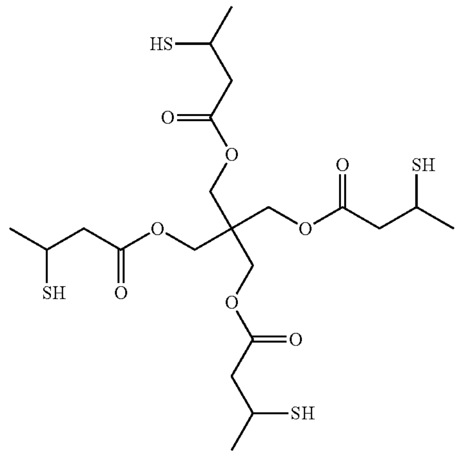

The amount of the polyfunctional mercapto compound added to the coloring composition according to the present invention is preferably 0.3 to 8.9 mass % and more preferably 0.8 to 6.4 mass % with respect to the total solid content of the coloring composition excluding a solvent. Among the polyfunctional mercapto compounds, one kind may be used alone, or two or more kinds may be used in combination. In a case where the coloring composition according to the present invention includes two or more polyfunctional mercapto compounds, it is preferable that the total content of the two or more polyfunctional mercapto compounds is in the above-described range. In addition, the polyfunctional mercapto compound may be added in order to improve stability, odor, resolution, developability, adhesiveness, and the like.

<<<Organic Solvent>>>

The coloring composition according to the present invention may include an organic solvent.

Basically, the organic solvent is not particularly limited as long as it satisfies the solubility of each component and the application properties of the coloring composition. However, it is preferable that the organic solvent is selected in consideration of the solubility, application properties, and safety of the colorant (A), the curable compound, and the like. In addition, in order to prepare the coloring composition according to the present invention, it is preferable that at least two organic solvents are used.

Preferable examples of the organic solvent include: an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate; an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol methyl ether acetate, propylene glycol ethyl ether acetate, or propylene glycol propyl ether acetate; a ketone, for example, methyl ethyl ketone, cyclohexanone, cyclopentanone, 2-heptanone, or 3-heptanone; and an aromatic hydrocarbon, for example, toluene or xylene.

It is also preferable that two or more kinds among the above organic solvents are mixed with each other from the viewpoints of improving the solubility of the colorant (A), a curable compound, or the like and improving a coated surface shape. In this case, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

From the viewpoint of application properties, the content of the organic solvent in the coloring composition is controlled such that the total solid content concentration of the coloring composition is preferably 5 to 80 mass %, more preferably 5 to 60 mass %, and still more preferably 10 to 50 mass %.

The coloring composition according to the present invention may include one organic solvent or two or more organic solvents. In a case where the coloring composition according to the present invention includes two or more organic solvents, it is preferable that the total content of the two or more organic solvents is in the above-described range.

<<<Crosslinking Agent>>>

The coloring composition according to the present invention may include a crosslinking agent. By the coloring composition including a crosslinking agent, the hardness of the obtained cured film can be further improved.

The crosslinking agent is not particularly limited as long as a film can be cured using a crosslinking reaction, and examples thereof include: (a) an epoxy resin; (b) a melamine compound, a guanamine compound, a glycoluril compound, or a urea compound which is substituted with at least one substituent selected from a methylol group, an alkoxymethyl group, or an acyloxymethyl group; and (c) a phenol compound, a naphthol compound, or a hydroxyanthracene compound which is substituted with at least one substituent of a methylol group, an alkoxymethyl group, or an acyloxymethyl group. Among these, a polyfunctional epoxy resin is preferable.

The details of the crosslinking agent such as specific examples can be found in paragraphs "0134" to "0147" of JP2004-295116A, the content of which is incorporated herein by reference.

In a case where the coloring composition according to the present invention includes a crosslinking agent, the content of the crosslinking agent is not particularly limited and is preferably 2 to 30 mass % and more preferably 3 to 20 mass % with respect to the total solid content of the coloring composition.

The coloring composition according to the present invention may include one crosslinking agent or two or more crosslinking agents. In a case where the coloring composition according to the present invention includes two or more crosslinking agents, it is preferable that the total content of the two or more crosslinking agents is in the above-described range.

<<<Polymerization Inhibitor>>>

It is preferable that a small amount of polymerization inhibitor is added to the coloring composition according to the present invention in order to prevent unnecessary thermal polymerization of the polymerizable compound during the manufacturing or storage of the coloring composition.

Examples of the polymerization inhibitor which can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxylamine cerium (III) salt.

In a case where the coloring composition according to the present invention includes a polymerization inhibitor, the content of the polymerization inhibitor is preferably about 0.01 to 5 mass % with respect to the mass of the coloring composition.

The coloring composition according to the present invention may include one polymerization inhibitor or two or more polymerization inhibitors. In a case where the coloring composition according to the present invention includes two or more polymerization inhibitors, it is preferable that the total content of the two or more polymerization inhibitors is in the above-described range.

<<<Surfactant>>>

Various surfactants may be added to the coloring composition according to the present invention from the viewpoint of further improving application properties. As the surfactants, various surfactants such as a fluorine surfactant, a nonionic surfactant, a cationic surfactant, an anionic surfactant, or a silicone surfactant can be used.

In particular, by the coloring composition according to the present invention including a fluorine surfactant, liquid properties (for example, fluidity) of a coating solution prepared from the coloring composition are further improved, and thus the uniformity in coating thickness and liquid saving properties can be further improved.

That is, in a case where a film is formed using a coating solution prepared using the coloring composition including a fluorine surfactant, the interfacial tension between a coated surface and the coating solution decreases. As a result, the wettability on the coated surface is improved, and the application properties on the coated surface are improved. Therefore, even in a case where a thin film having a thickness of several micrometers is formed using a small amount of the coating solution, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the coloring composition is also excellent.

Examples of the fluorine surfactant include: MEGAFACE F171, F172, F173, F176, F177, F141, F142, F143, F144, R30, F437, F475, F479, F482, F554, F780, and F781F (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PF636, PF656, PF6320, PF6520, and PF7002 (all of which are manufactured by OMNOVA Solutions Inc.).

As the fluorine surfactant, a fluorine surfactant described in JP2010-32698A can also be used.

In addition, as the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having two or more (preferably 5 or more) alkyleneoxy groups (preferably an ethyleneoxy group and/or a propyleneoxy group).

In addition, a fluorine-containing polymer having an ethylenically unsaturated group at a side chain can also be preferably used as the fluorine surfactant. Specific examples include compounds described in paragraphs "0050" of "0090" and paragraphs "0289" to "0295" of JP2010-164965A, for example, MEGAFACE RS-101, RS-102, and RS-718K manufactured by DIC Corporation.

Specific examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co., Ltd.), an organosiloxane polymer KP-341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.).

Examples of the silicone surfactant include: "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" (all of which are manufactured by Dow Corning Corporation); "TSF-4440", "TSF-4300", "TSF-4445", "TSF-4460", and "TSF-4452" (all of which are manufactured by Momentive Performance Materials Inc.); "KP341", "KF6001", and "KF6002" (all of which are manufactured by Shin-Etsu Chemical Co., Ltd.); and "BYK307", "BYK323", and "BYK330" (all of which are manufactured by BYK-Chemie Japan K.K.).

In a case where the coloring composition according to the present invention includes a surfactant, the addition amount of the surfactant is preferably 0.001 to 2.0 mass % and more preferably 0.005 to 1.0 mass % with respect to the total mass of the coloring composition.

The coloring composition according to the present invention may include one surfactant or two or more surfactants. In a case where the coloring composition according to the present invention includes two or more surfactants, it is preferable that the total content of the two or more surfactants is in the above-described range.

<<<Organic Carboxylic Acid and Organic Carboxylic Anhydride>>>

The coloring composition according to the present invention may include an organic carboxylic acid having a molecular weight of 1000 or lower and/or an organic carboxylic anhydride. Specific examples of the organic carboxylic anhydride and the organic carboxylic anhydride can be found in, for example, paragraphs "0338" to "0340" of JP2013-29760A, the content of which is incorporated herein by reference.

In a case where the coloring composition according to the present invention includes an organic carboxylic acid and/or an organic carboxylic anhydride, the addition amount of the organic carboxylic acid and/or the organic carboxylic anhydride is typically, 0.01 to 10 wt %, preferably 0.03 to 5 wt %, and more preferably 0.05 to 3 wt % with respect to the total solid content of the coloring composition.

The coloring composition according to the present invention may include one organic carboxylic acid and/or one organic carboxylic anhydride, or may include two or more organic carboxylic acids and/or two or more organic carboxylic anhydrides. In a case where the coloring composition according to the present invention includes two or more organic carboxylic acids and/or two or more organic carboxylic anhydrides, it is preferable that the total content of the two or more organic carboxylic acids and/or the two or more organic carboxylic anhydrides is in the above-described range.

In addition to the above-described components, various additives, for example, a filler, an adhesion accelerator, an antioxidant, a ultraviolet absorber, or an aggregation inhibitor are optionally added to the coloring composition. Examples of the additives can be found in paragraphs "0155" and "0156" of JP2004-295116A, the content of which is incorporated herein by reference.

The coloring composition according to the present invention can include a sensitizer or a photostabilizer described in paragraph "0078" of JP2004-295116A or a thermal polymerization inhibitor described in paragraph "0081" of JP2004-295116A. In addition, the coloring composition according to the present invention can include, as a binder, a resin including a monomer represented by Formula (1) described in JP2006-215453A as a copolymerization component.

In the coloring composition according to the present invention, the content of free metals which are neither bonded nor coordinated to each of the components of the coloring composition such as the colorant, the pigment, the pigment dispersant, the solvent, the alkali-soluble resin, the polymerizable compound, the surfactant, the photopolymerization initiator, the epoxy compound, and the like is preferably 25 ppm or lower, the free metals being selected from the group consisting of Al, Ca, Cu, Cr, Mg, Fe, Mn, Ni, Co, Cd, Li, Pb, Na, K, Zn, and P. In addition, the total content of the free metals is preferably 70 ppm or lower and more preferably 60 ppm or lower. According to this embodiment, a color filter having reduced defects is likely to be manufactured. The content of the free metals in the coloring composition can be measured appropriately using the existing analysis methods. However, if possible, it is preferable that the measurement is performed by inductively coupled plasma atomic emission spectroscopy. Examples of means for avoiding the incorporation of the metals include management of the purity of raw materials, selection of a reaction container of non-metals (for example, glass), appropriate purification, and selection of a storage method.

In the coloring composition according to the present invention, the content of free Br which is neither bonded nor coordinated to each of the components of the coloring composition such as the colorant, the pigment, the pigment dispersant, the solvent, the alkali-soluble resin, the polymerizable compound, the surfactant, the photopolymerization initiator, the epoxy compound, and the like is preferably 900 ppm or lower and more preferably 600 ppm or lower. In addition, the content of free Cl is preferably 900 ppm or lower and more preferably 600 ppm or lower. In addition, the total content of free Br and free Cl is preferably 1500 ppm or lower and more preferably 900 ppm or lower. According to this embodiment, a color filter having reduced defects is likely to be manufactured. The content of free Br and the content of free Cl in the coloring composition can be measured appropriately using the existing analysis methods. If possible, it is preferable that the measurement is performed using combustion ion chromatography according to BS EN 14582 (halogen content measurement).

<Method of Preparing Coloring Composition>

The coloring composition according to the present invention is prepared by mixing the above-described components with each other.

During the preparation of the coloring composition, the respective components constituting the coloring composition may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the coloring composition. Optionally, two or more solutions or dispersions may be appropriately prepared using the respective components, and the solutions or dispersions may be mixed with each other during use (during application) to prepare the coloring composition.

It is preferable that the coloring composition according to the present invention is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter, which inhibits a fine and smooth coloring composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

With the coloring composition according to the present invention, a cured film having excellent heat resistance and color transfer properties can be formed. Therefore, the coloring composition according to the present invention is suitably used for forming a colored layer of a color filter. In addition, the coloring composition according to the present invention can be suitably used for forming a colored pattern of a color filter or the like used in a solid image pickup element (for example, CCD or complementary metal-oxide semiconductor (CMOS)) or an image display apparatus such as a liquid crystal display apparatus (LCD). Further, the coloring composition according to the present invention can also be suitably used for preparing a printing ink, an ink jet ink, a coating material, and the like. In particular, the coloring composition according to the present invention can also be suitably used for manufacturing a color filter in a solid image pickup element such as CCD or CMOS.

<Cured Film, Color Filter, and Method of Manufacturing Color Filter>

Next, a cured film and a color filter according to the present invention will be described in detail with reference to a method of manufacturing the same. In addition, a method of manufacturing a color filter according to the present invention will be described.

The cured film according to the present invention is obtained by curing the coloring composition according to the present invention. The cured film is preferably used in a color filter.

A method of manufacturing a color filter according to a first embodiment of the present invention includes: a step of applying the coloring composition according to the present invention to a support to form a coloring composition layer; a step of exposing the coloring composition layer in a pattern shape; and a step of forming a colored pattern by removing a non-exposed portion by development. Optionally, the method further includes: a step (pre-baking step) of baking the coloring composition layer; and a step (post-baking step) of baking the developed colored pattern. Hereinafter, these steps will also be collectively referred to as "pattern forming step".

In addition, a method of manufacturing a color filter according to a second embodiment of the present invention includes: a step of forming a colored layer by applying the coloring composition according to the present invention to a support to form a coloring composition layer and curing the coloring composition layer; a step of forming a photoresist layer on the colored layer; a step of obtaining a resist pattern by patterning the photoresist layer by exposure and development; and a step of forming a colored pattern by dry-etching the colored layer by using the resist pattern as an etching mask.

The color filter according to the present invention can be more suitably obtained using the above-described manufacturing method. Hereinafter, the details will be described.

<<Step of Forming Coloring Composition Layer>>

In the step of forming a coloring composition layer, the coloring composition according to the present invention is applied to a support to form a coloring composition layer thereon.

As the support which can be used in this step, for example, a substrate for a solid image pickup element obtained by providing an image pickup element (light-receiving element) such as CCD or CMOS on a substrate (for example, a silicon substrate) can be used.

The colored pattern according to the present invention may be formed on an image pickup element-formed surface (front surface) of the substrate for a solid image pickup element, or may be formed on an image pickup element non-formed surface (back surface) thereof.

A light shielding film may be provided between colored patterns of a solid image pickup element or on a back surface of a substrate for a solid image pickup element.

In addition, optionally, an undercoat layer may be provided on the support to improve adhesion with a layer above the support, to prevent diffusion of materials, or to make a surface of the substrate flat.

As a method of applying the coloring composition according to the present invention to the support, various coating methods such as slit coating, an ink jet method, spin coating, cast coating, roll coating, or screen printing method can be applied.

The coloring composition layer applied to the support can be dried (pre-baked) using, for example, a hot plate or an oven at a temperature of 50° C. to 140° C. for 10 seconds to 300 seconds.

<<Case where Pattern is Formed Using Photolithography Method>>

<<Exposure Step>>

In the exposure step, the coloring composition layer formed in the coloring composition layer forming step is exposed in a pattern shape. For example, the coloring composition layer formed on the support is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). The irradiation intensity (exposure intensity) is preferably 0.03 to 2.5 J/cm$^2$, more preferably 0.05 to 1.0 J/cm$^2$, and most preferably 0.08 to 0.5 J/cm$^2$.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

The thickness of the cured film is preferably 1.0 μm or less, more preferably 0.1 μm to 0.9 μm, and still more preferably 0.2 μm to 0.8 μm.

By controlling the thickness to be 1.0 μm or less, high resolution and high adhesiveness can be obtained, which is preferable.

In addition, in this step, a thin cured film having a thickness of 0.7 μm or less can also be suitably formed. By developing the obtained cured film in the pattern forming step described below, even though the thickness thereof is small, a colored pattern having excellent developability, reduced surface roughening, and an excellent pattern shape can be obtained.

<<<Pattern Forming Step>>>

Next, an alkali development treatment is performed such that a non-cured portion of the coloring composition layer in the exposure step is eluted into an alkali aqueous solution and only a photo-cured portion remains.

As the developer, an organic alkali developer which does not cause damages to an image pickup element as a substrate, a circuit or the like is desired. A developing temperature is typically 20° C. to 30° C., and a developing time is 20 seconds to 90 seconds in the related art. Recently, in order to further remove a residue, the developing type may be set as 120 seconds to 180 seconds. Further, in order to further improve residue removing properties, a step of shaking the developer off per 60 seconds and supplying a new developer may be repeated multiple times.

Examples of an alkaline agent used in the developer include: an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5.4.0]-7-undecene. As the developer, an alkali aqueous solution is preferably used in which the above alkaline agent is diluted with pure water such that a concentration thereof is 0.001 mass % to 10 mass % and preferably 0.01 mass % to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the coloring composition. Among these, a nonionic surfactant is preferable. In a case where the developer includes a surfactant, the content of the surfactant is preferably 0.001 to 2.0 mass % and more preferably 0.01 to 1.0 mass % with respect to the total mass of the developer.

In a case where a developer including the alkaline aqueous solution is used, in general, it is preferable that the film is rinsed with pure water after development.

Next, it is preferable that the film is dried and then heated (post-baking). In a case where colored pattern of multiple colors are formed, the steps are repeated for each color such that cured films can be manufactured. As a result, a color filter can be obtained.

Post-baking is a heat treatment which is performed after development to completely cure the film, in which a thermal curing treatment is performed typically at 100° C. to 240° C. and preferably 200° C. to 240° C.

The coating film after the development is post-baked continuously or batchwise using heating means such as a hot plate, a convection oven (hot air circulation dryer), a high-frequency heater under the above-described conditions.

<<Case where Pattern is Formed Using Dry Etching Method>>

The colored layer can be dry-etched with etching gas by using a patterned photoresist layer as a mask. Specifically, a positive type or negative type radiation sensitive composition is applied to the colored layer and is dried such that a photoresist layer is formed. It is preferable that pre-baking is further performed in order to form the photoresist layer. In particular, in a preferable embodiment, as a process of forming the photoresist, baking after exposure (PEB) or baking after development (post baking) is performed.

As the photoresist, for example, a positive type radiation sensitive composition is used. As the positive type radiation sensitive composition, a positive type resit composition suitable for a positive type photoresist, which is reactive with radiation including ultraviolet rays (g-rays, h-rays, i-rays), far ultraviolet rays such as excimer laser, electron rays, ion beams, and X-rays, can be used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. The positive type radiation sensitive composition including a quinonediazide compound and an alkali-soluble resin uses a configuration in which a quinonediazide group is decomposed into a carboxyl group by irradiation of light having a wavelength of 500 nm or shorter such that the state of the composition is converted from alkali-insoluble to alkali-soluble. This positive type photoresist is has an excellent resolution and thus is used for preparing an integrated circuit such as IC or LSI. Examples of the quinonediazide compound include a naphthoquinonediazide compound. Examples of a commercially available product of the quinonediazide compound include "FHi622BC" (manufactured by Fujifilm Electronic Materials Co., Ltd.).

The thickness of the photoresist layer is preferably 0.1 to 3 μm, more preferably 0.2 to 2.5 μm, and still more preferably 0.3 to 2 μm. The application of the photoresist layer can be suitably performed using an existing application method of a colored layer.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the colored layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a colored pattern is desired to be formed.

As the developer, any developer can be used as long as it has no effect on a colored layer including a colorant and an exposed portion of a positive resist and a non-cured portion of a negative resist are soluble therein. For example, a combination of various organic solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium silicate, ammonia water, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. In a case where an alkaline aqueous solution is used as a developer, in general, a rinsing treatment using water is performed after development.

Next, patterning is performed by dry-etching the colored layer using the resist pattern as an etching mask so as to form a group of through-holes in the colored layer. As a result, a colored pattern is formed. The group of through-holes is provided in the colored layer in a checked pattern. Therefore, a first colored pattern in which the group of through-holes is provided in the colored layer has plural quadrangular first colored pixels in a checked pattern.

From the viewpoint of forming a pattern cross-section in a substantially rectangular shape or the viewpoint of further reducing damages to the support, it is preferable that dry etching is performed according the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined second etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by performing etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is important to determine a ratio between the etching amount in the first etching step and the etching amount in the second etching step such that the rectangularity obtained by etching in the first etching step does not deteriorate. A latter proportion in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be arbitrarily set and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be peeled; and a step of removing the resist pattern using rinse water.

Examples of the step applying a peeling solution or a solvent to the resist pattern such that the resist pattern can be peeled include a step of applying a peeling solution or a solvent to at least the resist pattern and holding the peeling solution and the solvent for a predetermined time to perform paddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used. In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include 1) a hydrocarbon compound, 2) a halogenated hydrocarbon compound, 3) an alcohol compound, 4) an ether or acetal compound, 5) a ketone or aldehyde compound, 6) an ester compound, 7) a polyhydric alcohol compound, 8), a carboxylic acid or acid anhydride compound, 9) a phenol compound, 10) a nitrogen-containing compound, 11) a sulfur-containing compound, and 12) a fluorine-containing compound. It is preferable that the peeling solution includes a nitrogen-containing compound, and it is more preferable that the peeling solution includes an acyclic or cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

When the peeling solution is removed, the resist pattern formed on the colored pattern only has to be removed. Even in a case where a deposit as an etching product is attached to a side wall of the colored pattern, it is not necessary to completely remove the deposit. The deposit refers to an etching product which is attached and deposited to a side wall of the colored layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution In addition, it is preferable that the peeling solution is obtained by diluting a mixture of the acyclic nitrogen-containing compound and the cyclic nitrogen-containing compound with pure water.

In addition to the above-described steps, the method of manufacturing a color filter according to the present invention optionally includes a well-known step in a method of manufacturing a color filter for a solid image pickup element. For example, after the above-described steps including the coloring composition layer forming step, the exposure step, and the pattern forming step, optionally, a curing step of curing the formed colored pattern by heating and/or exposure is provided.

In addition, in order efficiently clean contaminants and the like, which are formed by clogging of a nozzle or a pipe of a discharge portion of an application device, and attachment, precipitation, and drying of the coloring composition or the pigment in an application device, it is preferable that the solvent relating to the coloring composition according to the present invention is used as a cleaning solution. In addition, a cleaning solution described in JP1995-128867A (JP-H07-128867A), JP1995-146562A (JP-H07-146562A), JP1996-278637A (JP-H08-278637A), JP2000-273370A, JP2006-85140A, JP2006-291191A, JP2007-2101A, JP2007-2102A, or JP2007-281523A can be preferably used.

Among these, alkylene glycol monoalkyl ether carboxylate, or alkylene glycol monoalkyl ether is preferable.

Among these solvents, one kind may be used alone, or two or more kinds may be used in combination. In a case where a mixture of two or more solvents is used, it is preferable that a solvent having a hydroxyl group is mixed with a solvent having no hydroxyl group with each other. A mass ratio of the solvent having a hydroxyl group to the solvent having no hydroxyl group is 1/99 to 99/1, preferably 10/90 to 90/10, and more preferably 20/80 to 80/20. A mixed solvent obtained by mixing propylene glycol monomethyl ether acetate (PGMEA) and propylene glycol monomethyl ether (PGME) with each other at a ratio of 60/40 is more preferable. In order to improve permeability of the cleaning solution into contaminants, the surfactant relating to the coloring composition according to the present invention may be added to the cleaning solution.

In the color filter according to the present invention, the coloring composition according to the present invention is used, and thus heat resistance color transfer properties are excellent.

The color filter according to the present invention can be suitably used in a solid image pickup element such as CCD or CMOS. In particular, the color filter according to the present invention can be suitably used in a CCD or a CMOS having a high resolution of 1000000 pixels. For example, the color filter for a solid image pickup element according to the present invention can be used as a color filter which is disposed between a light receiving section of each of pixels constituting a CCD or a CMOS and a microlens for collecting light.

The thickness of the colored pattern (colored pixel) in the color filter according to the present invention is preferably 2.0 μm or less, more preferably 1.0 μm or less, and still more preferably 0.7 μm or less.

In addition, the size (pattern width) of the colored pattern (colored pixel) is preferably 2.5 μm or less, more preferably 2.0 μm or less, and still more preferably 1.7 μm or less.

<Solid Image Pickup Element>

A solid image pickup element according to the present invention includes the color filter according to the present invention. The solid image pickup element according to the present invention is configured to include the color filter according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a CCD image sensor or a CMOS image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protection film formed of silicon nitride or the like is formed on the light shielding film so as to cover the entire surface of the light shielding film and the light receiving sections of the photodiodes, and the color filter for a solid image pickup element according to the present invention is formed on the device protection film.

Further, a configuration in which light collecting means (for example, a microlens; hereinafter, the same shall be applied) is provided above the device protection film and below the color filter (on a side thereof close the support), or a configuration in which light collecting means is provided on the color filter may be adopted.

<Image Display Apparatus>

The color filter according to the present invention can be used not only in a solid image pickup element but also in an image display apparatus such as a liquid crystal display apparatus or an organic EL display apparatus. In particular, the color filter according to the present invention can be suitably used in a liquid crystal display apparatus. A liquid crystal display apparatus including the color filter according to the present invention can display a high-quality image with a favorable color and excellent display properties.

The definition of a display apparatus and the details of each display apparatus can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd., 1989)". In addition, the details of a liquid crystal display apparatus can be found in, for example, "Next-Generation Liquid Crystal Display Techniques (Edited by Tatsuo Uchida, Kogyo Chosakai Publishing Co., Ltd., 1994)". The liquid crystal display apparatus to which the present invention is applicable is not particularly limited. For example, the present invention is applicable to various liquid crystal display apparatuses descried in "Next-Generation Liquid Crystal Display Techniques".

The color filter according to the present invention may be used in a color TFT type liquid crystal display apparatus. The details of a color TFT type liquid crystal display apparatus can be found in, for example, "Color TFT Liquid Crystal Display (Published by Kyoritsu Shuppan Co., Ltd., 1996)". Further, the present invention is also applicable to, for example, a liquid crystal display apparatus having a wide view angle including a horizontal electric field driving type such as IPS and a pixel division type such as MVA, STN, TN, VA, OCS, FFS, or R-OCB.

In addition, the color filter according to the present invention is also applicable to a bright and high-definition color-filter on array (COA) type. In a COA type liquid crystal display apparatus, requirements for a color filter layer include not only the above-described typical requirements but also requirements for an interlayer insulator, that is, low dielectric constant and peeling solution properties. In the color filter according to the present invention, a colorant having an excellent color is used, and thus color purity, light permeability, and the like are favorable, and the color of a colored pattern (pixels) is excellent. Therefore, a COA type liquid crystal display apparatus having a high resolution and an excellent long-term durability can be provided. In order to satisfy a requirement of low dielectric constant, a resin film may be provided on the color filter layer.

In addition, the color filter according to the present invention can also be preferably used in a micro OLED type device.

The details of the image display types can be found in, for example, p. 43, "EL, PDP, and LCD Display Technology and Recent Trends of the Market (Toray Research Center, research and study department, 2001).

In addition to the color filter according to the present invention, the liquid crystal display apparatus including the color filter according to the present invention includes various members such as an electrode substrate, a polarizing film, a phase difference film, a backlight, a spacer, or a view angle compensation film. The color filter according to the present invention is applicable to a liquid crystal display apparatus including the above-described well-known members. The details of these members can be found in, for example, "'94 Market for Liquid Crystal Display Related Materials and Chemicals (Kentaro Shima, CMC Publishing CO., LTD., 1994)" and "2003 Current Situation of Liquid Crystal-Related Market and Future Prospects (2nd volume) (Yoshikichi Hyo, Fuji Chimera Research Institute, Inc., 2003)".

The details of the backlight can be found in, for example, "SID meeting Digest 1380 (2005) (A. Konno et al.)", "Display monthly publication; December, 2005, pp. 18-24 (Yasuhiro Shima) and pp. 25-30 (Takaaki Hachiki)".

In a case where the color filter according to the present invention is used in a liquid crystal display apparatus in combination with a three-wavelength tube of a well-known cold cathode fluorescent lamp of the related art, high contrast can be realized. Further, by using an LED light source of red, green, and blue (RGB-LED) as a backlight, a liquid crystal display apparatus having high brightness, high color purity, and excellent color reproducibility can be provided.

EXAMPLES

Hereinafter, the present invention will be described in more detail using examples. However, the present invention is not limited to the following examples as long as it does not depart from the scope of the present invention. Unless specified otherwise, "%" and "part(s)" represent "mass %" and "part(s) by mass".

In addition, the colorant (A) used in the following Examples is a mixture in which m's and n's in Formula (1) have given distributions and different plural values, and values of m and n described below in Table 1 are average values of the respective colorants.

<Method of Measuring Weight Average Molecular Weight>

The weight average molecular weight is a value in terms of polystyrene measured by gel permeation chromatography (GPC). Specifically, the weight average molecular weight was obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

<Method of Measuring Acid Value>

The acid value indicates the mass of potassium hydroxide required to neutralize an acidic component per 1 g of solid content. Specifically, a measurement sample was dissolved in a mixed solution including tetrahydrofuran and water at a ratio (mass ratio; tetrahydrofuran/water) of 9/1, and the obtained solution was neutralized and titrated with a 0.1 mol/l sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A=56.11\times Vs\times 0.1\times f/w$$

A: the acid value (mgKOH/g)

Vs: the amount (mL) of the 0.1 mol/l sodium hydroxide aqueous solution used for the titration f: the titer of the 0.1 mol/l sodium hydroxide aqueous solution w: the mass (g) of the measurement sample (in terms of solid content)

<Method of Measuring Turbidity>

47.5 g of cyclohexanone was dissolved in 2.5 g of a colorant, and the turbidity of the obtained solution was measured using a turbidity measuring device (SEP-PT-760D type, manufactured by manufactured by Mitsubishi Chemical Corporation; in which a standard plate having an optical path length 10 mm and 252.2 ppm was used).

<Measurement of Contents of Free Metals>

A colorant was dissolved in a mixed solvent (methyl ethyl ketone (MEK)/N-methylpyrrolidone (NMP)=1/9) to prepare a 1 mass % solution, and the contents of free metals were measured by inductively coupled plasma atomic emission spectroscopy (ICP-OES).

<Measurement of Content of Free Halogen>

The contents of free halogen metals were measured using combustion ion chromatography according to BS EN 14582 (halogen content measurement).

<Synthesis Examples of Triarylmethane Compounds (A-tp-1) to (A-tp-4)>

Using the same method as in JP2000-162429A, Triarylmethane Compounds (A-tp-1) to (A-tp-4) were synthesized.

(A-tp-1)

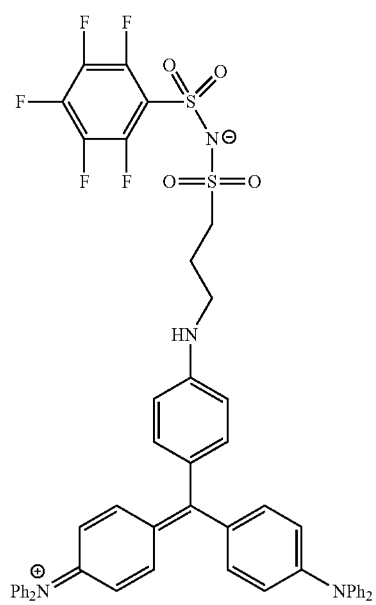

-continued (A-tp-2)

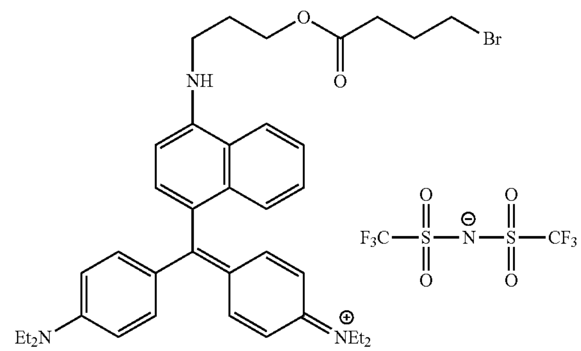

(A-tp-3)

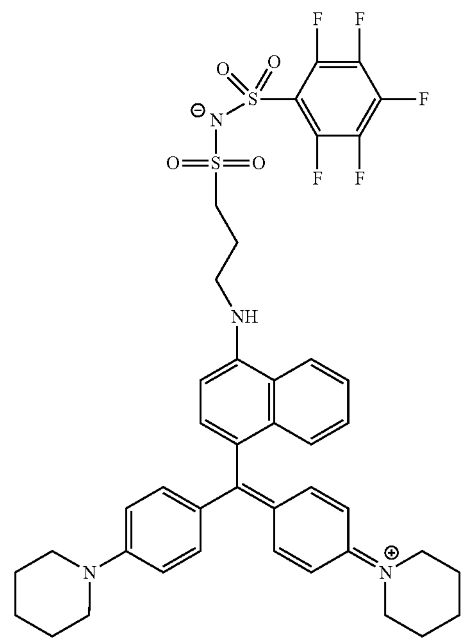

(A-tp-4)

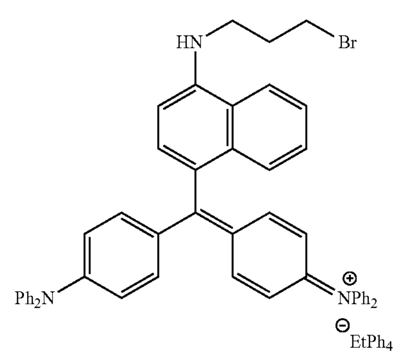

<Synthesis Example of Xanthene Compounds (A-xt-1) to (A-xt-5)>
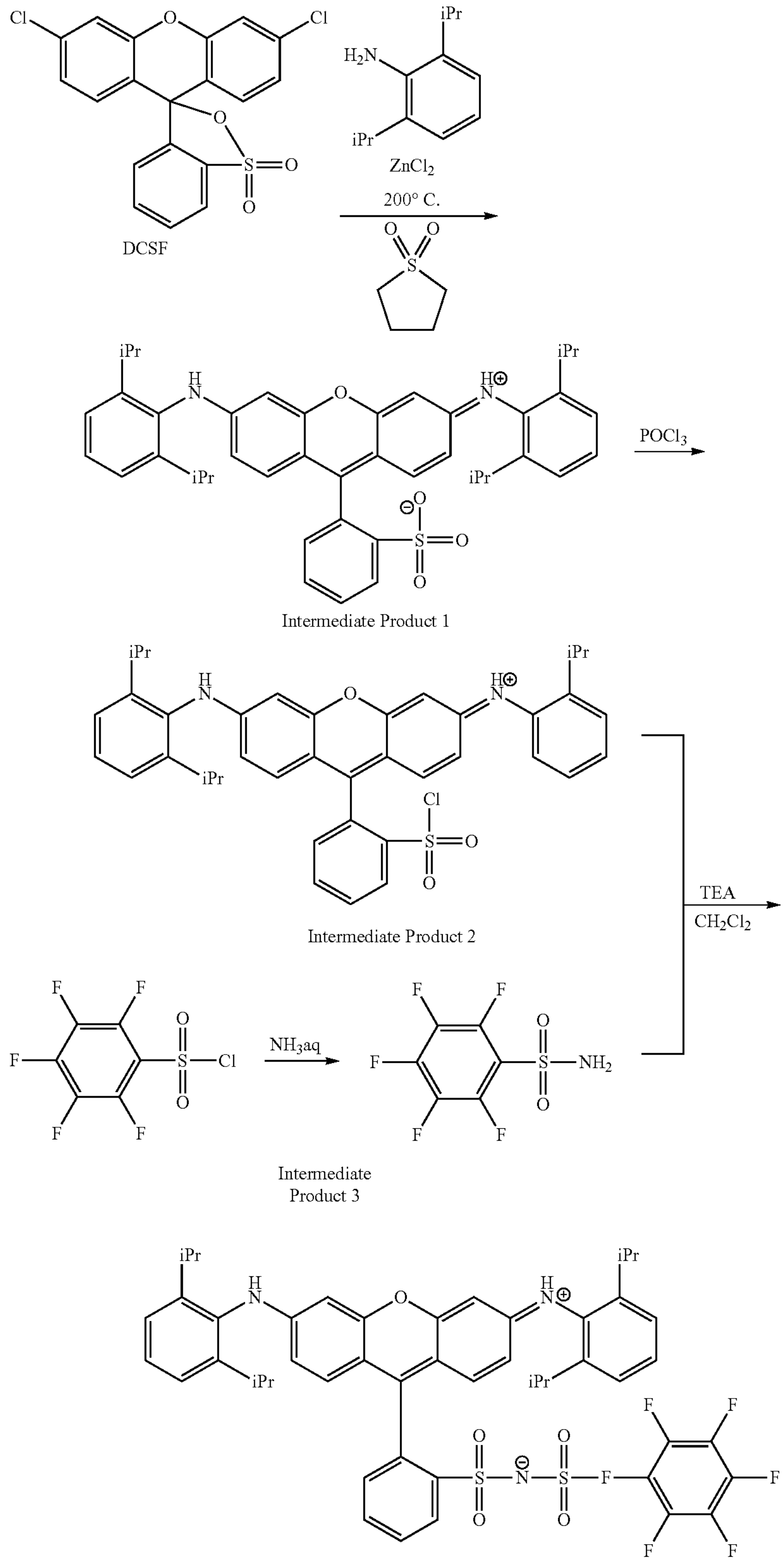
A-Xt-1

<<Synthesis of Intermediate Product 1>>

The following synthesis was performed using a glass flask. In addition, DCSF had a purity of 95% or higher when measured by liquid chromatography (HPLC) after dissolved in NMP, filtered through celite, and crystallized. In addition, 2,6-diisopropylaniline had a purity of 95% or higher when measured by HPLC after converted into a hydrochloride, treated with sodium hydroxide, and purified.

31 parts of DCSF (Spiro[3H-2,1-benzoxathiole-3,9'-[9H] xanthene], 3',6'-dichloro-, or 1,1-dioxide; manufactured by Chugai Kasei Co., Ltd.), 67 parts of 2,6-diisopropylaniline, 17 parts of zinc chloride, and 120 parts of sulfolane were put into a flask and were stirred at an outside temperature of 200 degrees for 8 hours. Next, the reaction solution was allowed to cool to room temperature and was added dropwise to 600 parts of 2 N hydrochloric acid water, and precipitated crystals were separated by filtration. The crystals was dispersed and washed in 600 parts of acetonitrile at 40 degrees, was separated by filtration, and was dried by blowing air for 10 hours. As a result, 42.5 parts (yield: 82%) of Intermediate Product 1 was obtained.

<<Synthesis of Intermediate Product 2>>

11 parts of Intermediate Product 1 and 50 parts of phosphorus oxychloride were put into a flask and were stirred at 60° C. for 4 hours. The reaction solution was allowed to cool to room temperature, was added dropwise to 150 parts of iced water, and was stirred for 30 minutes. The obtained crystals were separated by filtration, were washed with 20 parts of water, were dissolved in 150 parts of chloroform, and were filtered through celite. The filtrate was washed with 100 parts of a 5% saline solution and 100 parts of a 15% saline solution separately. The solution was dried with sodium sulfate and was condensed under reduced pressure. As a result, 12.1 parts (yield: 91%) of Intermediate Product 2 was obtained.

<<Synthesis of Intermediate Product 3>>

15 parts of pentafluorobenzenesulfonyl chloride and 300 parts of tetrahydrofuran (THF) were put into a flask and were cooled such that the inside temperature reached −10° C. 6.8 parts of 28% ammonia water was added dropwise to the reaction solution such that the reaction solution was held at 0° C. or lower. After the dropwise addition, the reaction solution was stirred at 0° C. for 1 hour and was filtered. The obtained filtrate was condensed under reduced pressure, and THF was removed from the filtrate. Next, 100 parts of water was added to the filtrate, and the components were stirred. The obtained solid was filtered, was washed with water, was dried by blowing air for 10 hours. As a result, 11.7 parts (yield: 84%) of Intermediate Product 3 was obtained.

<<Synthesis of Xanthene Compound (A-xt-1)>>

5 parts of intermediate product 3, 18.0 parts of intermediate product 2, and 50 parts of methylene chloride were put into a flask and were stirred at room temperature. 6.1 parts of triethylamine (TEA) was added to the flask, and the components were stirred at room temperature for 2 hours. After completion of the reaction, the reaction solution was purified by column chromatography using a chloroform/ethyl acetate solution. As a result, 11.1 parts (yield: 60%) of A-xt-1 was obtained.

<Synthesis Examples of Xanthene Compounds (A-xt-2) to (A-xt-5)>

Xanthene Compounds (A-xt-2) to (A-xt-5) were synthesized using the same method as in Xanthene Compound (A-xt-1).

(A-xt-2)

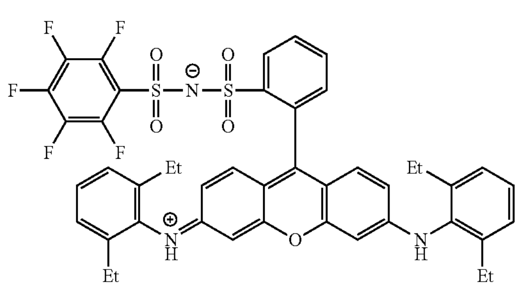

(A-xt-3)

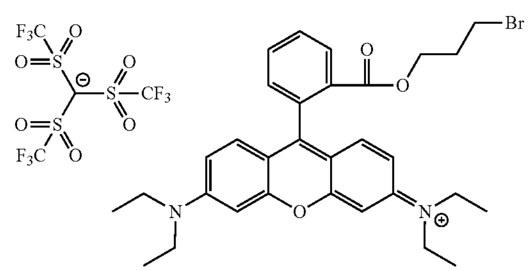

(A-xt-4)

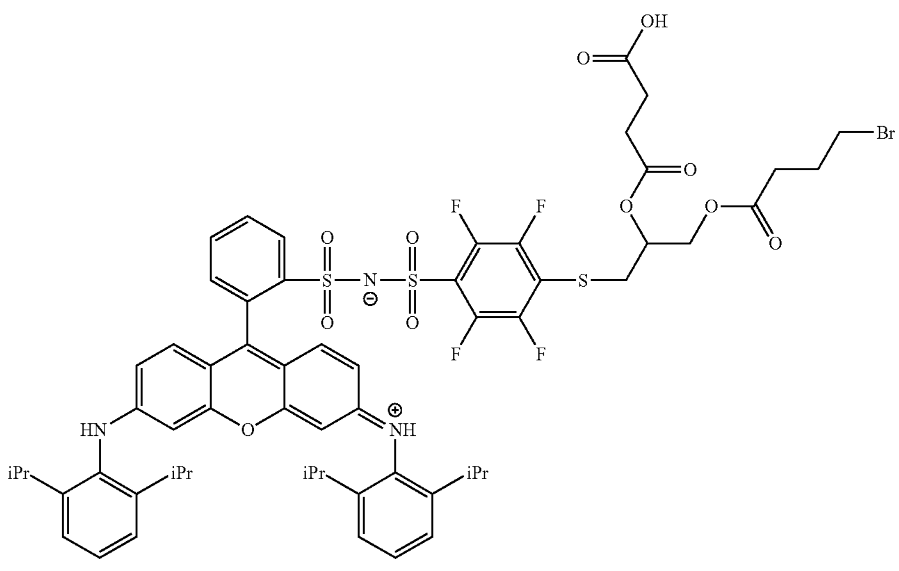

-continued
(A-xt-5)
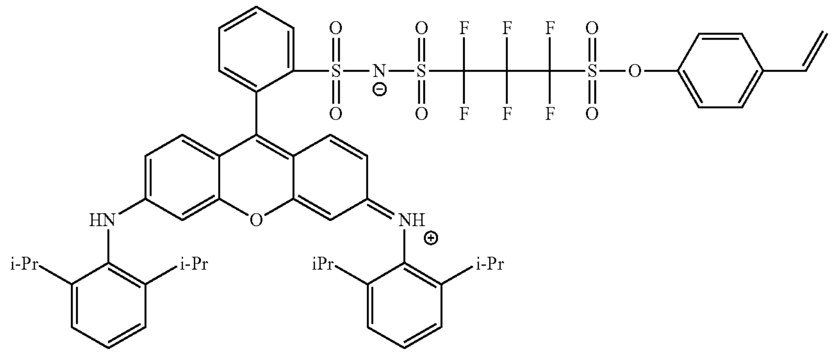
<Synthesis of Compound having 3 to 15 Mercapto Groups in One Molecule>
As shown below, Compounds (S-6) and (S-4) having 3 to 15 mercapto groups in one molecule were synthesized. (S-1) to (S-3), (S-5), and (S-7) to (S-19) were also synthesized using the same method.
<<Synthesis of (S-6)>>
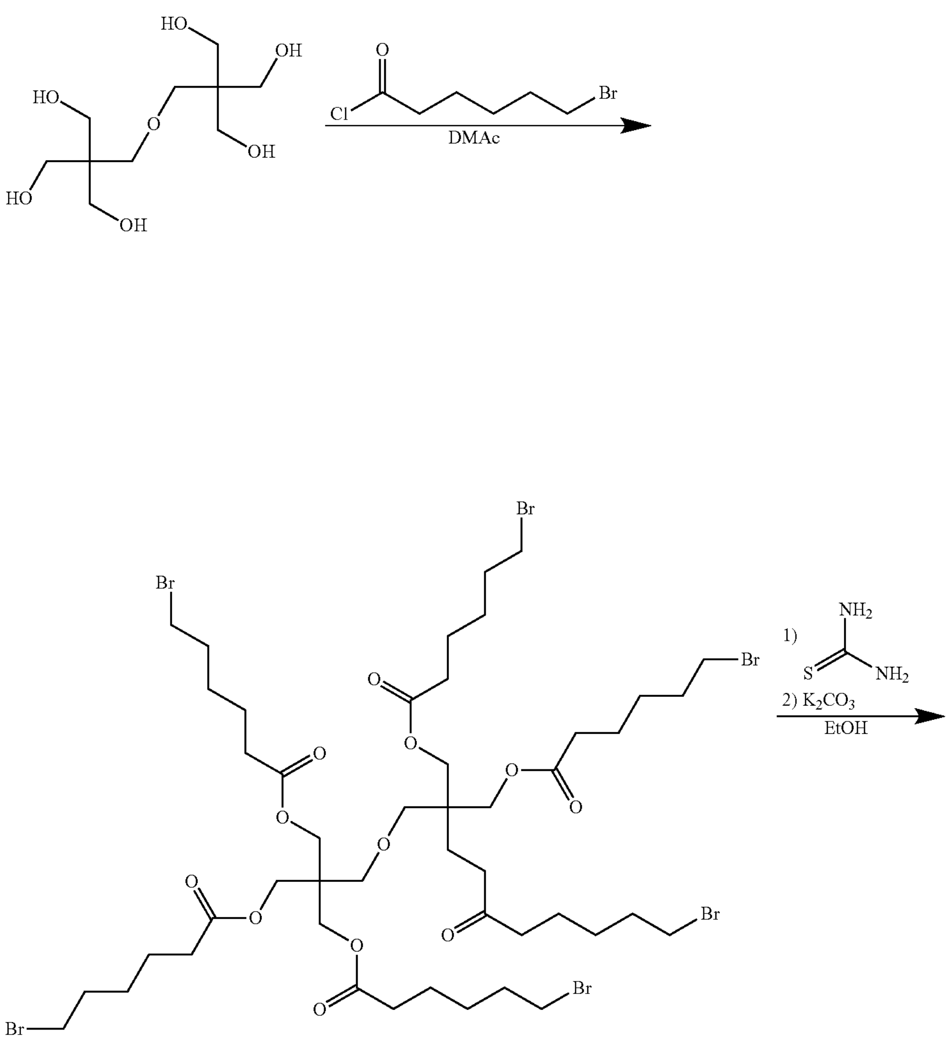
Intermediate Product 1

-continued

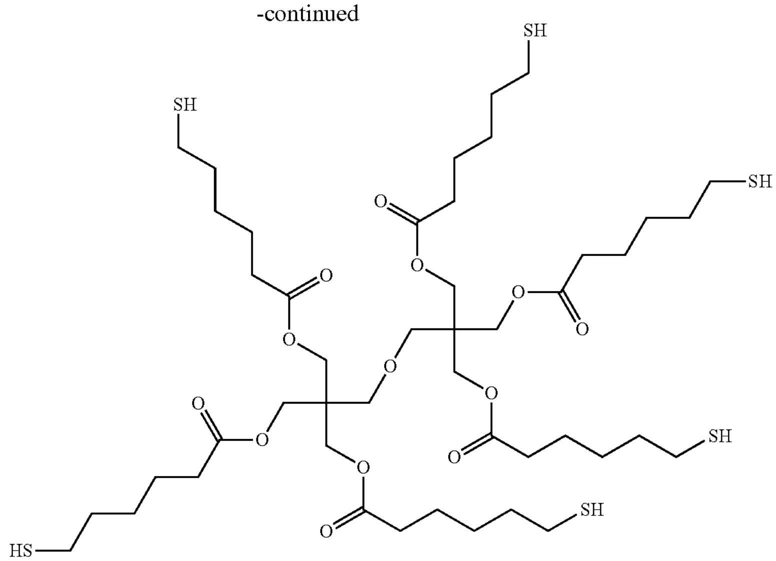

(S-6)

5 parts of dipentaerythritol and 80 parts of dimethylacetamide were put into a three-necked flask and were stirred in a water bath in a nitrogen atmosphere at 20° C. 31 parts of 6-bromohexanoyl chloride was added dropwise to the reaction solution such that temperature did not exceed 30° C., and the components were stirred at room temperature for 2 hours. The reaction solution was added to 350 parts of 1 N hydrochloric acid water little by little until the reaction was stopped. Next, 500 parts of ethyl acetate was added to perform a liquid separation operation. Next, the organic layer was washed with 250 parts of a saturated sodium bicarbonate solution, 250 parts of water, and 150 parts of a saturated saline solution. Sodium sulfate was added to the obtained organic layer and was filtered. The filtrate was condensed under reduced pressure. As a result, 24 parts of Intermediate Product 1 was obtained.

Next, 20 parts of Intermediate Product 1, 8.9 parts of thiourea, 200 parts of ethanol, and 17.6 parts of potassium iodide were put into a three-necked flask and were heated to reflux so as to react with each other in a nitrogen atmosphere for 18 hours. Next, 81 parts of a 20% potassium carbonate aqueous solution was added to the reaction solution, and the components were caused to react with each other at 70° C. for 3 hours and then were cooled. Next, 150 parts of 1 N hydrochloric acid water and 300 parts of chloroform were added to perform a liquid separation operation. The organic layer was washed with 150 parts of a saturated saline solution twice. Sodium sulfate was added to the organic layer and was filtered. The filtrate was condensed under reduced pressure. As a result, 14.7 parts of (S-6) was obtained.

<<Synthesis of (S-4)>>

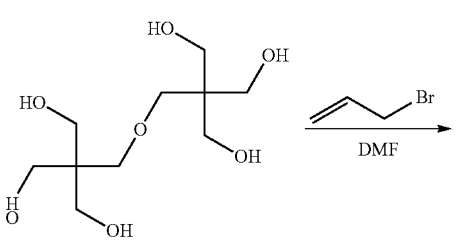

-continued

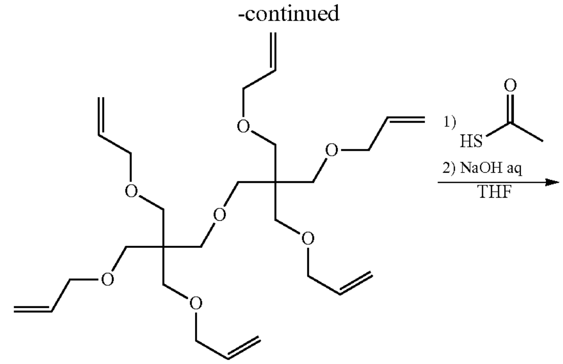

Intermediate Product 2

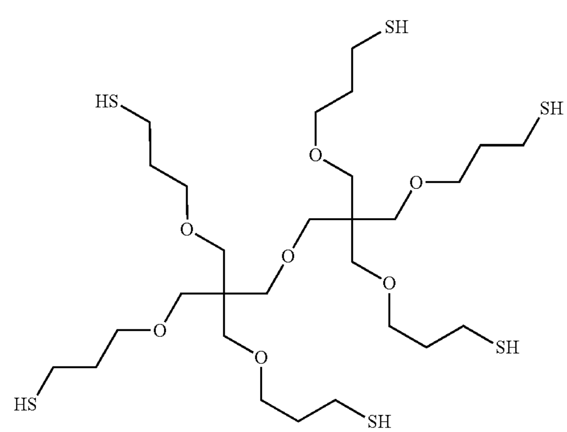

(S-4)

15 parts of dipentaerythritol, 270 parts of dehydrated DMF (N,N-dimethylformamide), and 86 parts of allyl bromide were put into a three-necked flask and were stirred in a water bath in a nitrogen atmosphere at 20° C. 35 parts of sodium hydride (60% oil dispersion) in total was added to the reaction solution such that the temperature did not exceed 35° C., and the components were stirred at room temperature for 2 hours. The reaction solution was added to 200 parts of 1 N hydrochloric acid water little by little until the reaction was stopped. Next, 200 parts of ethyl acetate was added to perform a liquid separation operation. Next, the organic layer was washed with 200 parts of 1 N hydrochloric acid water, 200 parts of water, and 200 parts of a saturated saline solution. Sodium sulfate was added to the obtained organic layer and was filtered. The filtrate was condensed under reduced pressure. As a result, 28 parts of Intermediate Product 2 was obtained.

Next, 25 parts of Intermediate Product 2 and 58 parts of thioacetic acid were dissolved in 125 parts of dehydrated THF (tetrahydrofuran), and the solution was stirred in a nitrogen atmosphere at 70° C. for 30 minutes. Next, 2 parts of azobisisobutyronitrile was added, and the components were stirred at 70° C. for 4 hours. The obtained reaction solution was condensed under reduced pressure, dehydrated methanol was added, and 19 parts of sodium methoxide (28% methanol solution) was added. After 1 hour, the reaction solution was added dropwise to 120 parts of 1 N hydrochloric acid water while cooling it in an ice bath. Next, 200 parts of ethyl acetate was added to perform a liquid separation operation. Next, the organic layer was washed with 200 parts of 1 N hydrochloric acid water, 200 parts of water, and 200 parts of a saturated saline solution. Sodium sulfate was added to the obtained organic layer and was filtered. The filtrate was condensed under reduced pressure. As a result, 13 parts of (S-4) was obtained.

<Synthesis of Mercapto Compound Having Colorant Structure>

As shown below, a mercapto compound having a colorant structure was synthesized.

<<Synthesis Example>>

<<Synthesis of (B-1)>>

2.0 parts of Compound (S-6) having 3 to 15 mercapto groups in one molecule, 6.2 parts of Xanthene Compound (A-xt-1), and 1.03 parts of diazabicycloundecene were dissolved in 39.8 parts of dimethylformamide (DMF) and were stirred at 25° C. for 2 hours. After the reaction, the reaction solution was added dropwise to a mixed solvent including 250 parts of 1 N hydrochloric acid water such that a solid was obtained by reprecipitation and filtration. The obtained solid was put into 250 parts of acetonitrile, was suspended and washed, and was reprecipitated and filtered. As a result, 7.4 parts of the following Mercapto Compound (B-1) was obtained. It was verified by NMR measurement that a ratio of colorant sites to R sites was 3.5.

(B-1)

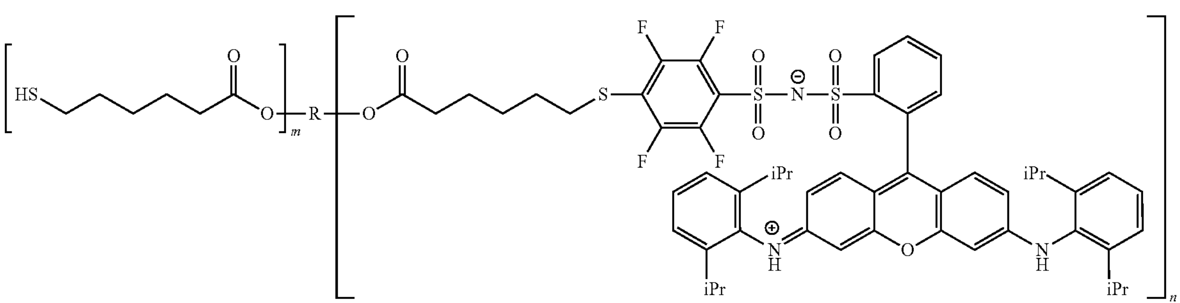

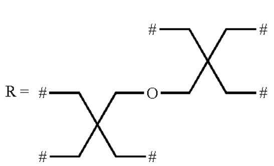

<Synthesis of (B-2) to (B-27) and (Comp-1) to (Comp-3)>

(B-2) to (B-27) and (Comp-1) to (Comp-3) were synthesized using the same method as in (B-1) such that m and n represent as shown in Table 1 after changing (A-xt-1) was changed to a colorant corresponding to (A-xt-1) and changing (S-6) to a compound having a mercapto group corresponding to (S-6).

In Table 1, (A-xt-1) to (A-xt-5), (A-tp-1) to (A-tp-5), (A-aq-1), (A-az-1), (A-sq-1), (A-Pc-1), (A-subPc-1), (A-Qu-1), and (A-pm-1) represent the colorants having the above-described structures.

(B-2)

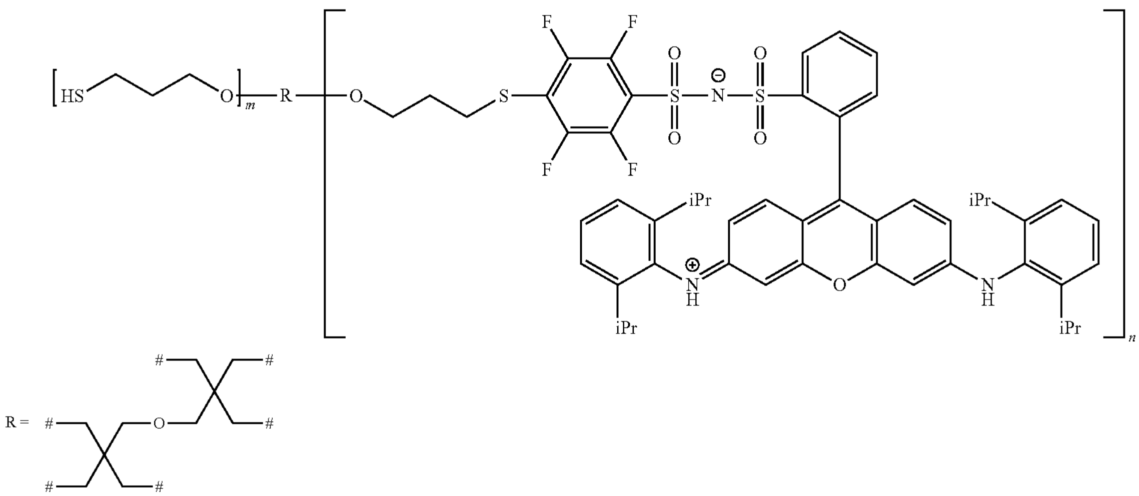

(B-3)

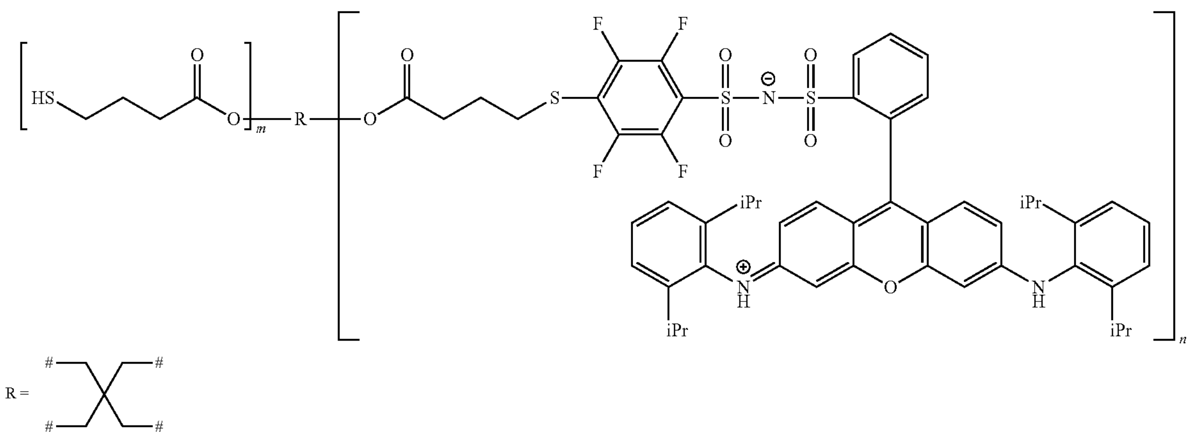

(B-4)

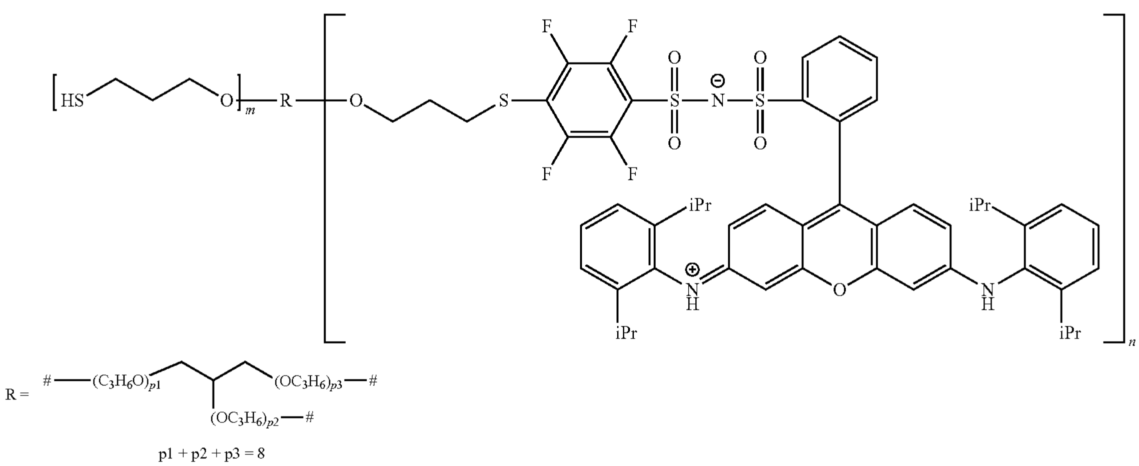

-continued
(B-5)
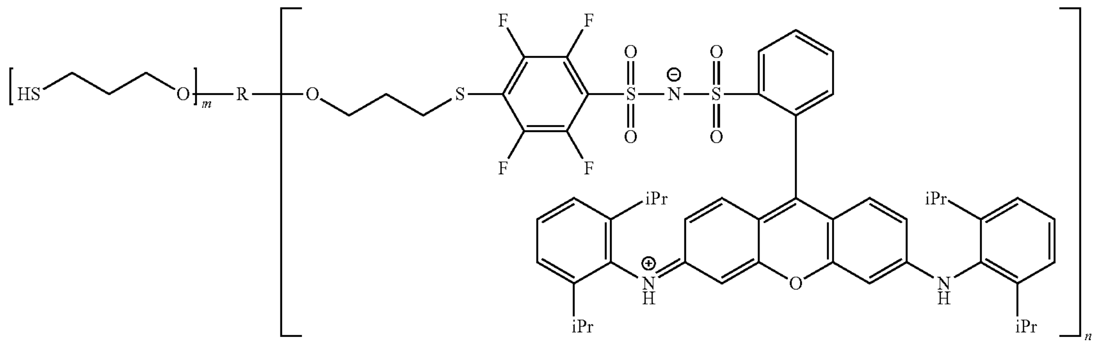
R = 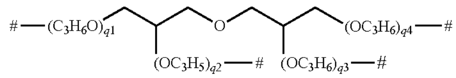
$q1 + q2 + q3 + q4 = 9$
(B-6)
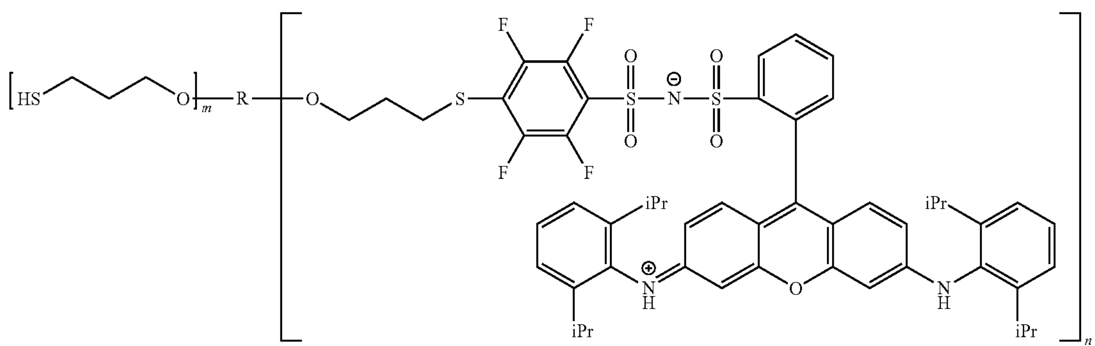
R = 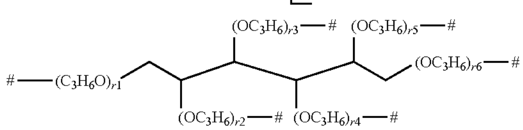
$r1 + r2 + r3 + r4 + r5 + r6 = 25$
(B-7)
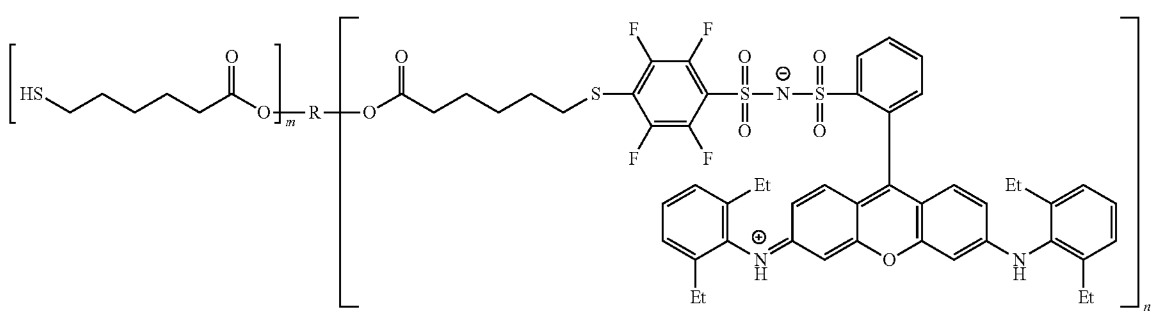
R = 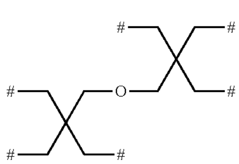

-continued
(B-9)
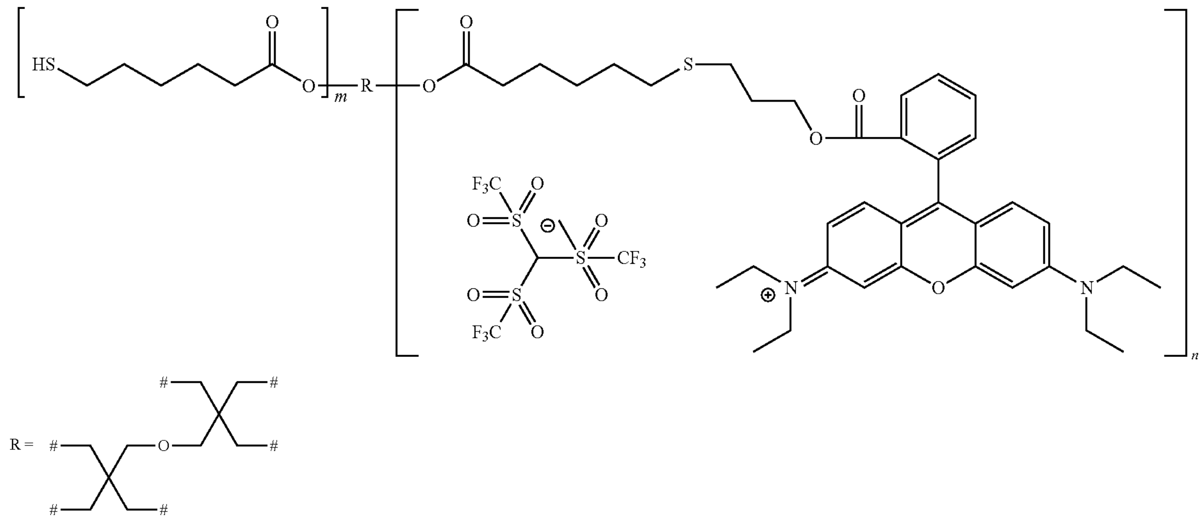
(B-10)
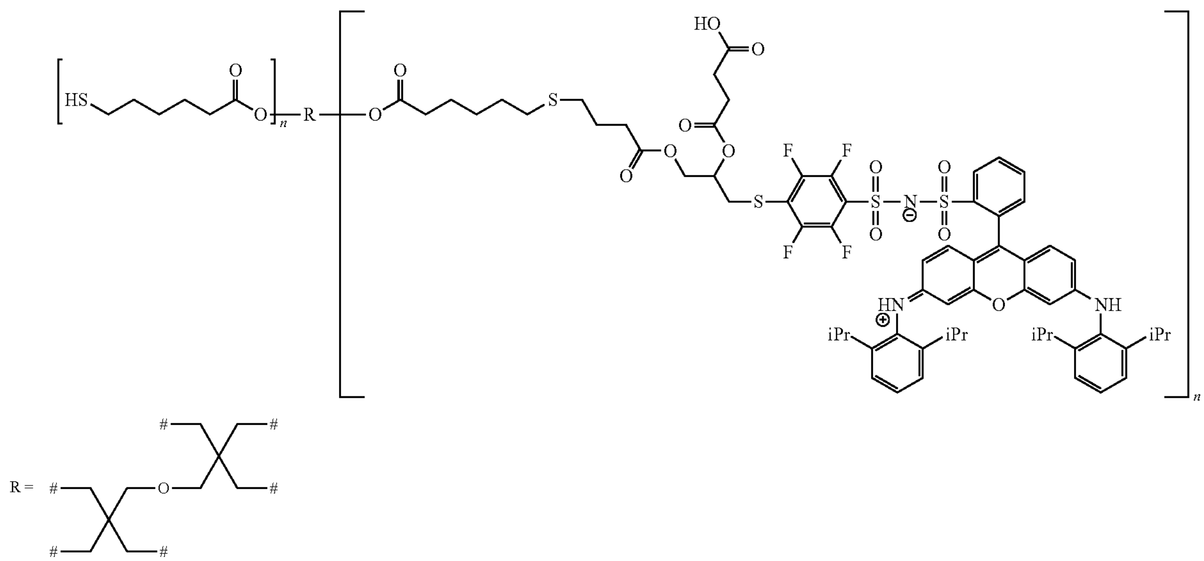
(B-11)
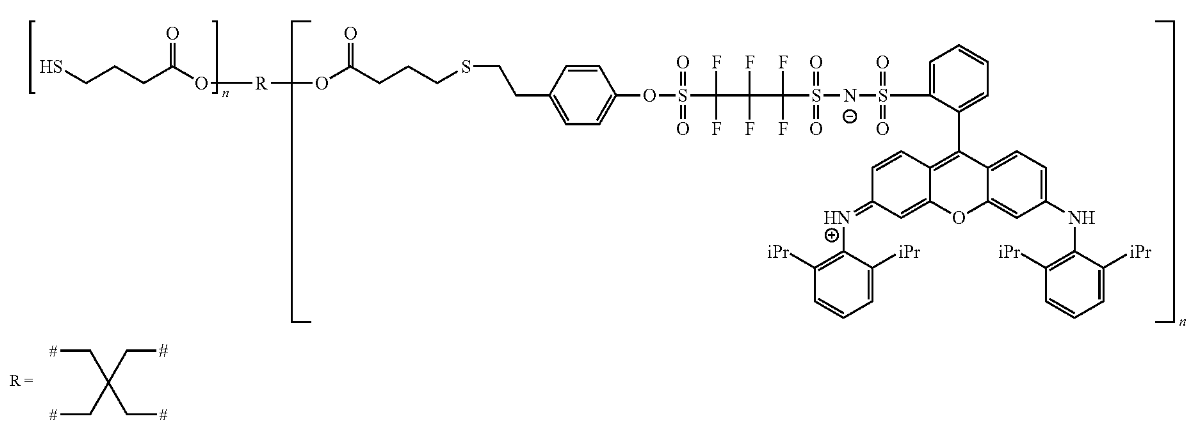

-continued
(B-12)
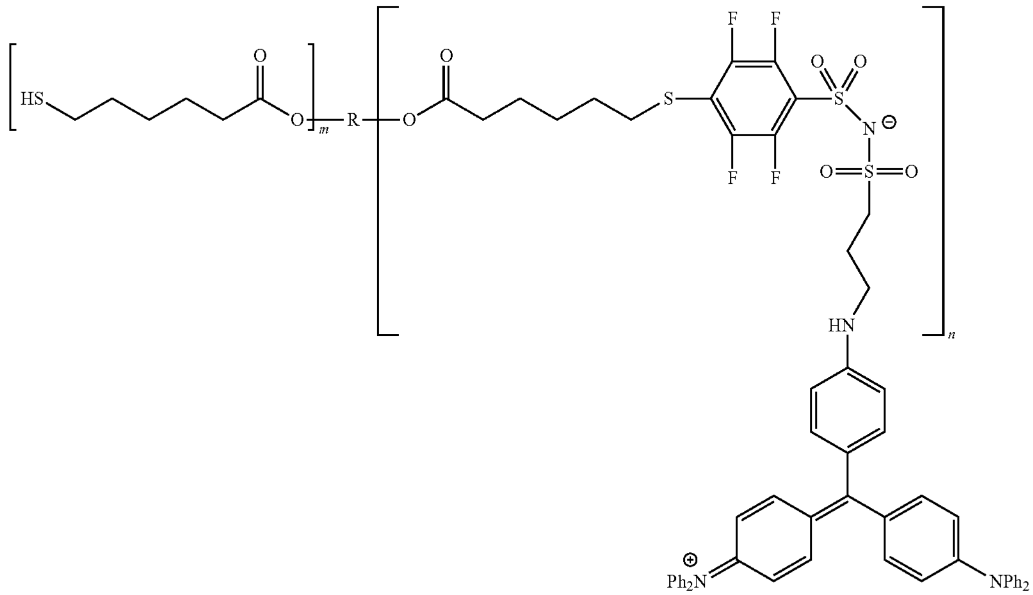
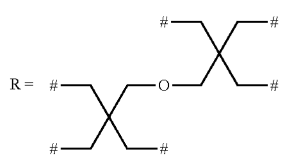
(B-13)
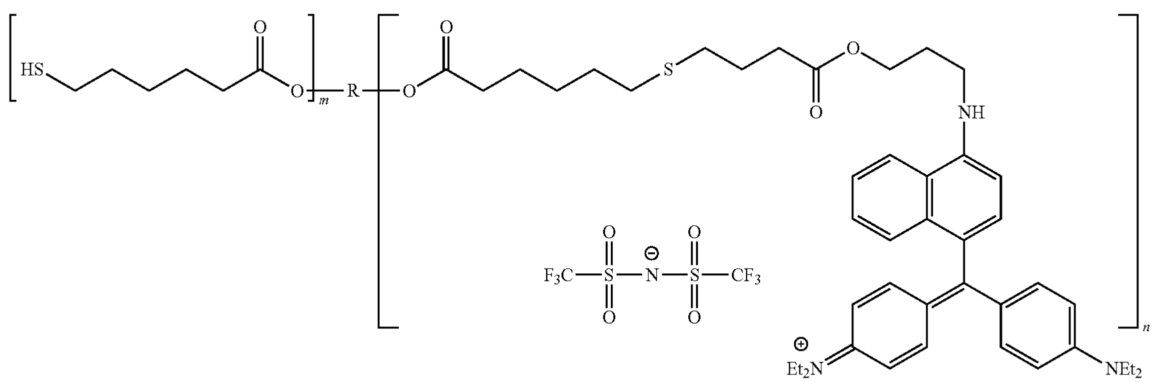
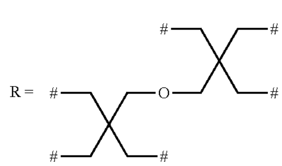

-continued
(B-14)
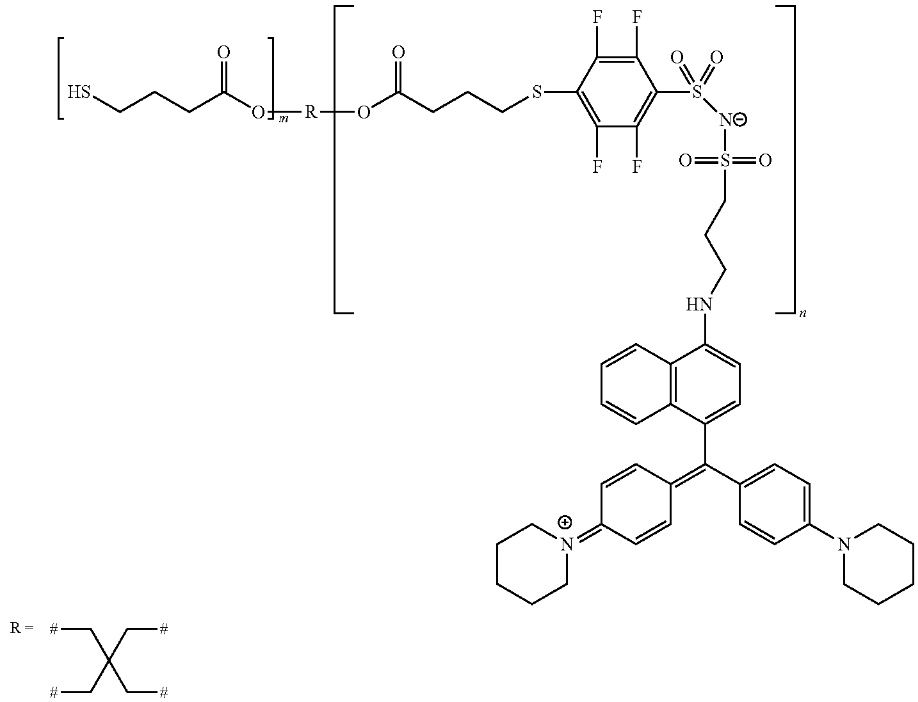
(B-15)
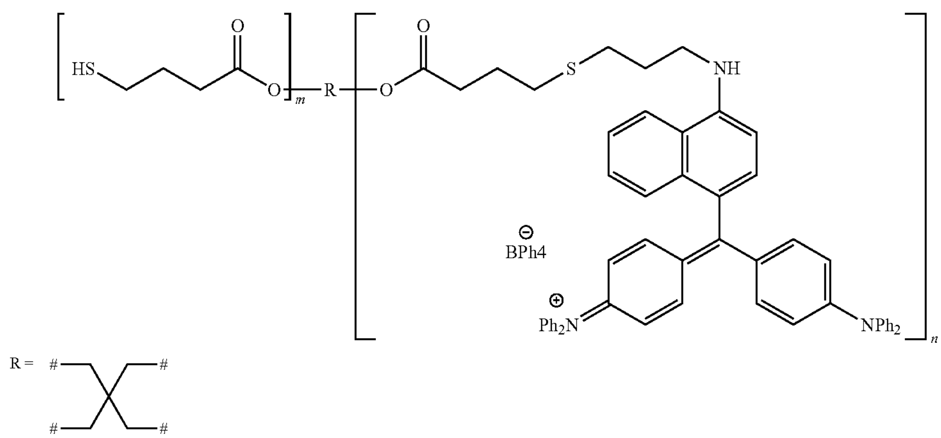
(B-16)
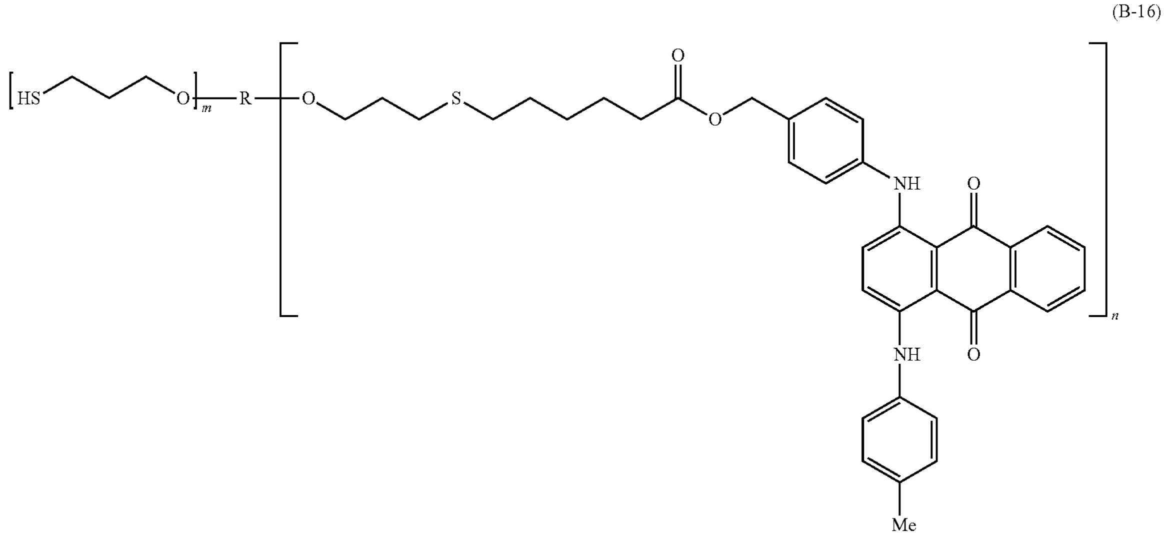

-continued
R = 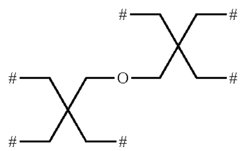
(B-17)
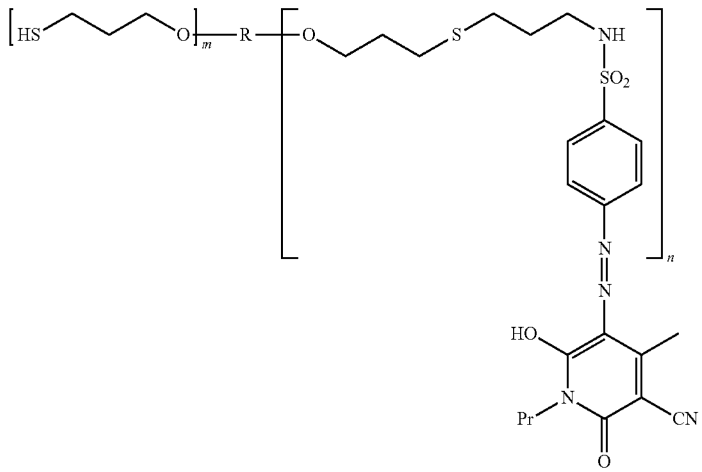
R = 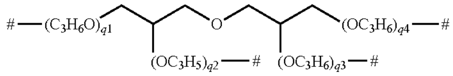
q1 + q2 + q3 + q4 = 9
(B-18)
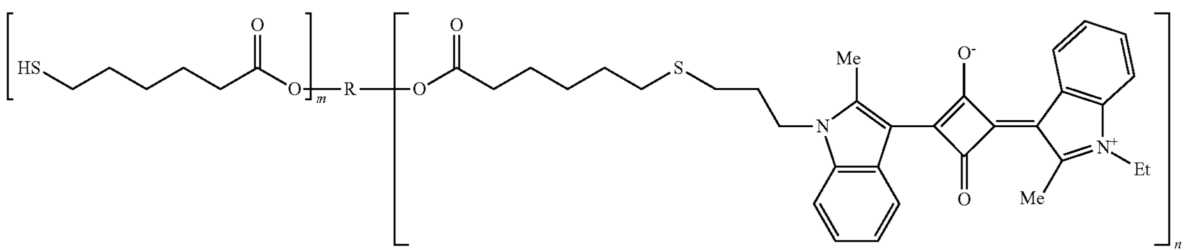
R = 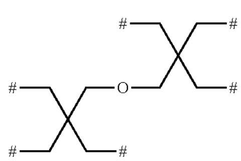
(B-19)
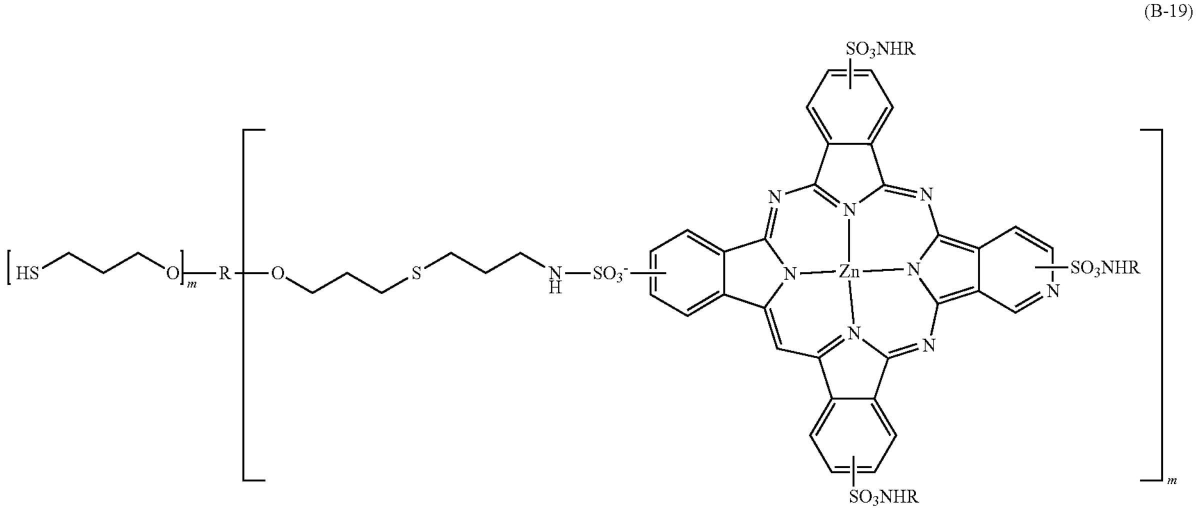

-continued
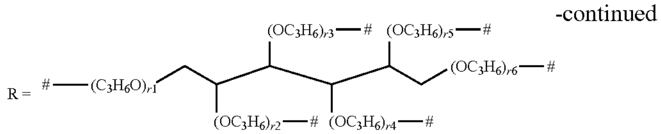
r1 + r2 + r3 + r4 + r5 + r6 = 25
(B-20)
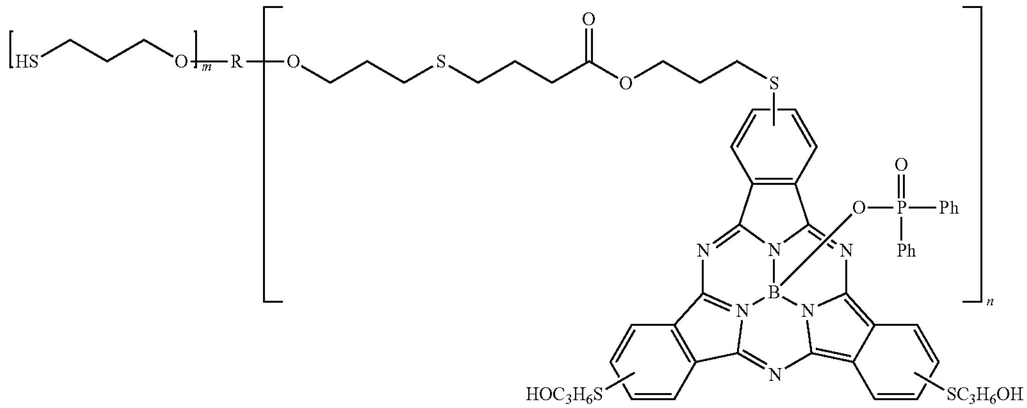
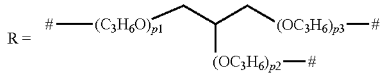
p1 + p2 + p3 = 8
(B-21)
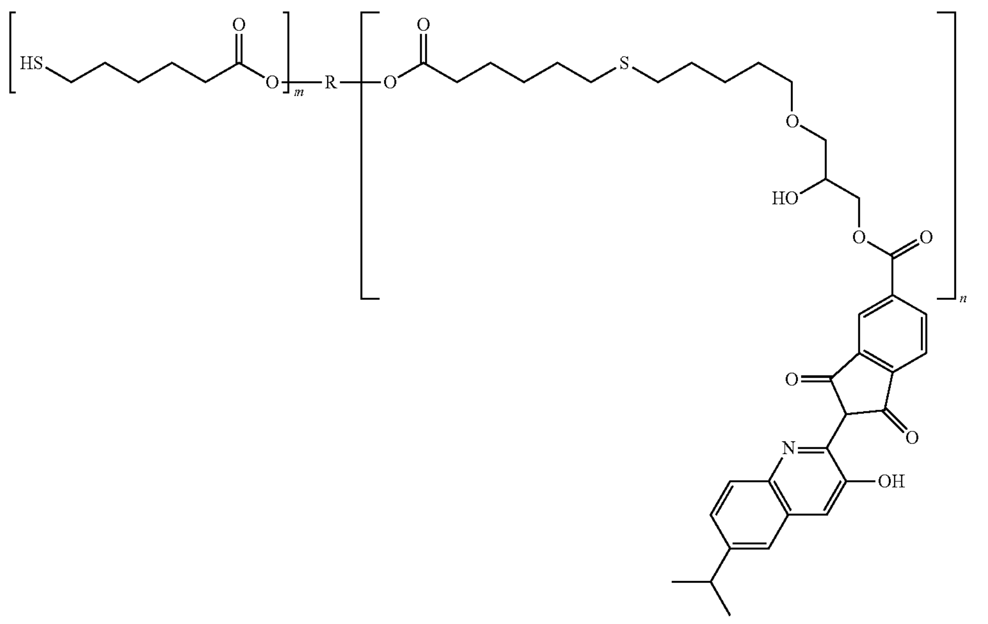
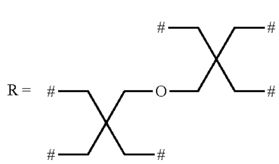

-continued
(B-22)
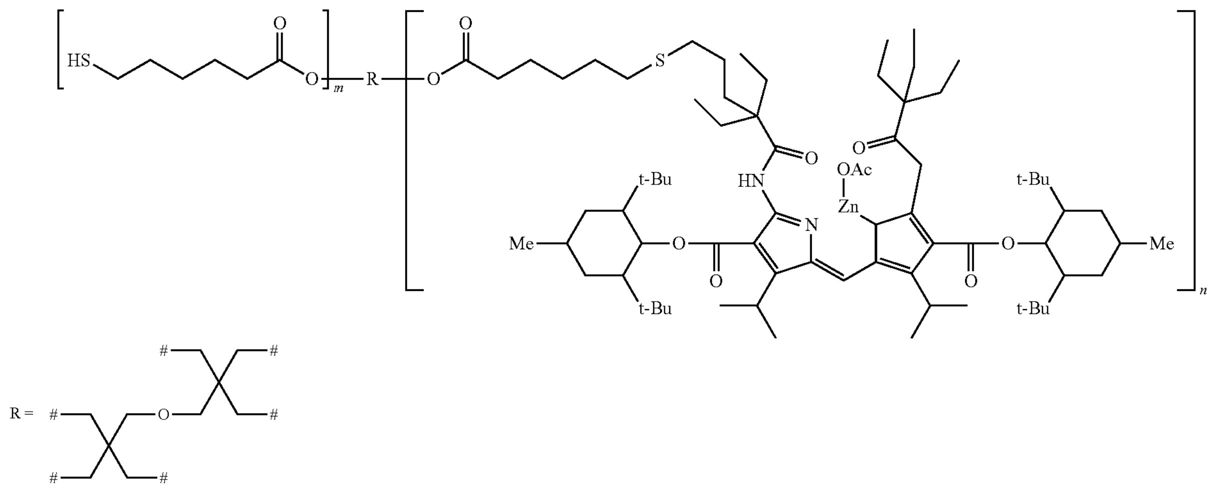
(B-23)
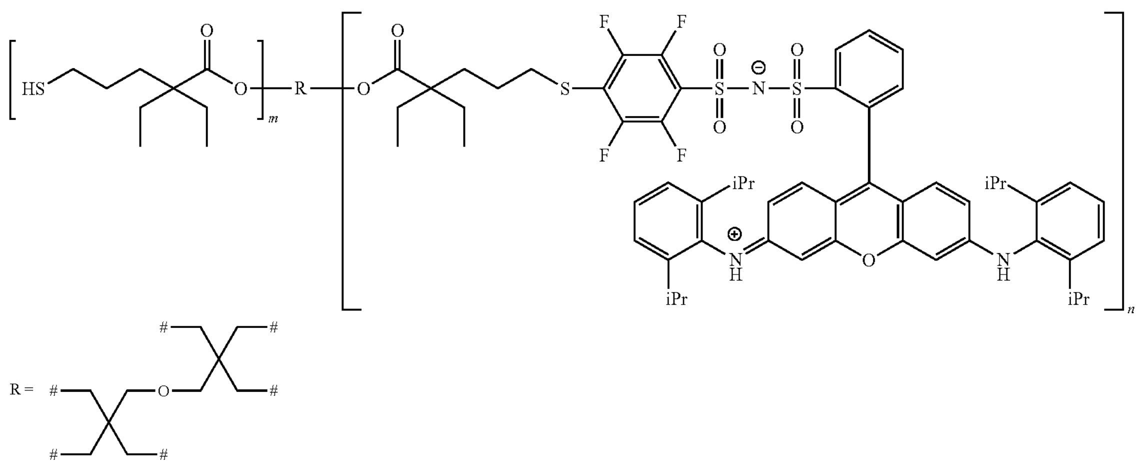
(B-24)
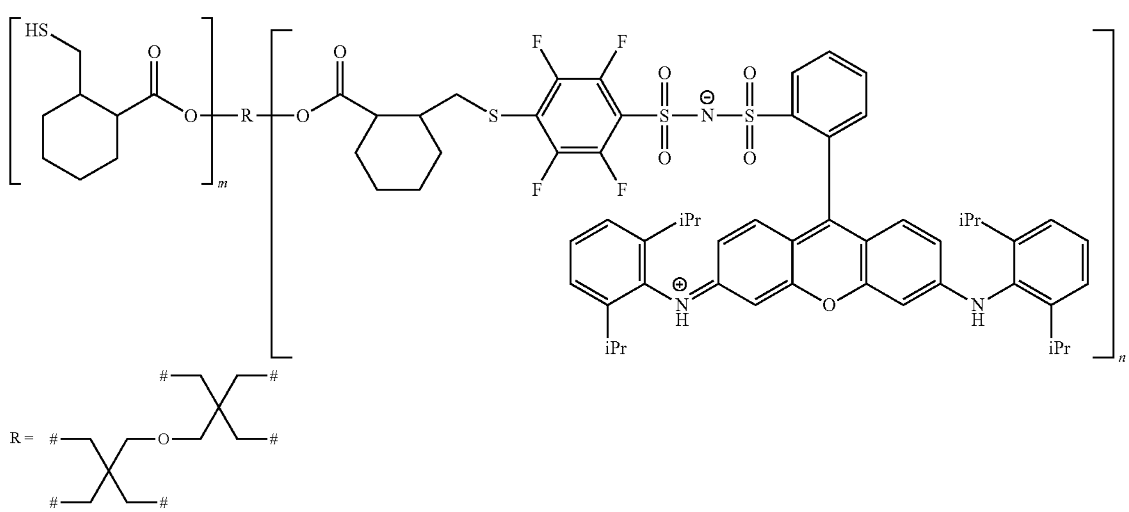

-continued
(B-25)
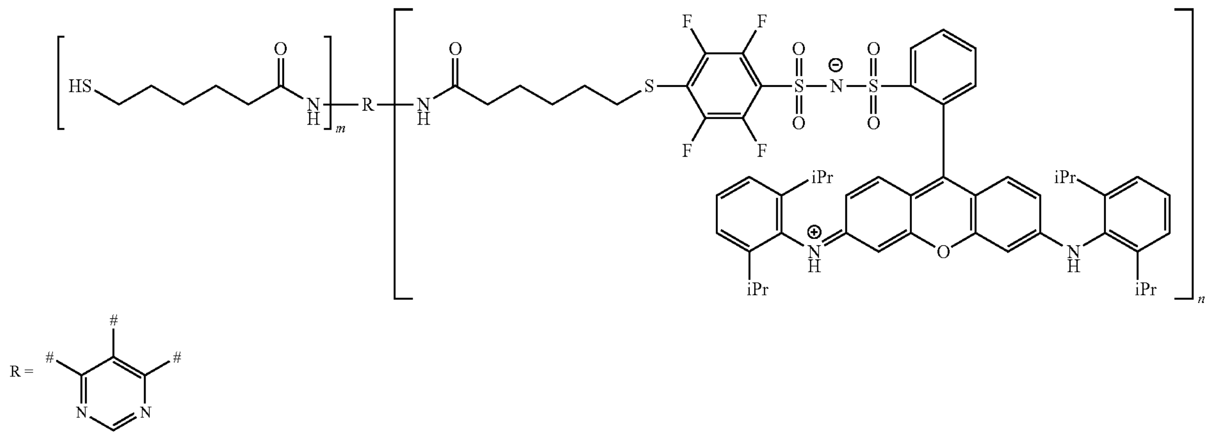
(B-26)
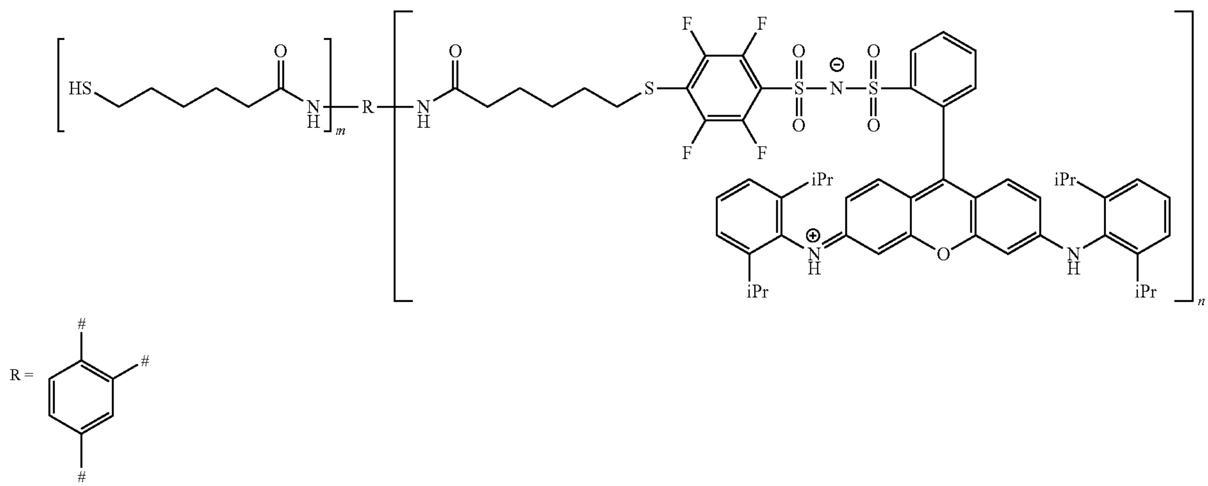
(B-27)
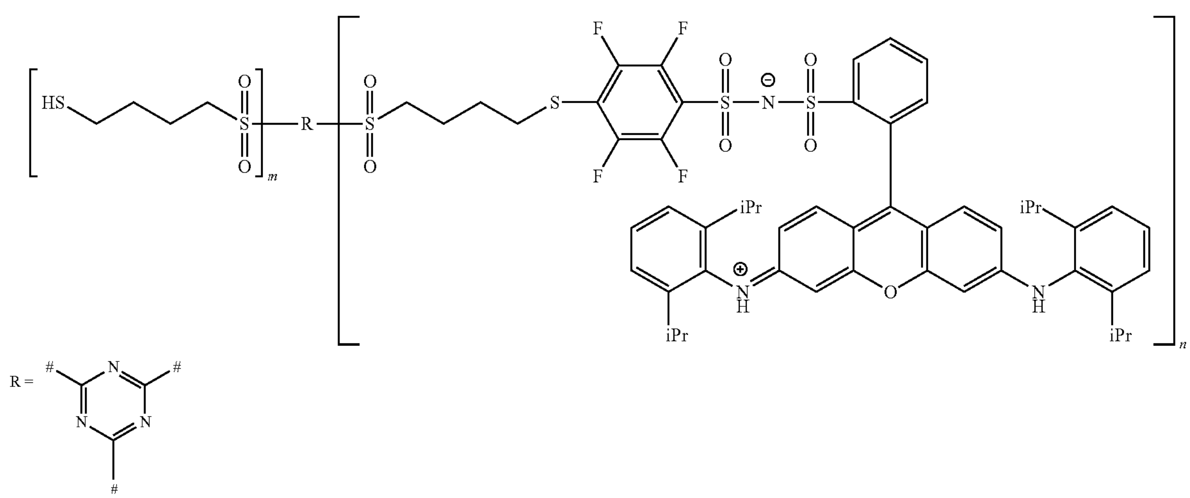

-continued (Comp-1)

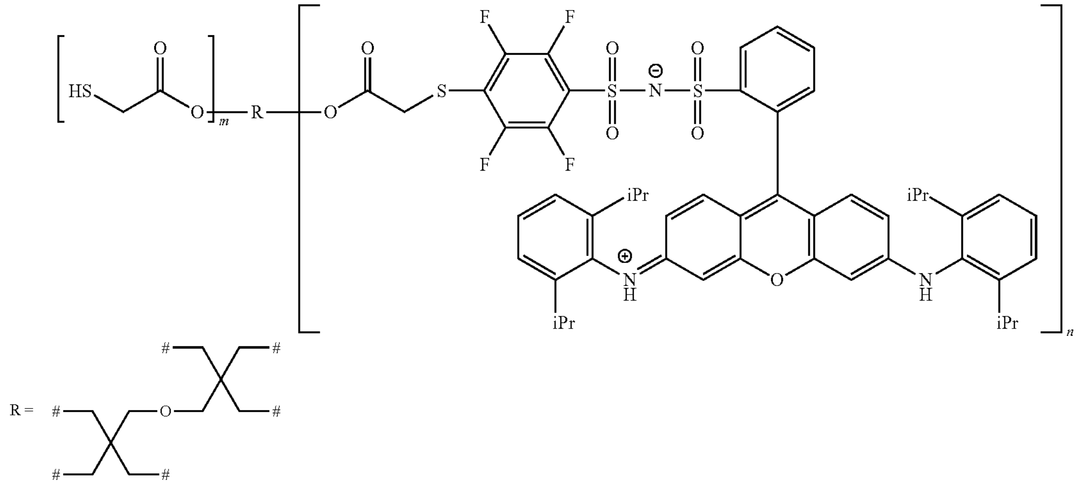

(Comp-2)

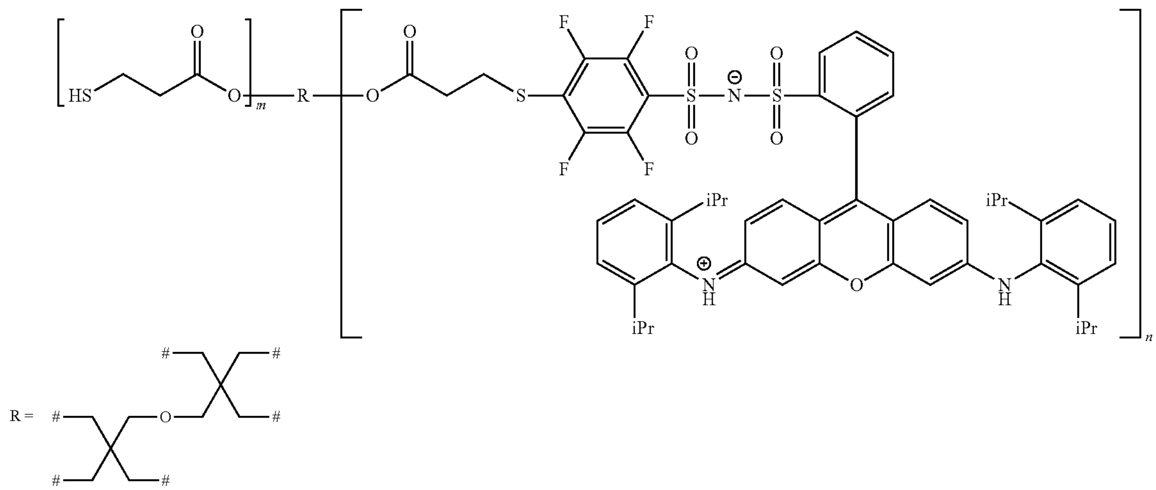

(Comp-3)

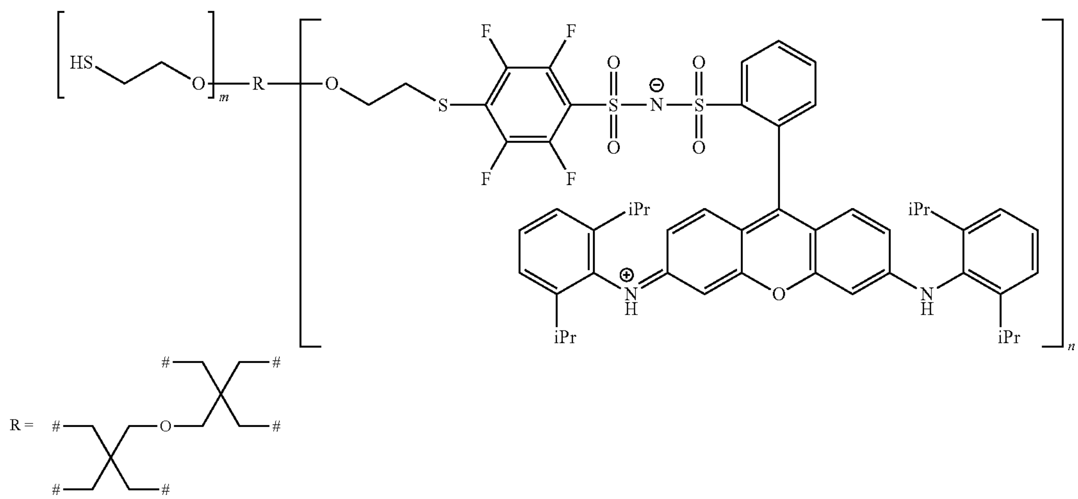

<Synthesis of Colorants (Po-1 to Po-22) Represented by Formula (1)>

Synthesis of (Po-1)

A mixed solution of 5.0 parts of Mercapto Compound (B-1), 0.62 parts of methacrylic acid (MAA), 1.07 parts of ethylene glycol mono-2-bromoisobutyrate monomethacrylate (BBEM), and 9.0 parts of N-ethylpyrrolidone was heated to 90° C. in a nitrogen stream. 0.087 parts of dimethyl 2,2'-azobis(isobutyrate) [V-601; manufactured by Wako Pure Chemical Industries, Ltd.] was added to the mixed solution, and the components were heated and stirred at 90° C. for 1.5 hours. Further, 0.087 parts of V-601 was added, and the components were heated and stirred at 90° C. for 1.5 hours. Further, 0.087 parts of V-601 was added, and the components were heated and stirred at 90° C. for 2 hours. The solution was cooled to room temperature, 10.0 parts of diazabicycloundecene (DBU) was slowly added, and the components were stirred at room temperature for 14 hours. Next, the solution was cooled to 5 degrees or lower in an ice bath, and 6.3 parts of methanesulfonic acid was slowly added. After the reaction, the reaction solution was added dropwise to a mixed solvent including 250 parts of 1 N hydrochloric acid water such that a solid was obtained by reprecipitation and filtration. The obtained solid was put into 250 parts of acetonitrile, was suspended and washed, and was reprecipitated and filtered. As a result, 6.0 parts of the following Colorant (Po-1) according to the present invention was obtained. The weight average molecular weight (value in terms of polystyrene) of Po-1 was 8900, and the acid value thereof was 60 mgKOH/g when obtained by titration using a 0.1 N sodium hydroxide aqueous solution. In addition, when obtained by NMR, a molar ratio of colorant structure/MAA/HBr-Eliminated portion of BBEM was 3.5/6/4.5, and the average number of P sites repeated was calculated as 4.

In addition, the turbidity of Po-1 in 5 mass % cyclohexanone was 0.5 ppm.

In addition, the content of free metals which were neither bonded nor coordinated to Po-1 was 2 ppm or lower, the free metals being selected from the group consisting of Al, Ca, Cu, Cr, Mg, Fe, Mn, Ni, Co, Cd, Li, Pb, Na, K, Zn, and P. Further, the content of free Br which was neither bonded nor coordinated to Po-1 was 500 ppm, and the content of free C1 which was neither bonded nor coordinated to Po-1 was 100 ppm.

Synthesis of (Po-7)

A mixed solution of 5.0 parts of Mercapto Compound (B-7), 0.41 parts of itaconic acid (ICA), and 9.0 parts of N-ethylpyrrolidone was heated to 90° C. in a nitrogen stream. 0.022 parts of dimethyl 2,2'-azobis(isobutyrate) [V-601; manufactured by Wako Pure Chemical Industries, Ltd.] was added to the mixed solution, and the components were heated and stirred at 90° C. for 1.5 hours. Further, 0.022 parts of V-601 was added, and the components were heated and stirred at 90° C. for 1.5 hours. Further, 0.022 parts of V-601 was added, and the components were heated and stirred at 90° C. for 2 hours. The solution was cooled to room temperature, 30.0 parts of N-ethylpyrrolidone, 0.05 parts of tetrabutylammonium bromide (TBAB), and 0.27 parts of glycidyl methacrylate (GMA) were added, and the components were stirred at 80° C. for 18 hours. The reaction solution was cooled to room temperature and then was added dropwise to 250 parts of a mixed solvent of hexane/ethyl acetate such that a solid was reprecipitated. As a result, 5.1 parts of the following Colorant (Po-7) according to the present invention was obtained. The weight average molecular weight (value in terms of polystyrene) of Po-7 was 7200, and the acid value thereof was 44 mgKOH/g when obtained by titration using a 0.1 N sodium hydroxide aqueous solution. In addition, when obtained by NMR, a molar ratio of colorant structure/MAA/ICA/adduct of ICA and GMA was 3.5/3.5/2.

In addition, the turbidity of Po-7 in 5 mass % cyclohexanone was 1.5 ppm.

In addition, the content of free metals which were neither bonded nor coordinated to Po-7 was 2 ppm or lower, the free metals being selected from the group consisting of Al, Ca, Cu, Cr, Mg, Fe, Mn, Ni, Co, Cd, Li, Pb, Na, K, Zn, and P. Further, the content of free Br which was neither bonded nor coordinated to Po-7 was 400 ppm, and the content of free C1 which was neither bonded nor coordinated to Po-1 was 100 ppm.

(Po-1)

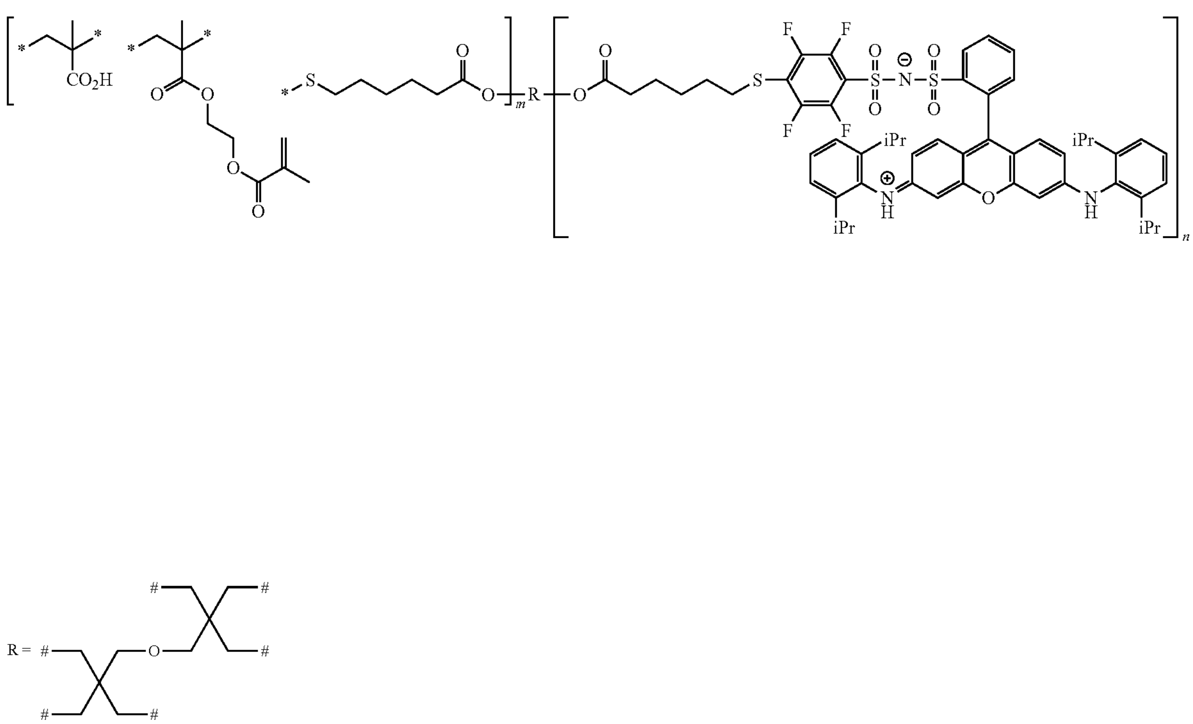

(Po-7)

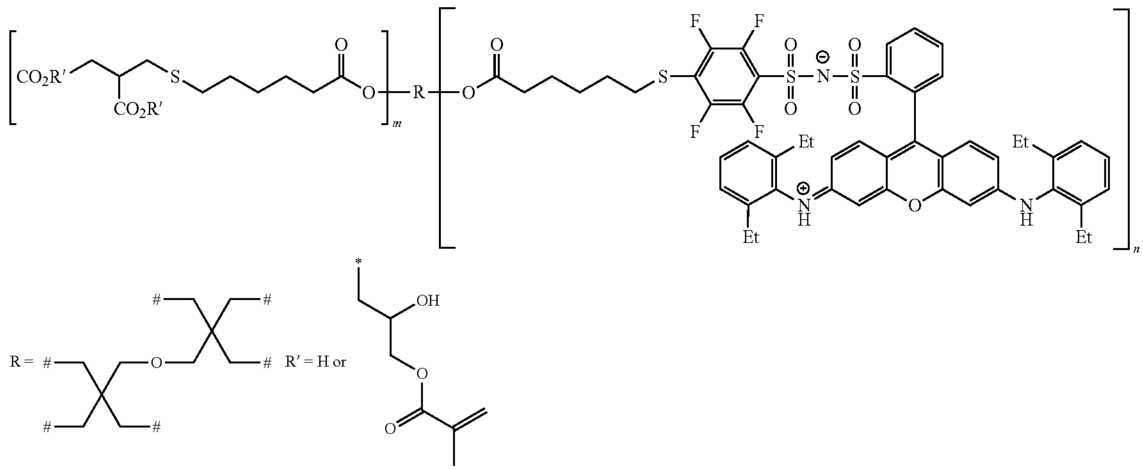

Synthesis of (Po-2) to (Po-6) and (Po-8) to (Po-27)

(Po-2) to (Po-6) and (Po-8) to (Po-27) were synthesized using the same method as in (Po-1) and (Po-7), except that the mercapto compound, the monomers, and the like used were changed as shown in Table 1.

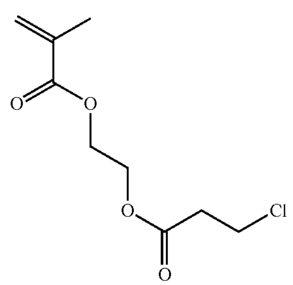

CEEMA (S-20)

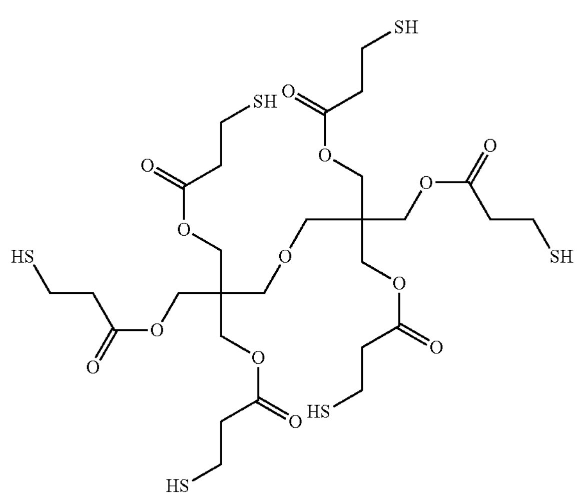

-continued (S-21)

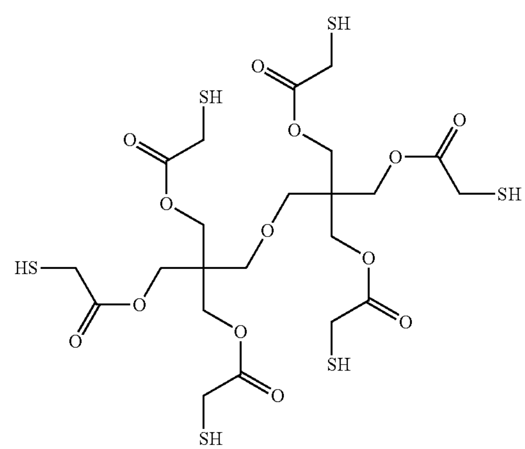

(S-22)

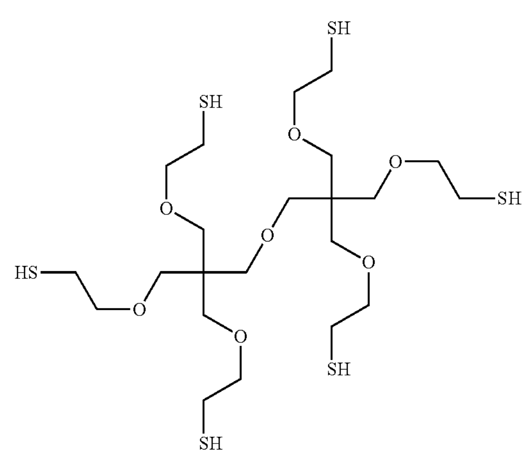

<Synthesis of Comparative Colorants 1 to 3>

Comparative Colorants 1 to 3 were synthesized using the same synthesis method as in (Po-1) and (Po-7), except that the mercapto compound, the monomers, and the like used were changed as shown in Table 1.

TABLE 1

| Colorant | Synthesis Method of Colorant | Intermediate Product | Mercapto Compound: $R^1$ | Mercapto Compound: Colorant (Structure Before Reaction) | Mercapto Compound: Addition Amount (Part(s)) | m:n | m | n | Monomer: Component 1 | Monomer: Molar Ratio | Monomer: Component 1 (Part(s)) | Monomer: Component 2 | Monomer: Molar Ratio | Monomer: Component 2 (Part(s)) |
|---|---|---|---|---|---|---|---|---|---|---|---|---|---|---|
| Po-1 | BBEM | B-1 | (S-6) | (A-xt-1) | 5.00 | 6 | 2.5 | 3.5 | MAA | 6 | 0.62 | BBEM | 4.5 | 1.07 |
| Po-2 | BBEM | B-2 | (S-4) | (A-xt-1) | 5.00 | 6 | 2 | 4 | MAA | 10 | 1.00 | BBEM | 6 | 1.39 |
| Po-3 | BBEM | B-3 | (S-1) | (A-xt-1) | 5.00 | 4 | 1 | 3 | MAA | 6 | 0.80 | BBEM | 4 | 1.23 |
| Po-4 | BBEM | B-4 | (S-9) | (A-xt-1) | 5.00 | 3 | 1 | 2 | MAA | 5 | 0.71 | BBEM | 4 | 1.31 |
| Po-5 | BBEM | B-5 | (S-10) | (A-xt-1) | 5.00 | 4 | 1 | 3 | MAA | 6 | 0.70 | BBEM | 3 | 0.87 |
| Po-6 | BBEM | B-6 | (S-11) | (A-xt-1) | 5.00 | 6 | 2 | 4 | MAA | 10 | 0.76 | BBEM | 6 | 0.94 |
| Po-7 | ICA | B-7 | (S-6) | (A-xt-2) | 5.00 | 6 | 2.5 | 3.5 | ICA | 2.5 | 0.41 | | | |
| Po-8 | GMA | B-8 | (S-6) | (A-xt-1) | 5.00 | 6 | 2.5 | 3.5 | MAA | 8 | 0.83 | | | |
| Po-9 | GMA | B-9 | (S-6) | (A-xt-3) | 5.00 | 6 | 2.5 | 3.5 | MAA | 9 | 0.93 | | | |
| Po-10 | BBEM | B-10 | (S-6) | (A-xt-4) | 5.00 | 4 | 1 | 3 | MAA | 5 | 0.47 | BBEM | 3 | 0.65 |
| Po-11 | CEEMA | B-11 | (S-1) | (A-xt-5) | 5.00 | 4 | 1 | 3 | MAA | 5 | 0.57 | CEEMA | 4 | 0.97 |
| Po-12 | BBEM | B-12 | (S-6) | (A-tp-1) | 5.00 | 3 | 1 | 2 | MAA | 4 | 0.60 | BBEM | 6 | 2.06 |
| Po-13 | BBEM | B-13 | (S-6) | (A-tp-2) | 5.00 | 6 | 2.5 | 3.5 | MAA | 8 | 0.85 | BBEM | 6 | 1.47 |
| Po-14 | GMA | B-14 | (S-1) | (A-tp-3) | 5.00 | 6 | 2.75 | 3.25 | MAA | 10 | 1.36 | | | |
| Po-15 | BBEM | B-15 | (S-1) | (A-tp-4) | 5.00 | 6 | 2.5 | 3.5 | MAA | 10 | 1.06 | BBEM | 6 | 1.47 |
| Po-16 | GMA | B-16 | (S-4) | (A-aq-1) | 5.00 | 6 | 2.5 | 3.5 | MAA | 12 | 2.02 | | | |
| Po-17 | BBEM | B-17 | (S-10) | (A-az-1) | 5.00 | 4 | 1 | 3 | MAA | 4 | 0.77 | BBEM | 6 | 2.65 |
| Po-18 | BBEM | B-18 | (S-6) | (A-sq-1) | 5.00 | 6 | 2.5 | 3.5 | MAA | 7 | 1.22 | BBEM | 6 | 2.41 |
| Po-19 | BBEM | B-19 | (S-11) | (A-Pc-1) | 5.00 | 6 | 2.5 | 3.5 | MAA | 6 | 0.42 | BBEM | 4 | 0.65 |
| Po-20 | BBEM | B-20 | (S-9) | (A-subPc-1) | 5.00 | 6 | 2.5 | 3.5 | MAA | 6 | 0.53 | BBEM | 4 | 0.81 |
| Po-21 | GMA | B-21 | (S-6) | (A-Qu-1) | 5.00 | 6 | 2.5 | 3.5 | MAA | 8 | 1.23 | | | |
| Po-22 | BBEM | B-22 | (S-6) | (A-pm-1) | 5.00 | 6 | 2.5 | 3.5 | MAA | 6 | 0.51 | BBEM | 6 | 1.17 |
| Po-23 | BBEM | B-23 | (S-15) | (A-Xt-1) | 5.00 | 4 | 1 | 3 | MAA | 4 | 0.43 | BBEM | 6 | 1.50 |
| Po-24 | BBEM | B-24 | (S-16) | (A-Xt-1) | 5.00 | 6 | 2.5 | 3.5 | MAA | 6 | 0.60 | BBEM | 6 | 1.37 |
| Po-25 | BBEM | B-25 | (S-17) | (A-Xt-1) | 5.00 | 6 | 2.5 | 3.5 | MAA | 10 | 1.18 | BBEM | 6 | 1.63 |
| Po-26 | BBEM | B-26 | (S-18) | (A-Xt-1) | 5.00 | 6 | 2.5 | 3.5 | MAA | 10 | 1.18 | BBEM | 4 | 1.09 |
| Po-27 | BBEM | B-27 | (S-19) | (A-Xt-1) | 5.00 | 6 | 2.5 | 3.5 | MAA | 5 | 0.59 | BBEM | 6 | 1.62 |
| Comparative Colorant 1 | BBEM | Comp-1 | (S-20) | (A-xt-1) | 5.00 | 6 | 2.5 | 3.5 | MAA | 6 | 0.66 | BBEM | 4 | 1.01 |
| Comparative Colorant 2 | BBEM | Comp-2 | (S-21) | (A-xt-1) | 5.00 | 6 | 2.5 | 3.5 | MAA | 6 | 0.67 | BBEM | 4 | 1.03 |
| Comparative Colorant 3 | BBEM | Comp-3 | (S-22) | (A-xt-1) | 5.00 | 6 | 2.5 | 3.5 | MAA | 6 | 0.69 | BBEM | 4 | 1.06 |

| Colorant | Polymerization Initiator: Kind | Polymerization Initiator: (Part(s)) | Compound: Component 3 | Compound: Molar Ratio | Compound: (Part(s)) | Compound: Component 4 | Compound: (Part(s)) | Molar Ratio (NMR): Colorant Structure | Molar Ratio (NMR): Component 1 | Molar Ratio (NMR): Component 2 | Molar Ratio (NMR): GMA Adduct | $R^2$ Site Number of Repeating Units | Acid Value mgKOH/g | Mw | Yield (Part(s)) |
|---|---|---|---|---|---|---|---|---|---|---|---|---|---|---|---|
| Po-1 | V-601 | 0.087 | | 0 | 0.00 | | 0.00 | 3.5 | 6 | 4.5 | 0 | 4.2 | 60 | 8900 | 6.0 |
| Po-2 | V-601 | 0.129 | | 0 | 0.00 | | 0.00 | 4 | 10 | 6 | 0 | 8.0 | 89 | 10100 | 6.7 |
| Po-3 | V-601 | 0.107 | | 0 | 0.00 | | 0.00 | 3 | 6 | 4 | 0 | 10.0 | 74 | 7200 | 6.3 |
| Po-4 | V-601 | 0.103 | | 0 | 0.00 | | 0.00 | 2 | 5 | 4 | 0 | 9.0 | 66 | 6700 | 6.3 |
| Po-5 | V-601 | 0.084 | | 0 | 0.00 | | 0.00 | 3 | 6 | 3 | 0 | 9.0 | 69 | 7700 | 5.9 |
| Po-6 | V-601 | 0.098 | | 0 | 0.00 | | 0.00 | 4 | 10 | 6 | 0 | 8.0 | 74 | 12000 | 6.0 |
| Po-7 | V-601 | 0.022 | GMA | 1.5 | 0.27 | TBAB | 0.05 | — | — | — | — | — | 44 | 7200 | 5.1 |
| Po-8 | V-601 | 0.066 | GMA | 4 | 0.68 | TBAB | 0.12 | 3.5 | 4 | 0 | 4 | 3.2 | 41 | 8600 | 5.9 |
| Po-9 | V-601 | 0.075 | GMA | 4 | 0.68 | TBAB | 0.12 | 3.5 | 5 | 0 | 4 | 3.6 | 51 | 8800 | 6.0 |
| Po-10 | V-601 | 0.061 | | 0 | 0.00 | | 0.00 | 3 | 5 | 3 | 0 | 8.0 | 60 | 8900 | 5.5 |
| Po-11 | V-601 | 0.082 | | 0 | 0.00 | | 0.00 | 3 | 5 | 4 | 0 | 9.0 | 57 | 7900 | 5.9 |
| Po-12 | V-601 | 0.120 | | 0 | 0.00 | | 0.00 | 2 | 4 | 6 | 0 | 10.0 | 51 | 7000 | 6.9 |
| Po-13 | V-601 | 0.120 | | 0 | 0.00 | | 0.00 | 3.5 | 8 | 6 | 0 | 5.6 | 76 | 9400 | 6.6 |
| Po-14 | V-601 | 0.109 | GMA | 6 | 1.35 | TBAB | 0.24 | 3.25 | 4 | 0 | 6 | 3.6 | 46 | 7700 | 6.9 |
| Po-15 | V-601 | 0.136 | | 0 | 0.00 | | 0.00 | 3.5 | 10 | 6 | 0 | 6.4 | 92 | 9700 | 6.8 |

TABLE 1-continued

| | | | | | | | | | | | | | | | |
|---|---|---|---|---|---|---|---|---|---|---|---|---|---|---|---|
| Po-16 | V-601 | 0.162 | GMA | 6 | 1.67 | | 0.30 | 3.5 | 6 | 0 | 0 | 4.8 | 76 | 7100 | 7.8 |
| Po-17 | V-601 | 0.154 | | 0 | 0.00 | | 0.00 | 3 | 4 | 6 | 0 | 10.0 | 59 | 6000 | 7.6 |
| Po-18 | V-601 | 0.182 | | 0 | 0.00 | | 0.00 | 3.5 | 7 | 6 | 0 | 5.2 | 92 | 6800 | 7.8 |
| Po-19 | V-601 | 0.057 | | 0 | 0.00 | | 0.00 | 3.5 | 6 | 4 | 0 | 4.0 | 46 | 11800 | 5.5 |
| Po-20 | V-601 | 0.070 | | 0 | 0.00 | | 0.00 | 3.5 | 6 | 4 | 0 | 4.0 | 54 | 9900 | 5.7 |
| Po-21 | V-601 | 0.099 | GMA | 3 | 0.76 | TBAB | 0.14 | 3.5 | 5 | 0 | 0 | 3.2 | 72 | 6200 | 6.3 |
| Po-22 | V-601 | 0.082 | | 0 | 0.00 | | 0.00 | 3.5 | 6 | 6 | 0 | 4.8 | 50 | 10800 | 6.0 |
| Po-23 | V-601 | 0.087 | | 0 | 0.00 | | 0.00 | 3 | 4 | 6 | 0 | 10.0 | 41 | 8800 | 6.2 |
| Po-24 | V-601 | 0.096 | | 0 | 0.00 | | 0.00 | 3.5 | 6 | 6 | 0 | 4.8 | 56 | 9600 | 6.3 |
| Po-25 | V-601 | 0.151 | | 0 | 0.00 | | 0.00 | 3.5 | 10 | 6 | 0 | 6.4 | 98 | 9100 | 7.0 |
| Po-26 | V-601 | 0.132 | | 0 | 0.00 | | 0.00 | 3.5 | 10 | 4 | 0 | 5.6 | 106 | 8400 | 6.5 |
| Po-27 | V-601 | 0.103 | | 0 | 0.00 | | 0.00 | 3.5 | 5 | 6 | 0 | 4.4 | 53 | 8400 | 6.5 |
| Comparative Colorant 1 | V-601 | 0.088 | | 0 | 0.00 | | 0.00 | 3.5 | 6 | 4 | 0 | 4.0 | 64 | 8300 | 6.0 |
| Comparative Colorant 2 | V-601 | 0.090 | | 0 | 0.00 | | 0.00 | 3.5 | 6 | 4 | 0 | 4.0 | 65 | 8200 | 6.0 |
| Comparative Colorant 3 | V-601 | 0.092 | | 0 | 0.00 | | 0.00 | 3.5 | 6 | 4 | 0 | 4.0 | 67 | 8000 | 6.1 |

In Table 1 above, $R^1$ represents the structure of the mercapto compound before the reaction. m+n corresponds to the number of mercapto groups in the mercapto compound, and m and n represent the average values of m's and n's in the obtained colorant. In Table 1 above, BBEM and CEEMA in "Synthesis Method" represent that the synthesis was used using these compounds. $R^2$ represents the average number of repeating units included in the colorant. "Acid Value" represents the acid value (unit: mgKOH/g) of the obtained colorant. Mw represents the weight average molecular weight of the obtained colorant which was obtained by GPC measurement.

(Po-2)

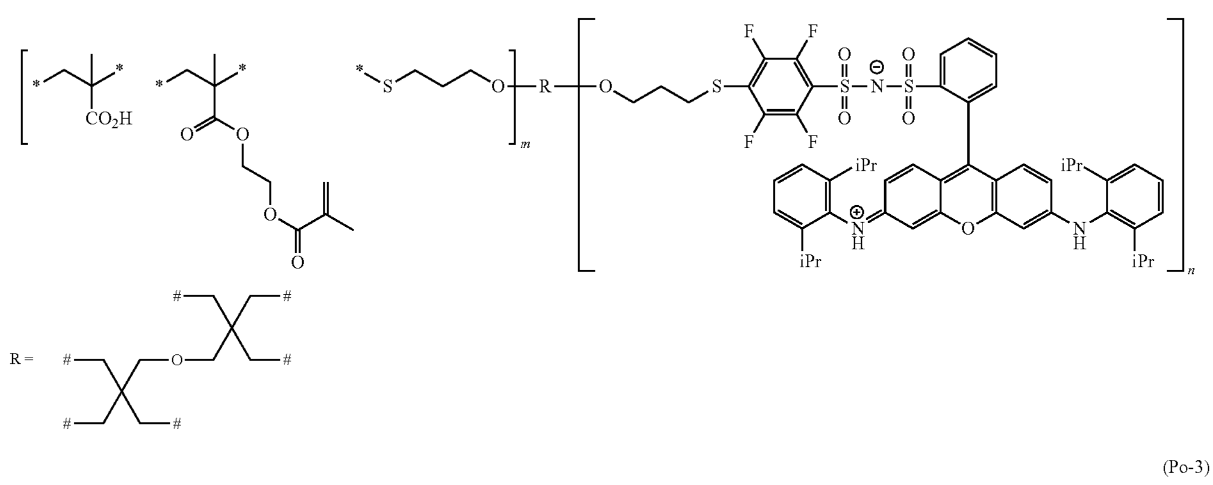

(Po-3)

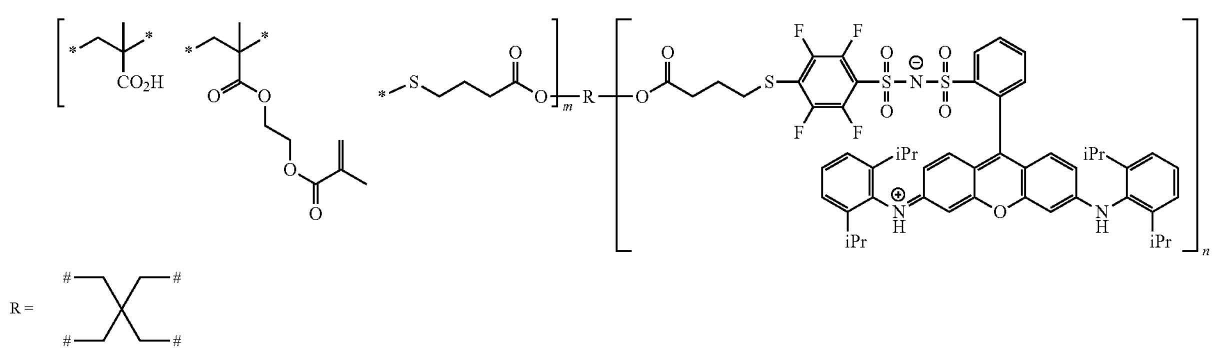

-continued
(Po-4)
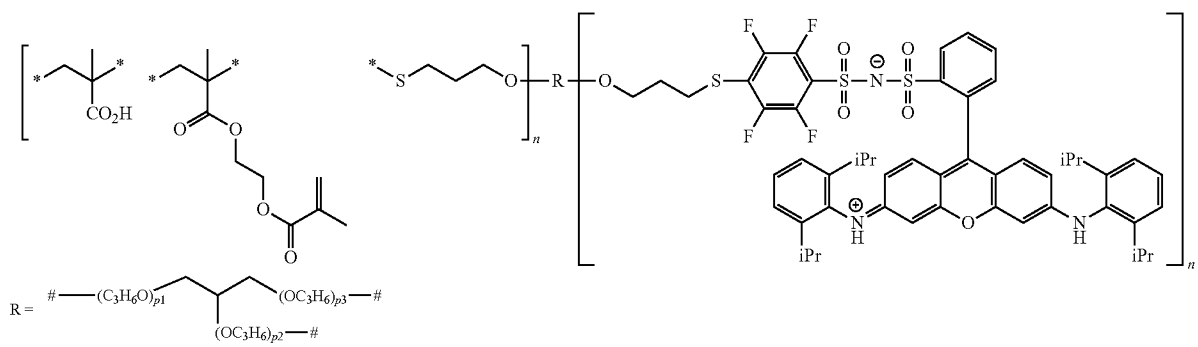
$p1 + p2 + p3 = 8$
(Po-5)
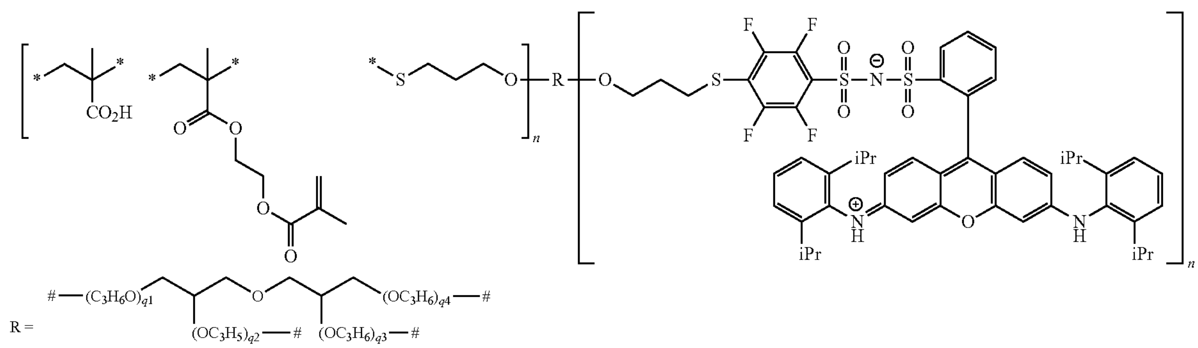
$q1 + q2 + q3 + q4 = 9$
(Po-6)
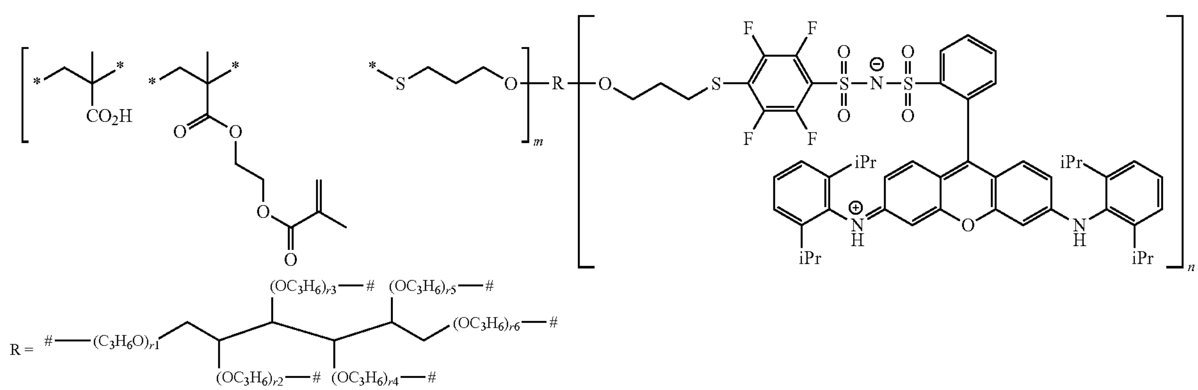
$r1 + r2 + r3 + r4 + r5 + r6 = 25$
(Po-8)
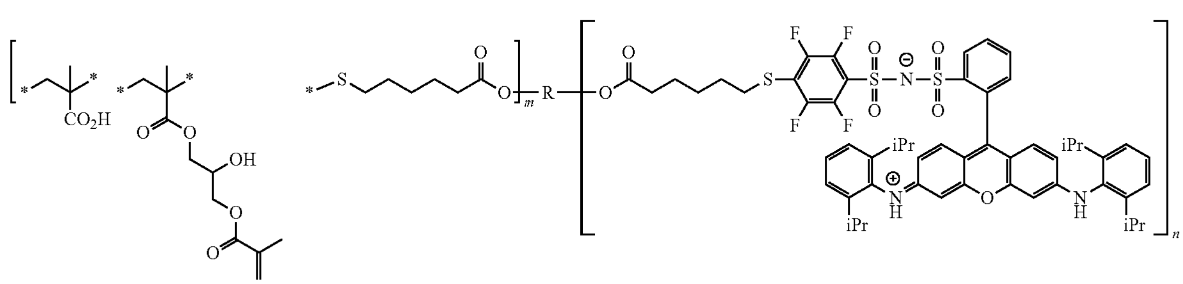

-continued
R = 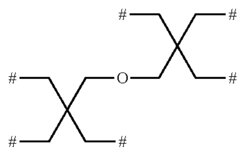
(Po-9)
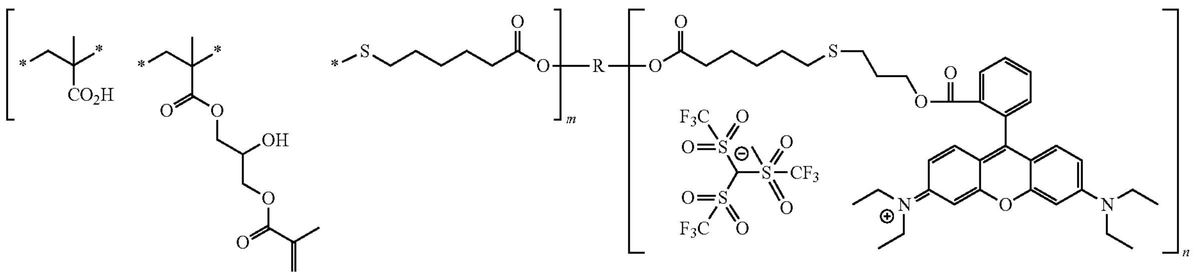
R = 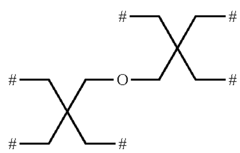
(Po-10)
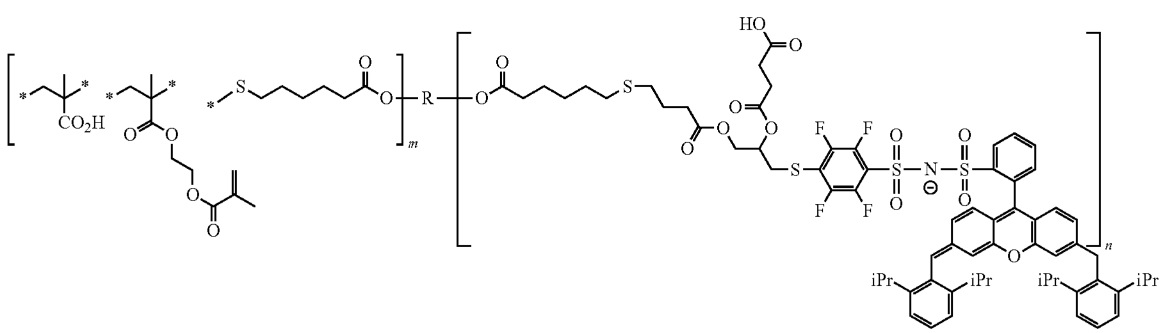
R = 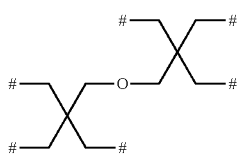
(Po-11)
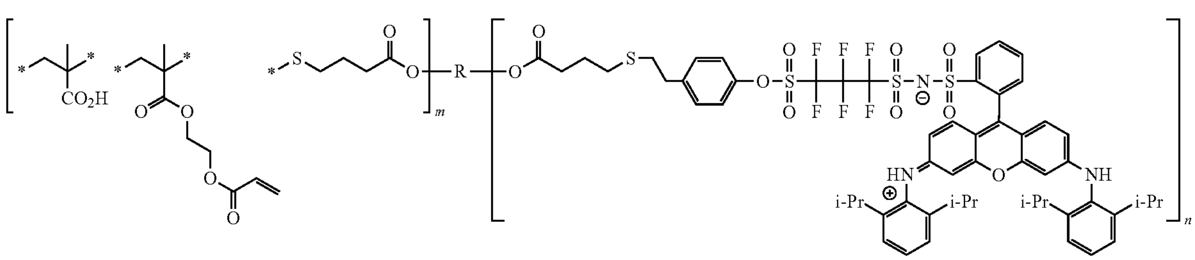
R = 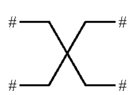

-continued
(Po-12)
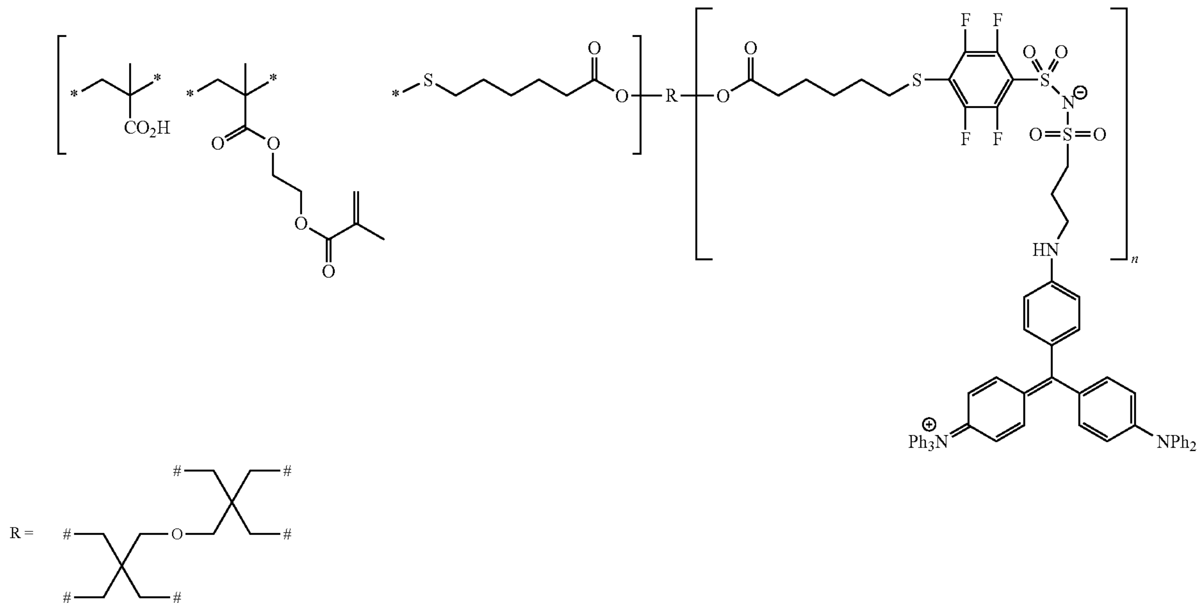
(Po-13)
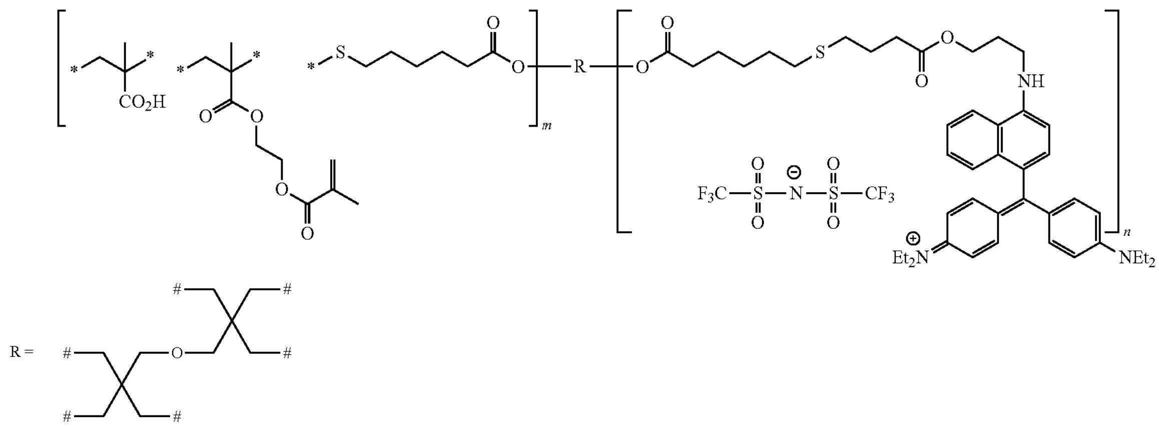
(Po-14)
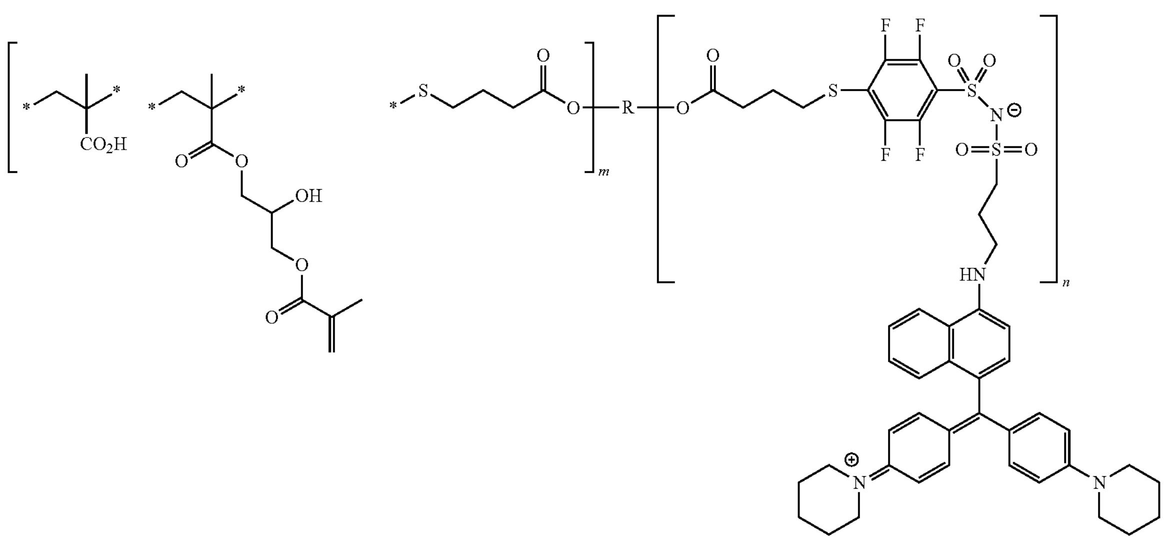

-continued
R = 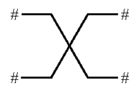
(Po-15)
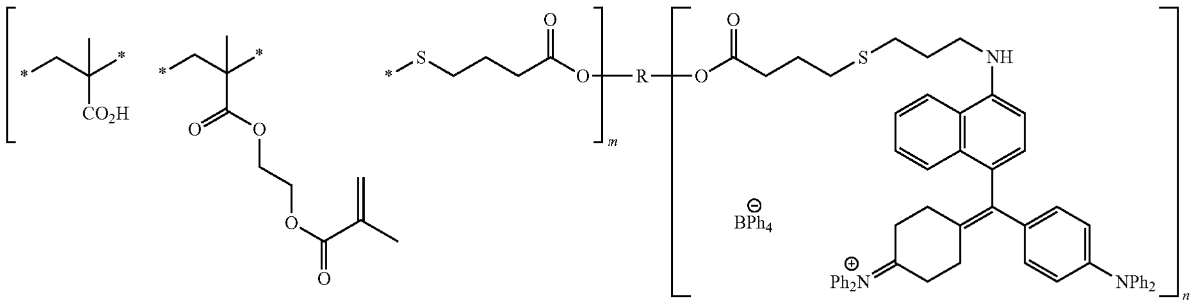
R = 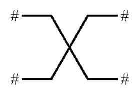
(Po-16)
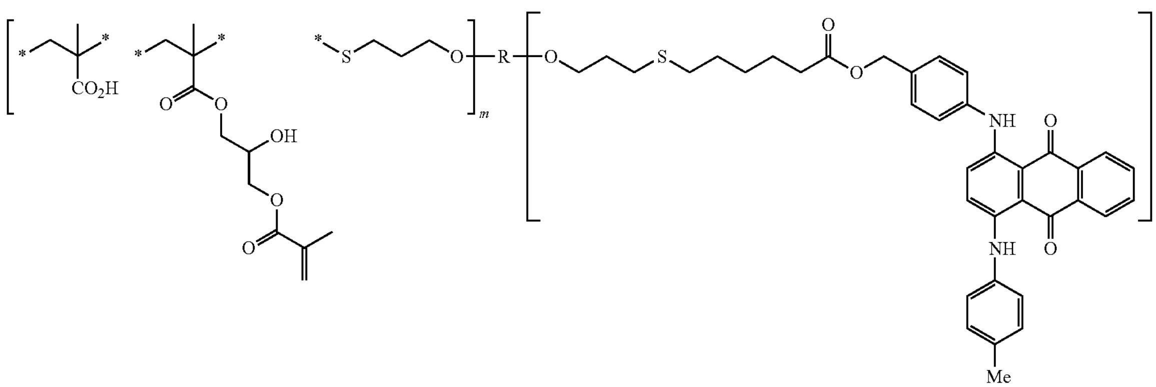
R = 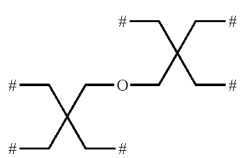
(Po-17)
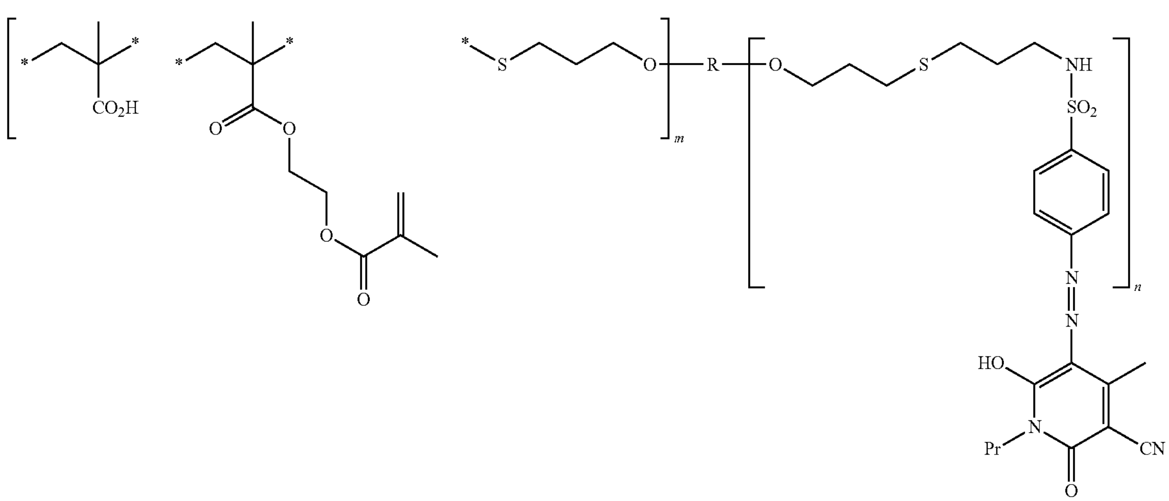
R = 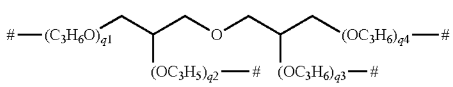
q1 + q2 + q3 + q4 = 9

-continued
(Po-18)
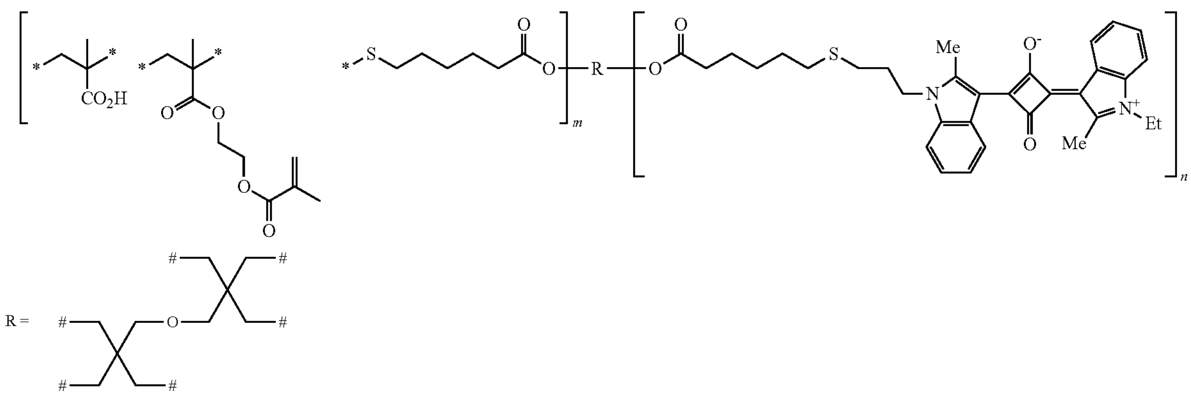
(Po-19)
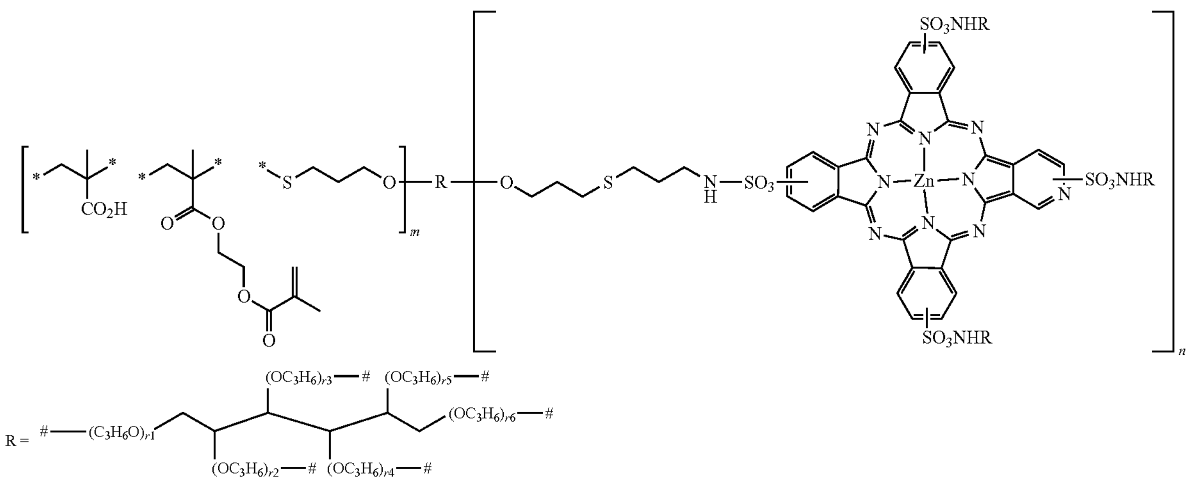
$r1 + r2 + r3 + r4 + r5 + r6 = 25$
(Po-20)
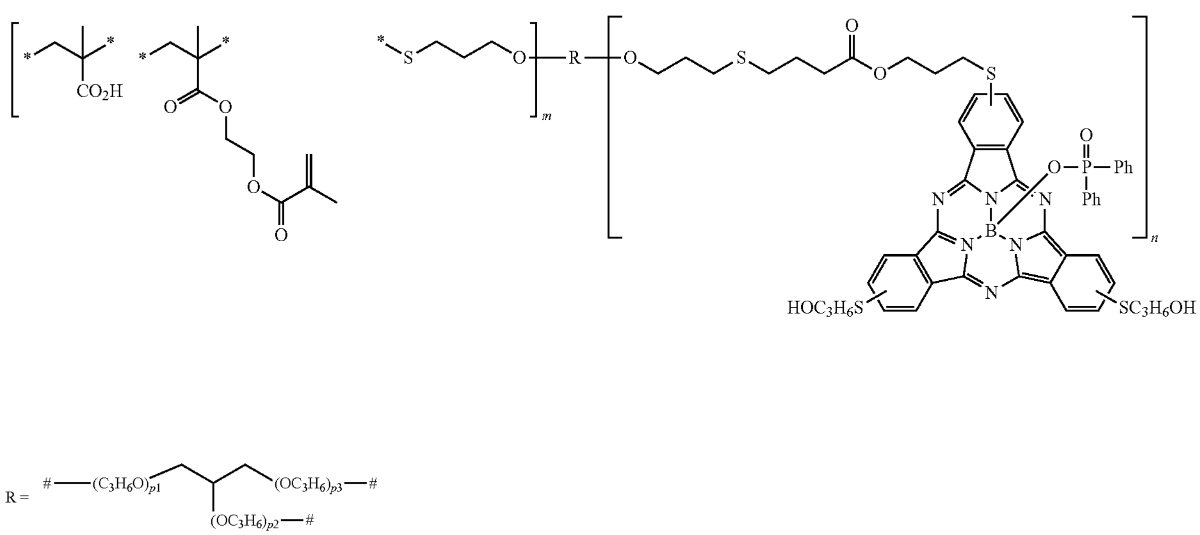
$p1 + p2 + p3 = 8$ -continued
(Po-21)
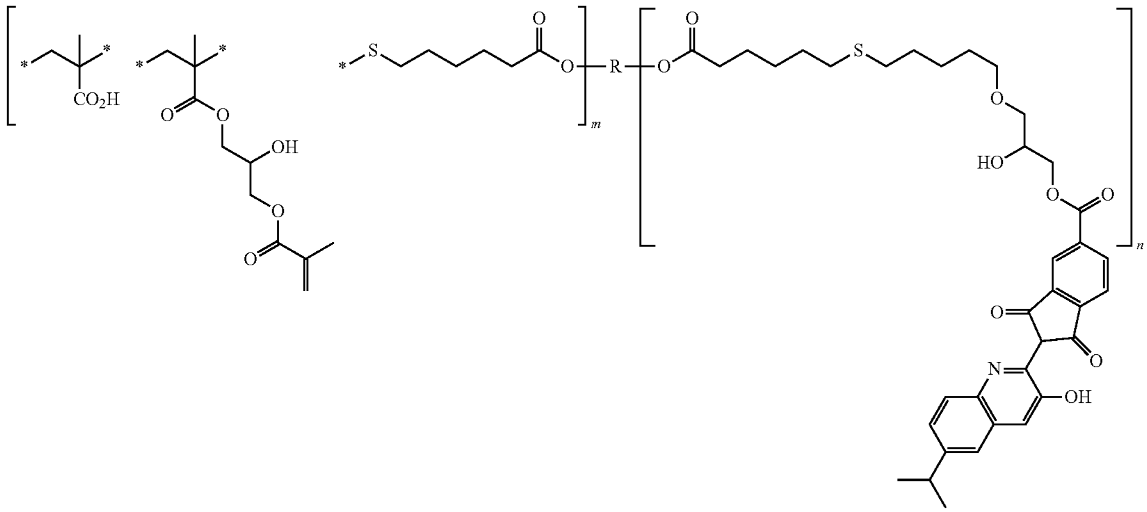
R =
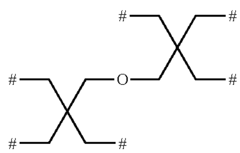
(Po-22)
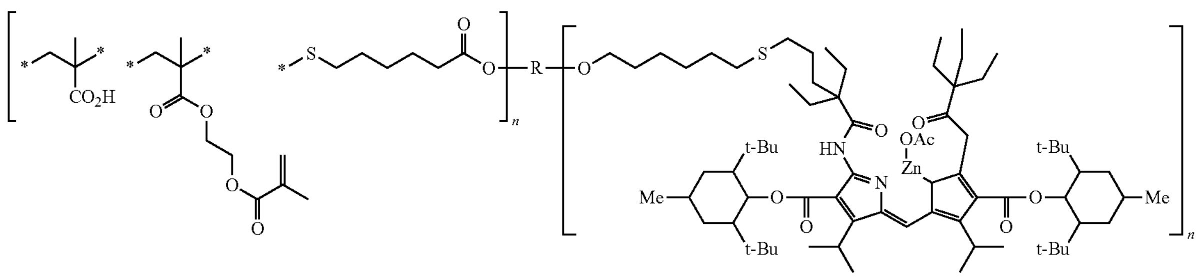
R =
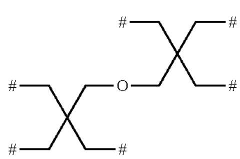
(Po-23)
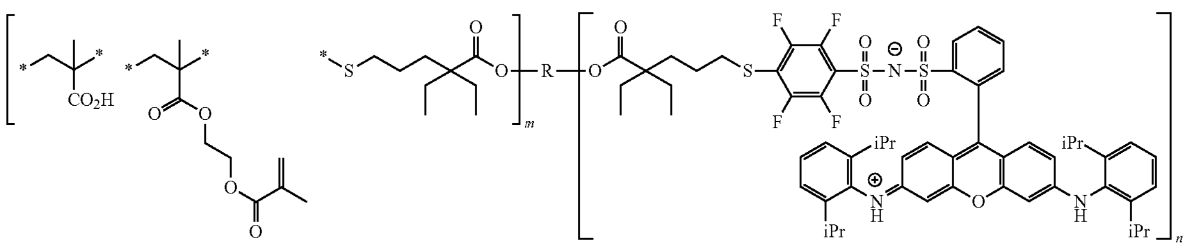
R =
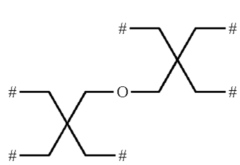

-continued
(Po-24)
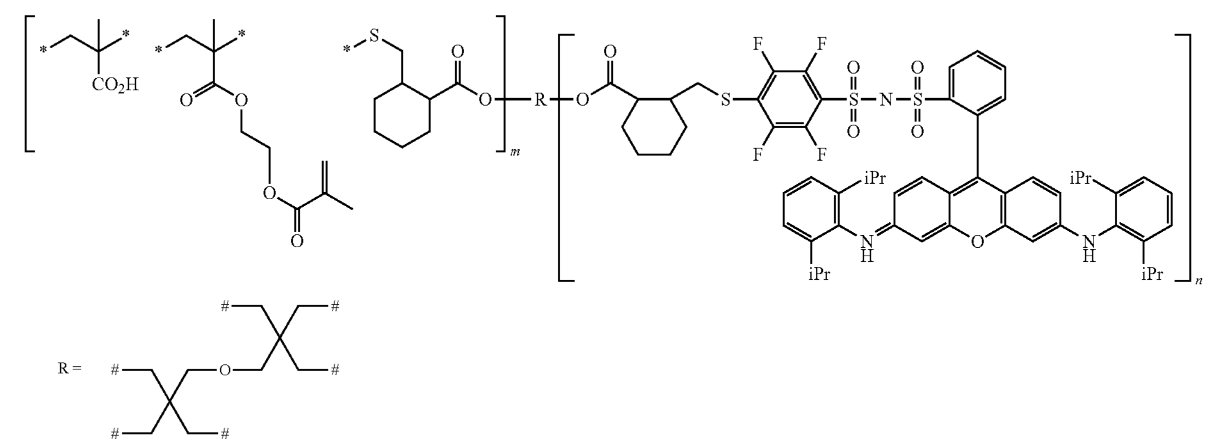
(Po-25)
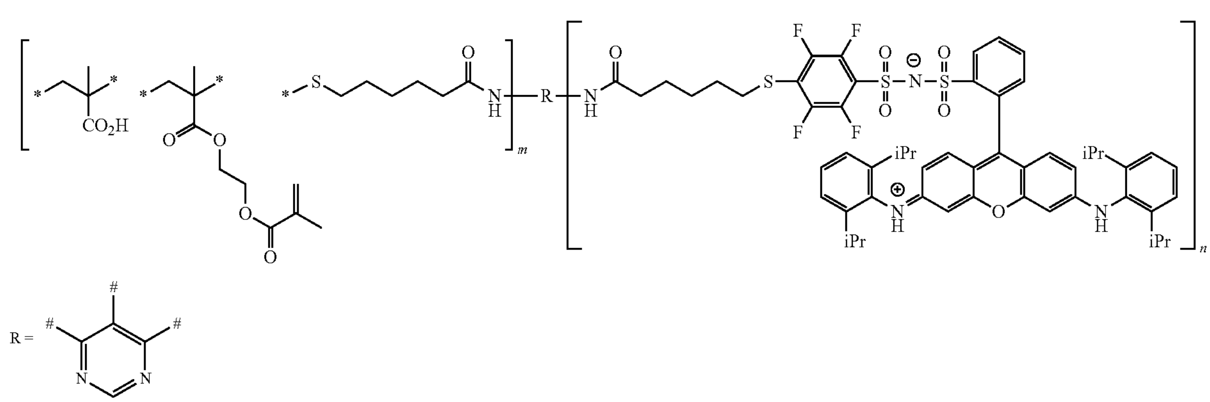
(Po-26)
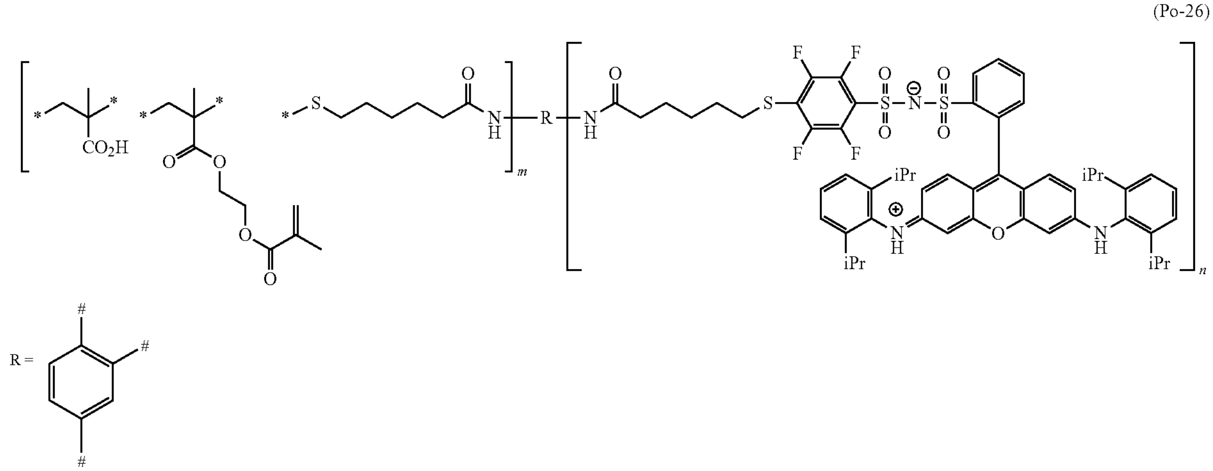
(Po-27)
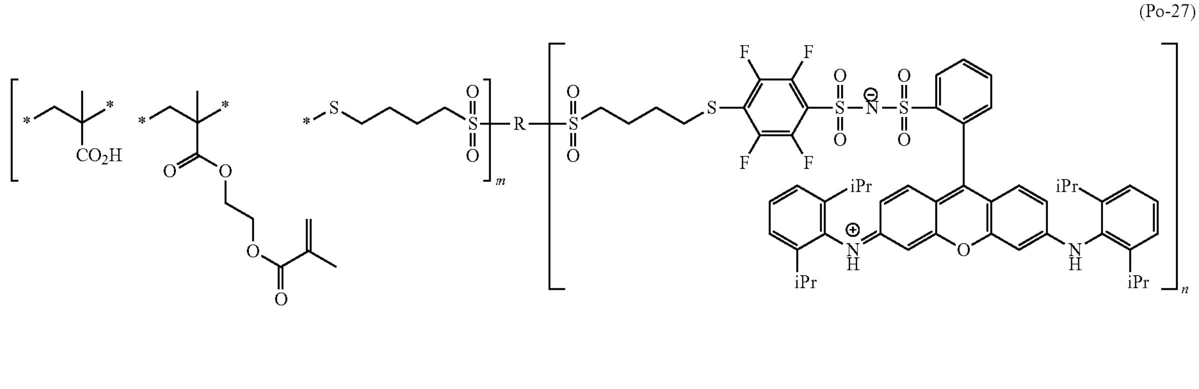

-continued
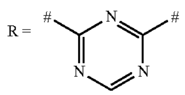
(Comparative Colorant-1)
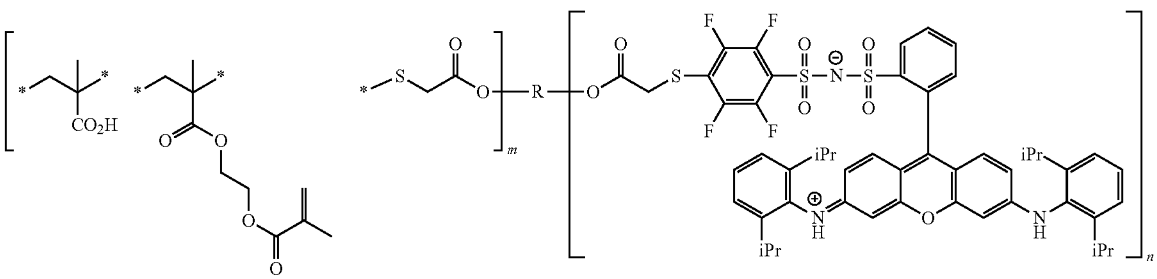
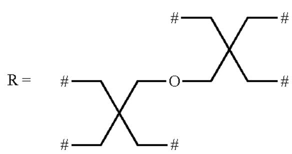
(Comparative Colorant-2)
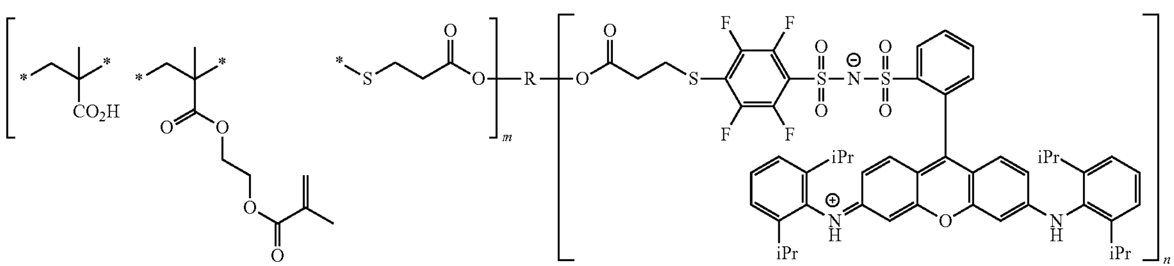
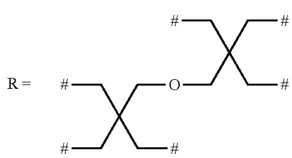
(Comparative Colorant-3)
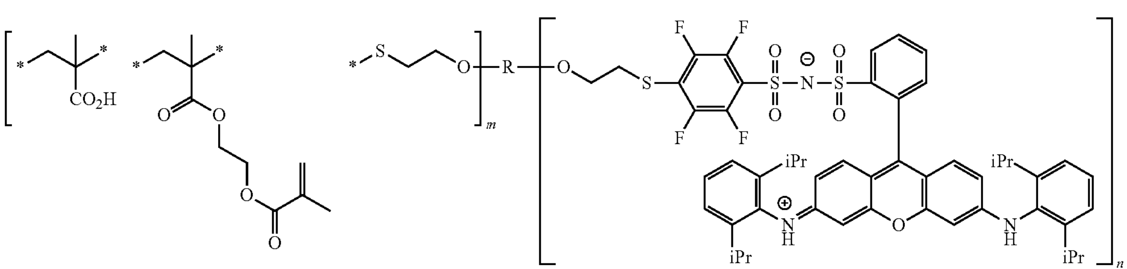
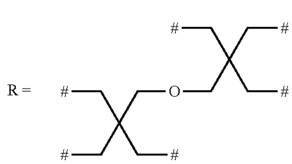

Example 1

1. Preparation of Resist Solution

Components having the following composition were mixed and dissolved and were filtered through a 0.45 μm nylon filter. As a result, a resist solution for forming an undercoat layer was prepared.

| Compositions of Resist Solution for Undercoat Layer | |
|---|---|
| Solvent: propylene glycol monomethyl ether acetate | 19.20 parts |
| Solvent: ethyl lactate | 36.67 parts |
| Alkali-soluble resin: a 40% PGMEA solution of a copolymer including benzyl methacrylate, methacrylic acid, and 2-hydroxyethyl methacrylate (molar ratio = 60/22/18, weight average molecular weight = 15000, number average molecular weight = 9000) | 30.51 parts |
| Ethylenically unsaturated double bond-containing compound: dipentaerythritol hexaacrylate (KAYARAD DPHA, manufactured by Sartomer) | 12.20 parts |
| Polymerization inhibitor: p-methoxyphenol | 0.0061 parts |
| Fluorine surfactant: F-475 (manufactured by DIC Corporation) | 0.83 parts |
| Photopolymerization initiator: a trihalomethane triazine photopolymerization initiator (TAZ-107, manufactured by Midori Kagaku Co., Ltd.) | 0.586 parts |

2. Preparation of Silicon Wafer Substrate Provided with Undercoat Layer

A 6-inch silicon wafer was heated in an oven at 200° C. for 30 minutes. Next, the resist solution for an undercoat layer was applied to the silicon wafer such that the thickness thereof after drying was 1.5 μm, and was further heated and dried in an oven at 220° C. for 1 hour to form an undercoat layer. As a result, the silicon wafer substrate provided with the undercoat layer was obtained.

3. Preparation of Coloring Composition 3-1. Preparation of Blue Pigment Dispersion (Pigment Dispersion P1)

(Preparation of Pigment Dispersion P1 (C.I. Pigment Blue 15:6 Dispersion))

Pigment Dispersion P1 (C.I. Pigment Blue 15:6 Dispersion) was prepared as described below.

That is, 19.4 parts by mass of C.I. Pigment Blue 15:6 (blue pigment; hereinafter also referred to as "PB 15:6"; average primary particle size: 55 nm) and a mixed solution including 2.95 parts by mass of a pigment dispersant Disperbyk-161 (manufactured by BYK Chemie), 2.95 parts by mass (in terms of solid content; 9.93 parts by mass of the solution) of Alkali-Soluble Resin J1 (a copolymer of benzyl methacrylate and methacrylic acid, 30% PGMEA solution), and 165.3 parts by mass of PGMEA were mixed and dispersed using a beads mill (zirconia beads; diameter: 0.3 mm) for 3 hours. Next, using a high-pressure disperser NANO-3000-10 (manufactured by Nihon B.E.E Co., Ltd.) equipped with a pressure reducing mechanism, the mixture was further dispersed under a pressure of 2000 kg/cm$^3$ at a flow rate of 500 g/min. This dispersion was repeated 10 times. As a result, a C.I. Pigment Blue 15:6 dispersion was obtained as a pigment dispersion. The average primary particle size of the pigment in the obtained C.I. Pigment Blue 15:6 dispersion was 24 nm when measured using a dynamic light scattering method (Microtrac Nanotrac UPA-EX150 (manufactured by Nikkiso Co., Ltd.)).

3-2. Preparation of Coloring Composition

Components shown below were mixed, dispersed, and dissolved, and the obtained reaction solution was filtered through a 0.45 μm nylon filter. As a result, a coloring composition was obtained.

Organic solvent (cyclohexanone): 14.69 parts

Alkali-Soluble Resin 1 (J1): 0.29 parts (solid content: 0.09 parts, solid content concentration: 30%)

Alkali-Soluble Resin 2 (ACRYCURE RD-F8 (manufactured by Nippon Shokubai Co., Ltd.)): 0.05 parts Photopolymerization Initiator I-2 (IRGACURE OXE-02): 0.78 parts Cyclohexanone solution of Colorant Po-L (solid content concentration: 12.3%): 28.45 parts Pigment Dispersion P1 (C.I. Pigment Blue 15:6 Dispersion, PGMEA solution, solid content concentration: 12.8%): 51.23 parts Polymerizable Compound Z-3 (ethoxylated (4) pentaerythritol tetraacrylate; SR494 (manufactured by Sartomer)): 1.61 parts Epoxy Compound E-1 (EHPE3150, manufactured by Daicel Corporation): 0.39 parts Polymerization Inhibitor (p-methoxyphenol): 0.0007 parts Fluorine surfactant (F-475, manufactured by DIC Corporation, 1% PGMEA solution): 2.50 parts 4. Preparation of Color Filter (Colored Pattern)

4-1: Preparation of Color Filter Using Coloring Composition with Photolithography Method The coloring composition prepared as described above was applied to the undercoat layer of the silicon wafer provided with the undercoat layer prepared as described above to form a colored layer (coating film). The coating film was heated (pre-baked) using a hot plate at 100° C. for 120 seconds such that the thickness of the coating film after drying was 1 μm.

Next, using an i-ray stepper exposure device FPA-3000 i5+ (manufactured by Canon Corporation), the coloring composition was exposed to form a pattern through a 1.0 μm island pattern mask at a wavelength of 365 nm at an exposure intensity of 50 to 1200 mJ/cm$^2$.

Next, the irradiated silicon wafer substrate on which the coating film was formed was placed on a horizontal rotary table of a spin-shower developing machine (DW-30, manufactured by Chemitronics Co., Ltd.) and underwent paddle development at 23° C. for 60 seconds using CD-2000 (manufactured by Fujifilm Electronic Materials Co., Ltd.) to form a colored pattern on the undercoat layer of the silicon wafer provided with the undercoat layer.

The silicon wafer on which the colored pattern was formed was fixed to the horizontal rotary table using a vacuum chuck method. While rotating the silicon wafer at a rotating speed of 50 rpm using a rotating device, the silicon wafer was rinsed with pure water supplied from a region above the rotation center through a spray nozzle, was spray-dried, and then was post-baked using a hot plate at 200° C. for 300 seconds. As a result, a colored pattern (color filter) having a thickness of 1 μm was formed on the silicon wafer.

Through the above-described steps, the colored pattern (color filter) was provided on the undercoat layer of the silicon wafer provided with the undercoat layer, and the silicon wafer provided with the colored pattern having the above-described configuration was obtained.

<<Evaluation of Heat Resistance>>

The coloring composition prepared as described above was applied to a glass substrate using a spin coater to form a coating film. The glass substrate on which the colored layer was formed was placed on a hot plate at 280° C. such that a surface of the substrate was in contact with the hot plate, and was heated for 1 hour, and then a heat resistance test was performed. A color difference before and after the heating was measured using a colorimeter MCPD-1000 (manufactured by Otsuka Electronics Co., Ltd.). Based on the measured color difference (ΔE*ab value), heat resistance was evaluated according to the following evaluation criteria. The lower the ΔE*ab value, the higher the heat resistance. The ΔE*ab value was obtained from the following color difference formula of CIE 1976 (L*, a*, b*) color space (Handbook of Color Science, p. 266, 1985, edited by The Color Science Association Of Japan).

$$\Delta E^*ab=\{(\Delta L^*)^2+(\Delta a^*)^2+(\Delta b^*)^2\}^{1/2}$$

<Evaluation Criteria>

A: ΔE*ab was 3 or lower

B: ΔE*ab was higher than 3 and 5 or lower

C: ΔE*ab was higher than 5 and 10 or lower

D: ΔE*ab was lower than 10

<<Evaluation of Color Transfer Properties>>

The absorbance of the colored pattern in each color filter was measured using MCPD-3000 (manufactured by Otsuka Electronics Co., Ltd.) (Absorbance A).

A CT-2000L solution (transparent undercoating agent, manufactured by Fujifilm Electronic Materials Co., Ltd.) was applied to a colored pattern-formed surface of the color filter such that the thickness thereof after drying was 1 μm, was dried to form a transparent film, and was heated at 280° C. for 30 minutes.

After the completion of heating, the absorbance of the transparent film adjacent to the colored pattern was measured using MCPD-3000 (manufactured by Otsuka Electronics Co., Ltd.) (Absorbance B).

A ratio [%] of the value of Absorbance B of the obtained transparent film to the value of Absorbance A of the colored pattern measured before heating was calculated [the following (Expression A)]. This ratio was set as an index for evaluating color transfer to an adjacent pixel.

$$\text{Color Transfer (\%)}=(\text{Absorbance }B/\text{Absorbance }A)\times 100 \quad \text{(Expression A)}$$

A: lower than 1%

B: 1% or higher and lower than 3%

C: 3% or higher and lower than 5%

D: 5% or higher

Examples 2 to 40 and Comparative Examples 1 to 3

Coloring compositions were prepared using the same method as in Example 1, except that Pigment Dispersion P1, Colorant C-1, Photopolymerization Initiator I-2, Alkali-Soluble Resin 1, and Polymerizable Compound Z-3 in "3-2. Preparation of Coloring Composition" of Example 1 were changed as shown in the following table. Next, heat resistance and color transfer properties were evaluated using the same method as in Example 1.

Example 41

A coloring composition was prepared using the same method as in Example 1, except that the following components were mixed with each other in "3-2. Preparation of Coloring Composition" of Example 1. Next, heat resistance and color transfer properties were evaluated using the same method as in Example 1.

Organic solvent (cyclohexanone): 17.12 parts

Alkali-Soluble Resin 1 (J1): 1.23 parts (solid content: 0.37 parts, solid content concentration: 30%)

Alkali-Soluble Resin 2 (ACRYCURE RD-F8 (manufactured by Nippon Shokubai Co., Ltd.)): 0.23 parts Photopolymerization Initiator I-2 (IRGACURE OXE-02): 0.975 parts Cyclohexanone solution of Colorant Po-1 (solid content concentration: 12.3%): 24.57 parts Pigment Dispersion P1 (C.I. Pigment Blue 15:6 Dispersion, PGMEA solution, solid content concentration: 12.8%): 51.40 parts Polymerizable Compound Z-1 (ethyleneoxy-modified dipentaerythritol hexaacrylate, NK ester, A-DPH-12E (manufactured by Shin-Nakamura Chemical Co., Ltd.)): 1.96 parts Polymerization Inhibitor (p-methoxyphenol): 0.0007 parts Fluorine surfactant (F-475, manufactured by DIC Corporation, 1% PGMEA solution): 2.50 parts

TABLE 2

| | | | | | | | Performance Evaluation | |
|---|---|---|---|---|---|---|---|---|
| | Colorant No. | Pigment Dispersion | Photopolymerization Initiator | Alkali-Soluble Resin 1 | Polymerizable Compound | Epoxy Compound | Heat Resistance | Color Transfer Properties |
| Example 1 | Po-1 | P1 | I2 | J1 | Z3 | E1 | A | A |
| Example 2 | Po-2 | P1 | I2 | J2 | Z1 | E1 | A | B |
| Example 3 | Po-3 | P1 | I1 | J1/32 (Mass Ratio 1/1) | Z1 | E1 | A | A |
| Example 4 | Po-4 | P1 | I2 | J1 | Z3 | E2 | A | B |
| Example 5 | Po-5 | P2 | I2 | J1 | Z1 | E1 | A | B |
| Example 6 | Po-6 | P1 | I2 | J1 | Z1 | E1 | A | B |
| Example 7 | Po-7 | P1 | I7 | J3 | Z1 | E1 | A | A |
| Example 8 | Po-8 | P1 | I1/I2 (Mass Ratio 1/1) | J1 | Z5 | E1 | A | A |
| Example 9 | Po-9 | P1 | I2 | J1 | Z1 | E1 | A | A |
| Example 10 | Po-10 | P3 | I5 | J1 | Z1 | E4 | A | A |
| Example 11 | Po-11 | P1 | I2 | J1 | Z1 | E1 | A | A |
| Example 12 | Po-12 | P1 | I2 | J1 | Z1 | E1 | A | A |
| Example 13 | Po-13 | P1/P3 (Mass Ratio 1/1) | I2 | J2 | Z2 | E1 | A | A |
| Example 14 | Po-14 | P1 | I2 | J1 | Z1 | E1 | A | A |
| Example 15 | Po-15 | P1 | I5 | J1 | Z7 | E1 | A | A |
| Example 16 | Po-16 | P4 | I2 | J3 | Z1 | E1 | A | B |
| Example 17 | Po-17 | P5 | I2 | J2 | Z3 | E3 | A | B |
| Example 18 | Po-18 | P1 | I1 | J1 | Z1/Z6 | E1 | A | A |

TABLE 2-continued

| | Colorant No. | Pigment Dispersion | Photopolymerization Initiator | Alkali-Soluble Resin 1 | Polymerizable Compound | Epoxy Compound | Performance Evaluation: Heat Resistance | Performance Evaluation: Color Transfer Properties |
|---|---|---|---|---|---|---|---|---|
| | | | | | (Mass Ratio 1/1) | | | |
| Example 19 | Po-19 | P6 | I2 | J1 | Z4 | E1 | A | B |
| Example 20 | Po-20 | P5 | I2 | J1 | Z1 | E1 | A | B |
| Example 21 | Po-21 | P5 | I2 | J1 | Z1/Z2 (Mass Ratio 1/1) | E1 | A | A |
| Example 22 | Po-22 | P1 | I2 | J1 | Z1 | E1 | A | A |
| Example 23 | Po-23 | P1 | I7 | J3 | Z1 | E1 | B | B |
| Example 24 | Po-24 | P1 | I2 | J1 | Z1 | E1 | B | B |
| Example 25 | Po-25 | P3 | I2 | J1 | Z1 | E2 | B | B |
| Example 26 | Po-26 | P1 | I2 | J1 | Z1 | E1 | B | B |
| Example 27 | Po-27 | P1 | I2/I3 (Mass Ratio 1/1) | J1/J3 (Mass Ratio 1/1) | Z6 | E1 | B | B |
| Example 28 | Po-1/Po-2 (Mass Ratio 1/1) | P1 | I2 | J1 | Z1 | E1 | A | A |
| Example 29 | Po-2 | P1 | I2 | J2 | Z4 | E3 | A | B |
| Example 30 | Po-3 | P1 | I2 | J1 | Z1 | E1 | A | A |
| Example 31 | Po-4 | P1 | I2 | J1 | Z1 | E1 | A | B |
| Example 32 | Po-5 | P1 | I2 | J1 | Z1 | E1 | A | B |
| Example 33 | Po-1 | P1 | I2 | J1 | Z4/Z7 (Mass Ratio 1/1) | E1 | A | A |
| Example 34 | Po-1 | P2/P3 (Mass Ratio 1/1 ) | I3 | J1 | Z1 | E1 | A | A |
| Example 35 | Po-1 | P1 | I4 | J1 | Z1 | E4 | A | A |
| Example 36 | Po-1 | P1 | I6/I8 (Mass Ratio 1/1) | J1 | Z1 | E2 | A | A |
| Example 37 | Po-1 | P1 | I2 | J1 | Z2/Z4 (Mass Ratio 1/1) | E1 | A | A |
| Example 38 | Po-1 | P2 | I2 | J1 | Z1 | E1 | A | A |
| Example 39 | Po-1 | P3 | I2 | J1 | Z1 | E1 | A | A |
| Example 40 | Po-1 | P1/P2 (Mass Ratio 1/1) | I2 | J1 | Z1 | E1 | A | A |
| Example 41 | Po-1 | P1 | I3 | J1 | Z1 | — | A | A |
| Comparative Example 1 | Comparative Colorant 1 | P1 | I2 | J1 | Z1 | E1 | C | D |
| Comparative Example 2 | Comparative Colorant 2 | P1 | I2 | J1 | Z1 | E1 | C | D |
| Comparative Example 3 | Comparative Colorant 3 | P1 | I2 | J1 | Z1 | E1 | C | D |

The results were as follows. In the coloring compositions according to Examples 1 to 41 including the colorant according to the present invention, heat resistance and color transfer properties were excellent.

On the other hand, in Comparative Example 1 to 3, heat resistance and color transfer properties were poor.

Abbreviations of the compounds in Table 2 are as follows.

(Preparation of Pigment Dispersion P2 (C.I. Pigment Blue 15:6 Dispersion))

Pigment Dispersant P2 was prepared using the same method as that of Pigment Dispersion P1, except that the following Dispersant D1 was used as the pigment dispersant.

D1

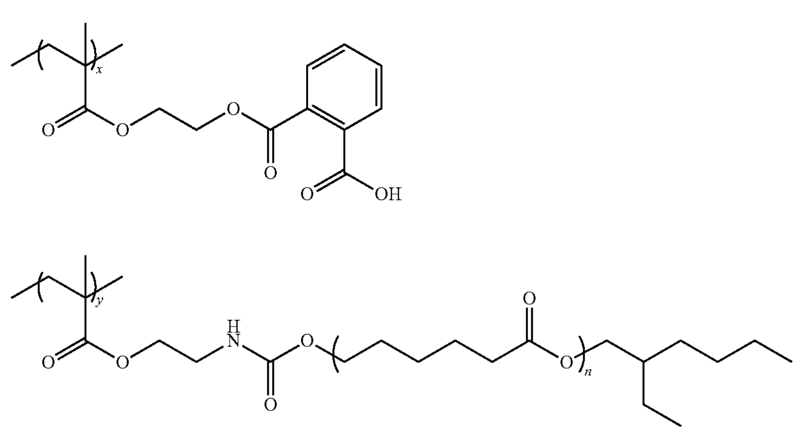

Mw=20000, x/y=50/50 (mass ratio), n=20, acid value=100 mgKOH/g (Preparation of Pigment Dispersion P3 (C.I. Pigment Blue 15:6 Dispersion))

Pigment Dispersant P3 was prepared using the same method as that of Pigment Dispersion P1, except that the following Dispersant D2 was used as the pigment dispersant.

D2

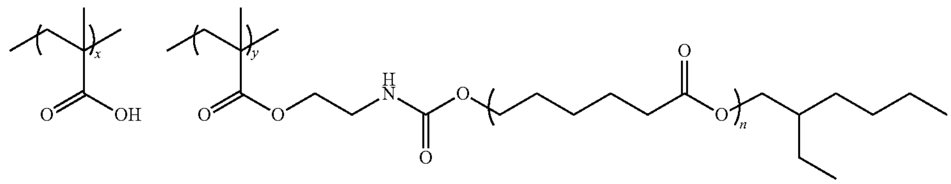

Mw=20000, x/y=15/85 (mass ratio), n=20, acid value=100 mgKOH/g (Preparation of Pigment Dispersion P4 (C.I. Pigment Red 254 Dispersion))

Pigment Dispersant P4 was prepared using the same method as that of Pigment Dispersion P1, except that C.I. Pigment Red 254 was used instead of PB 15:6 as the pigment. The average primary particle size of the pigment was 26 nm when measured using a dynamic light scattering method (Microtrac Nanotrac UPA-EX150 (manufactured by Nikkiso Co., Ltd.)).

(Preparation of Pigment Dispersion P5 (C.I. Pigment Green 58 Dispersion))

Pigment Dispersant P5 was prepared using the same method as that of Pigment Dispersion P1, except that C.I. Pigment Green 58 was used instead of PB 15:6 as the pigment. The average primary particle size of the pigment was 30 nm when measured using a dynamic light scattering method (Microtrac Nanotrac UPA-EX150 (manufactured by Nikkiso Co., Ltd.)).

(Preparation of Pigment Dispersion P6 (C.I. Pigment Yellow 139 Dispersion))

Pigment Dispersant P6 was prepared using the same method as that of Pigment Dispersion P1, except that C.I. Pigment Yellow 139 was used instead of PB 15:6 as the pigment. The average primary particle size of the pigment was 27 nm when measured using a dynamic light scattering method (Microtrac Nanotrac UPA-EX150 (manufactured by Nikkiso Co., Ltd.)).

Photopolymerization initiator: the following structure (I-1)

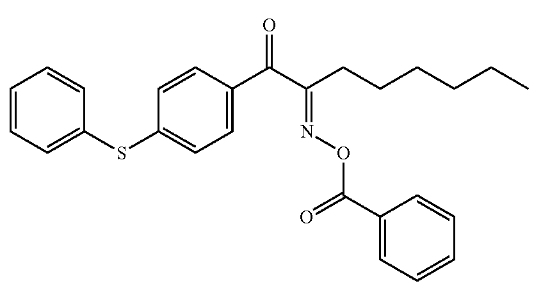

IRUGACURE OXE01 (manufactured by BASF SE)

-continued (I-2)

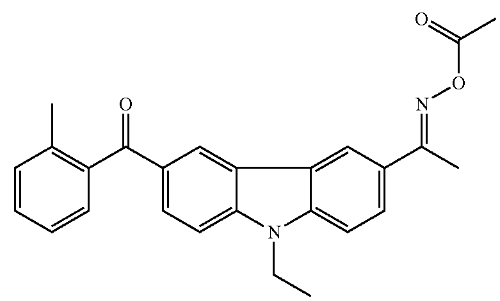

IRUGACURE OXE02 (manufactured by BASF SE)

(I-3)

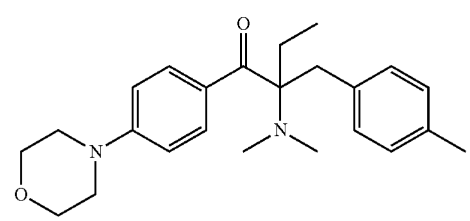

IRUGACURE OXE379 (manufactured by BASF SE)

(I-4)

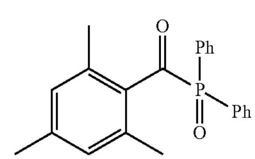

DAROCUR TPD (I-5)

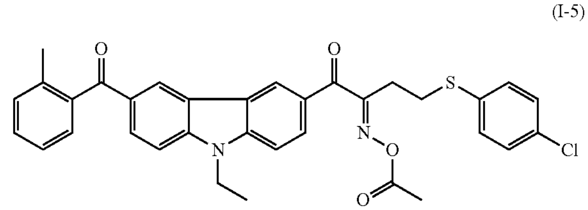

-continued (I-6a)

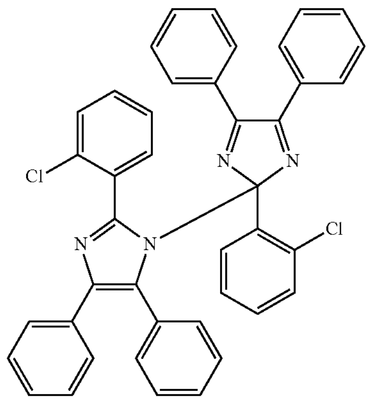

(I-6b)

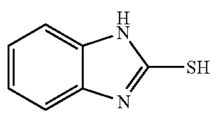

(I-6): (I-6a)/(I-6b) = 20/10 (mass ratio)

(I-7)

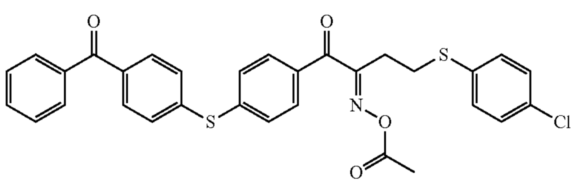

(I-8)

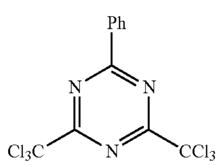

Alkali-Soluble Resin 1: the following structure (J1)

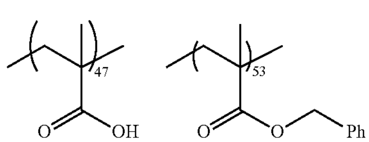

Mw: 11,000

(J2)

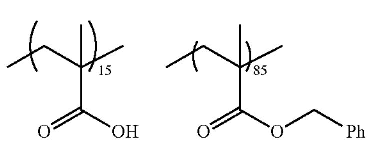

Mw: 15,000

(J3)

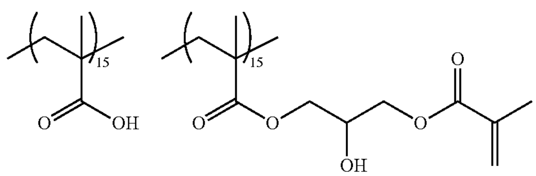

-continued

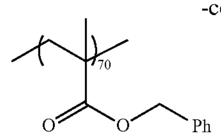

Mw: 15,000

Polymerizable Compounds

Z1: ethyleneoxy-modified dipentaerythritol hexaacrylate, NK ester, A-DPH-12E (manufactured by Shin-Nakamura Chemical Co., Ltd.)

Z2: dipentaerythritol hexaacrylate, KAYARAD DPHA (manufactured by Nippon Kayaku Co., Ltd.)

Z3: ethoxylated (4) pentaerythritol tetraacrylate, SR494 (manufactured by Sartomer)

Z4: ethoxylated (3) trimethylolpropane triacrylate, SR454 (manufactured by Sartomer)

Z5: ethoxylated (6) trimethylolpropane triacrylate, SR499 (manufactured by Sartomer)

Z6: KAYARAD DPCA-60 (manufactured by Nippon Kayaku Co., Ltd.)

Z7: tris(2-hydroxy ethyl) isocyanurate triacrylate, SR368 (manufactured by Sartomer) Epoxy Compounds E1: EHPE 3150 (manufactured by Daicel Corporation)

E2: EPICLON 840 (manufactured by DIC Corporation)

E3: EPICLEPICLON N660 (manufactured by DIC Corporation)

E4: EPICLON HP7200 (manufactured by DIC Corporation)

Example 42

Components shown below were mixed, dispersed, and dissolved, and the obtained reaction solution was filtered through a 0.45 μm nylon filter. As a result, a coloring composition was obtained. Using the obtained coloring composition, heat resistance and color transfer properties were evaluated using the same method as in Example 1.

(Composition)

Organic solvent (cyclohexanone): 25.22 parts

Alkali-Soluble Resin 1 (J1): 0.62 parts (solid content: 0.19 parts, solid content concentration: 30.6%)

Alkali-Soluble Resin 2 (ACRYCURE RD-F8 (manufactured by Nippon Shokubai Co., Ltd.)): 0.12 parts (solid content: 0.05 parts, solid content concentration: 41.7%)

Photopolymerization Initiator I-7: 0.59 parts

Cyclohexanone solution of Colorant Po-1 (solid content concentration: 12.3%): 23.04 parts Pigment Dispersion P1 (C.I. Pigment Blue 15:6 Dispersion, PGMEA solution, solid content concentration: 12.8%): 45.66 parts Polymerizable Compound Z-4 (ethoxylated (3) trimethylolpropane triacrylate, SR454 (manufactured by Sartomer)): 1.90 parts Epoxy Compound E-1 (EHPE3150, manufactured by Daicel Corporation): 0.35 parts Polymerization Inhibitor (p-methoxyphenol): 0.0009 parts Fluorine surfactant (MEGAFACE F781F (a fluorine surfactant having an alkyleneoxy chain), manufactured by DIC Corporation, 1% PGMEA solution): 2.50 parts

Examples 43 to 58

Coloring compositions were prepared using the same method as in Example 42, except that Colorant Po-1, Pigment Dispersion P-1, Photopolymerization Initiator I-7, Alkali-Soluble Resin 1, Polymerizable Compound Z-4, and Epoxy Compound E1 in the Preparation the coloring composition of Example 42 were changed as shown in the following table. Using the obtained coloring compositions, heat resistance and color transfer properties were evaluated using the same method as in Example 1.

Cyclohexanone solution 2 of Colorant Po-12 (solid content concentration: 12.3%): 51.23 parts Polymerizable Compound Z-3 (ethoxylated (4) pentaerythritol tetraacrylate; SR494 (manufactured by Sartomer)): 1.61 parts Epoxy Compound E-1 (EHPE3150, manufactured by Daicel Corporation): 0.39 parts

TABLE 3

| | Colorant No. | Pigment Dispersion | Photopolymerization Initiator | Alkali-Soluble Resin 1 | Polymerizable Compound | Epoxy Compound | Performance Evaluation Heat Resistance | Performance Evaluation Color Transfer Properties |
|---|---|---|---|---|---|---|---|---|
| Example 42 | Po-1 | P1 | I7 | J1 | Z4 | E1 | A | A |
| Example 43 | Po-2 | P1 | I3 | J1 | Z3 | E2 | A | A |
| Example 44 | Po-5 | P1 | I4 | J1 | Z4 | E1 | A | A |
| Example 45 | Po-8 | P1 | I7 | J2 | Z4 | E1 | A | A |
| Example 46 | Po-9 | P1 | I7 | J1/J2 (Mass Ratio 1/1) | Z4 | E1 | A | A |
| Example 47 | Po-12 | P1 | I7 | J1 | Z4 | E3 | A | A |
| Example 48 | Po-13 | P1 | I5 | J1 | Z4 | E1 | A | A |
| Example 49 | Po-14 | P1 | I7 | J1 | Z4 | E2 | A | A |
| Example 50 | Po-22 | P1 | I7 | J1 | Z4 | E1 | A | A |
| Example 51 | Po-23 | P1/P3 (Mass Ratio 1/1) | I7 | J1 | Z4 | E1 | A | A |
| Example 52 | Po-24 | P2 | I2 | J1 | Z3 | E1 | A | A |
| Example 53 | Po-1/Po-12 (Mass Ratio 10/1) | P1 | I5 | J1 | Z3 | E1 | A | A |
| Example 54 | Po-1/Po-14 (Mass Ratio 10/1) | P1 | I7 | J1 | Z2 | E1 | A | A |
| Example 55 | Po-1/Po-9 (Mass Ratio 7/3) | P2 | I7 | J1 | Z4 | E4 | A | A |
| Example 56 | Po-22/Po-12 (Mass Ratio 10/1) | P1 | I1 | J1/J2 (Mass Ratio 1/1) | Z1 | E1 | A | A |
| Example 57 | Po-1/Po-22 (Mass Ratio 1/1) | P1/P3 (Mass Ratio 1/1) | I2 | J1 | Z3 | E2 | B | A |
| Example 58 | Po-1/Po-22/Po-12 (Mass Ratio 9/1/1) | P1 | I7 | J1 | Z4/Z3 (Mass Ratio 1/1) | E1 | A | A |

As shown in the above table, in the coloring compositions according to Examples 42 to 58, heat resistance and color transfer properties were excellent.

Example 59

Components shown below were mixed, dispersed, and dissolved, and the obtained reaction solution was filtered through a 0.45 μm nylon filter. As a result, a coloring composition was obtained. Using the obtained coloring composition, heat resistance and color transfer properties were evaluated using the same method as in Example 1.

(Composition)

Organic solvent (cyclohexanone): 14.69 parts

Alkali-Soluble Resin 1 (J1): 0.29 parts (solid content: 0.09 parts, solid content concentration: 30%)

Alkali-Soluble Resin 2 (ACRYCURE RD-F8 (manufactured by Nippon Shokubai Co., Ltd.)): 0.05 parts Photopolymerization Initiator I-2 (IRGACURE OXE-02): 0.78 parts Cyclohexanone Solution 1 of Colorant Po-1 (solid content concentration: 12.3%): 28.45 parts Polymerization Inhibitor (p-methoxyphenol): 0.0007 parts Fluorine surfactant (F-475, manufactured by DIC Corporation, 1% PGMEA solution): 2.50 parts

Examples 60 to 70

Coloring compositions were prepared using the same method as in Example 59, except that Colorant Po-1, Colorant Po-12, Photopolymerization Initiator I-2, Alkali-Soluble Resin 1, Polymerizable Compound Z-3, and Epoxy Compound E-1 in the Preparation the coloring composition of Example 59 were changed as shown in the following table. Using the obtained coloring compositions, heat resistance and color transfer properties were evaluated using the same method as in Example 1.

TABLE 4

| | Colorant | | | | | | Performance Evaluation | |
|---|---|---|---|---|---|---|---|---|
| | Cyclohexanone Solution | | Photopolymerization | Alkali-Soluble | Polymerizable | Epoxy | Heat | Color Transfer |
| | 1 | 2 | Initiator | Resin 1 | Compound | Compound | Resistance | Properties |
| Example 59 | Po-1 | Po-12 | I2 | J1 | Z3 | E1 | A | A |
| Example 60 | Po-1 | Po-12 | I7 | J1 | Z4 | E1 | A | A |
| Example 61 | Po-1 | Po-14 | I7/I2 (Mass Ratio 1/1) | J1 | Z4 | E1 | A | A |
| Example 62 | Po-8 | Po-12 | I1 | J1/J2 (Mass Ratio 1/1) | Z1 | E1 | A | A |
| Example 63 | Po-9 | Po-14 | I2 | J1 | Z3 | E2 | A | B |
| Example 64 | Po-1 | Po-13 | I7 | J1 | Z4/Z3 (Mass Ratio 1/1) | E1 | A | B |
| Example 65 | Po-22 | Po-12 | I2 | J1 | Z1 | E1 | A | B |
| Example 66 | Po-10 | Po-13 | I7 | J3 | Z4 | E1 | A | A |
| Example 67 | Po-2 | Po-12 | I1/I2 (Mass Ratio 1/1) | J1 | Z5 | E1 | A | A |
| Example 68 | Po-4 | Po-14 | I2 | J1 | Z3 | E2 | A | A |
| Example 69 | Po-23 | Po-15 | I5 | J2 | Z1 | E4 | A | A |
| Example 70 | Po-24 | Po-13 | I2 | J1 | Z4 | E1 | A | A |

As shown in the above table, in the coloring compositions according to Examples 59 to 70, heat resistance and color transfer properties were excellent.

(Preparation of Coloring Composition for Dry Etching)

Example 71

Components shown below were mixed, dispersed, and dissolved, and the obtained reaction solution was filtered through a 0.45 μm nylon filter. As a result, a coloring composition was obtained.

(Composition)

Organic solvent (cyclohexanone): 17.12 parts

Epoxy Compound E5: JER1031S (manufactured by Mitsubishi Chemical Corporation, epoxy equivalent: 180-220 (g/eq.)): 4.395 parts Cyclohexanone solution of Colorant Po-1 (solid content concentration: 12.3%): 24.57 parts Pigment Dispersion P1 (C.I. Pigment Blue 15:6 Dispersion, PGMEA solution, solid content concentration: 12.8%): 51.40 parts Polymerization Inhibitor (p-methoxyphenol): 0.0007 parts Fluorine surfactant (F-475, manufactured by DIC Corporation, 1% PGMEA solution): 2.50 parts (Preparation of Color Filter Using Dry Etching Method)

The coloring composition obtained as described above was applied to a glass substrate having a size of 7.5 cm×7.5 cm using a spin coater such that the thickness thereof was 0.5 μm, and was heated using a hot plate at 200° C. for 5 minutes to cure the coating film. As a result, a colored layer was prepared. The thickness of the colored layer was 0.5 μm.

Next, a positive type photoresist "FHi622BC" (manufactured by Fujifilm Electronic Materials Co., Ltd.) was applied to the colored layer and then was pre-baked at 90° C. for 1 minutes. As a result, a photoresist layer having a thickness of 0.8 μm was formed.

Next, using a i-ray stepper (manufactured by Canon Corporation) the photoresist layer was exposed to form a pattern at an exposure intensity of 350 mJ/cm$^2$ and was heated for 1 minute at a temperature where the temperature of the photoresist layer or the atmosphere temperature was 90° C. Next, the photoresist layer was developed using a developer "FHD-5" (manufactured by Fujifilm Electronic Materials Co., Ltd.) for 1 minute and was further post-baked at 110° C. for 1 minute to form a resist pattern. The size of one side of the resist pattern was set as 1.0 μm in consideration of an etching conversion difference (shrinkage of the pattern width caused by etching).

Next, the obtained glass substrate was attached to a silicon wafer having a diameter of 8 inch (1 inch=25.4 mm), and first etching was performed thereon for 80 seconds using a dry etching machine (U-621, manufactured by Hitachi High-Technologies Corporation) under conditions of RF power: 800 W, antenna bias: 400 W, wafer bias: 200 W, internal pressure of chamber: 4.0 Pa, substrate temperature: 50° C., and kinds and flow rates of gases in mixed gas: $CF_4$ (80 mL/min), $O_2$ (40 mL/min), Ar (800 mL/min).

Next, in the same etching chamber, second etching was performed for 28 seconds and over etching was performed under conditions of RF power: 600 W, antenna bias: 100 W, wafer bias: 250 W, internal pressure of chamber: 2.0 Pa, substrate temperature: 50° C., and kinds and flow rates of gases in mixed gas: $N_2$ (500 mL/min), $O_2$ (50 mL/min), Ar (500 mL/min) ($N_2/O_2$/Ar=10/1/10).

After the dry etching was performed under the above-described conditions, a peeling treatment was performed at 50° C. for 120 seconds using a photoresist peeling solution "MS230C" (manufactured by Fujifilm Electronic Materials Co., Ltd.) to remove the resist. As a result, a colored pattern was formed. Further, a washing treatment using pure water and a spin drying treatment were performed, and then a dehydration baking treatment was performed at 100° C. for 2 minutes. Through the above-described steps, a color filter was obtained.

Examples 72 to 81 and Comparative Examples 4 to 6

Coloring compositions were prepared using the same method as in Example 71, except that Colorant Po-1, Pigment Dispersion P1, and Epoxy Compound E5 in the Preparation the coloring composition of Example 71 were changed as shown in the following table. Next, heat resistance and color transfer properties were evaluated using the same method as in Example 71.

Example 82

Components shown below were mixed, dispersed, and dissolved, and the obtained reaction solution was filtered through a 0.45 μm nylon filter. As a result, a coloring composition was obtained. Using the obtained coloring composition, heat resistance and color transfer properties were evaluated using the same method as in Example 71.

(Composition)

Organic solvent (cyclohexanone): 17.12 parts

Epoxy Compound E5: JER1031S (manufactured by Mitsubishi Chemical Corporation, epoxy equivalent: 180-220 (g/eq.)): 4.395 parts Cyclohexanone Solution 1 of Colorant Po-1 (solid content concentration: 12.3%): 24.57 parts Cyclohexanone solution 2 of Colorant Po-12 (solid content concentration: 12.3%): 51.40 parts Polymerization Inhibitor (p-methoxyphenol): 0.0007 parts Fluorine surfactant (F-475, manufactured by DIC Corporation, 1% PGMEA solution): 2.50 parts

Examples 83 to 88

Coloring compositions were prepared using the same method as in Example 82, except that Colorant Po-1, Colorant Po-12, and Epoxy Compound E5 in the Preparation the coloring composition of Example 82 were changed as shown in the following table. Using the obtained coloring compositions, heat resistance and color transfer properties were evaluated using the same method as in Example 71.

TABLE 5

| | Colorant No. | Pigment Dispersion | Epoxy Compound | Performance Evaluation: Heat Resistance | Performance Evaluation: Color Transfer Properties |
|---|---|---|---|---|---|
| Example 71 | Po-1 | P1 | E5 | A | A |
| Example 72 | Po-1 | P2 | E5 | A | A |
| Example 73 | Po-8 | P1 | E4 | A | A |
| Example 74 | Po-9 | P1 | E3 | A | A |
| Example 75 | Po-22 | P1 | E5 | A | A |
| Example 76 | Po-10 | P1 | E5 | A | A |
| Example 77 | Po-1/Po-14 (Mass Ratio 10/1) | P1 | E5 | A | A |
| Example 78 | Po-22/Po-12 (Mass Ratio 10/1) | P1 | E4 | A | A |
| Example 79 | Po-1/Po-9 (Mass Ratio 7/3) | P1 | E5 | A | A |
| Example 80 | Po-1/Po-22 (Mass Ratio 1/1) | P1/P3 (Mass Ratio 1/1) | E5 | B | A |
| Example 81 | Po-1/Po-22/Po-12 (Mass Ratio 9/1/1) | P1 | E1 | A | A |
| Comparative Example 4 | Comparative Colorant 1 | P1 | E3 | C | D |
| Comparative Example 5 | Comparative Colorant 2 | P1 | E4 | D | C |
| Comparative Example 6 | Comparative Colorant 3 | P1 | E5 | C | D |

TABLE 6

| | Colorant: Cyclohexanone Solution 1 | Colorant: Cyclohexanone Solution 2 | Epoxy Compound | Performance Evaluation: Heat Resistance | Performance Evaluation: Color Transfer Properties |
|---|---|---|---|---|---|
| Example 82 | Po-1 | Po-12 | E3 | A | A |
| Example 83 | Po-1 | Po-14 | E4 | A | A |
| Example 84 | Po-8 | Po-12 | E1 | A | A |
| Example 85 | Po-22 | Po-12 | E5 | B | A |
| Example 86 | Po-10 | Po-13 | E2 | A | A |
| Example 87 | Po-23 | Po-15 | E5 | A | A |
| Example 88 | Po-24 | Po-13 | E5 | A | A |

As shown in the above table, in Examples, heat resistance and color transfer properties were excellent.

On the other hand, in Comparative Examples, heat resistance and color transfer properties were poor.

In Tables 5 and 6, Epoxy Compound E4 represents EPICLON HP7200 (manufactured by DIC Corporation), and E5 represents JER1031S (manufactured by Mitsubishi Chemical Corporation).

<Synthesis of Colorant Po-28>
(Synthesis of Xanthene Colorant A-xt-23)
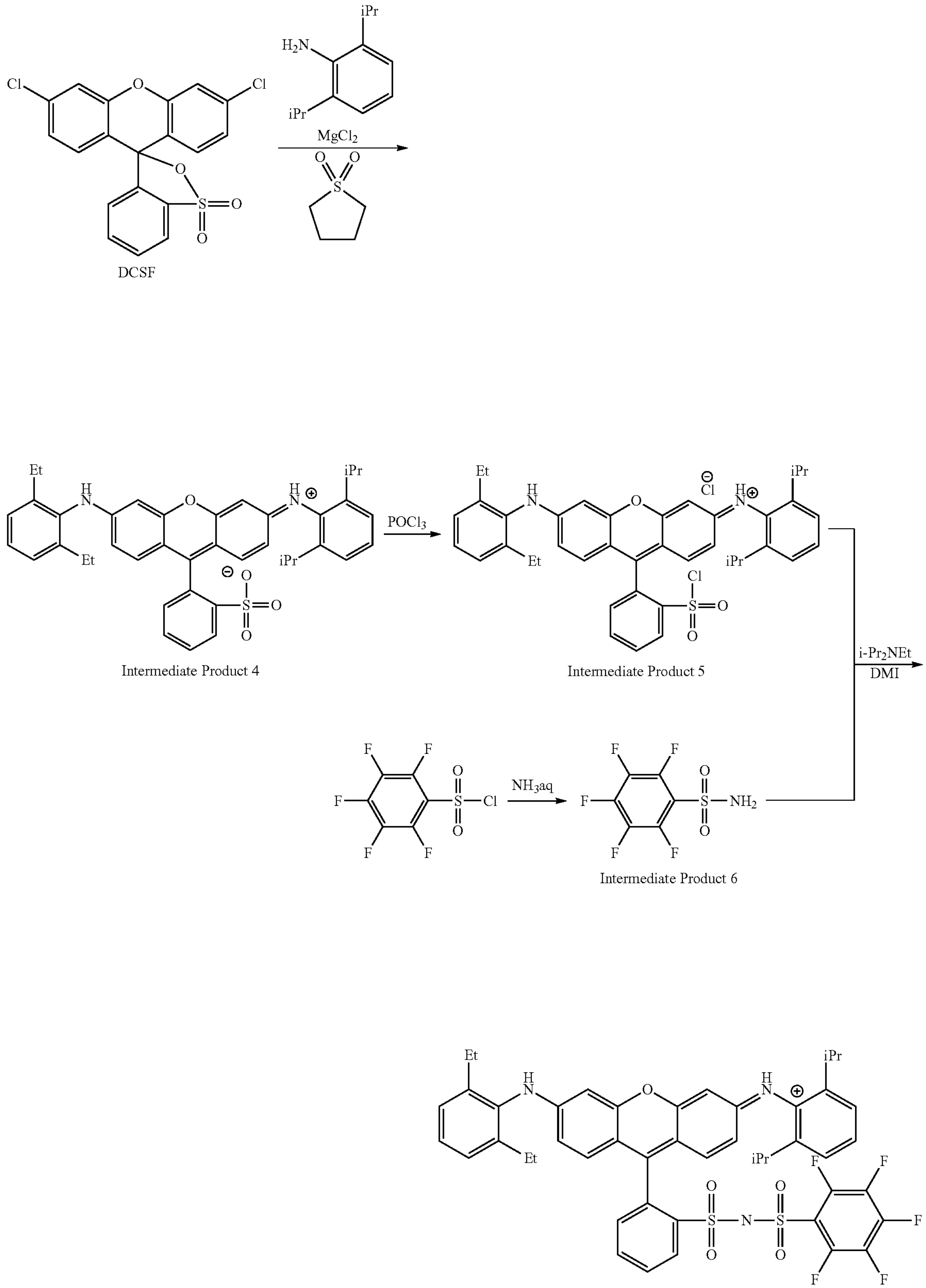
DCSF
Intermediate Product 4
Intermediate Product 5
Intermediate Product 6
A-xt-23

<<Synthesis of Intermediate Product 4>>

The following experiment was performed using a glass flask. 204 parts of DCSF (having a purity of 95% or higher when measured by HPLC after dissolved in NMP, filtered through celite, and crystallized), 1408 parts of sulfolane, 295 parts of 2,6-diisopropylaniline (having a purity of 95% or higher when measured by HPLC after converted into a hydrochloride, treated with sodium hydroxide, and purified), and 108 parts of 1-butoxy-2-propanol were put into a flask and were stirred at 80° C. for 4.5 hours. This reaction solution was cooled to 65° C. and was stirred for 12 hours, and 109 parts of magnesium chloride anhydrous, 294 parts of tripotassium phosphate, 788 parts of 2,6-diethylaniline were added. This reaction solution was heated to 140° C., was stirred for 22 hours, and was cooled to 50° C. This reaction solution was added dropwise to 7828 parts of acetonitrile, and the components was stirred at 50° C. for 3 hours. This reaction solution was cooled to room temperature and was stirred for 2 hours. Next, the obtained crystals were separated by filtration and were washed with 2817 parts of acetonitrile. The crystals were added to 2466 parts of methanol while being washed with 274 parts of methanol at room temperature. The components were stirred at 50° C. for 3 hours. This reaction solution was cooled to room temperature, 3716 parts of 2 N hydrochloric acid was added dropwise thereto, and the components were stirred at room temperature for 2 hours. The obtained crystals were separated by filtration and were sequentially washed with 3334 parts of ion exchange water and 798 parts of acetonitrile. The crystals were dried under reduced pressure at 60° C. for 14 hours. As a result, 250 parts of Intermediate Product 4 was obtained.

<<Synthesis of Intermediate Product 5>>

105 parts of DMF, 1068 parts of sulfolane, 282 parts of Intermediate Product 1, and 222 parts of acetonitrile were put into a flask at room temperature, were heated to 85° C., and were stirred for 5 minutes. 285 parts of phosphorus oxychloride was added to the reaction solution, and the components were stirred at 110° C. for 3.5 hours. The reaction solution was allowed to cool to 60° C., 222 parts of acetonitrile was added thereto, and the reaction solution was allowed to cool to −2° C. 2824 parts of ion exchange water was added dropwise such that the temperature of the reaction solution was in a range of −2° C. to 7° C., and the components were stirred for 1 hour. The obtained crystals were separated by filtration and were sequentially washed with a mixed solution of 1113 parts of acetonitrile and 1412 parts of ion exchange water, 4236 parts of ion exchange water, and 1059 parts of acetonitrile. As a result, 238 parts of Intermediate Product 5 was obtained.

<<Synthesis of Intermediate Product 6>>

150 parts of pentafluorobenzenesulfonyl chloride and 2668 parts of tetrahydrofuran (THF) were put into a flask and were cooled such that the inside temperature reached −10° C. 54.8 parts of 28% ammonia water was added dropwise to the reaction solution such that the reaction solution was held at −5° C. or lower. After the dropwise addition, the components were stirred at −10° C. for 10 minutes. Next, 6.85 parts of 28% ammonia water was added dropwise to the reaction solution such that the reaction solution was held at −5° C. or lower. Further, after the dropwise addition, the components were stirred at −10° C. for 10 minutes. Next, 1.14 parts of 28% ammonia water was added dropwise to the reaction solution such that the reaction solution was held at −5° C. or lower. 3.58 parts of lithium chloride was added to the reaction solution, and the components were heated to room temperature and were stirred for 10 minutes. This reaction solution was filtered, and the filtrate was washed with 400 parts of THF. The filtrate and the washing liquid were put into a flask together, and 1005 parts of ion exchange water was added dropwise thereto at room temperature. This reaction solution was stirred at 35° C. for 2 hours and was cooled to room temperature, 7.39 parts of sodium acetate was added thereto, and the components were stirred at room temperature for 10 minutes. This reaction solution was concentrated under reduced pressure at 35° C., was cooled to 5° C., and was stirred for 30 minutes. The obtained solid was filtered, was washed with 450 parts of ion exchange water, and was dried in a vacuum at 45° C. for 12 hours. As a result, 107 parts of Intermediate Product 6 was obtained.

<<Synthesis of Xanthene Compound (A-xt-23)>>

508 parts of DMI (1,3-dimethyl-2-imidazolidinone) was put into a flask, and then 86.4 parts of Intermediate Product 6 and 208 parts of Intermediate Product 5 were put into the flask while being washed with 127 parts of DMI. The components was stirred at room temperature for 5 minutes and were cooled to 1° C., 113 parts of diisopropylethylamine was added thereto at 1° C. to 5° C., and the components were stirred at 1° C. to 5° C. for 2 hours. After the completion of the reaction, 35.0 parts of acetic acid was added to the reaction solution at 1° C. to 5° C. and was heated to room temperature, and then 788 parts of EKINEN F6 (modified alcohol, Japan Alcohol Trading Co., Ltd.) was added thereto. This reaction solution was stirred at room temperature for 10 minutes, was filtered through celite, and was washed with 265 parts of EKINEN F6. The filtrate and the washing liquid were put into a flask together, and 1194 parts of EKINEN F6 and 250 parts of ion exchange water were added dropwise thereto at room temperature. Next, 0.03 parts of seed crystals of Xanthene Compound (A-xt-23) were added to the reaction solution at room temperature, and the components were stirred for 13 hours. This reaction solution was cooled to 5° C. The obtained crystals were filtered and were washed with 505 parts of methanol. The crystals were put into a flask, 909 parts of methanol was added thereto, and the components were heated to flux for 1 hour. This reaction solution was cooled to 5° C., the crystals were filtered, were washed with 505 parts of methanol, and were dried under reduced pressure at 45° C. for 12 hours. As a result, 194 parts of (A-xt-23) was obtained.

<<Synthesis of (B-28)>>

22.0 parts of Compound (S-6) having 3 to 15 mercapto groups in one molecule and 317 parts of DMI (1,3-dimethyl-2-imidazolidinone) were put into a flask and were stirred in a nitrogen atmosphere at room temperature for 5 minutes. 66.0 parts of Xanthene Compound (A-xt-23) was slowly added to the reaction solution while being washed with 34.0 parts of DMI, and the components were stirred at room temperature for 30 minutes. 11.3 parts of DBU (diazabicycloundecene) was added to the reaction solution while being washed with 1.13 parts of DMI such that the temperature of the reaction solution did not exceed 30° C., and the components were stirred at room temperature for 1 hour. 13.4 parts of acetic acid was added to the reaction solution while being washed with 1.3 parts of DMI such that the temperature of the reaction solution did not exceed 30° C., and the components were stirred at room temperature for 5 minutes. The reaction solution was added dropwise to a mixed solvent including 720 parts of methanol and 303 parts of ultrapure water such that a solid was obtained by reprecipitation. The obtained solid was filtered and was washed with a mixed solvent including 360 parts of methanol and 151 parts of ultrapure water. The obtained solid was dried by blowing air at 45° C. for 2 days. As a result, 86.5 parts of the following Mercapto Compound (B-28) was obtained. It was verified by NMR measurement that a ratio of colorant sites to R sites was 3.5.

(B-28)

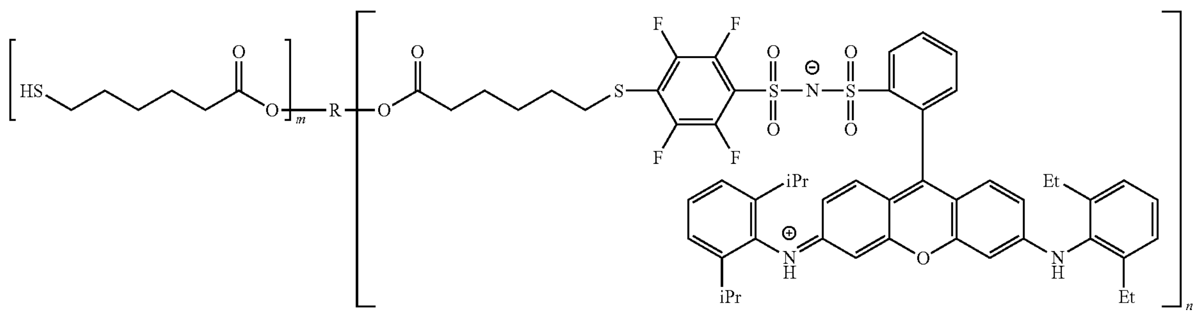

R =

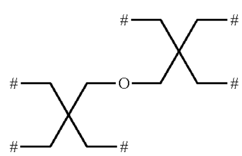

Synthesis of (Po-28)

A mixed solution of 37.1 parts (solid content: 94.40%) of Mercapto Compound (B-28), 0.082 parts of 4-OH TEMPO (4-hydroxy-2,2,6,6-tetramethylpiperidine 1-oxyl, free radical), 5.44 parts of methacrylic acid (MAA), 10.4 parts of ethylene glycol mono-2-bromoisobutyrate monomethacrylate (BBEM), and 56.4 parts of NEP (N-ethylpyrrolidone) was heated to 80° C. in a nitrogen stream. A NEP solution (V-601: 0.694 parts, NEP: 6.19 parts) of dimethyl 2,2'-azobis(isobutyrate) [V-601; manufactured by Wako Pure Chemical Industries, Ltd.] was added dropwise to the reaction solution for 3 hours. After the completion of the dropwise addition, 0.69 parts of NEP was added, the components were stirred at 80° C. for 30 minutes, and a NEP solution (V-601: 0.694 parts, NEP: 1.15 parts) of V-601 was added. This reaction solution was stirred at 80° C. for 1.5 hours, and then a NEP solution (V-601: 0.694 parts, NEP: 1.15 parts) of V-601 was further added. This reaction solution was stirred at 80° C. for 1.5 hours, and then a NEP solution (V-601: 0.694 parts, NEP: 1.15 parts) of V-601 was further added. The reaction solution was heated to 90° C. and was stirred for 2 hours. The reaction solution was cooled, and the nitrogen substitution in the system was stopped. In air, 0.204 parts of 4-OH TEMPO and 26.7 parts of NEP were added. Next, 42.7 parts of DBU (diazabicycloundecene) was slowly added while being washed with 3.04 parts of NEP such that the temperature did not exceed 30° C., and the components were stirred at room temperature for 14 hours. Next, 62.6 parts of NEP was added, and the reaction solution was cooled to 5 degrees or lower in an ice bath. Next, 27.0 parts of methanesulfonic acid was slowly added while being washed with 1.99 parts of NEP such that the temperature did not exceed 15° C. After the completion of the addition, the reaction solution was added dropwise to a mixed solvent of 543 parts of methanol, 686 parts of ultrapure water, and 0.478 parts of p-methoxyphenol such that a solid was reprecipitated. The components were stirred at room temperature for 1 hour. This reaction solution was heated to 47.5° C., was stirred for 1 hours, and was cooled to room temperature. The obtained solid was filtered and was washed with a mixed solvent including 272 parts of methanol and 343 parts of ultrapure water. This solid was converted into a slurry in a mixed solvent of 136 parts of methanol, 172 parts of ultrapure water, and 0.478 parts of p-methoxyphenol. The obtained solid was filtered and was washed with 136 parts of methanol and 172 parts of ultrapure water. The obtained solid was dried by blowing air at 45° C. for 2 days. As a result, 45.7 parts of the following Colorant (Po-28) according to the present invention was obtained. The weight average molecular weight (value in terms of polystyrene) of Po-28 was 8900, and the acid value thereof was 61 mgKOH/g when obtained by titration using a 0.1 N sodium hydroxide aqueous solution. In addition, when obtained by NMR, a molar ratio of colorant structure/MAA/HBr-Eliminated portion of BBEM was 3.5/6/4.5, and the average number of P sites repeated was calculated as 4.

In addition, the turbidity of Po-28 in 5 mass % cyclohexanone was 1.0 ppm. In addition, the content of free metals which were neither bonded nor coordinated to Po-28 was 2 ppm or lower, the free metals being selected from the group consisting of Al, Ca, Cu, Cr, Mg, Fe, Mn, Ni, Co, Cd, Li, Pb, Na, K, Zn, and P. Further, the content of free Br which was neither bonded nor coordinated to Po-28 was 400 ppm, and the content of free C1 which was neither bonded nor coordinated to Po-28 was 100 ppm.

(Po-28)
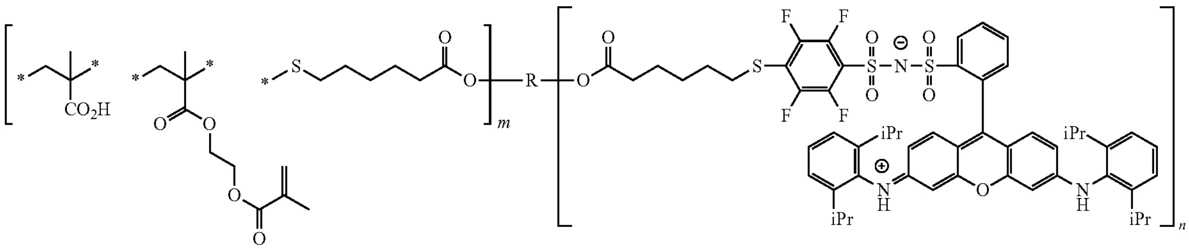
R =
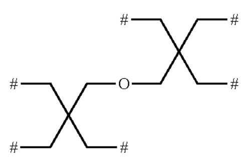
<Synthesis of Colorants Po-29 to Po-33>
(Synthesis of (B-29) to (B-33))
(B-29) to (B-33) were synthesized using the same method as in (B-28) such that m and n represent as shown in the table after changing (A-xt-23) was changed to a colorant corresponding to (A-xt-1) and changing (S-6) to a compound having a mercapto group corresponding to (S-6).
(B-29)
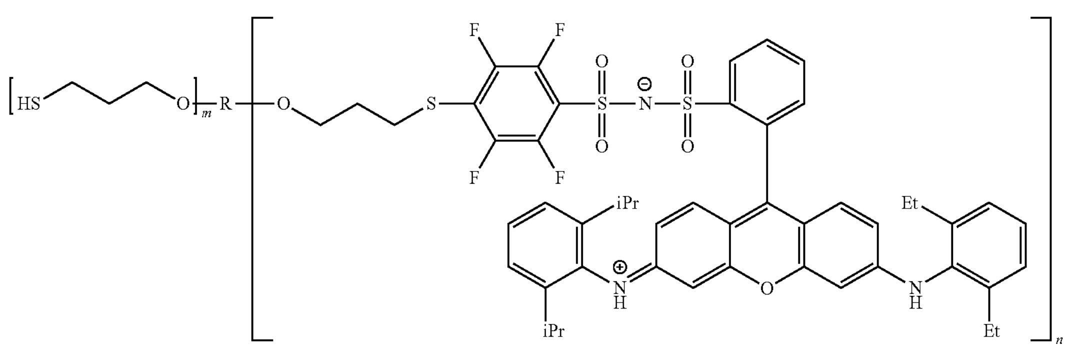
R =
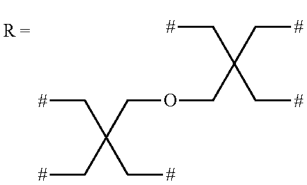

-continued
(B-30)
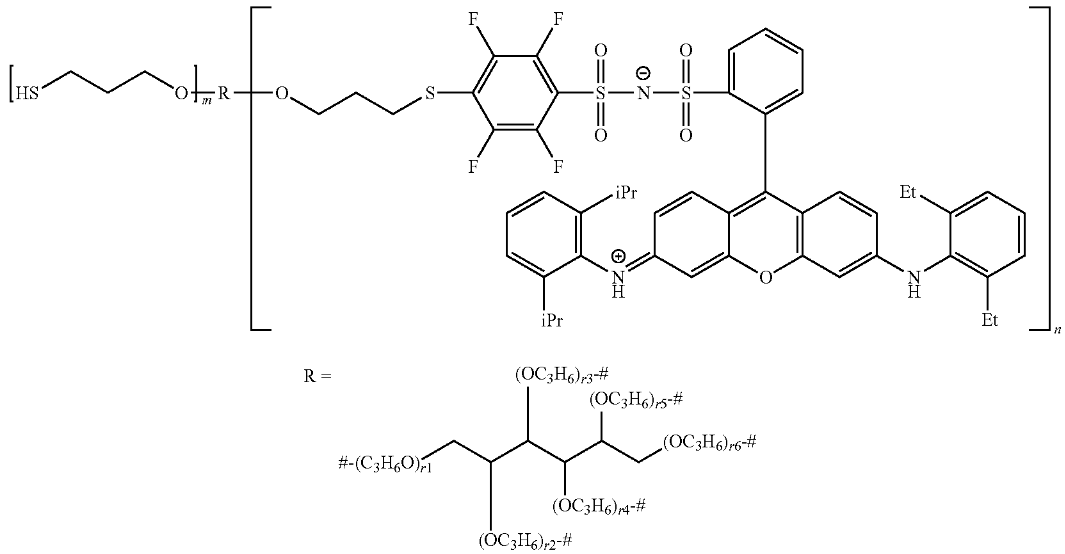
r1+r2+r3+r4+r5+r6=25
(B-31)
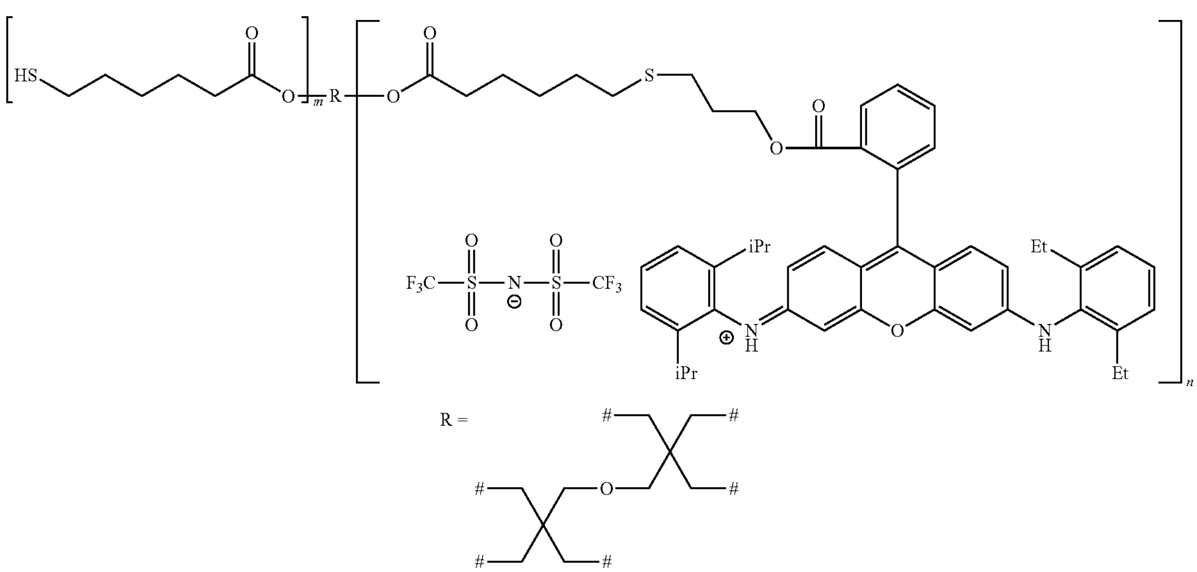

-continued
(B-32)
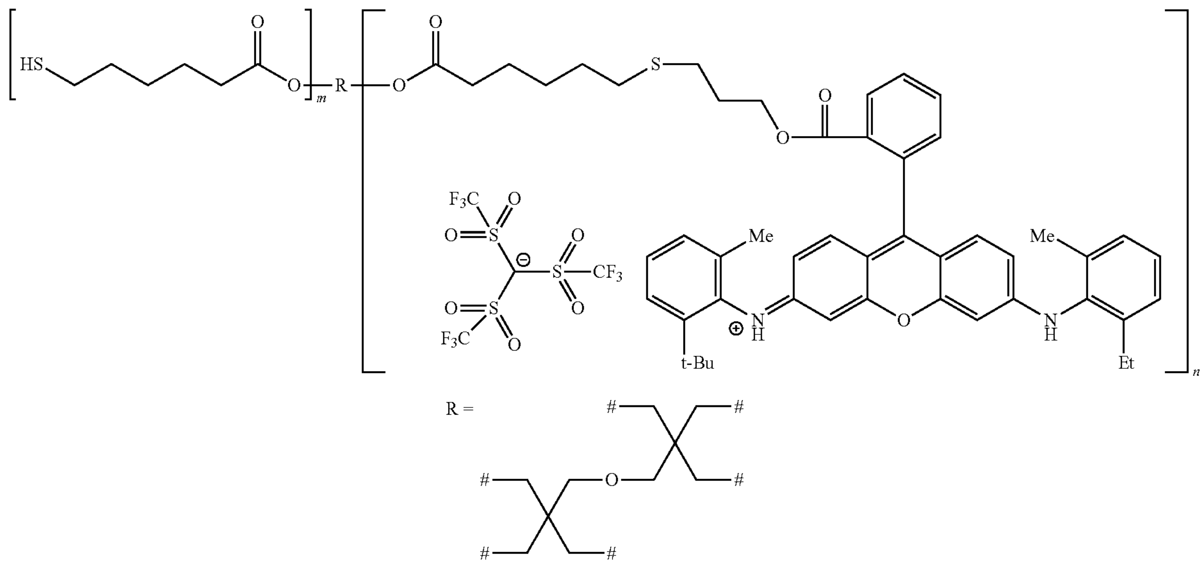
(B-33)
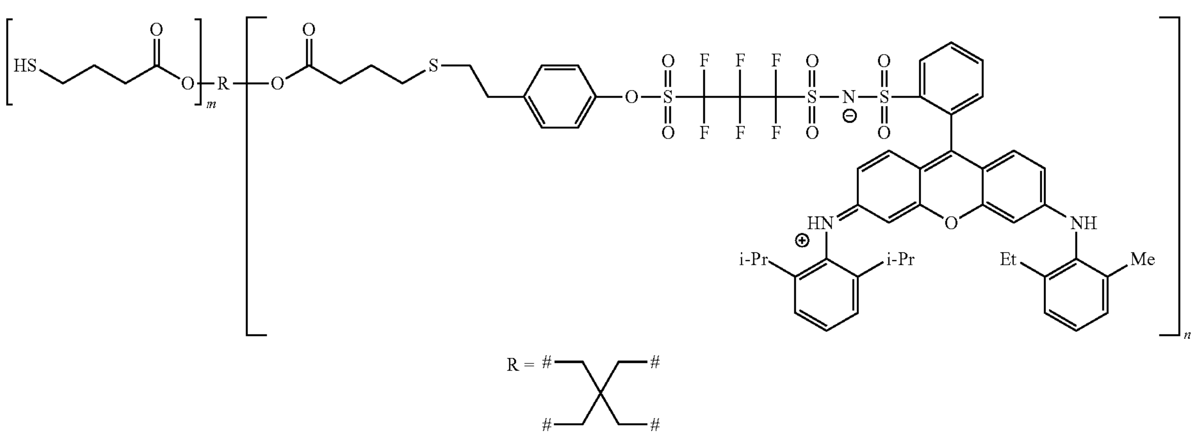
(Synthesis of (Po-29) to (Po-33))
(Po-29) to (Po-33) were synthesized using the same synthesis method as in (Po-28), except that the mercapto compound, the monomers, and the like used were changed as shown in the table.
(Po-29)
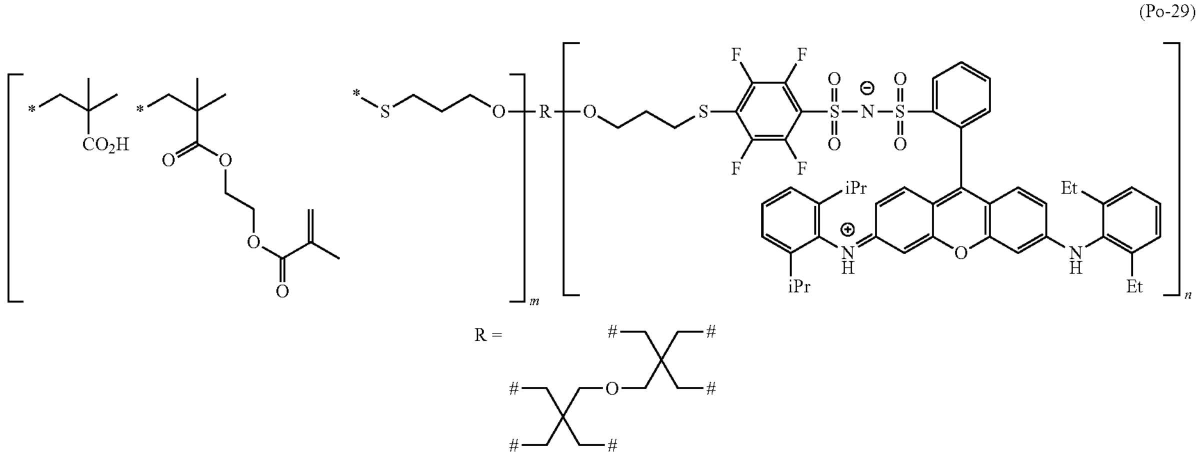

-continued
(Po-30)
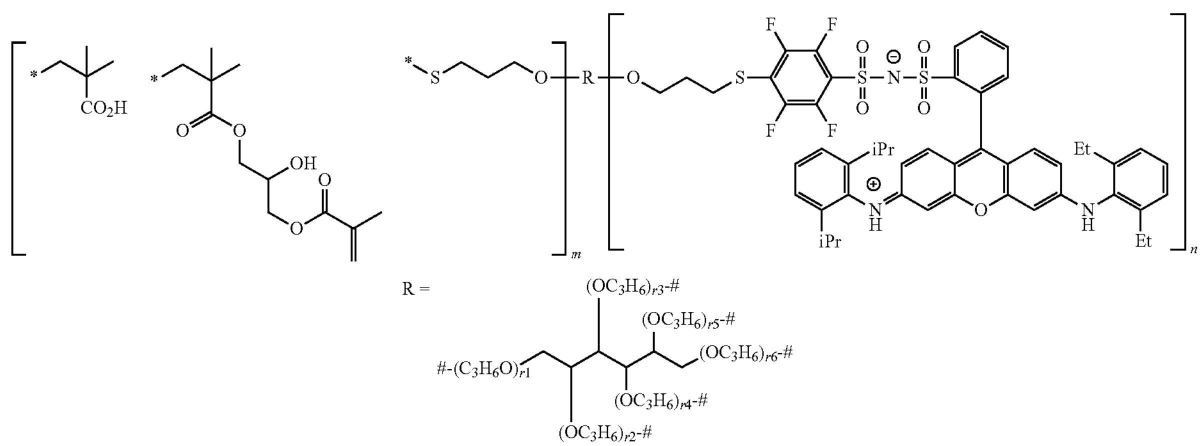
r1+r2+r3+r4+r5+r6=25
(Po-31)
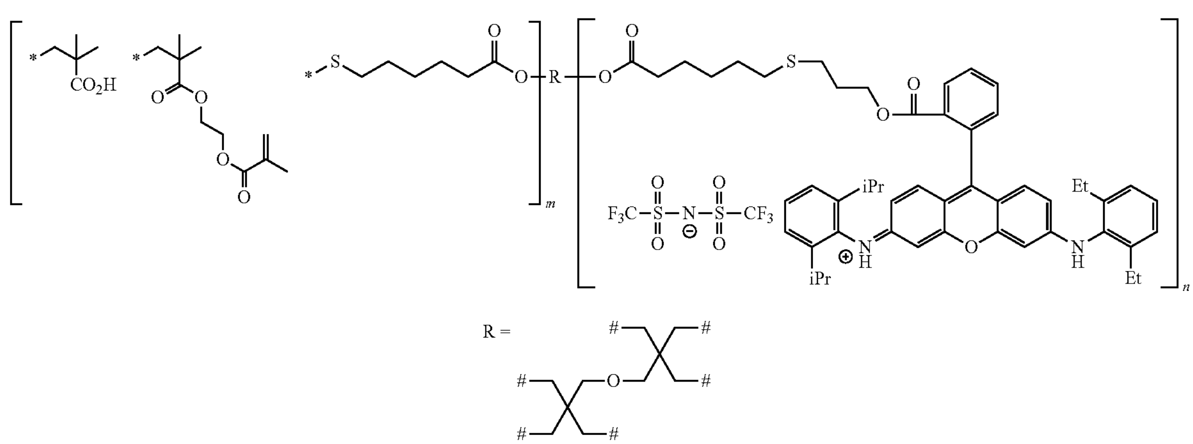
(Po-32)
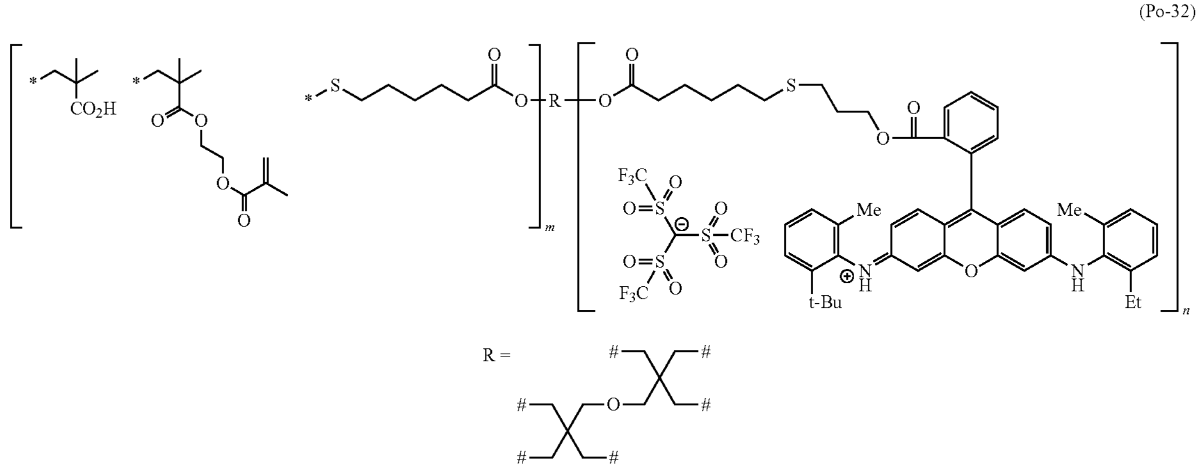

-continued (Po-33)

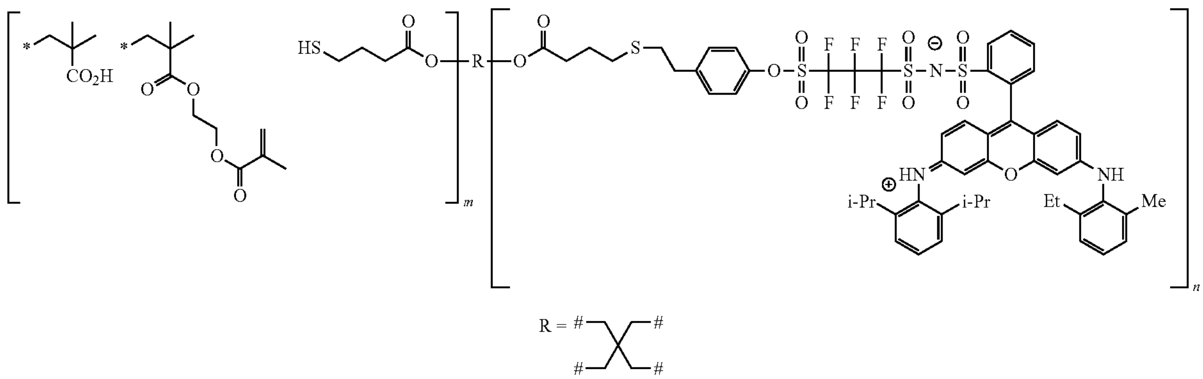

TABLE 7

| Colorant | Synthesis Method of Colorant | Intermediate Product | Mercapto Compound: $R^1$ | Mercapto Compound: Colorant (Structure Before Reaction) | Mercapto Compound: Addition Amount (Part(s)) | Mercapto Compound: m + n | Mercapto Compound: w | Mercapto Compound: n | Monomer: Component 1 | Monomer: Molar Ratio | Monomer: Component 1 (Part(s)) | Monomer: Component 2 | Monomer: Molar Ratio | Monomer: Component 2 (Part(s)) |
|---|---|---|---|---|---|---|---|---|---|---|---|---|---|---|
| Po-29 | BBEM | B-28 | (S-6) | (A-xt-23) | 5.00 | 6 | 2.5 | 3.5 | MAA | 6 | 0.63 | BBEM | 4.5 | 1.09 |
| Po-29 | BBEM | B-29 | (S-6) | (A-xt-23) | 5.00 | 6 | 2 | 4 | MAA | 8 | 0.76 | BBEM | 6 | 1.32 |
| Po-30 | GMA | B-30 | (S-11) | (A-xt-23) | 5.00 | 6 | 3 | 3 | MAA | 8 | 0.74 | | | |
| Po-31 | BBEM | B-31 | (S-6) | (A-xt-24) | 5.00 | 6 | 2 | 4 | MAA | 7 | 0.63 | BBEM | 4 | 0.82 |
| Po-32 | BBEM | B-32 | (S-6) | (A-xt-25) | 5.00 | 6 | 3 | 3 | MAA | 6 | 0.62 | BBEM | 3 | 0.77 |
| Po-33 | BBEM | B-33 | (S-1) | (A-xt-26) | 5.00 | 4 | 1 | 3 | MAA | 6 | 0.70 | BBEM | 6 | 1.44 |

| Colorant | Polymerization Initiator: Kind | Polymerization Initiator: (Part(s)) | Compound: Component 3 | Compound: Molar Ratio | Compound: (Part(s)) | Compound: Component 4 | Compound: (Part(s)) | Molar Ratio (NMR): Colorant Structure | Molar Ratio (NMR): Component 1 | Molar Ratio (NMR): Component 2 | Molar Ratio (NMR): GMA Adduct | $R^2$ Site: Number of Repeating Units | Acid Value mgKOH/g | Mw | Yield (Part(s)) |
|---|---|---|---|---|---|---|---|---|---|---|---|---|---|---|---|
| Po-29 | V-601 | 0.089 | | 0 | 0.00 | | 0.00 | 3.5 | 6 | 4.5 | 0 | 4.2 | 61 | 8700 | 6.1 |
| Po-29 | V-601 | 0.107 | | 0 | 0.00 | | 0.00 | 4 | 8 | 6 | 0 | 7.0 | 70 | 10200 | 6.4 |
| Po-30 | V-601 | 0.059 | GMA | 2 | 0.31 | TBAB | 0.06 | 3 | 6 | 0 | 2 | 2.7 | 60 | 9000 | 5.4 |
| Po-31 | V-601 | 0.079 | | 0 | 0.00 | | 0.00 | 4 | 7 | 4 | 0 | 5.5 | 63 | 9900 | 5.8 |
| Po-32 | V-601 | 0.074 | | 0 | 0.00 | | 0.00 | 3 | 6 | 3 | 0 | 3.0 | 63 | 8500 | 5.7 |
| Po-33 | V-601 | 0.113 | | 0 | 0.00 | | 0.00 | 3 | 6 | 6 | 0 | 12.0 | 64 | 8300 | 6.4 |

A-xt-23 to A-xt-26 in Table 7 above have the following structures.

(A-xt-23)

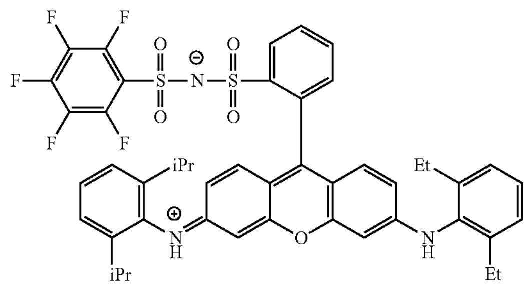

(A-xt-24)

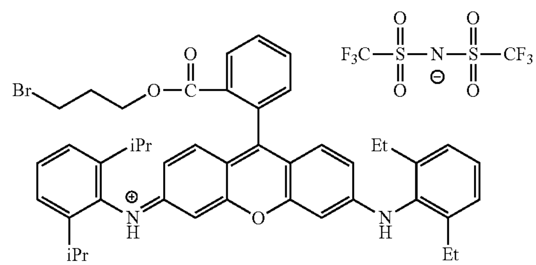

(A-xt-25)

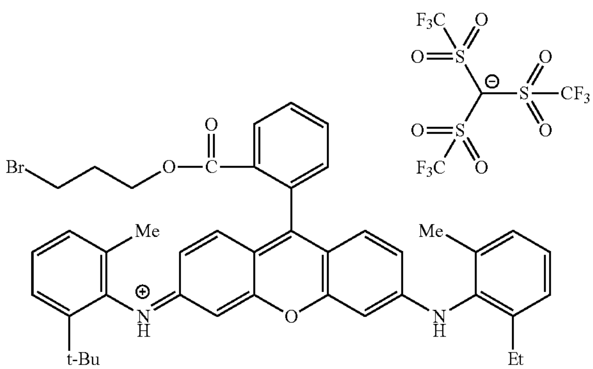

(A-xt-26)

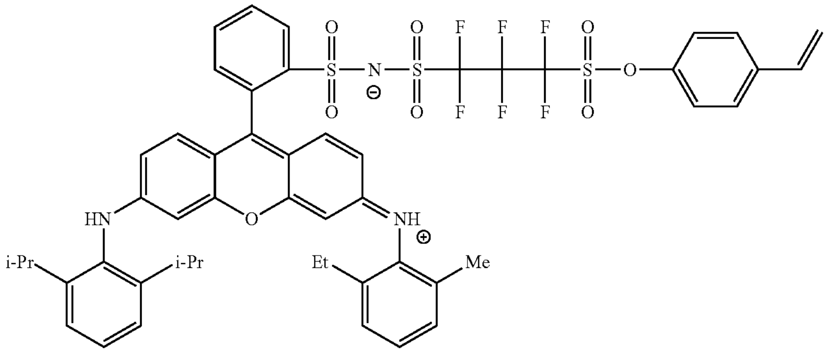

Examples 89 to 96

Coloring compositions were prepared using the same method as in Example 1, except that the colorant, the pigment dispersion, the photopolymerization initiator, the alkali-soluble resin 1, the polymerizable compound, and the epoxy compound were changed as shown in the Table 8 below. Using the obtained coloring compositions, heat resistance and color transfer properties were evaluated using the same method as in Example 1.

TABLE 8

| | Colorant No. | Pigment Dispersion | Photopolymerization Initiator | Alkali-Soluble Resin 1 | Polymerizable Compound | Epoxy Compound | Performance Evaluation Heat Resistance | Color Transfer Example |
|---|---|---|---|---|---|---|---|---|
| Example 89 | Po-28 | P1 | I7 | J1 | Z4 | E1 | A | A |
| Example 90 | Po-29 | P1 | I3 | J1 | Z3 | E2 | A | A |
| Example 91 | Po-30 | P1 | I4 | J1 | Z2 | E1 | A | A |
| Example 92 | Po-31 | P1 | I2 | J2 | Z4 | E1 | A | A |
| Example 93 | Po-32 | P1 | I7 | J1/J2 (Mass Ratio 1/1) | Z3 | E1 | A | A |
| Example 94 | Po-33 | P1 | I7 | J1 | Z4/Z3 (Mass Ratio 1/1) | E3 | A | A |
| Example 95 | Po-1/Po-28 (Mass Ratio 10/1) | P1 | I7 | J1 | Z4 | E1 | A | A |
| Example 96 | Po-1/Po-28 (Mass Ratio 10/1) | P1 | I7 | J1 | Z4 | E1 | A | A |

As shown m the above table, m the coloring compositions according to Examples 89 to 96, heat resistance and color transfer properties were excellent.

What is claimed is:

1. A coloring composition comprising a curable compound and a colorant represented by the following Formula (1), $$(D\text{-}L^1\text{-}Y\text{—}X\text{—})_n\text{—}R^1\text{—}(R^2)_m, \qquad \text{Formula (1):}$$

in Formula (1), $R^1$ represents a (m+n)-valent linking group, X represents —C(═O)O—, —C(═O)—, —C(═O)NR$^{10}$—, —O—, —S(═O)—, or —SO$_2$—, $R^{10}$ represents a hydrogen atom or an alkyl group, Y represents an alkylene group, $L^1$ represents a single bond or a divalent linking group, D represents a colorant structure, $R^2$ represents a monovalent substituent, m represents an integer of 1 to 13, n represents an integer of 2 to 14, m+n represents an integer of 3 to 15, in a case where m represents 2 or more, plural $R^2$'s may be different from each other, in a case where n represents 2 or more, plural D's may be different from each other, in a case where $L^1$ represents a divalent linking group, $L^1$ and X are separated by Y by a distance of three or more carbon atoms, in a case where $L^1$ represents a single bond, D and X are separated by Y by a distance of three or more carbon atoms, and at least one of D, $L^1$, $R^1$, $R^2$, X, or Y has an acid group.

2. The coloring composition according to claim 1, wherein D in Formula (1) is derived from a colorant selected from the group consisting of a dipyrromethene colorant, a triarylmethane colorant, a xanthene colorant, a cyanine colorant, a squarylium colorant, an anthraquinone colorant, a quinophthalone colorant, a phthalocyanine colorant, a subphthalocyanine colorant, and an azo colorant.

3. The coloring composition according to claim 1, wherein D in Formula (1) has a cation site and a counter anion or has a cation site and an anion site in one molecule, the counter anion is at least one selected from the group consisting of a sulfonic acid anion, a sulfonyl imide anion, a bis(alkylsulfonyl)imide anion, a tris(alkylsulfonyl)methide anion, a carboxylic acid anion, a tetraaryl borate anion, $BF_4^-$, $PF_6^-$, and $SbF_6^-$, and the anion site is a sulfonyl imide anion.

4. The coloring composition according to claim 1, wherein Y in Formula (1) represents an unsubstituted linear alkylene group.

5. The coloring composition according to claim 1, wherein $R^2$ in Formula (1) includes a repeating unit derived from a vinyl compound having an acid group.

6. The coloring composition according to claim 1, wherein $R^2$'s in Formula (1) include repeating units, and an average number of the repeating units is 2 to 20.

7. The coloring composition according to claim 1, wherein X in Formula (1) represents *—C(═O)O—#,

* is bonded to Y, and is bonded to $R^1$.

8. The coloring composition according to claim 1, wherein the colorant represented by Formula (1) includes a group having an ethylenically unsaturated bond.

9. The coloring composition according to claim 1, wherein $R^2$ in Formula (1) includes a group having an ethylenically unsaturated bond.

10. The coloring composition according to claim 1, wherein $R^1$ in Formula (1) represents a linking group represented by the following Formula (2), a linking group represented by the following Formula (3), a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms, Formula (2)

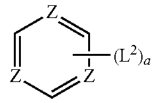

in Formula (2), Z's each independently represent $CR^{20}$ or N, $L^2$'s each independently represent a single bond or a p-valent linking group, $R^{20}$ represents a hydrogen atom or a substituent, a represents an integer of 1 to 6, p represents an integer of 2 or more, and in a case where $L^2$ represents a p-valent linking group, $L^2$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms, and Formula (3)

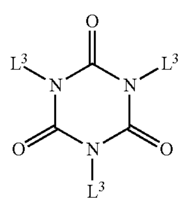

in Formula (3), $L^3$'s each independently represent a single bond or a q-valent linking group, q represents an integer of 2 or more, and in a case where $L^3$ represents a q-valent linking group, $L^3$ represents a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

11. The coloring composition according to claim 1, wherein $L^1$ in Formula (1) represents a single bond,

—S—, a linking group which has a main chain including plural carbon atoms in which the main chain includes at least one portion where three or more carbon atoms are continuously located, a linking group which has a main chain including one heteroatom and plural carbon atoms in which the main chain includes at least one portion where three or more carbon atoms are continuously located, or a linking group which has a main chain including at least two heteroatoms and plural carbon atoms in which the main chain includes at least one portion where the heteroatoms are separated by three or more continuous carbon atoms.

12. The coloring composition according to claim 1, wherein in Formula (1), m represents 1 to 5 and n represents 2 to 8.

13. The coloring composition according to claim 1, wherein a weight average molecular weight of the colorant represented by Formula (1) is 2000 to 15000.

14. The coloring composition according to claim 1, further comprising a pigment other than the colorant represented by Formula (1).

15. The coloring composition according to claim 1, further comprising a photopolymerization initiator.

16. The coloring composition according to claim 1 which is used for forming a colored layer of a color filter.

17. A cured film which is obtained by curing the coloring composition according to claim 1.

18. A color filter which is obtained using the coloring composition according to claim 1.

19. A solid image pickup element comprising the color filter according to claim 18.

20. An image display apparatus comprising the color filter according to claim 18.

21. A method of manufacturing a color filter comprising:

applying the coloring composition according to claim 1 to a support to form a coloring composition layer;

exposing the coloring composition layer in a pattern shape; and forming a colored pattern by removing a non-exposed portion by development.

22. A method of manufacturing a color filter comprising:

forming a colored layer by applying the coloring composition according to claim 1 to a support to form a coloring composition layer and curing the coloring composition layer;

forming a photoresist layer on the colored layer;

obtaining a resist pattern by patterning the photoresist layer by exposure and development; and dry-etching the colored layer by using the resist pattern as an etching mask.

23. The coloring composition according to claim 1, wherein $L^1$ in Formula (1) represents a divalent linking group includes at least one sulfur atom.

* * * * *